US009972802B2

(12) United States Patent
Ikemizu et al.

(10) Patent No.: US 9,972,802 B2
(45) Date of Patent: May 15, 2018

(54) ORGANIC ELECTROLUMINESCENT ELEMENT

(71) Applicant: Konica Minolta, Inc., Tokyo (JP)

(72) Inventors: Dai Ikemizu, Hachioji (JP); Takayuki Iijima, Hino (JP); Takamune Hattori, Hachioji (JP); Yasushi Okubo, Hino (JP); Hideo Taka, Inagi (JP)

(73) Assignee: KONICA MINOLTA, INC., Tokyo (JP)

( * ) Notice: Subject to any disclaimer, the term of this patent is extended or adjusted under 35 U.S.C. 154(b) by 552 days.

(21) Appl. No.: 14/395,319

(22) PCT Filed: Apr. 12, 2013

(86) PCT No.: PCT/JP2013/061053
§ 371 (c)(1),
(2) Date: Oct. 17, 2014

(87) PCT Pub. No.: WO2013/157494
PCT Pub. Date: Oct. 24, 2013

(65) Prior Publication Data
US 2015/0076469 A1 Mar. 19, 2015

(30) Foreign Application Priority Data
Apr. 20, 2012 (JP) ................. 2012-096269

(51) Int. Cl.
C09K 11/06 (2006.01)
H01L 51/50 (2006.01)
C09K 11/88 (2006.01)
H01L 51/00 (2006.01)

(52) U.S. Cl.
CPC ............ H01L 51/502 (2013.01); C09K 11/06 (2013.01); C09K 11/88 (2013.01); H01L 51/0072 (2013.01); H01L 51/0073 (2013.01); H01L 51/0085 (2013.01); H01L 51/5004 (2013.01); H01L 51/5016 (2013.01); C09K 2211/185 (2013.01); H01L 51/0097 (2013.01); Y02B 20/181 (2013.01)

(58) Field of Classification Search
CPC .................................................... H01L 51/502
See application file for complete search history.

(56) References Cited

U.S. PATENT DOCUMENTS

2011/0057559 A1 3/2011 Xia et al.

FOREIGN PATENT DOCUMENTS

| JP | 2006-066395 A | 3/2006 |
|---|---|---|
| JP | 2006-128667 A | 5/2006 |
| JP | 2006128667 A | 5/2006 |
| JP | 2006-190682 A | 7/2006 |
| JP | 2009-087744 A | 4/2009 |
| JP | 200987744 A | 4/2009 |
| JP | 2009-199738 A | 9/2009 |
| JP | 2009199738 A | 9/2009 |
| JP | 2010-192719 A | 9/2010 |
| JP | 2011-061028 A | 3/2011 |
| JP | 201161028 A | 3/2011 |
| JP | 2011-086442 A | 4/2011 |
| JP | 2012-023127 A | 2/2012 |
| JP | 201223127 A | 2/2012 |
| WO | 2011147522 A1 | 12/2011 |

OTHER PUBLICATIONS

Hong-Wei et al., Thin Solid Films, (2006) vol. 489, Issue 1-2.*
Zhang et al., Applied Physics letters, (2010) vol. 97, Issue 25.*
Office Action dated Jun. 28, 2016 from corresponding Korean Application; Patent Application No. 10-2014-7028989; English translation of Office Action; Total of 14 pages.
Office Action dated Aug. 2, 2016 from the corresponding Japanese Application; Patent Application No. 2014-511195; English translation of Office Action; Total of 20 pages.
Hong-Wei Liu, et al, "Enhanced phosphorescence and electroluminescence in triplet emitters by droping gold into cadmium sel", Departmentof Applied Chemistry, National Chiao Tung University and UST-CNST.
Y.Q. Zhang, et al, "Electroluminescence of green CdSe/ZnS quantum dots enhanced by harvesting excitons from phosphoresce", Applied Physics Letters 97, 253115(2010); Published by the AIP Publishing LLC.
Notification of Reasons for Refusal dated Mar. 21, 2017 from corresponding Japanese Patent Application No. JP 2014-511195; English translation of Notification of Reasons for Refusal; Total of 15 pages.
Notice of Final Rejection dated Apr. 3, 2017 from corresponding Korean Patent Application No. KR 10-2014-7028989; Applicant: Konica Minolta, Inc.; English translation of Notice of Final Rejection; Total of 9 pages.
International Preliminary Report on Patentability, PCT/JP2013/ 061053, International filing date: Apr. 12, 2013, dated Oct. 21, 2014 with English translation thereof (total pp. 22).
Hong-Wei Liu, et al; Enhanced phosphorescence and electroluminescence . . . ; Thin Solid Films; vol. 489; Issues 1-2; 2005; pp. 296-302.
Y.Q. Zhang, et al; Electroluminescence of green CdSe/ZnS quantum . . . ; Applied Physics Letters; vol. 97; Issue 25; 2010; pp. 253115-1-253115-3.
Office Action dated May 30, 2016 from corresponding Korean Application; Patent Application No. 10-2014-7028989; English translation of Office Action; Total of 14 pages.
Office Action dated Jul. 19, 2017 from the corresponding Korean Patent Application No. KR 10-2014-7028989 and English translation.

* cited by examiner

Primary Examiner — Paul V Ward
(74) Attorney, Agent, or Firm — Lucas & Mercanti, LLP

(57) ABSTRACT

The organic electroluminescent element has a pair of electrodes and at least two organic functional layers including a light-emitting layer on a substrate. The light-emitting layer contains a host compound and a phosphorescent dopant. The light-emitting layer or the layer adjacent to the light-emitting layer contains quantum dots.

15 Claims, 3 Drawing Sheets

ORGANIC ELECTROLUMINESCENT ELEMENT

CROSS REFERENCE TO RELATED APPLICATION

This Application is a 371 of PCT/JP2013/061053 filed on Apr. 12, 2013 which, in turn, claimed the priority of Japanese Patent Application No. JP2012-096269 filed on Apr. 20, 2012 both applications are incorporated herein by reference.

TECHNICAL FIELD

The present invention relates to an organic electroluminescent element, in particular an organic electroluminescent element having high luminous efficiency, prolonged emission lifetime, and excellent color rendering properties.

BACKGROUND ART

In recent years, organic electroluminescent elements composed of organic materials (hereinafter, also referred to as organic EL elements) have promise as inexpensive large-area full-color display devices of solid emission types and writing light-source arrays and thus have been under extensive research and development.

Organic EL elements are full solid state elements of thin film types, each including a single or multiple organic functional layers having a thickness of about 0.1 μm and containing an organic luminescent material between an anode film and a cathode film. When a relatively low voltage of about 2 to 20 V is applied to such an organic EL element, electrons are injected from the cathode into the organic functional layer(s) while holes are injected from the anode into the organic functional layer(s). The electrons and holes recombine in the luminous layer and the resulting excitons are returned to the ground state. At this time, energy is emitted as light to perform light emission. Such devices are expected as next-generation flat displays and illuminating devices.

Organic EL elements by phospholuminescent emission, which has been recently discovered, can emit light at a luminous efficiency about four times higher than that of conventional fluorescence, in principle. Material development for the elements and research on the configuration of organic functional layer(s) and electrodes are under study all over the world. In particular, application to lighting systems comes under review as a measure against global warming because lighting systems account for a large percentage of energy consumed by human beings. Improvements in performance and reductions in costs have been extensively attempted toward the practical use of white light-emitting panels in place of conventional lighting systems.

Requirements for white light-emitting panels for lighting are high light emission efficiency and prolonged service life. Unfortunately, the service life of the panels is still insufficient compared to fluorescent lamps and white light LEDs.

Although some blue phosphorescent compounds having high luminous efficiency have been discovered, these are still unsatisfactory in view of compatibility with wet coating processes, service life, and color purity at the present stage.

A countermeasure to solve these problems is use of "quantum dots", which are inorganic luminous substances, as luminous materials.

Quantum dots have sharp luminescent spectrum characteristics. They, which are inorganic compounds, further have advantageous characteristics suitable for wet coating processes, such as high durability and high dispersion in a variety of solvents.

For example, Patent Literature 1 discloses white light emission achieved by a layer containing a quantum dot formed on a light-emitting side of a luminescent element in which emission involves photoexcitation by down conversion for compensation for the color of the light emitted from the luminous layer. Unfortunately, the emission lifetime, depending on characteristics of materials in the luminous layer, is still insufficient.

Patent Literature 2 discloses white light emission by a hole transport layer containing two types of quantum dots or a fluorescent polymer material. Unfortunately, this technology can contain a limited amount of quantum dot material causing concentration quenching and thus exhibits insufficient brightness efficiency. A possible technique to achieve high-quality white light emission, i.e., white light emission having high color rendering properties is addition of a variety of quantum dots having different particle sizes. Since large amounts of various quantum dots cannot be added for the reason described above, the element exhibits unsatisfactory color rendering properties and fluctuated color indicating a color shift during a continuous drive.

Some organic EL elements that have been disclosed in recent years have a plurality of luminous layers and charge generating layers (hereinafter also referred to as CGLs) disposed between the luminous layers to improve the luminous efficiency.

For example, Patent Literature 3 discloses a structure including a 1,4,5,8,9,12-hexaazatriphenylene hexacarbonitrile (hereinafter referred to as HATCN or HAT) layer in place of a molybdenum layer as part of a charge generating layer. Patent Literature 4 discloses a charge generating layer primarily containing an organic compound or its metal complex. Unfortunately, in both structures disclosed in Patent Literatures 3 and 4, the multiple layer configurations inevitably require high driving voltages and thus low power efficiency. In addition, the half-life luminance of organic EL elements should be further improved.

PRIOR ART DOCUMENTS

Patent Literature

[Patent Literature 1] Japanese Unexamined Patent Application Publication No. 2006-190682
[Patent Literature 2] Japanese Unexamined Patent Application Publication No. 2006-66395
[Patent Literature 3] Japanese Unexamined Patent Application Publication No. 2010-192719
[Patent Literature 4] Japanese Unexamined Patent Application Publication No. 2011-86442

SUMMARY OF INVENTION

Technical Problem

An object of the present invention, which has been accomplished in view of the above problems, is to provide an organic electroluminescent element with a long service life and high luminous efficiency, in particular an organic electroluminescent element that has high color rendering properties and can emit white light with stable chromaticity even at a low driving voltage.

Solution to Problem

The present inventors, who have been extensively studying solution of the problems described above, have completed an organic electroluminescent element including a pair of electrodes and at least two organic functional layers on a substrate, wherein the luminous layer contains a host compound and a phosphorescent dopant, and the luminous layer or an adjacent layer contains a quantum dot. Such an organic electroluminescent element can emit white light with high luminous efficiency, has a prolonged service life, high color rendering properties, and stable chromaticity even at a low driving voltage.

The present invention involves the following aspects:

1. An organic electroluminescent element comprising: a substrate, a pair of electrodes and at least two organic functional layers including a luminous layer provided on the substrate, the luminous layer containing a host compound and a phosphorescent dopant, the luminous layer or an adjacent layer containing a quantum dot.

2. The organic electroluminescent element according to Aspect 1, wherein the luminous layer contains the quantum dot.

3. The organic electroluminescent element according to Aspect 1, wherein the adjacent layer adjacent to the luminous layer contains the quantum dot.

4. The organic electroluminescent element according to any one of Aspects 1 to 3, further comprising a charge generating layer between the luminous layer and the adjacent layer adjacent to the luminous layer.

5. The organic electroluminescent element according to any one of Aspects 1 to 4, wherein the phosphorescent dopant contained in the luminous layer comprises at least one type of blue phosphorescent compound.

6. The organic electroluminescent element according to any one of Aspects 1 to 5, wherein the phosphorescent dopant contained in the luminous layer comprises at least one type of blue phosphorescent compound and another phosphorescent compound having a band gap which is at least 0.1 eV lower than the band gap of the blue phosphorescent dopant, and the luminous layer emits white light.

7. The organic electroluminescent element according to any one of Aspects 1 to 6, wherein the quantum dot comprises at least Si, Ge, GaN, GaP, CdS, CdSe, CdTe, InP, InN, ZnS, $In_2S_3$, ZnO, CdO, or a mixture thereof.

8. The organic electroluminescent element according to any one of Aspects 1 to 7, wherein the quantum dot has an average particle size in a range of 1.0 to 20 nm.

9. The organic electroluminescent element according to any one of Aspects 1 to 8, wherein the quantum dot has a core-shell or gradient structure composed of at least two types of compounds.

10. The organic electroluminescent element according to any one of Aspects 1 to 9, wherein a surface of the quantum dot is modified with a surface modifier.

11. The organic electroluminescent element according to any one of Aspects 1 to 10, wherein the quantum dot has a band gap which is at least 0.1 eV lower than the band gap of the material contained in the adjacent layer.

12. The organic electroluminescent element according to any one of Aspects 1 to 11, wherein the quantum dot has a band gap which is at least 0.1 eV lower than the band gap of the host compound contained in the luminous layer.

13. The organic electroluminescent element according to any one of Aspects 5 to 6, wherein the band gap of the at least one type of quantum dot is at least 0.1 eV higher than the band bap of the blue phosphorescent compound contained in the luminous layer.

14. The organic electroluminescent element according to any one of Aspects 1 to 13, wherein the phosphorescent dopant is a compound represented by Formula (1):

[Chemical Formula 1]

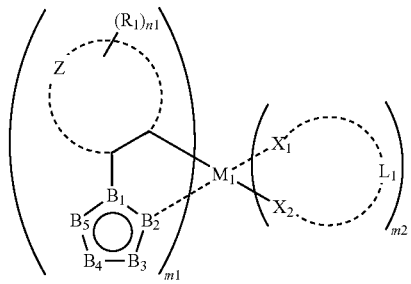

Formula (1)

wherein $R_1$ represents a substituent group; Z represents a nonmetallic atomic group necessary for formation of a five- to seven-member ring; n1 represents an integer of 0 to 5; $B_1$ to $B_5$ each represent an atom of carbon, nitrogen, oxygen, or sulfur and at least one of $B_1$ to $B_5$ represents a nitrogen atom; $M_1$ represents a metal belonging to Group 8 to 10 in the periodic table; $X_1$ and $X_2$ each represents an atom of carbon, nitrogen, or oxygen; $L_1$ represents an atomic group forming a bidentate ligand together with $X_1$ and $X_2$; and m1 represents 1, 2, or 3 and m2 represents 0, 1, or 2 provided that m1+m2 is 2 or 3.

15. The organic electroluminescent element according to any one of Aspects 5 to 14, wherein the blue phosphorescent dopant is a compound represented by Formula (2):

[Chemical Formula 2]

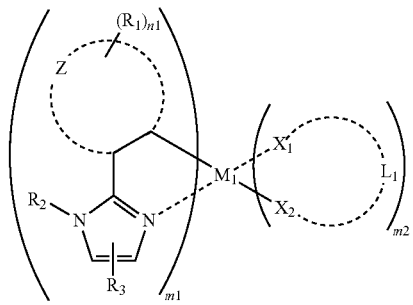

Formula (2)

wherein $R_1$, $R_2$, and $R_3$ each represent a substituent group; Z represents a nonmetallic atomic group necessary for formation of a five- to seven-member ring; n1 represents an integer of 0 to 5; $M_1$ represents a metal belonging to Groups 8 to 10 in the periodic table; $X_1$ and $X_2$ each represents an atom of carbon, nitrogen, or oxygen; $L_1$ represents an atomic group forming a bidentate ligand together with $X_1$ and $X_2$; and m1 represents 1, 2, or 3 and m2 represents 0, 1, or 2 provided that m1+m2 is 2 or 3.

16. The organic electroluminescent element according to any one of Aspects 5 to 14, wherein the blue phosphorescent dopant is a compound represented by Formula (3):

[Chemical Formula 3]

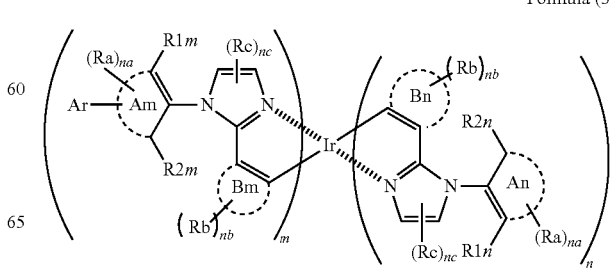

Formula (3)

wherein rings Am, An, Bm, and Bn each represents five- or six-member aromatic hydrocarbon ring or five- or six-member heterocyclic aromatic ring; Ar represents an aromatic hydrocarbon ring, heterocyclic aromatic ring, nonaromatic hydrocarbon ring, or a nonaromatic heterocyclic ring; R1m, R2m, R1n, and R2n each independently represent an alkyl group having two or more carbon atoms, aromatic hydrocarbon ring group, heterocyclic aromatic ring group, nonaromatic hydrocarbon ring group, or nonaromatic heterocyclic ring group which optionally have a substituent group; Ra, Rb, and Rc each independently a hydrogen or halogen atom or a cyano, alkyl, alkenyl, alkynyl, alkoxy, amino, silyl, arylalkyl, aryl, heteroaryl, or nonaromatic hydrocarbon ring group, or a nonaromatic heterocyclic ring group which optionally have a substituent; Ra may form a ring together with Ar; na and nc each represents 1 or 2; nb represents an integer of 1 to 4; m represents 1 or 2, n represents 1 or 2, wherein m+n is 3; three ligands coordinated to Ir are not all the same.

17. The organic electroluminescent element according to any one of Aspects 5 to 14, wherein the blue phosphorescent dopant is a compound represented by Formula (4):

[Chemical Formula 4]

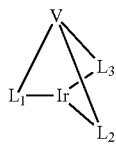

Formula (4)

wherein V represents a trivalent linking group and links with $L_1$ to $L_3$ by covalent bonds; V has a partial structure of a trivalent linking group represented by Formula (5) or (6), and $L_1$ to $L_3$ represent a ligand moiety represented by Formula (7):

[Chemical Formula 5]

Formula (5)

wherein A represents an aromatic hydrocarbon ring or heterocyclic aromatic ring; and R represents a halogen atom or a substituent group:

[Chemical Formula 6]

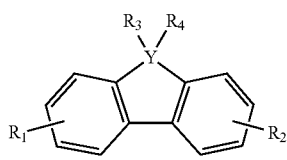

Formula (6)

wherein $R_1$ and $R_2$ each represent a hydrogen or halogen atom or a substituent group; Y represents a carbon or silicon atom; and $R_3$ and $R_4$ each represents a substituent group:

[Chemical Formula 7]

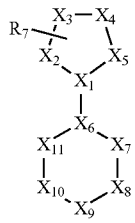

Formula (7)

wherein $X_1$ to $X_5$ represents an atomic group forming a nitrogen-containing heterocycle and are each selected from a carbon or nitrogen atom, at least one of $X_4$ and $X_5$ represents a nitrogen atom; $X_6$ to $X_{11}$ represents an atomic group forming a five- or six-member aromatic ring and are each selected from a carbon or nitrogen atom, provided that $X_{11}$ represents a linkage when $X_6$ to $X_{11}$ forms a five-member aromatic ring; $R_7$ represents a substituted aryl group having seven or more carbon atoms; $X_5$ is coordinated with Ir; and $X_7$ links with Ir by a covalent bond.

18. The organic electroluminescent element according to Aspect 17, wherein the five-member rings defined by $X_1$ to $X_5$ in at least one of $L_1$ to $L_3$ of the compound represented by Formula (4) is an imidazole ring.

19. The organic electroluminescent element according to any one of Aspects 1 to 18, wherein the luminous layer contains a host compound having a molecular weight of 2000 or less.

20. The organic electroluminescent element according to Aspect 19, wherein the host compound having a molecular weight of 2000 or less is represented by Formula (8):

[Chemical Formula 8]

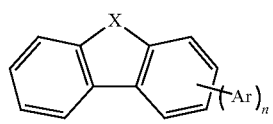

Formula (8)

wherein X represents NR', an oxygen atom, a sulfur atom, CR'R'', or SiR'R''; R' and R'' each represent a hydrogen atom or substituent group; Ar represents an aromatic ring; and n represents an integer of 0 to 8.

21. The organic electroluminescent element according to any one of Aspects 1 to 20, wherein at least one layer of the at least two organic layers including the luminous layer is formed by a wet coating process.

Advantageous Effects

The present invention provides an organic electroluminescent element that includes a luminous layer containing a selected host compound, a selected phosphorescent dopant, and a selected quantum dot. The element can emit white light at high luminous efficiency for a prolonged time. In particular, the element exhibits high color rendering properties and stable chromaticity even at a low driving voltage, which cannot be achieved by any combination of known materials.

Furthermore, a multilayer configuration including a charge generating layer can provide an organic electroluminescent element having a further prolonged service life with a limited increase in driving voltage compared to conventional configurations.

The advantageous effects of the configuration defined in the present invention are probably produced by the following reason.

In the configuration, in particular, a combination of a blue phosphorescent compound and a quantum dot in the present invention, energy transfer smoothly proceeds from the blue phosphorescent compound. This configuration can achieve efficient light emission with high color rendering properties at both the quantum dot and the blue phosphorescent compound at high luminous efficiency. The smooth energy transfer is also effective for delayed deterioration of the blue phosphorescent compound. Furthermore, the blue phosphorescent compound of the present invention exhibits a significantly prolonged emission lifetime due to robustness of the dopant having a heteroleptic cage structure. In addition, the arrangement of the quantum dot disposed adjacent to the charge generating layer facilitates charge transfer at their interface and can suppress an increase in drive voltage, which is inevitable in conventional techniques.

DESCRIPTION OF EMBODIMENT

Figure 1:
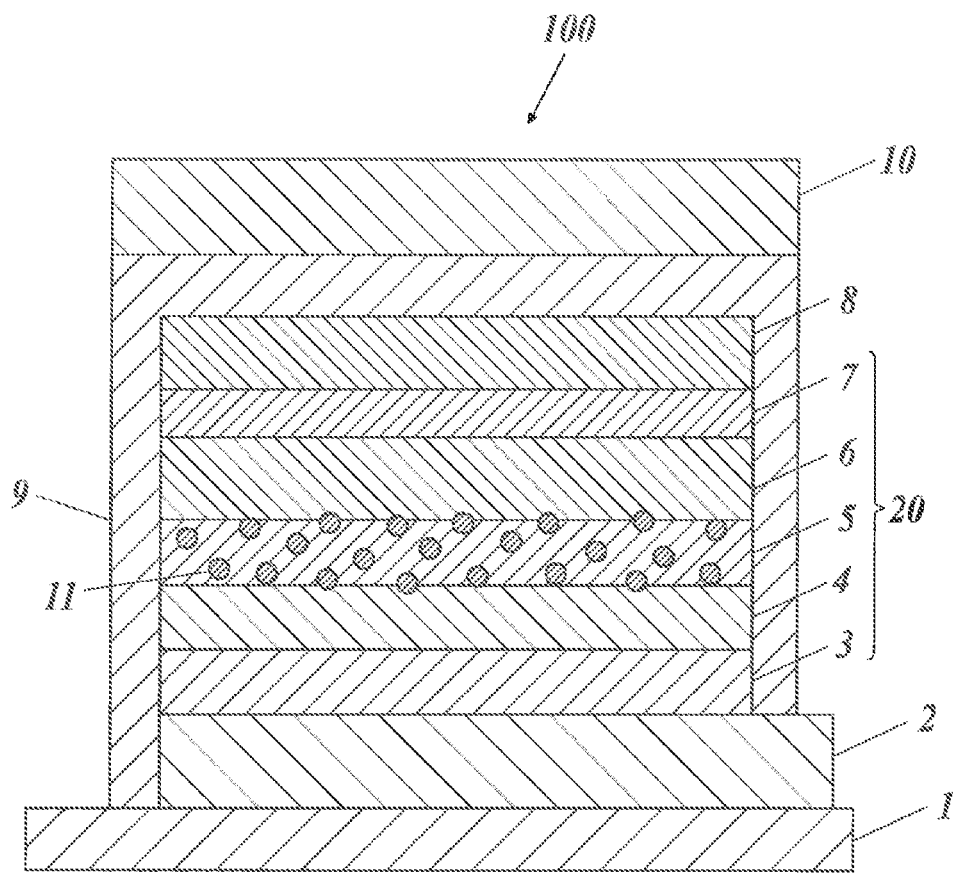
FIG. 1 is an outline cross-sectional view illustrating an exemplary configuration of an organic electroluminescent element of the present invention.

The organic electroluminescent element of the present invention includes a substrate, and a pair of electrode and at least two organic functional layers including a luminous layer provided on the substrate. The luminous layer contains a host compound and a phosphorescent dopant, and the luminous layer or an adjacent layer contains a quantum dot. Such an organic electroluminescent element can emit white light with high luminous efficiency, a prolonged service life, high color rendering properties, and stable chromaticity even at a low driving voltage. Such advantageous effects are technical features common in the present invention.

In a preferred embodiment of the present invention, the luminous layer contains the quantum dot in view of further noticeable advantageous effects. In another preferred embodiment, the adjacent layer adjacent to the luminous layer contains the quantum dot. In a further preferred embodiment, a charge generating layer is disposed between the luminous layer and the adjacent layer.

In a preferred embodiment, the phosphorescent dopant contained in the luminous layer comprises at least one type of blue phosphorescent compound. In another preferred embodiment the phosphorescent dopant contained in the luminous layer comprises at least one type of blue phosphorescent compound and another phosphorescent compound having a band gap which is at least 0.1 eV lower than the band gap of the blue phosphorescent dopant, and the organic electroluminescent element emits white light.

In a preferred embodiment of the present invention, the quantum dot comprises Si, Ge, GaN, GaP, CdS, CdSe, CdTe, InP, InN, ZnS, $In_2S_3$, ZnO, CdO, or a mixture thereof.

Preferably, the quantum dot has an average particle size in a range of 1.0 to 20 nm. Preferably, the quantum dot has a core-shell or gradient structure composed of at least two types of compounds. Preferably, the surface of the quantum dot is modified with a surface modifier.

In the present invention, the quantum dot preferably has a band gap which is at least 0.1 eV lower than the band gap of the material contained in the adjacent layer. The quantum dot preferably has a band gap which is at least 0.1 eV lower than the band gap of the host compound contained in the luminous layer. Preferably, the band gap of the at least one type of quantum dot is at least 0.1 eV higher than the band gap of the blue phosphorescent compound contained in the luminous layer.

In a preferred embodiment of the present invention, the phosphorescent dopant is a compound represented by Formula (1) or (2) described above. Preferably, the blue phosphorescent dopant is a compound represented by Formula (3) described above. In an alternative embodiment, the blue phosphorescent dopant is preferably a compound represented by Formula (4).

Preferably, the five-member rings defined by $X_1$ to $X_5$ in at least one of $L_1$ to $L_3$ of the compound represented by Formula (4) is an imidazole ring.

In the present invention, it is preferred that the luminous layer contains a host compound having a molecular weight of 2000 or less, and the host compound having a molecular weight of 2000 or less is represented by Formula (8) described above.

In a preferred embodiment of the present invention, at least one layer of the at least two organic layers including the luminous layer is formed by a wet coating process.

In the present invention, the term "quantum dot" refers to a semiconductor microcrystal having a diameter of several nanometers to several tens of nanometers that can confine electrons and positive holes and thus can have quantum size effect.

The term "band gap of the quantum dot" refers to an energy difference or gap between the valence band and the conduction band.

The term "band gap of the host compound and phosphorescent dopant" refers to an energy difference or gap between the highest occupied molecular orbital (HOMO) and the lowest occupied molecular orbital (LUMO).

The present invention, the constitutive elements of the present invention, the embodiments of the present invention will now be described in detail. As used herein, the term "to" indicating the numerical range is meant to be inclusive of the boundary values.

<<Basic Configuration of Organic EL Element>>

FIG. 1 is an outline cross-sectional view illustrating an exemplary configuration of an organic electroluminescent element of the present invention;

As shown in FIG. 1, the organic EL element 100 according to a preferred embodiment of the present invention includes a flexible substrate 1. An anode 2 is formed on the flexible substrate 1, organic functional layers 20 are formed on the anode 2, and a cathode 8 is formed on the organic functional layers 20.

The organic functional layers 20 refer to individual layers of the organic EL element 100 disposed between the anode 2 and the cathode 8.

For example, the organic functional layers 20 are a hole injection layer 3, a hole transport layer 4, luminous layer 5, an electron transport layer 6, and an electron injection layer 7, as shown in FIG. 1. The organic functional layers 20 may further include a hole blocking layer and an electron blocking layer (not depicted).

The anode 2, the organic functional layers 20, and the cathode 8 on the flexible substrate 1 are sealed with a sealing adhesive 9 and a flexible sealing member 10 to make up the organic EL element 100.

The layer configuration of the organic electroluminescent element 100 shown in FIG. 1 is a mere preferred embodiment. The element in the present invention may have any other configuration other than that shown in FIG. 1. Typical examples of the layer configuration of the organic EL element according to the present invention include the following configurations (i) to (viii):

(i) Flexible substrate/anode/luminous layer/electron transport layer/cathode/thermally conductive layer/sealing adhesive/sealing member (ii) Flexible substrate/anode/hole transport layer/luminous layer/electron transport layer/cathode/thermally conductive layer/sealing adhesive/sealing member (iii) Flexible substrate/anode/hole transport layer/luminous layer/hole blocking layer/electron transport layer/cathode/thermally conductive layer/sealing adhesive/sealing member (iv) Flexible substrate/anode/hole transport layer/luminous layer/hole blocking layer/electron transport layer/cathode buffer layer/cathode/thermally conductive layer/sealing adhesive/sealing member (v) Flexible substrate/anode/anode buffer layer/hole transport layer/luminous layer/hole blocking layer/electron transport layer/cathode buffer layer/cathode/thermally conductive layer/sealing adhesive/sealing member (vi) Glass support/anode/hole injection layer/luminous layer/electron injection layer/cathode/sealing member (vii) Glass support/anode/hole injection layer/hole transport layer/luminous layer/electron injection layer/cathode/sealing member (viii) Glass support/anode/hole injection layer/hole transport layer/luminous layer/electron transport layer/electron injection layer/cathode/sealing member If two or more luminous layers are disposed, a charge generating layer may be provided between a first luminous layer and a second luminous layer.

<<Components of Organic EL Element>>

[1] Organic Functional Layers

The organic functional layers constituting the organic EL element of the present invention will now be described in detail.

[1] Injecting Layers: Hole Injecting Layer and Electron Injecting Layer

The organic EL element of the present invention may optionally be provided with one or more injecting layers. The injecting layers are categorized as an electron injecting layer and a hole injecting layer, which are optionally disposed between the anode and the luminous layer or the anode and the hole transporting layer, and between the cathode and the luminous layer or the cathode and the electron transporting layer, respectively, as described above.

The injecting layer of the present invention is provided between an electrode and an organic functional layer in order to reduce the driving voltage and to improve the luminance and is described in detail in "Denkyoku zairyo (Electrode material)", Div. 2 Chapter 2 (pp. 123-166) of "Yuki EL soshi to sono kogyoka saizensen (Organic EL element and its frontier of industrialization)" (published by NTS Corporation, Nov. 30, 1998). The injecting layers are categorized as a hole injecting layer and an electron injecting layer.

The hole injecting layer is described in detail in, for example, Japanese Patent Application Laid-Open Nos. H09-45479, H09-260062, and H08-288069. Examples of the material applicable to the hole injecting layer are polymers or aniline copolymers containing, such as triazole, oxadiazole, imidazole, pyrazoline, pyrazolone, phenylenediamine, arylamine, amino substituted chalcone, oxazole, styryl anthracene, fluorenone, hydrazone, stilbene, and silazane derivatives; polyarylalkane derivatives; and electroconductive polymers; preferably polythiophene, polyaniline, and polypyrrole derivatives; more preferably polythiophene derivatives.

The electron injecting layer is described in detail in, for example, Japanese Patent Application Laid-Open Nos. H06-325871, H09-17574, and H10-74586, and specific examples thereof include metal buffer layers, such as a strontium or aluminum layer; alkali metal compound buffer layers, such as a lithium fluoride; alkali earth metal compound buffer layers, such as a magnesium fluoride layer; and oxide buffer layers, such as an aluminum oxide layer.

In the present invention, the above-mentioned buffer layer (injecting layer) is desirably a significantly thin layer that is preferably composed of potassium fluoride or sodium fluoride, and preferably has a thickness of about 0.1 nm to 5 µm, preferably 0.1 to 100 nm, more preferably 0.5 to 10 nm, and most preferably 0.5 to 4 nm.

[2] Hole Transporting Layer

Examples of the material constituting the hole transporting layer include the same compounds applicable to the hole injecting layer and also include porphyrin compounds, aromatic tertiary amine compounds, and styrylamine compounds. In particular, aromatic tertiary amine compounds are preferably used.

Typical examples of the aromatic tertiary amine compounds and the styrylamine compounds include N,N,N',N'-tetraphenyl-4,4'-diaminophenyl, N,N'-diphenyl-N,N'-bis(3-methylphenyl)-(1,1'-biphenyl)-4,4'-diamine (hereinafter referred to as "TPD"), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quardriphenyl, N,N,N-trip-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds having two fused aromatic rings per molecule, described in U.S. Pat. No. 5,061,569, such as 4,4'-bis[N-(1-naphthyl)-N-phenylamino]biphenyl (hereinafter referred to as "NPD"), and compounds described in Japanese Patent Application Laid-Open No. H04-308688, such as 4,4',4"-tris[N-(3-methylphenyl)-N-phenylamino]triphenylamine (hereinafter referred to as "MTDATA") in which three triphenylamine units are bonded into a starburst form.

Polymer materials containing the above compounds introduced into their chains or containing the above compounds as main chains can also be used. Inorganic compounds such as p-type Si and p-type SiC can also be used as the hole injecting material or the hole transporting material.

The hole transporting layer may also be composed of any material having so called p-type conductivity. Such materials are described in Japanese Patent Application Laid-Open Nos. H04-297076, 2000-196140, and 2001-102175, J. Appl. Phys., 95, 5773 (2004), Japanese Patent Application Laid-Open No. H11-251067, J. Huang, et al., "Applied Physics Letters", 80 (2002), p. 139, and Japanese Publication of International Patent Application No. 2003-519432.

The above hole transporting material can be formed into a thin film of the hole transporting layer by any known technique, such as vacuum deposition, spin coating, casting, printing including ink jetting, and LB coating. The hole transporting layer may have any thickness, which is within a range of, usually about 5 nm to 5 μm and preferably 5 to 200 nm. The hole transporting layer may have a monolayer structure composed of one or more types of the materials mentioned above.

Non-limiting examples of the compound that is preferably used in formation of the hole transporting layer of the organic EL element of the present invention are specifically shown in (1) to (60) below:

[Chemical Formula 9]

(1)

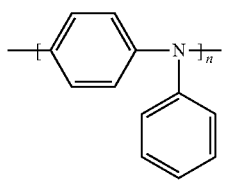

(2)

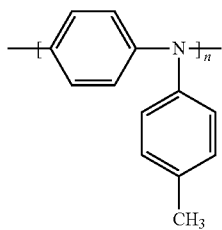

(3)

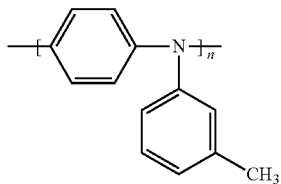

(4)

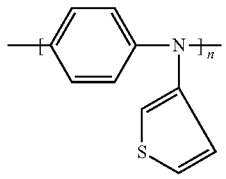

(5)

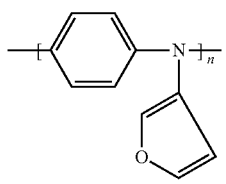

(6)

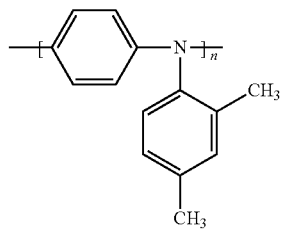

(7)

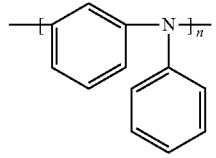

(8)

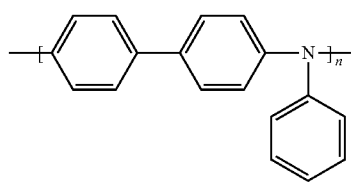

(9)

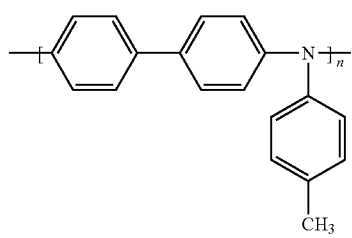

(10)

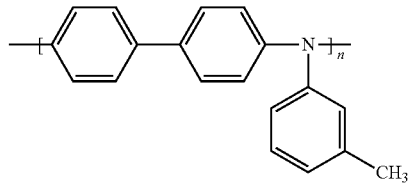

(11)

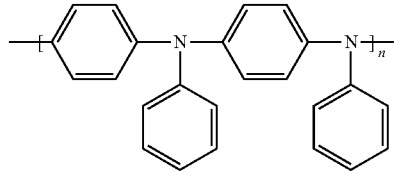

(12)

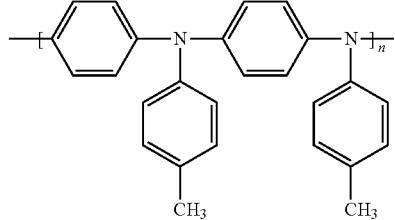

(13)

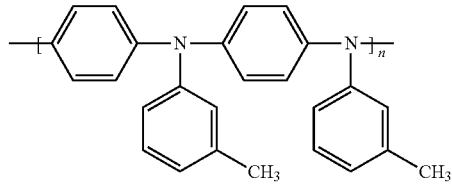

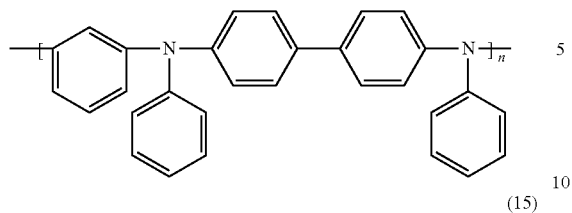
(14)
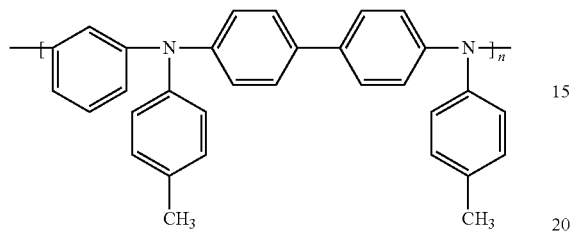
(15)
[Chemical Formula 10]
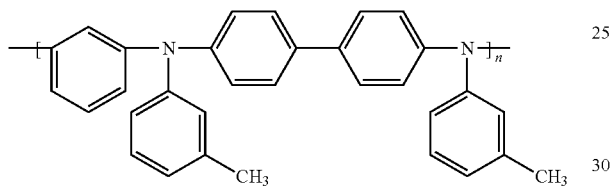
(16)
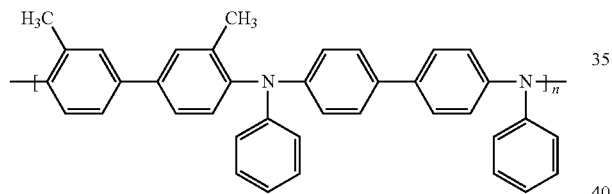
(17)
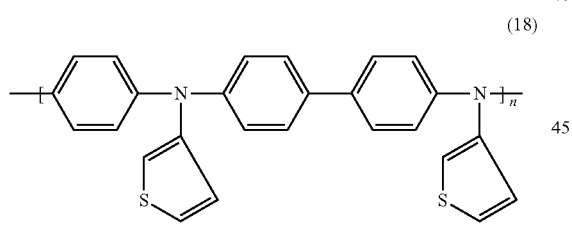
(18)
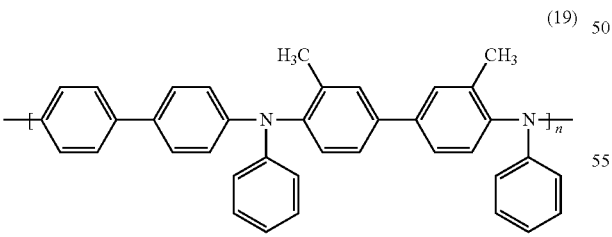
(19)
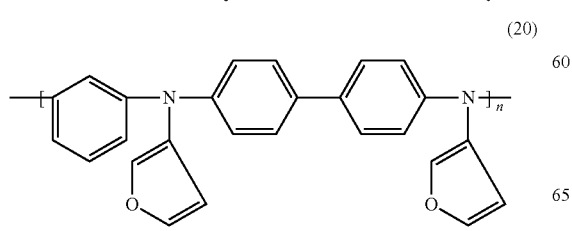
(20)
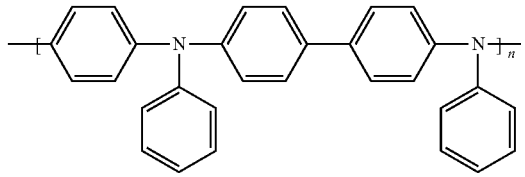
(21)
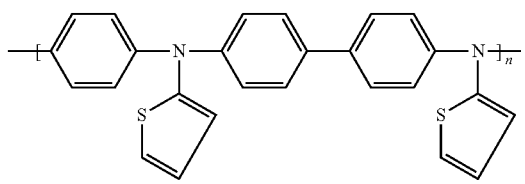
(22)
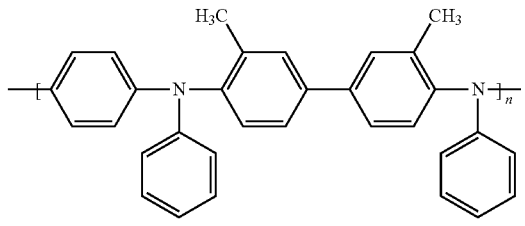
(23)
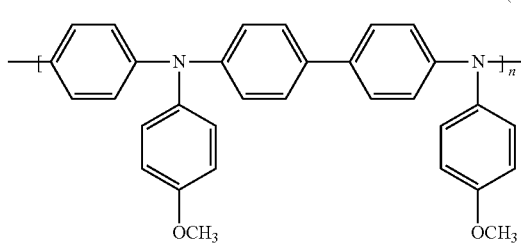
(24)
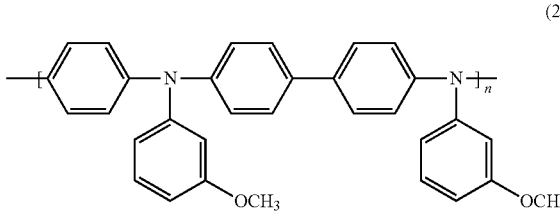
(25)
[Chemical Formula 11]
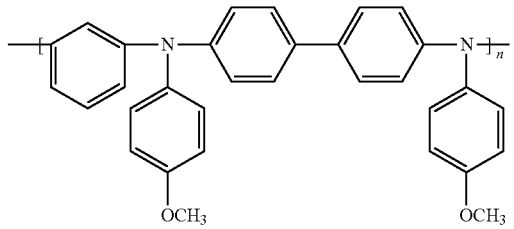
(26)

(27)
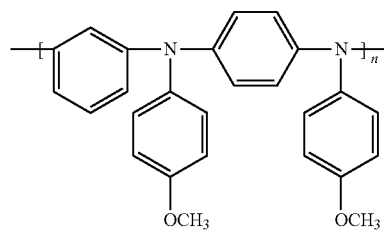
(28)
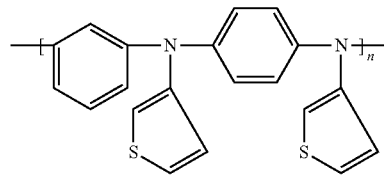
(29)
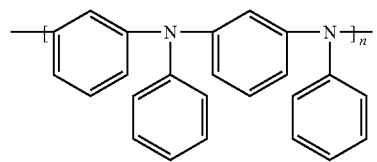
(30)
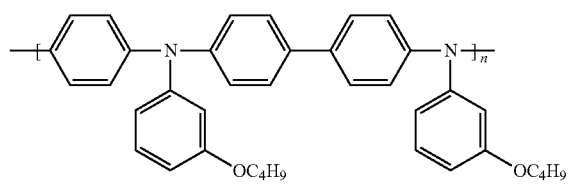
(31)
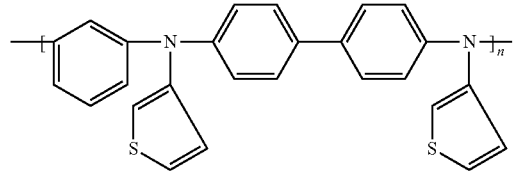
(32)
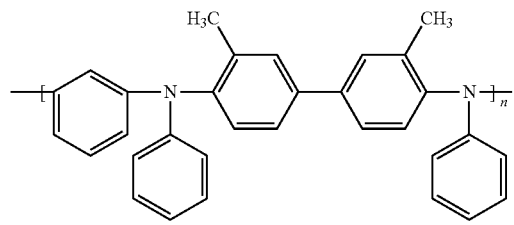
(33)
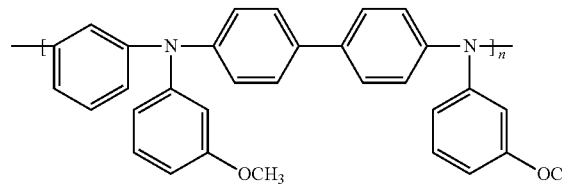
(34)
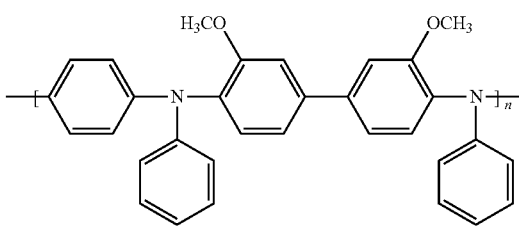
(35)
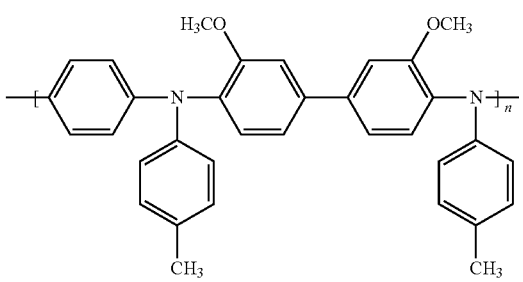
[Chemical Formula 12]
(36)
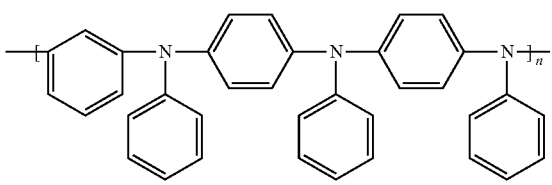
(37)
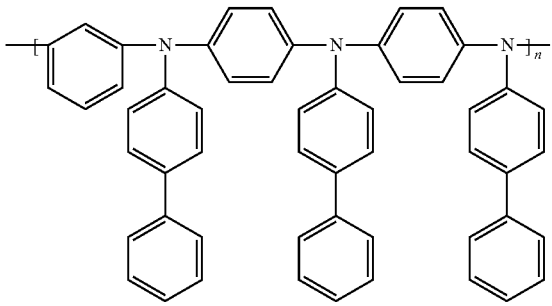
(38)
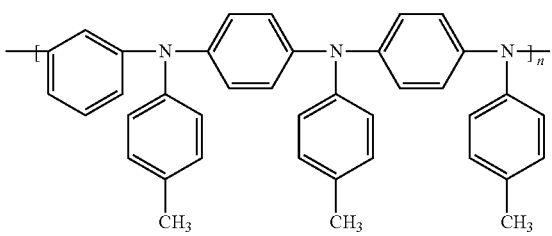
(39)
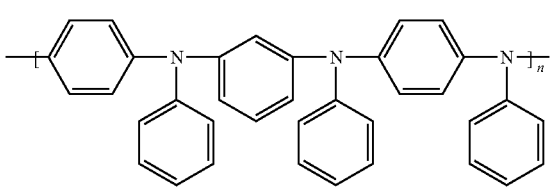

(40)
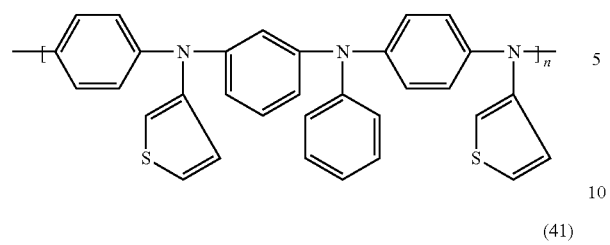
(41)
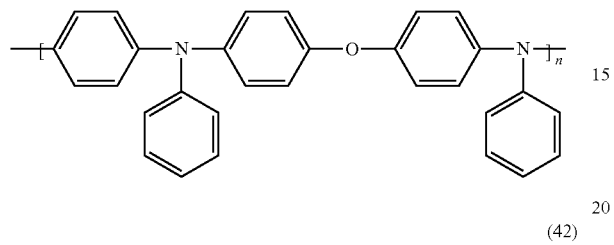
(42)
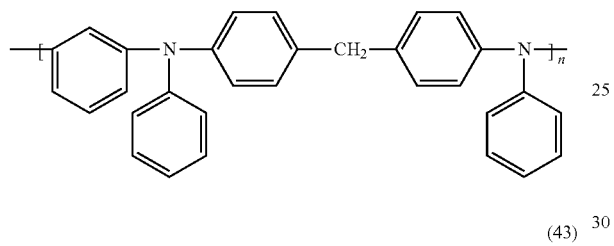
(43)
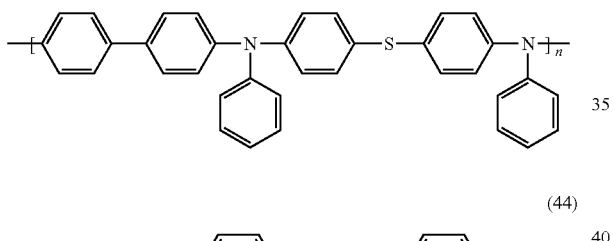
(44)
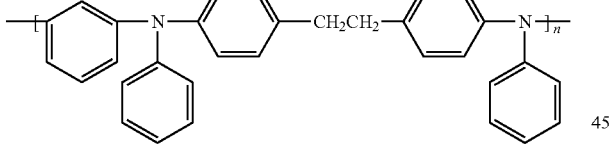
[Chemical Formula 13]
(45)
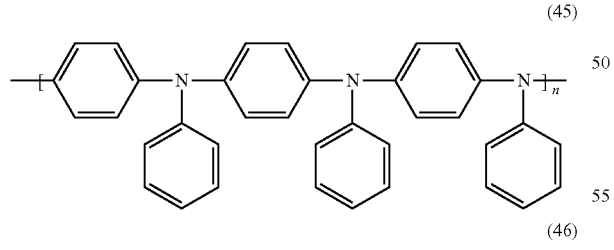
(46)
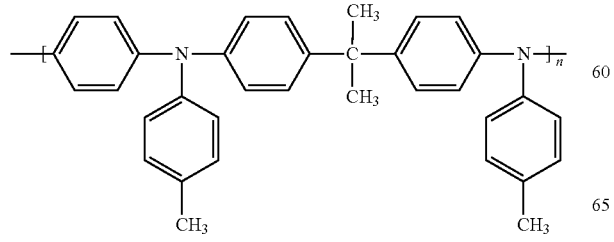
(47)
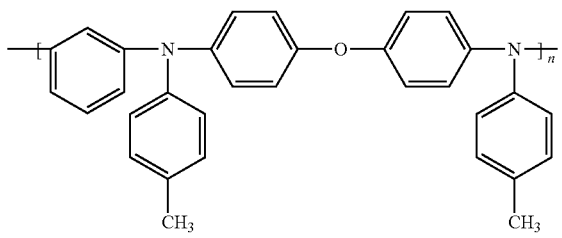
(48)
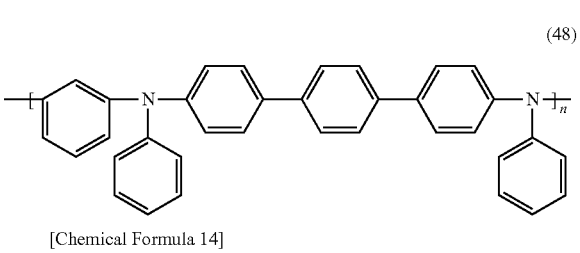
[Chemical Formula 14]
(49)
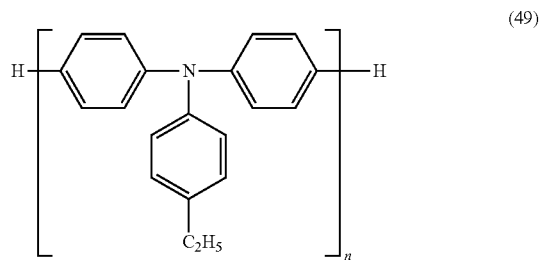
(50)
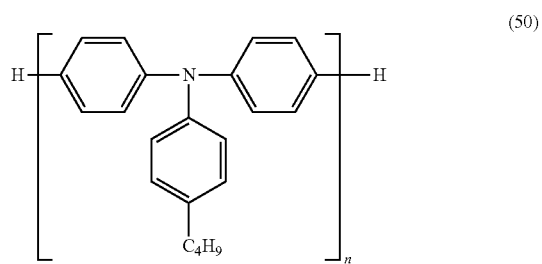
(51)
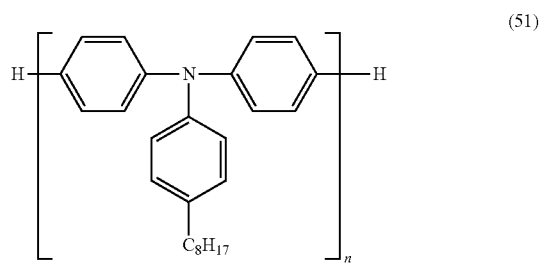
(52)
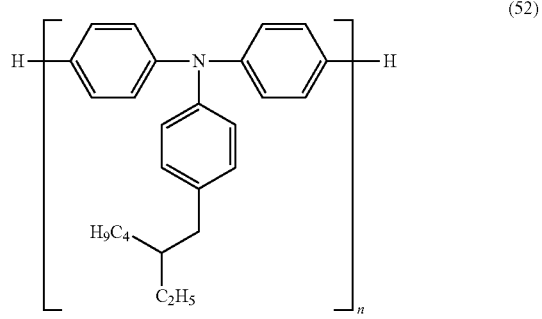

(53) 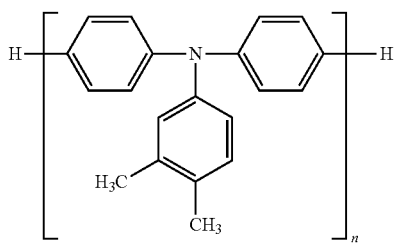

(54) 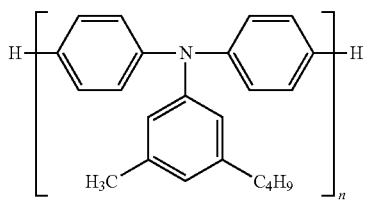

(55) 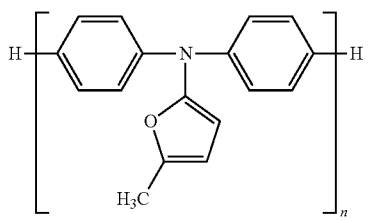

(56) 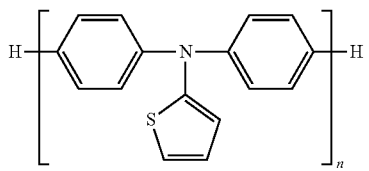

(57) 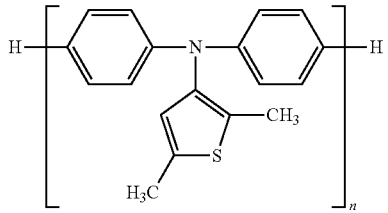

(58) 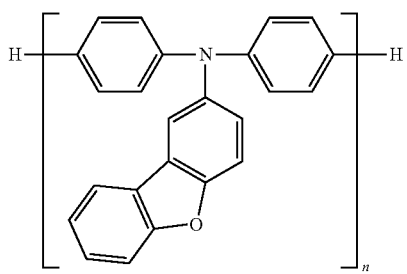

(59) 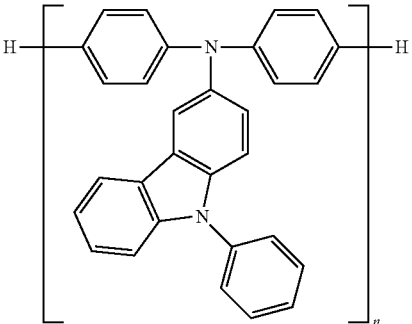

(60) 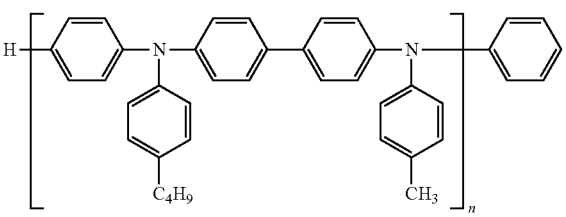

In Formulae of the above exemplified compounds, n represents the degree of polymerization. The weight-average molecular weight of the compounds ranges from 50,000 to 200,000. At a weight-average molecular weight of 50,000 or more, solubility into a solvent can be controlled to prevent a layer from being mixed with other layers during formation of a film. Desirable light emission efficiency can also be achieved. At a weight-average molecular weight of 200,000 or less, a suitable condition can be selected for synthesis and purification. Furthermore, the broadening of the molecular weight distribution can be suppressed and the residual amount of impurities can be reduced, resulting in improving the luminous efficiency, the voltage, and the lifetime of the organic EL element.

These polymer compounds can be synthesized by any known technique, such as described in Makromol. Chem., 1992, 193, P. 909.

[3] Electron Transporting Layer

The electron transporting layer constituting one functional layer of the organic EL element of the present invention is composed of a material having electron transportability, and the electron injecting layer and the hole blocking layer are categorized into the electron transporting layer in a broad sense. The electron transporting layer may have a monolayer or multilayer structure.

The electron transporting material (also serves as hole blocking material), which is used in the single or multiple electron transporting layer(s) adjacent to a cathode, may be conventionally any material that can transport electrons injected from a cathode to a luminous layer. The material can be selected from any known compounds, such as metal complexes of derivatives of, e.g., fluorene, carbazole, azacarbazole, oxadiazole, triazole, silole, pyridine, pyrimidine, and 8-quinolinol.

In addition, examples of the electron transporting material that is preferably used include a metal-free or metal-containing phthalocyanine and its derivatives having an end substituted by an alkyl or sulfonate group.

Among them, preferred in the present invention are carbazole, azacarbazole, and pyridine derivatives. More preferred are azacarbazole derivatives.

The above electron transporting material can be formed into a thin film of the electron transporting layer by any known technique, such as spin coating, casting, printing including ink jetting, and LB coating. The material can preferably be subjected to a wet coating process with a coating solution containing fluorinated alcohol solvent.

The electron transporting layer may have any thickness, which is usually about 5 nm to 5 μm, preferably 5 to 200 nm. The electron transporting layer may have a monolayer structure composed of one or more types of the materials mentioned above.

An electron transporting layer having high n-type properties doped with an impurity can also be used. Examples thereof include those described in, for example, Japanese Patent Application Laid-Open Nos. H04-297076, H10-270172, 2000-196140, and 2001-102175 and J. Appl. Phys., 95, 5773 (2004).

The electron transporting layer of the present invention is preferably composed of organic salts with alkali metals. Non-limiting examples of such organic substance include salts of formic acid, acetic acid, propionic acid, butyric acid, valerianic acid, caproic acid, enanthic acid, caprylic acid, oxalic acid, malonic acid, succinic acid, benzoic acid, phthalic acid, isophthalic acid, terephthalic acid, salicylic acid, pyruvic acid, lactic acid, malic acid, adipic acid, mesylic acid, tosyl acid, and benzenesulfonic acid. Preferred are salts of formic acid, acetic acid, propionic acid, butyric acid, valerianic acid, caproic acid, enanthic acid, caprylic acid, oxalic acid, malonic acid, succinic acid, and benzoic acid. More preferred are salts with alkali metals of aliphatic carboxylic acid having 4 or less carbon atoms, such as salts of formic acid, acetic acid, propionic acid, and butyric acid. Most preferred are salts of acetic acid.

Non-limiting examples of alkali metals for the organic salts with alkali metals include Na, K, and Cs, preferably K and Cs, and more preferably Cs. Examples of the organic salts with alkali metals include the above organic substance combined with the above alkali metal; preferably lithium formate, potassium formate, sodium formate, cesium formate, lithium acetate, potassium acetate, sodium acetate, cesium acetate, lithium propionate, potassium propionate, sodium propionate, cesium propionate, lithium butyrate, potassium butyrate, sodium butyrate, cesium butyrate, lithium malonate, potassium malonate, sodium malonate, cesium malonate, lithium succinate, potassium succinate, sodium succinate, cesium succinate, lithium benzoate, potassium benzoate, sodium benzoate, and cesium benzoate; more preferably lithium acetate, potassium acetate, sodium acetate, and cesium acetate; most preferably cesium acetate.

The content of the salt with alkali metal in 100 mass % of the electron transporting layer is preferably within a range of 1.5 to 35 mass %, more preferably within a range of 3 to 25 mass %, and most preferably within a range of 5 to 15 mass %.

[4] Luminous Layer

The luminous layer constituting the organic EL element of the present invention emits light by recombination of electrons and holes injected from electrodes or an electron transporting layer and a hole transporting layer. The luminous site may be inside the luminous layer or may be the interface between the luminous layer and an adjoining layer thereof.

The luminous layer of the present invention may have any configuration provided that the contained luminous materials meet the above requirements.

The luminous layer may have a multilayer structure having the same emission spectrum or maximum emission wavelength. A non-luminous intermediate layer may preferably be provided between any two luminous layers.

The luminous layer of the present invention has a total thickness within a range of, preferably 1 to 100 nm, more preferably 50 nm or less for the reason that the driving voltage can be reduced. The "total thickness" herein refers to a thickness including the thickness of one or more optional non-luminous intermediate layers in adjacent luminous layers.

Each luminous layer is preferably arranged to have a thickness within a range of 1 to 50 nm.

Each luminous layer may emit any of blue, green or red light. The thickness of the individual luminous layers may be determined regardless of the thickness of the other luminous layer(s).

The luminous layer can be produced by forming a film from a luminescent material or a host compound described below by any known thin-film forming technique, for example, vacuum deposition, spin coating, casting, Langmuir Blodgett (LB) coating, or ink jetting.

In the present invention, each luminous layer may contain a mixture of different luminous materials. Phosphorescent materials and fluorescent materials may also be incorporated into one luminous layer.

In the present invention, the luminous layer preferably contains a host compound and a luminous material (also referred to as luminous dopant compound) that emit light.

(4.1) Host Compound

Examples of the host compound contained in the luminous layer of the organic EL element of the present invention include a phosphorescent compound having a quantum yield at room temperature (25° C.) of, preferably less than 0.1, more preferably less than 0.01. The host compound is preferably contained in a mass ratio of 50% or more in the luminous layer.

The host compound may be composed of one or more of any known host compound. Use of a plurality of host compounds can control the charge transfer, resulting in enhancing the efficiency of the organic EL element. Furthermore, use of a plurality of luminous materials described below can emit light with a mixture of different colors, resulting in emission of light with an intended color.

The luminous host used in the present invention may be any known compound having a low molecular weight, a polymer having repeating units, or a low-molecular-weight compound having a polymerizable group, such as a vinyl group or an epoxy group (polymerizable luminous host). A polymer readily traps the solvent to be swollen or gelled. To prevent this phenomenon, the molecular weight is preferably not higher. In particular, the usable material has a molecular weight of preferably 2,000 or less, more preferably 1,000 or less when it is applied.

Preferred known host compounds have hole and electron transportability, can prevent the shift of emission toward a longer wavelength, and has a high glass transition temperature (Tg). The glass transition temperature (Tg) herein is determined by differential scanning calorimetry (DSC) in accordance with JIS-K-7121.

Specific examples of the known host compound include compounds described in the following patents: Japanese Patent Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-

234888, 2003-27048, 2002-255934, 2002-260861, 2002-280183, 2002-299060, 2002-302516, 2002-305083, 2002-305084, and 2002-308837.

The host compound of the present invention is preferably carbazole derivatives.

Examples of the host compound preferably used in the present invention include compounds shown in Formula (8).

[Chemical Formula 15]

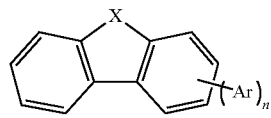

Formula (8)

In Formula (8), X represents NR', an oxygen atom, a sulfur atom, CR' R'', or SiR' R''; R' and R'' each represent a hydrogen atom or substituent group; Ar represents an aromatic ring; and n represents an integer of 0 to 8.

Examples of the substituent groups represented by R' and R'' in X of Formula (8) include alkyl groups (e.g., methyl, ethyl, propyl, isopropyl, t-butyl, pentyl, hexyl, octyl, dodecyl, tridecyl, tetradecyl, and pentadecyl groups); cycloalkyl groups (e.g., cyclopentyl and cyclohexyl groups); alkenyl groups (e.g., vinyl and aryl groups); alkynyl groups (e.g., ethynyl and propargyl groups); aromatic hydrocarbon ring groups (also called aromatic carbon ring or aryl groups, e.g., phenyl, p-chlorophenyl, mesityl, tolyl, xylyl, naphthyl, anthryl, azulenyl, acenaphthenyl, fluorenyl, phenantolyl, indenyl, pyrenyl, and biphenylyl groups); heterocyclic aromatic ring groups (e.g., pyridyl, pyrimidinyl, furyl, pyrrolyl, imidazolyl, benzoimidazolyl, pyrazolyl, pyradinyl, triazolyl (e.g., 1,2,4-triazole-1-yl and 1,2,3-triazole-1-yl groups), oxazolyl, benzoxazolyl, triazolyl, isooxazolyl, isothiazolyl, furazanyl, thienyl, quinolyl, benzofuryl, dibenzofuryl, benzothienyl, dibenzothienyl, indolyl, carbazolyl, carbolinyl, diazacarbazolyl (i.e., a group in which one of the carbon atoms in the carboline ring of the carbolinyl group is replaced with a nitrogen atom), quinoxalinyl, pyridazinyl, triazinyl, quinazolinyl, and phthalazinyl groups); heterocyclic groups (e.g., pyrrolidyl, imidazolidyl, morpholyl, and oxazolidyl groups); alkoxyl groups (e.g., methoxy, ethoxy, propyloxy, pentyloxy, hexyloxy, octyloxy, and dodecyloxy groups); cycloalkoxy groups (e.g., cyclopentyloxy and cyclohexyloxy groups); aryloxy groups (e.g., phenoxy and naphthyloxy groups); alkylthio groups (e.g., methylthio, ethylthio, propylthio, pentylthio, hexylthio, octylthio, and dodecylthio groups); cycloalkylthio groups (e.g., cyclopentylthio and cyclohexylthio groups); arylthio groups (e.g., phenylthio and naphthylthio groups); alkoxycarbonyl groups (e.g., methyloxycarbonyl, ethyloxycarbonyl, butyloxycarbonyl, octyloxycarbonyl, and dodecyloxycarbonyl groups); aryloxycarbonyl groups (e.g., phenyloxycarbonyl and naphthyloxycarbonyl groups); sulfamoyl groups (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups); acyl groups (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups); acyloxy groups (e.g., acetyloxy, ethylcarbonyloxy, butylcarbonyloxy, octylcarbonyloxy, dodecylcarbonyloxy, and phenylcarbonyloxy groups); amido groups (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups); carbamoyl groups (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups); ureido groups (e.g., methylureido, ethylureido, pentylureido, cyclohexylureido, octylureido, dodecylureido, phenylureido, naphthylureido, and a 2-pyridylaminoureido groups); sulfinyl groups (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups); alkylsulfonyl groups (e.g., methylsulfonyl, ethylsulfonyl, butylsulfonyl, cyclohexylsulfonyl, 2-ethylhexylsulfonyl, and dodecylsulfonyl groups); arylsulfonyl groups or heteroarylsulfonyl groups (e.g., phenylsulfonyl, naphthylsulfonyl, and 2-pyridylsulfonyl groups); amino groups (e.g., amino, ethylamino, dimethylamino, butylamino, cyclopentylamino, 2-ethylhexylamino, dodecylamino, anilino, naphthylamino, and 2-pyridylamino groups); halogen atoms (e.g., fluorine, chlorine, and bromine atoms); fluorohydrocarbon groups (e.g., fluoromethyl, trifluoromethyl, pentafluoroethyl, and pentafluorophenyl groups); a cyano group; a nitro group; a hydroxy group; a mercapto group; and silyl groups (e.g., trimethylsilyl, triisopropylsilyl, triphenylsilyl, and phenyldiethylsilyl groups). These substituent groups may further be substituted by the above substituent groups. These substituent groups may also be bonded to each other to form a ring.

Among them, X is preferably NR' or an oxygen atom. Examples of R' include aromatic hydrocarbon groups (also called aromatic carbon ring or aryl groups, e.g., phenyl, p-chlorophenyl, mesityl, tolyl, xylyl, naphthyl, anthryl, azulenyl, acenaphthenyl, fluorenyl, phenantolyl, indenyl, pyrenyl, and biphenylyl groups) and preferably heterocyclic aromatic ring groups (e.g., furyl, thienyl, pyridyl, pyridazinyl, pyrimidinyl, pyradinyl, triazinyl, imidazolyl, pyrazolyl, thiazolyl, quinazolinyl, and phthalazinyl groups).

The above aromatic hydrocarbon groups and heterocyclic aromatic ring groups each may have the substituent groups represented by R' or R'' in X of Formula (8).

Examples of the aromatic ring represented by Ar in Formula (8) include an aromatic hydrocarbon ring and a heterocyclic aromatic ring. The aromatic ring may be monocyclic, fused, or unsubstituted, or may have the substituent groups represented by R' or R'' in X of Formula (8).

Examples of the aromatic hydrocarbon ring represented by Ar in Formula (8) include a benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthraanthrene rings.

Examples of the heterocyclic aromatic ring represented by Ar in the partial structure shown in Formula (8) include a furan, dibenzofuran, thiophene, oxazole, pyrrole, pyridine, pyridazine, pyrimidine, pyrazine, triazine, benzimidazole, oxadiazole, triazole, imidazole, pyrazole, triazole, indole, indazole, benzimidazole, benzothiazole, benzoxazole, quinoxaline, quinazoline, cinnoline, quinoline, isoquinoline, phthalazine, naphthyridine, carbazole, carboline, and diazacarbazole (i.e., a ring in which one of the carbon atoms in the carboline ring is further replaced with a nitrogen atom) rings.

These rings may further have the substituent groups represented by R' or R" in Formula (8).

Among the above rings, the usable aromatic ring represented by Ar in Formula (8) is preferably a carbazole, carboline, dibenzofuran, and benzene rings; more preferably a carbazole, carboline, and benzene rings; still more preferably a benzene ring having a substituent group; and particularly preferably a benzene ring having a carbazolyl group.

The aromatic ring represented by Ar in Formula (8) is preferably a fused ring composed of three or more rings. Specific examples of the aromatic hydrocarbon fused ring composed of three or more rings include naphthacene, anthracene, tetracene, pentacene, hexacene, phenanthrene, pyrene, benzopyrene, benzoazulene, chrysene, benzochrysene, acenaphthene, acenaphthylene, triphenylene, coronene, benzocoronene, hexabenzocoronene, fluorene, benzofluorene, fluoranthene, perylene, naphthoperylene, pentabenzoperylene, benzoperylene, pentaphene, picene, pyranthrene, coronene, naphthocoronene, ovalene, and anthraanthrene rings. These rings may further have the above substituent groups.

Specific examples of the heterocyclic aromatic fused ring composed of three or more rings include an acridine, benzoquinoline, carbazole, carboline, phenazine, phenanthridine, phenanthroline, carboline, cyclazine, quindoline, thebenidine, quinindoline, triphenodithiazine, triphenodioxazine, phenanthrazine, anthrazine, perimidine, diazacarbazole (i.e., a ring in which anyone of the carbon atoms in the carboline ring is replaced with a nitrogen atom), phenanthroline, dibenzofuran, dibenzothiophene, naphthofuran, naphthothiophene, benzodifuran, benzodithiophene, naphthodifuran, naphthodithiophene, anthrafuran, anthradifuran, anthrathiophene, anthradithiophene, thianthrene, phenoxathiin, and thiophanthrene (naphthothiophene) rings. These rings may further have a substituent group.

In Formula (8), n represents an integer of 0 to 8, preferably 0 to 2, especially 1 or 2 if X is O or S.

Particularly preferred host compounds of the present invention contain both structures of dibenzofuran and carbazole rings.

Non-limiting examples of the host compound in Formula (8) are specifically shown in a-1 to a-41 below:

[Chemical Formula 16]

a-1

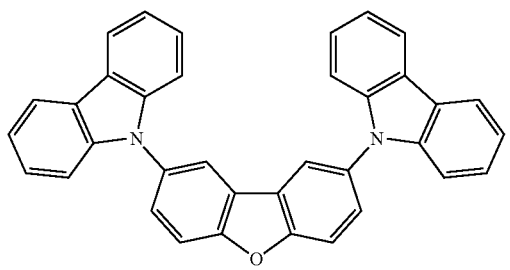

a-2

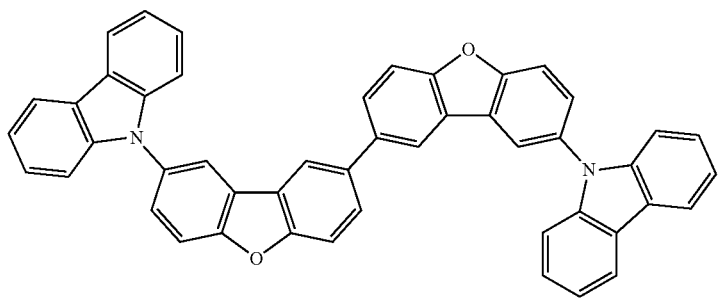

a-3

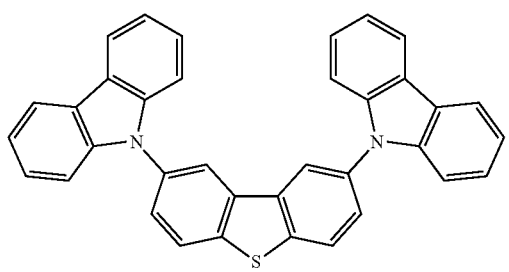

a-4
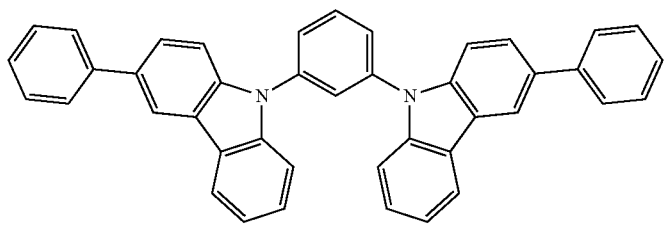
a-5
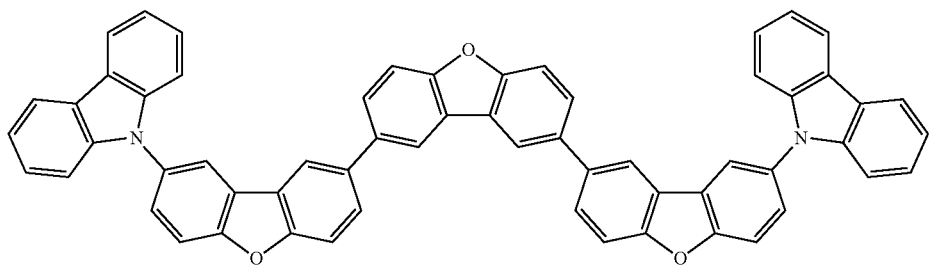
a-6
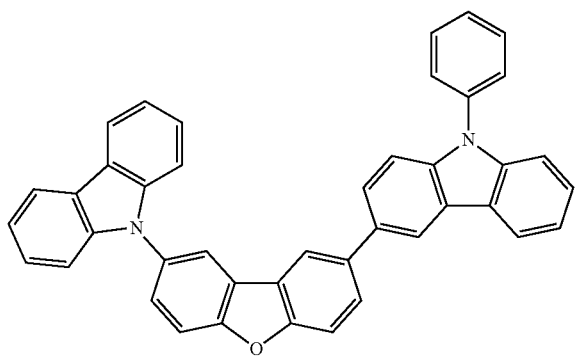
[Chemical Formula 17]
a-7
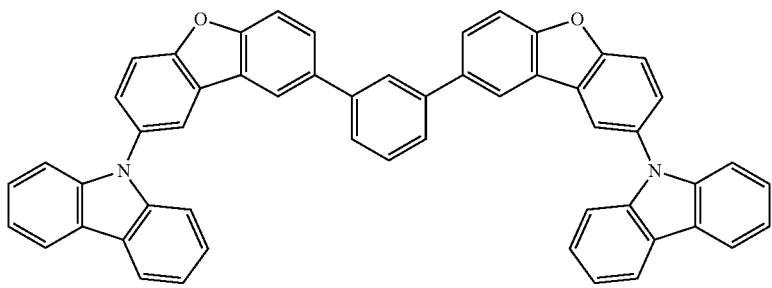
a-8
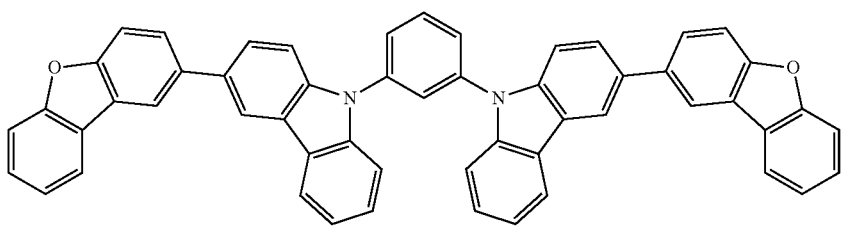

-continued
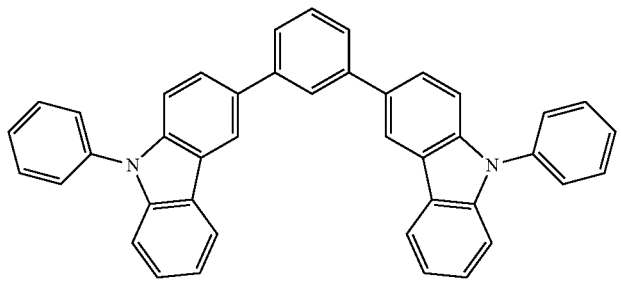
a-9
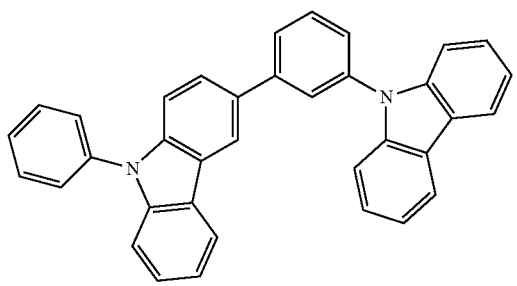
a-10
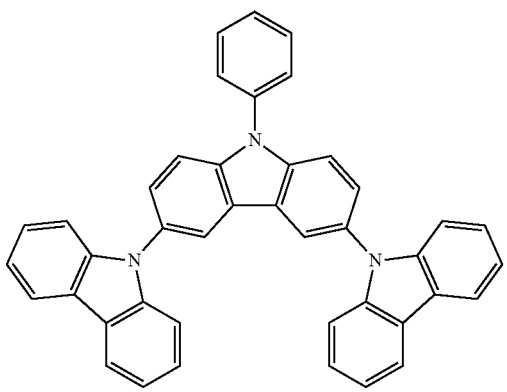
a-11
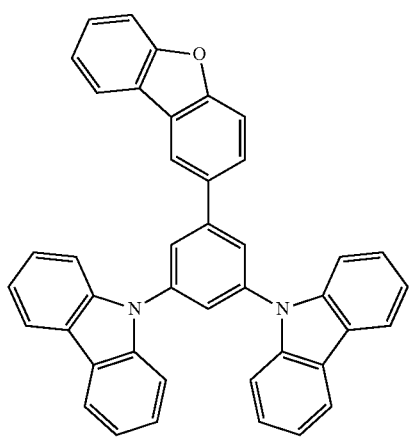
a-12
[Chemical Formula 18]
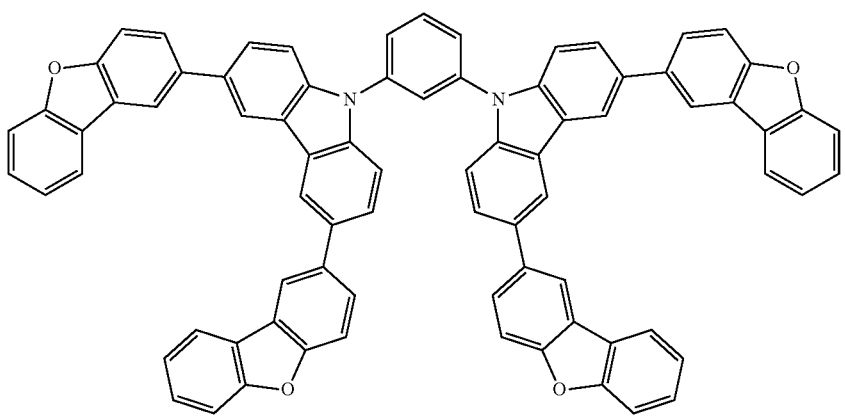
a-13 a-14
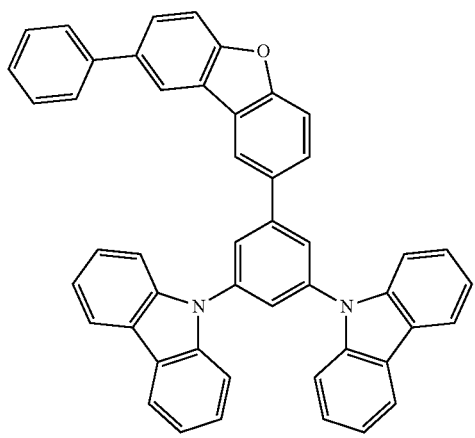
a-15
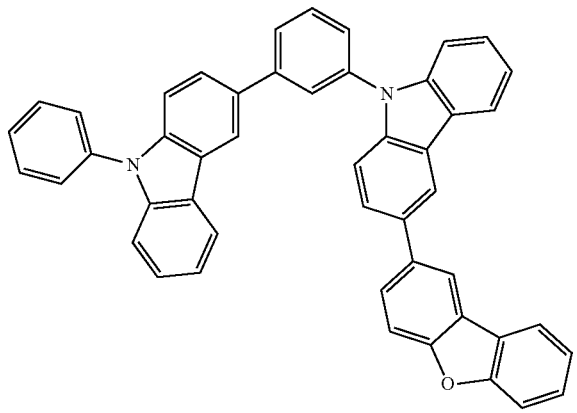
a-16
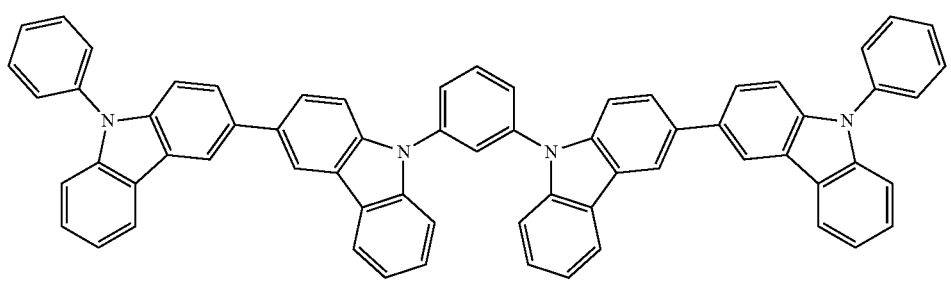
a-17
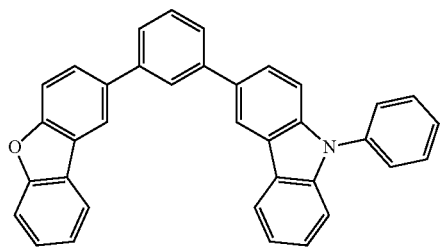
a-18
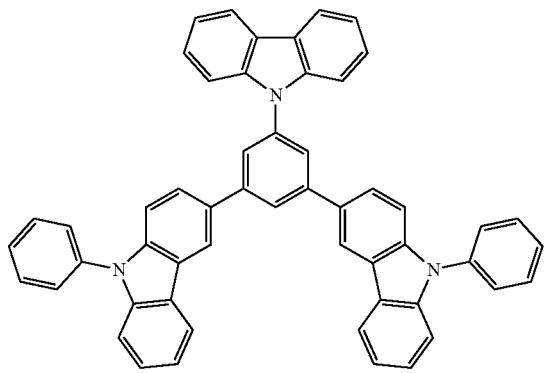
[Chemical Formula 19]
a-19
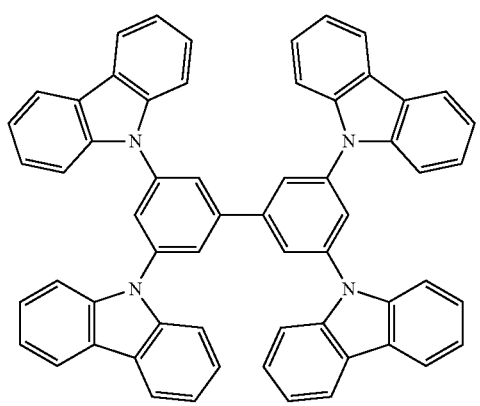

a-20
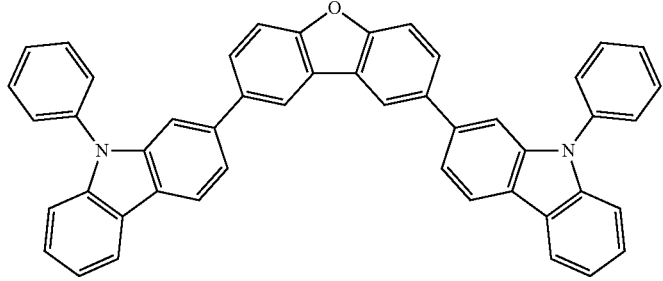
a-21
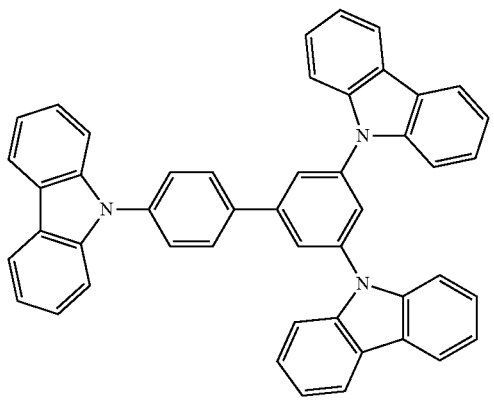
a-22
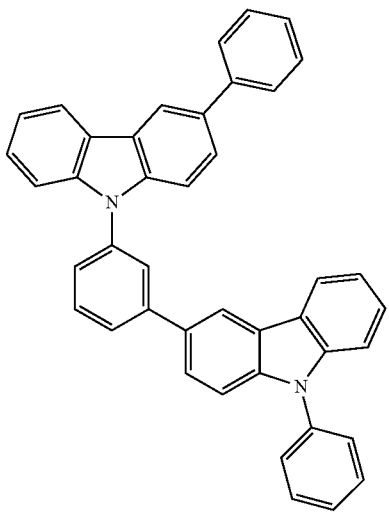
a-23
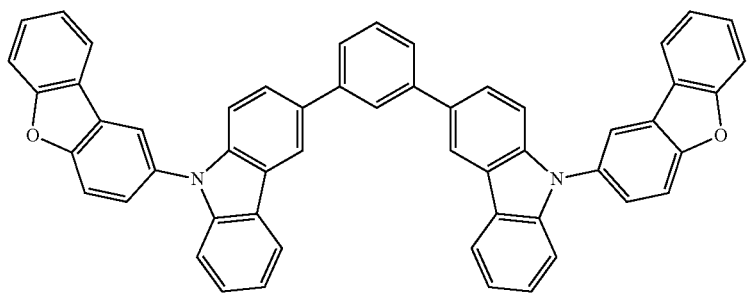
a-24
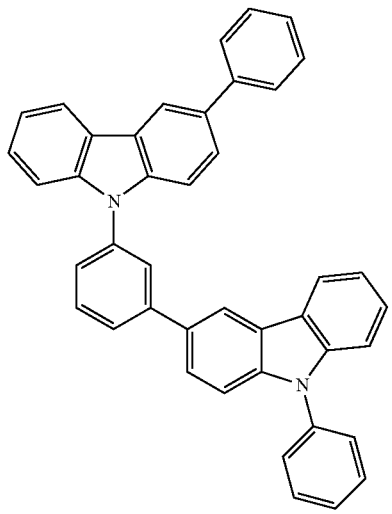

[Chemical Formula 20]
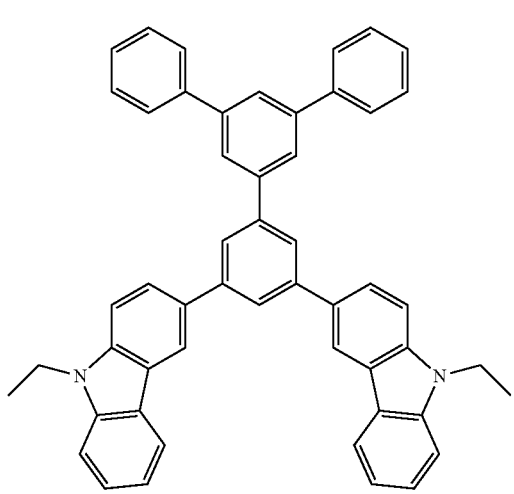
a-25
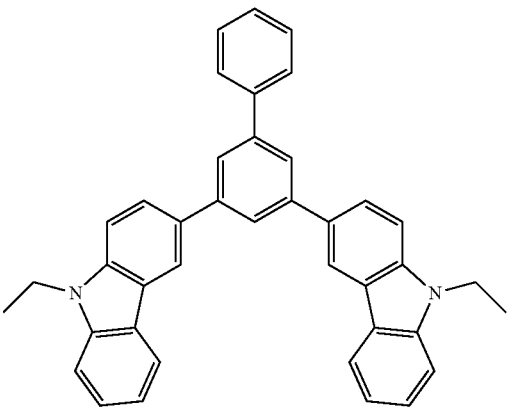
a-26
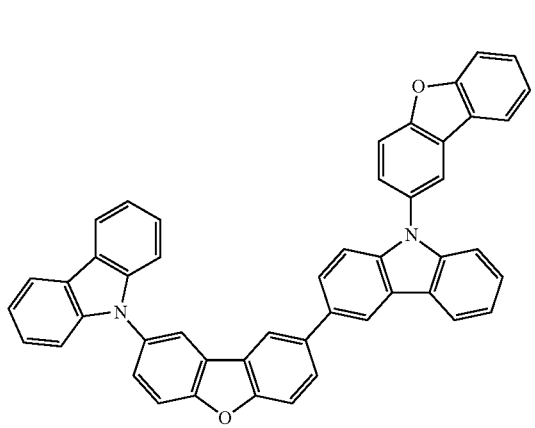
a-27
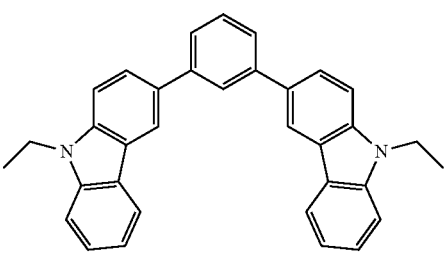
a-28
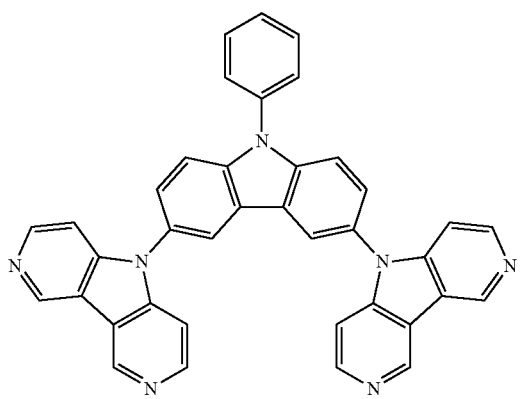
a-29

[Chemical Formula 21]
a-30
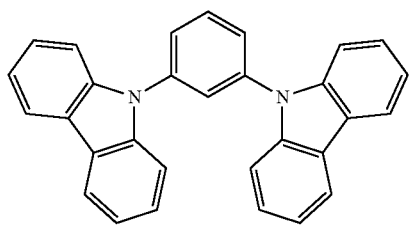
a-31
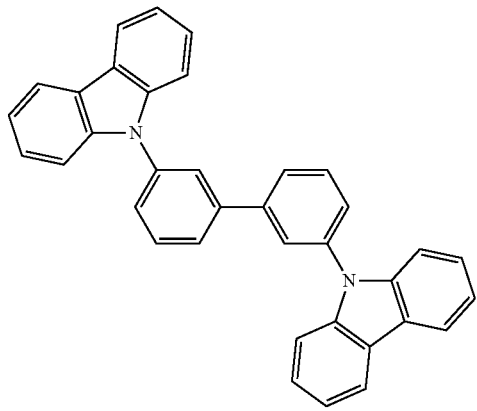
a-32
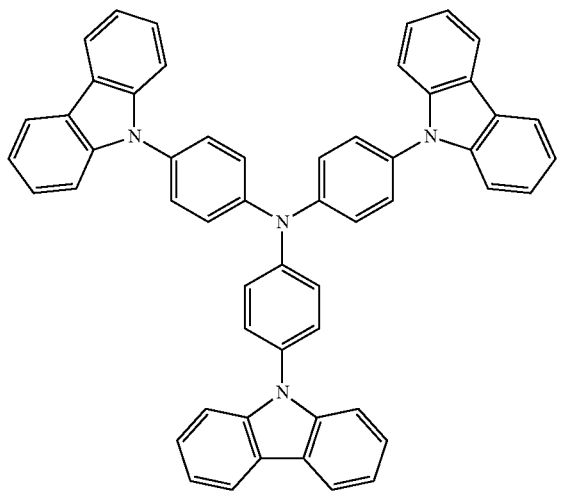
a-33
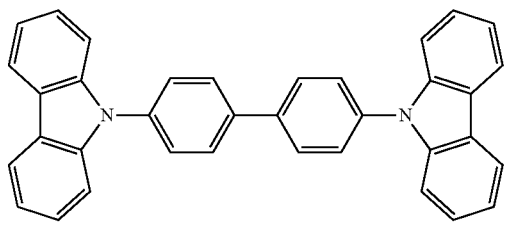
a-34
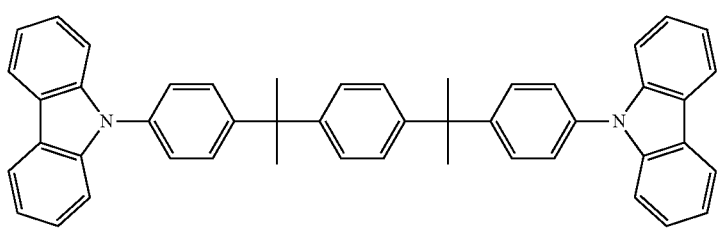
[Chemical Formula 22]
a-35
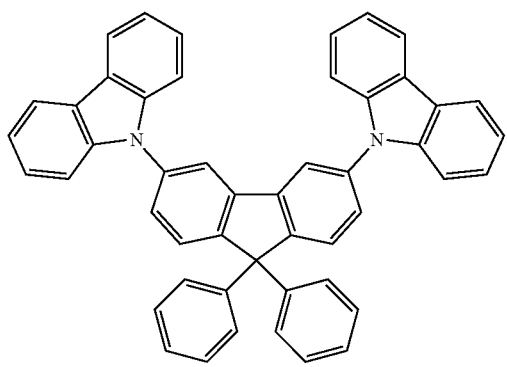
a-36
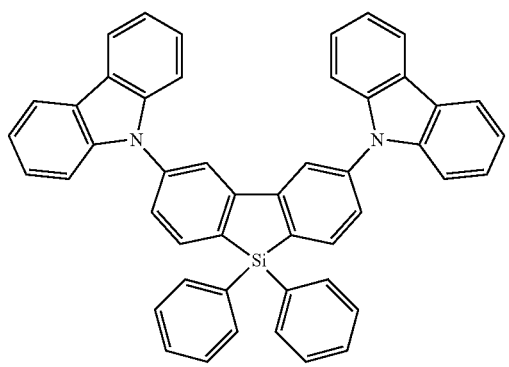

[Chemical Formula 23]

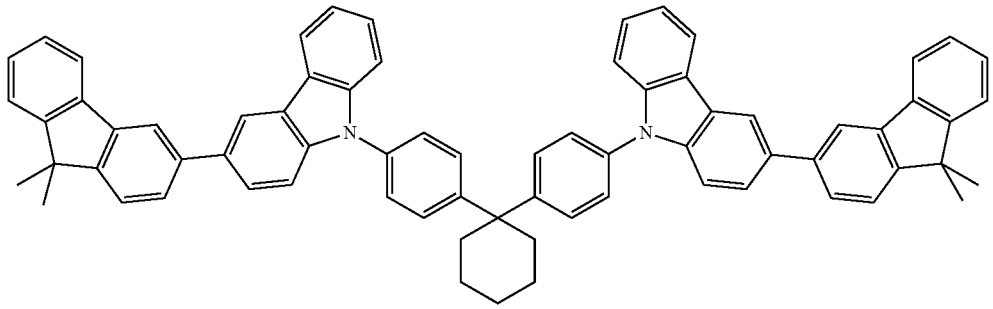

a-37

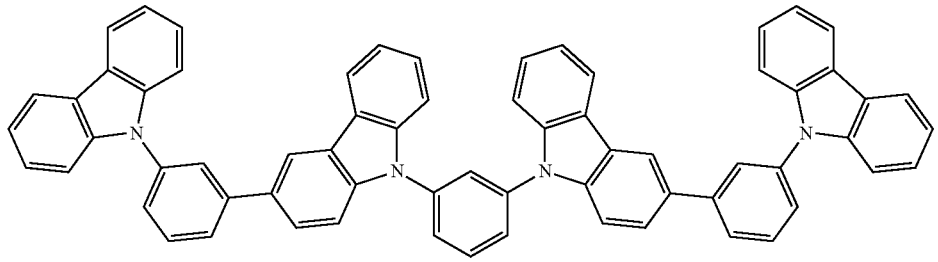

a-38

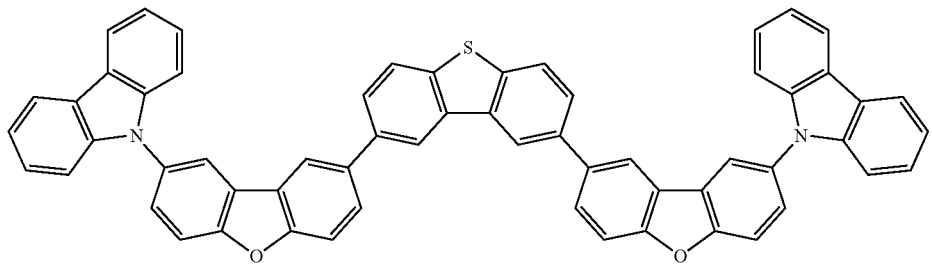

a-39

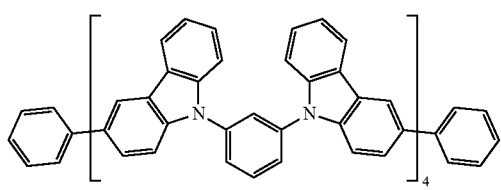

a-40

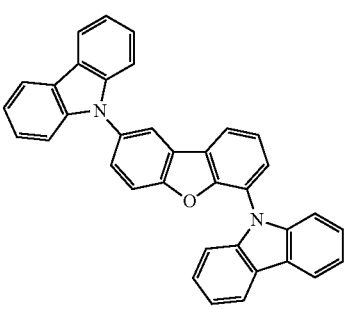

a-41

(4.2) Luminous Material

Luminous materials which have been commonly used are fluorescent compounds and phosphorescent materials (also referred to as phosphorescent compounds, phosphorescent luminous compounds, or phosphorescent dopants). The luminous material of the present invention is characterized by a phosphorescent material (phosphorescent dopant).

The phosphorescent material of the present invention can emit light from the excited triplet, specifically, can emit phosphorescence at room temperature (25° C.) and is defined as a compound having a phosphorescent quantum yield of 0.01 or more at 25° C. The phosphorescent quantum yield is preferably 0.1 or more.

The phosphorescent quantum yield can be measured by the method described in page 398 of Bunkoh II of Dai 4 Han Jikken Kagaku Koza 7 (Spectroscopy II of The 4th Series of Experimental Chemistry 7) (1992, published by Maruzen Co., Ltd.). The phosphorescent quantum yield in a solution can be measured using any appropriate solvent. The only requirement for the phosphorescent material used in the present invention is to have the above-mentioned phosphorescent quantum yield (0.01 or more) in any appropriate solvent.

There are two types of emission principles of a phosphorescent material. One is an energy transfer-type, which involves the recombination of carriers on a host compound onto which the carriers are transferred to produce an excited state of the host compound, and then emission from a phosphorescent material due to transfer of this energy to the phosphorescent material. The other is a carrier trap-type, wherein a phosphorescent material serves as a carrier trap to cause recombination of carriers on the phosphorescent material, and thereby emission from the phosphorescent material occurs. In each type, it is essential that the energy in the excited state of the phosphorescent material be lower than that in the excited state of the host compound.

The phosphorescent material can appropriately be selected from any known phosphorescent material used in a layer of an organic EL element. Examples of the phosphorescent material include preferably complex compounds containing a metal belonging to Groups 8 to 10 in the periodic table, more preferably iridium, osmium, and platinum compounds (platinum-group complex compounds) and rare earth complexes. Most preferred are iridium compounds.

The luminous layer of the present invention is characterized by containing both a host compound and a phosphorescent dopant.

The phosphorescent dopant of the present invention preferably contained in the luminous layer is represented by Formula (1):

<Compound Represented by Formula (1)>

The phosphorescent dopant of the present invention represented by Formula (1) will now be described:

[Chemical Formula 24]

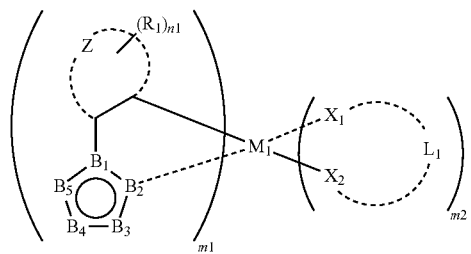

Formula (1)

In Formula (1), $R_1$ represents a substituent group; Z represents a nonmetallic atomic group necessary for formation of a five- to seven-member ring; n1 represents an integer of 0 to 5; $B_1$ to $B_5$ each represent an atom of carbon, nitrogen, oxygen, or sulfur and at least one of $B_1$ to $B_5$ represents a nitrogen atom; $M_1$ represents a metal belonging to Groups 8 to 10 in the periodic table; $X_1$ and $X_2$ each represent an atom of carbon, nitrogen, or oxygen; $L_1$ represents an atomic group forming a bidentate ligand together with $X_1$ and $X_2$; and m1 represents 1, 2, or 3 and m2 represents 0, 1, or 2 provided that m1+m2 is 2 or 3.

The phosphorescent compound of the present invention represented by Formula (1) has a HOMO energy level of −5.15 to −3.50 eV and a LUMO energy level of −1.25 to +1.00 eV; preferably, a HOMO energy level of −4.80 to −3.50 eV and a LUMO energy level of −0.80 to +1.00 eV.

Examples of the substituent groups represented by $R_1$ in Formula (1) of the phosphorescent compound include alkyl groups (e.g., methyl, ethyl, propyl, isopropyl, tert-butyl, pentyl, hexyl, octyl, dodecyl, tridecyl, tetradecyl, and pentadecyl groups); cycloalkyl groups (e.g., cyclopentyl and cyclohexyl groups); alkenyl groups (e.g., vinyl and aryl groups); alkynyl groups (e.g., ethynyl and propargyl groups); aromatic hydrocarbon ring groups (also called aromatic carbon ring or aryl groups, e.g., phenyl, p-chlorophenyl, mesityl, tolyl, xylyl, naphthyl, anthryl, azulenyl, acenaphthenyl, fluorenyl, phenantolyl, indenyl, pyrenyl, and biphenylyl groups); heterocyclic aromatic ring groups (e.g., pyridyl, pyrimidinyl, furyl, pyrrolyl, imidazolyl, benzoimidazolyl, pyrazolyl, pyradinyl, triazolyl (e.g., 1,2,4-triazole-1-yl and 1,2,3-triazole-1-yl groups), oxazolyl, benzoxazolyl, triazolyl, isooxazolyl, isothiazolyl, furazanyl, thienyl, quinolyl, benzofuryl, dibenzofuryl, benzothienyl, dibenzothienyl, indolyl, carbazolyl, carbolinyl, diazacarbazolyl (i.e., a group in which one of the carbon atoms in the carboline ring of the carbolinyl group is replaced with a nitrogen atom), quinoxalinyl, pyridazinyl, triazinyl, quinazolinyl, and phthalazinyl groups); heterocyclic groups (e.g., pyrrolidyl, imidazolidyl, morpholyl, and oxazolidyl groups); alkoxyl groups (e.g., methoxy, ethoxy, propyloxy, pentyloxy, hexyloxy, octyloxy, and dodecyloxy groups); cycloalkoxy groups (e.g., cyclopentyloxy and cyclohexyloxy groups); aryloxy groups (e.g., phenoxy and naphthyloxy groups); alkylthio groups (e.g., methylthio, ethylthio, propylthio, pentylthio, hexylthio, octylthio, and dodecylthio groups); cycloalkylthio groups (e.g., cyclopentylthio and cyclohexylthio groups); arylthio groups (e.g., phenylthio and naphthylthio groups); alkoxycarbonyl groups (e.g., methyloxycarbonyl, ethyloxycarbonyl, butyloxycarbonyl, octyloxycarbonyl, and dodecyloxycarbonyl groups); aryloxycarbonyl groups (e.g., phenyloxycarbonyl and naphthyloxycarbonyl groups); sulfamoyl groups (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups); acyl groups (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups); acyloxy groups (e.g., acetyloxy, ethylcarbonyloxy, butylcarbonyloxy, octylcarbonyloxy, dodecylcarbonyloxy, and phenylcarbonyloxy groups); amido groups (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups); carbamoyl groups (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups); ureido groups (e.g., methylureido, ethylureido, pentylureido, cyclohexylureido, octylureido, dodecylureido, phenylureido, naphthylureido, and a 2-pyridylaminoureido groups); sulfinyl groups (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups); alkylsulfonyl groups (e.g., methylsulfonyl, ethylsulfonyl, butylsulfonyl, cyclohexylsulfonyl, 2-ethylhexylsulfonyl, and dodecylsulfonyl groups); arylsulfonyl groups or heteroarylsulfonyl groups (e.g., phenylsulfonyl, naphthylsulfonyl, and 2-pyridylsulfonyl groups); amino groups (e.g., amino, ethylamino, dimethylamino, butylamino, cyclopentylamino, 2-ethylhexylamino, dodecylamino, anilino, naphthylamino, and 2-pyridylamino groups); a cyano group; a nitro group; a hydroxy group; a mercapto group; and silyl groups (e.g., trimethylsilyl, triisopropylsilyl, triphenylsilyl, and phenyldiethylsilyl groups). Among these substituent groups, preferred are alkyl and aryl groups.

Z represents a nonmetallic atomic group necessary for formation of a five- to seven-member ring. Examples of the five- to seven-member ring composed of Z include benzene, naphthalene, pyridine, pyrimidine, pyrrole, thiophene, pyrazole, imidazole, oxazole, and thiazole rings. Among them, preferred is a benzene ring.

$B_1$ to $B_5$ each represent an atom of carbon, nitrogen, oxygen, or sulfur and at least one of $B_1$ to $B_5$ represents a nitrogen atom. The five-member aromatic nitrogen-containing heterocycle is preferably monocyclic, for examples, a pyrrole, pyrazole, imidazole, triazole, tetrazole, oxazole, isoxazole, triazole, isothiazole, oxadiazole, and thiadiazole rings. Among them, preferred are a pyrazole and imidazole rings, and particularly preferred is an imidazole ring in which B2 and B5 are a nitrogen atom. These rings may further have the above-mentioned substituent groups. Preferred substituent groups are alkyl and aryl groups, and more preferred are aryl groups.

$L_1$ represents an atomic group forming a bidentate ligand together with $X_1$ and $X_2$. Specific examples of the bidentate ligand represented by $X_1$-$L_1$-$X_2$ include substituted or unsubstituted phenylpyridine, phenylpyrazole, phenylimidazole, phenyltriazole, phenyltetrazole, pyrazabole, picolinic acid, and acetylacetone. These groups may further have the above-mentioned substituent groups.

m1 represents 1, 2, or 3 and m2 represents 0, 1, or 2 provided that m1+m2 is 2 or 3. m2 is most preferably 0. Examples of the metal represented by $M_1$ include a transition metal element (also simply referred to as "transition metal") belonging to Groups 8 to 10 in the periodic table, preferably iridium and platinum, more preferably iridium.

<Compound Represented by Formula (2)>

The phosphorescent material of the present invention represented by Formula (1) is preferably a blue phosphorescent compound, most preferably the compound represented by Formula (2).

[Chemical Formula 25]

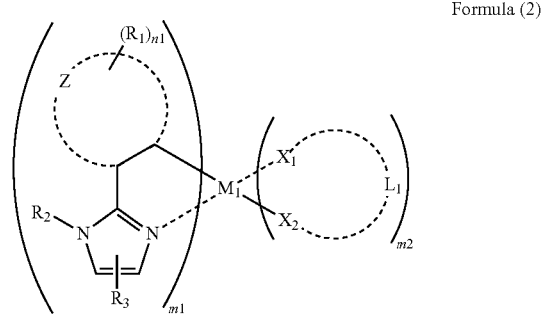

Formula (2)

In Formula (2), $R_1$, $R_2$, and $R_3$ each represent a substituent group; Z represents a nonmetallic atomic group necessary for formation of a five- to seven-member ring; n1 represents an integer of 0 to 5; $M_1$ represents a metal belonging to Groups 8 to 10 in the periodic table; $X_1$ and $X_2$ each represent an atom of carbon, nitrogen, or oxygen; $L_1$ represents an atomic group forming a bidentate ligand together with $X_1$ and $X_2$; m1 represents 1, 2, or 3; and m2 represents 0, 1, or 2 provided that m1+m2 is 2 or 3.

Examples of the substituent groups represented by $R_1$, $R_2$, and $R_3$ include the examples of the substituent groups represented by $R_1$ in Formula (1).

Z, $M_1$, $X_1$, $X_2$, $L_1$, $n_1$, $m_1$ and $m_2$ are each synonymous with that in Formula (1).

<Compound Represented by Formula (3)>

Furthermore, the blue phosphorescent compound of the present invention contained in the luminous layer is preferably the compound represented by Formula (3).

[Chemical Formula 26]

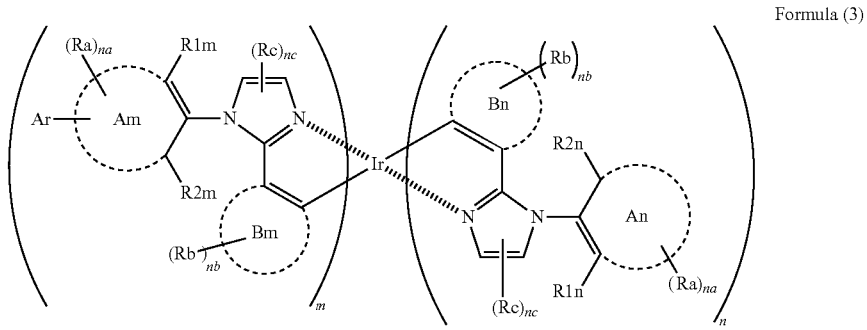

Formula (3)

In Formula (3), rings Am, An, Bm, and Bn each represents a five- or six-member aromatic hydrocarbon ring or five- or six-member heterocyclic aromatic ring; Ar represents an aromatic hydrocarbon, heterocyclic aromatic, nonaromatic hydrocarbon, or nonaromatic heterocyclic ring; R1m, R2m, R1n, and R2n each independently represent an alkyl group having two or more carbon atoms, an aromatic hydrocarbon ring group, a heterocyclic aromatic ring group, a nonaromatic hydrocarbon ring group, or a nonaromatic heterocyclic ring group which optionally have a substituent group; Ra, Rb, and Rc each independently a hydrogen or halogen atom or a cyano, alkyl, alkenyl, alkynyl, alkoxy, amino, silyl, arylalkyl, aryl, heteroaryl, or nonaromatic hydrocarbon ring group, or a nonaromatic heterocyclic ring group which optionally have a substituent group; Ra may form a ring together with Ar; na and nc each represents 1 or 2; nb represents an integer of 1 to 4; and m represents 1 or 2, n represents 1 or 2, wherein m+n is 3. Three ligands coordinated to Ir are not all the same.

Examples of the five- or six-member aromatic hydrocarbon rings represented by the rings An, Am, Bn, and Bm in Formula (3) include a benzene ring.

Examples of the five- or six-member heterocyclic aromatic rings represented by the rings An, Am, Bn, and Bm in Formula (3) include furan, thiophene, oxazole, pyrrole, pyridine, pyridazine, pyrimidine, pyrazine, triazine, oxadiazole, triazole, imidazole, pyrazole, and triazole rings; preferably at least one of the rings Bn and Bm is a benzene ring; and more preferably at least one of the rings An and Am is a benzene ring.

In Formula (3), Ar represents an aromatic hydrocarbon ring, heterocyclic aromatic ring, nonaromatic hydrocarbon ring, or a nonaromatic heterocyclic ring.

Examples of the aromatic hydrocarbon ring represented by Ar in Formula (3) include benzene, biphenyl, naphthalene, azulene, anthracene, phenanthrene, pyrene, chrysene, naphthacene, triphenylene, o-terphenyl, m-terphenyl, p-terphenyl, acenaphthene, coronene, fluorene, fluoranthrene, naphthacene, pentacene, perylene, pentaphene, picene, pyrene, pyranthrene, and anthraanthrene rings.

Examples of the heterocyclic aromatic ring represented by Ar in Formula (3) include silole, furan, thiophene, oxazole, pyrrole, pyridine, pyridazine, pyrimidine, pyrazine, triazine, oxadiazole, triazole, imidazole, pyrazole, triazole, indole, benzimidazole, benzothiazole, benzoxazole, quinoxaline, quinazoline, phthalazine, thienothiophene, carbazole, azacarbazole (i.e., a ring in which any one of the carbon atoms in the carbazole ring is replaced with a nitrogen atom), dibenzosilole, dibenzofuran, and dibenzothiophene rings; a ring in which any one of the carbon atoms in the benzothiophene or dibenzofuran ring is replaced with a nitrogen atom; benzodifuran, benzodithiophene, acridine, benzoquinoline, phenazine, phenanthridine, phenanthroline, cyclazine, quindoline, thebenidine, quinindoline, triphenodithiazine, triphenodioxazine, phenanthrazine, anthrazine, perimidine, naphthofuran, naphthothiophene, naphthodifuran, naphthodithiophene, anthrafuran, anthradifuran, anthrathiophene, anthradithiophene, thianthrene, phenoxathiin, dibenzocarbazole, indolocarbazole, and dithienobenzene rings.

Examples of the nonaromatic hydrocarbon ring represented by Ar in Formula (3) include cycloalkane rings (e.g., cyclopentane and cyclohexane rings); cycloalkoxy groups (e.g., cyclopentyloxy and cyclohexyloxy groups); cycloalkylthio groups (e.g., cyclopentylthio and cyclohexylthio groups); a cyclohexylaminosulfonyl group, tetrahydronaphthalene, 9,10-dihydroanthracene, and biphenylene rings.

Examples of the nonaromatic heterocyclic ring represented by Ar in Formula (3) include epoxy, aziridine, thiirane, oxetane, azetidine, thietane, tetrahydrofuran, dioxolane, pyrrolidine, pyrazolidine, imidazolidine, oxazolidine, tetrahydrothiophene, sulfolane, thiazolidine, ε-caprolactone, ε-caprolactam, piperidine, hexahydropyridazine, hexahydropyrimidine, piperazine, morpholine, tetrahydropyran, 1,3-dioxane, 1,4-dioxane, trioxane, tetrahydrothiopyran, thiomorpholine, thiomorpholine-1,1-dioxide, pyranose, diazabicyclo[2,2,2]-octane, phenoxazine, phenothiazine, oxanthrene, thioxanthene, and phenoxathiin rings.

These rings represented by Ar in Formula (3) may have a substituent group. These substituent groups may further be bonded to each other to form a ring.

In Formula (3), Ar is preferably an aromatic hydrocarbon or heterocyclic aromatic ring, more preferably an aromatic hydrocarbon ring, still more preferably a benzene ring.

In Formula (3), R1m and R2m each independently represent an alkyl group having two or more carbon atoms, aromatic hydrocarbon ring, heterocyclic aromatic ring, nonaromatic hydrocarbon ring, or nonaromatic heterocyclic ring group which optionally have a substituent group.

Examples of the alkyl group represented by R1m and R2m in Formula (3) include methyl, ethyl, trifluoromethyl, isopropyl, n-butyl, t-butyl, n-hexyl, 2-ethylhexyl, pentyl, adamantyl, n-decyl, and n-dodecyl groups.

Examples of the aromatic hydrocarbon ring, heterocyclic aromatic ring, nonaromatic hydrocarbon ring, and nonaromatic heterocyclic ring groups represented by R1m and R2m in Formula (3) include monovalent groups derived from the aromatic hydrocarbon, heterocyclic aromatic, nonaromatic hydrocarbon, and nonaromatic heterocyclic rings represented by Ar in Formula (3).

The alkyl groups having two or more carbon atoms, and aromatic hydrocarbon ring, heterocyclic aromatic ring, nonaromatic hydrocarbon ring, and nonaromatic heterocyclic ring groups represented by R1m and R2m in Formula (3) may each have a substituent group, for example, a halogen atom, a cyano, alkyl, alkenyl, alkynyl, alkoxy, amino, silyl, arylalkyl, aryl, heteroaryl, nonaromatic hydrocarbon ring, or nonaromatic heterocyclic ring group.

In Formula (3), both R1m and R2m are preferably an alkyl or cycloalkyl group having two or more carbon atoms. It is also preferred that one of R1m and R2m is a branched alkyl group having three or more carbon atoms. More preferred is that both R1m and R2m are a branched alkyl group having three or more carbon atoms.

In Formula (3), R1n and R2n are each synonymous with R1m and R2m in Formula (3).

In Formula (3), Ra, Rb, and Rc are each independently a halogen atom or a cyano, alkyl, alkenyl, alkynyl, alkoxy, amino, silyl, arylalkyl, aryl, heteroaryl, nonaromatic hydrocarbon ring, or nonaromatic heterocyclic ring group which optionally have a substituent; Ra may form a ring together with Ar.

Examples of the aryl and heteroaryl groups represented by Ra, Rb, and Rc in Formula (3) include monovalent groups derived from the aromatic hydrocarbon and aromatic heterocyclic rings represented by Ar in Formula (3).

Examples of the nonaromatic hydrocarbon ring and nonaromatic heterocyclic ring groups represented by Ra, Rb, and Rc in Formula (3) include monovalent groups derived from the nonaromatic hydrocarbon and nonaromatic heterocyclic rings represented by Ar in Formula (3).

In Formula (3), na and nc each represents 1 or 2; nb represents an integer of 1 to 4.

In Formula (3), m represents 1 or 2, n represents 1 or 2, wherein m+n is 3.

In Formula (3), three ligands coordinated to Ir are not all the same.

<Iridium Complex Compound Represented by Formula (3A)>

Preferred examples of the iridium complex compound represented by Formula (3) are represented by Formula (3A):

[Chemical Formula 27]

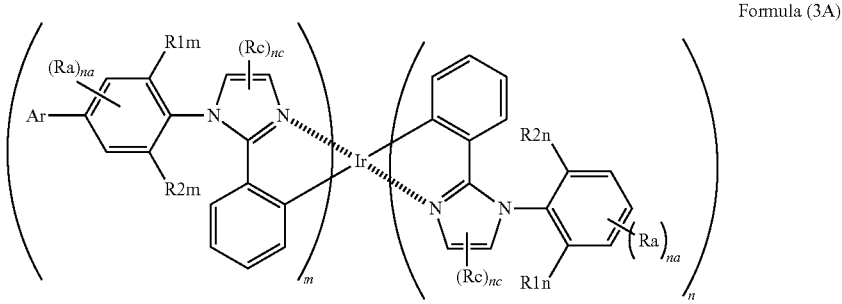

Formula (3A)

In Formula (3A), Ar, R1m, R2m, R1n, R2n, Ra, Rc, na, nc, m and n are each synonymous with Ar, R1m, R2m, R1n, R2n, Ra, Rc, na, nc, m and n in Formula (3).

In Formula (3A), three ligands coordinated to Ir are not all the same.

The iridium complex compounds of the present invention respectively represented by Formula (3) and (3A) can be synthesized by any known technique with reference to, such as described in WO 2006/121811.

<Iridium Complex Compound Represented by Formula (3B)>

Preferred examples of the iridium complex compound represented by Formula (3) or (3A) are represented by Formula (3B):

[Chemical Formula 28]

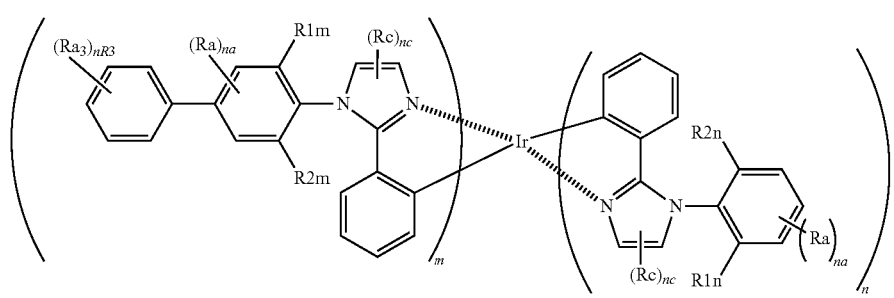

Formula (3B)

In Formula (3B), R1m, R2m, R1n, R2n, Ra, Rc, na, nc, m and n are each synonymous with Rim, R2m, R1n, R2n, Ra, Rc, na, nc, m and n in Formula (3).

In Formula (3B), $Ra_3$ is synonymous with Ra, Rb, and Rc in Formula (3). In Formula (3B), nR3 represents an integer of 1 to 5.

In Formula (3B), three ligands coordinated to Ir are not all the same.

<Iridium Complex Compound Represented by Formula (3C)>

Preferred examples of the iridium complex compound represented by Formula (3) are represented by Formula (3C):

In Formula (3C), R1m, R2m, R1n, R2n, Ra, Rc, na, nc, m and n are each synonymous with Rim, R2m, R1n, R2n, Ra, Rc, na, nc, m and n in Formula (3).

In Formula (3C), $Ra_3$ is synonymous with Ra, Rb, and Rc in Formula (3). In Formula (3C), nR3 represents an integer of 1 to 4.

In Formula (3C), X represents O, S, $SiRz_1Rz_2$, $NRz_1$ or $CRz_1Rz_2$; $Rz_1$ and $Rz_2$ each represent an alkyl, aromatic hydrocarbon ring, heterocyclic aromatic ring, nonaromatic hydrocarbon ring, or nonaromatic heterocyclic ring group.

Examples of the aromatic hydrocarbon ring, heterocyclic aromatic ring, nonaromatic hydrocarbon ring, and nonaromatic heterocyclic ring groups represented by $Rz_1$ and $Rz_2$ include monovalent groups derived from the aromatic hydrocarbon, heterocyclic aromatic, nonaromatic hydrocarbon, and nonaromatic hydrocarbon rings represented by Ar in Formula (3).

<Iridium Complex Compound Represented by Formula (3D)>

Preferred examples of the iridium complex compound represented by Formula (3) are represented by Formula (3D):

[Chemical Formula 29]

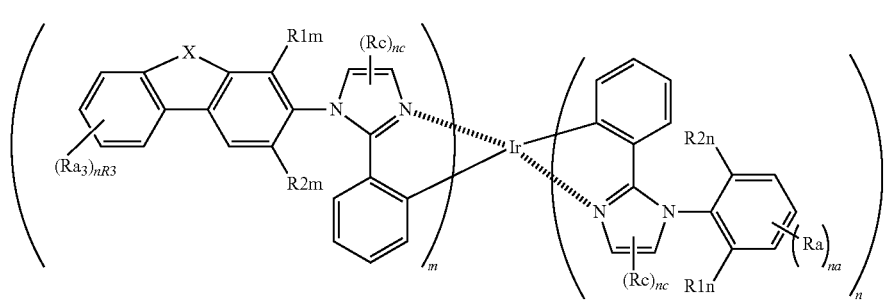

Formula (3C)

[Chemical Formula 30]

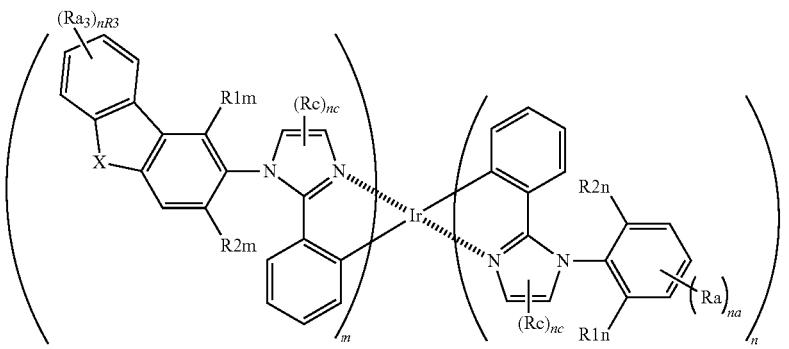

Formula (3D)

In Formula (3D), Rim, R2m, R1n, R2n, Ra, Rc, na, nc, m and n are each synonymous with Rim, R2m, R1n, R2n, Ra, Rc, na, nc, m and n in Formula (3).

In Formula (3D), $Ra_3$ is synonymous with Ra, Rb, and Rc in Formula (3).

In Formula (3D), nR3 and X are each synonymous with nRa and X in Formula (3B).

(Compound Represented by Formula (4))

In the present invention, the blue phosphorescent compound contained in the luminous layer is preferably a compound represented by Formula (4):

[Chemical Formula 31]

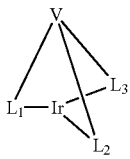

Formula (4)

In Formula (4), V represents a trivalent linking group and links with $L_1$ to $L_3$ by covalent bonds. V has a partial structure of a trivalent linking group represented by Formula (5) or (6).

[Chemical Formula 32]

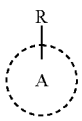

Formula (5)

In Formula (5), A represents an aromatic hydrocarbon ring or heteroaryl ring, and R represents a halogen atom or a substituent group.

[Chemical Formula 33]

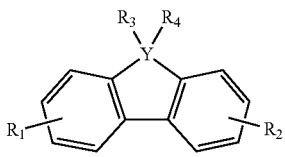

Formula (6)

In Formula (6), $R_1$ and $R_2$ each represent a hydrogen or halogen atom or a substituent group. Y represents a carbon or silicon atom, and $R_3$ and $R_4$ each represent a substituent group.

In Formula (5), A represents an aromatic hydrocarbon ring or a heteroaryl ring. Examples of the aromatic hydrocarbon ring represented by A include benzene, naphthalene and anthracene rings. Examples of the heteroaryl ring represented by A include furan, thiophene, oxazole, pyrrole, pyridine, pyridazine, pyrimidine, pyrazine, oxadiazole, triazole, imidazole, pyrazolo, and triazole rings. A is preferably a benzene ring.

In Formula (5), R represents a halogen atom or a substituent group. Examples of the halogen atom represented by R include fluorine, chlorine, bromine and iodine atoms. Examples of the substituent group represented by R include: alkyl groups, such as methyl, ethyl, propyl, isopropyl, tert-butyl, pentyl, hexyl, octyl, dodecyl, tridecyl, tetradecyl and pentadecyl groups; cycloalkyl groups such as cyclopentyl and cyclohexyl groups; alkenyl groups such as vinyl, allyl, 1-propenyl, 2-butenyl, 1,3-butadienyl, 2-pentenyl and isopropenyl groups; alkynyl groups, such as ethynyl and propargyl groups; aromatic hydrocarbon groups (also referred to as aromatic hydrocarbon ring groups, aromatic carbocyclic groups, or aryl groups), such as phenyl, p-chlorophenyl, mesityl, tolyl, xylyl, naphthyl, anthryl, azulenyl, acenaphthenyl, fluorenyl, phenanthryl, indenyl, pyrenyl and biphenylyl groups); heteroaryl ring groups, such as furyl, thienyl, pyridyl, pyridazinyl, pyrimidinyl, pyrazinyl, triazinyl, imidazolyl, pyrazolyl, thiazolyl, quinazolinyl, carbazolyl, carbolinyl, diazacarbazolyl (a group formed by substitution of any one of the carbon atoms forming the carboline ring of the carbolinyl group), and phthalazinyl groups; heterocyclic ring groups, such as pyrrolidyl, imidazolidyl, morpholyl, and oxazolidyl groups; alkoxy groups, such as methoxy, ethoxy, propyloxy, pentyloxy, hexyloxy, octyloxy, and dodecyloxy groups; cycloalkoxy groups, such as cyclopentyloxy and cyclohexyloxy groups; aryloxy groups, such as phenoxy and naphthyloxy groups; alkylthio groups, such as methylthio, ethylthio, propylthio, pentylthio, hexylthio, octylthio, and dodecylthio groups; cycloalkylthio groups, such as cyclopentylthio and cyclohexylthio groups; arylthio groups such as phenylthio and naphthylthio groups; alkoxycarbonyl groups, such as methyloxycarbonyl, ethyloxycarbonyl butoxycarbonyl, octyloxycarbonyl, and dodecyloxycarbonyl groups; aryloxycarbonyl groups, such as phenyloxycarbonyl, and naphthyloxycarbonyl groups; sulfamoyl groups, such as aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups; acyl groups, such as acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups; acyloxy groups, such as acetyloxy, ethylcarbonyloxy, butylcarbonyloxy, octylcarbonyloxy, dodecylcarbonyloxy, and phenylcarbonyloxy groups; amide groups, such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups; carbamoyl groups, such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups; ureido groups such as methylureido, ethylureido, pentylureido, cyclohexylureido, octylureido, dodecylureido, phenylureido, naphthylureido, and 2-pyridylaminoureido groups; sulfinyl groups such as methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups; alkylsulfonyl groups, such as methylsulfonyl, ethylsulfonyl, butylsulfonyl, cyclohexylsulfonyl, 2-ethylhexylsulfonyl and dodecylsulfonyl groups; arylsulfonyl or heteroarylsulfonyl groups, such as phenylsulfonyl, naphthylsulfonyl, and 2-pyridylsulfonyl groups; amino groups, such as amino, ethylamino, dimethylamino, butylamino, cyclopentylamino, 2-ethylhexylamino, dodecylamino, amino, naphthylamino, 2-pyridylamino, and diphenylamino groups; halogen atoms, such as fluorine, chlorine, and bromine atoms; fluorohydrocarbon groups, such as fluoromethyl, trifluoromethyl, pentafluoroethyl, and pentafluorophenyl groups; cyano groups; nitro groups; hydroxy groups; mercapto groups; silyl groups, such as trimethylsilyl, triisopropylsilyl, triphenylsilyl, and phenyldiethylsilyl groups; and phosphono groups. R is preferably a fluorine atom, an alkyl group, or an aryl group. The trivalent linking group represented by V may have a plurality of Rs, which may be mutually the same or different but are preferably the same.

In Formula (6), $R_1$ and $R_2$ each represent a hydrogen or halogen atom or a substituent group. Examples of the halogen atom or the substituent group represented by $R_1$ and $R_2$ include those exemplified as the halogen atom and the substituent group represented by R in Formula (5). A fluorine atom and alkyl and aryl groups are preferred.

In Formula (6), Y represents a carbon or silicon atom, and $R_3$ and $R_4$ each represent a substituent group. Examples of the substituent group represented by $R_3$ and $R_4$ include those exemplified as the substituent group represented by R in Formula (5). Alkyl and aryl groups are preferred and an aryl group is more preferred. $R_3$ and $R_4$ may bond together to form a ring.

In the present invention, the aromatic hydrocarbon ring or heteroaryl ring represented by A in Formula (5) has at least one halogen atom or substituent group represented by R, which probably reduces n-n stacking of the aromatic hydrocarbon rings or heteroaryl rings represented by A to prevent aggregation of metal complexes, and thus extends the lifetime and improves the luminous efficiency of the element. Similarly, V in Formula (6) has a highly planar fluorene or dibenzosilane ring as a partial structure, but the fluorene or dibenzosilane ring necessarily has two substituent groups represented by $R_3$ and $R_4$ at the center of the ring, which probably prevents aggregation of metal complexes and thus extends the lifetime and improves the luminous efficiency of the element.

In Formula (4), V represents a trivalent linking group and has a partial structure of a trivalent linking group represented by Formula (5) or (6). Preferred structures of V are shown in the following formulae. In each formula, the symbol "*" represents binding sites to $L_1$ to $L_3$.

[Chemical Formula 34]

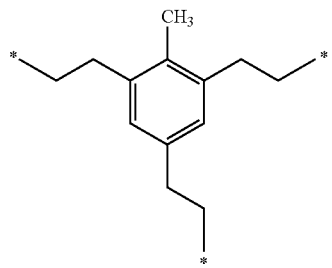

V-1

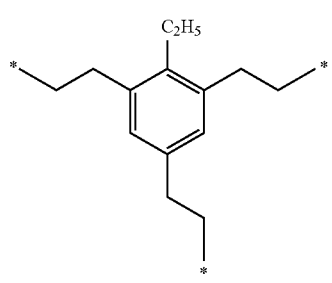

V-2

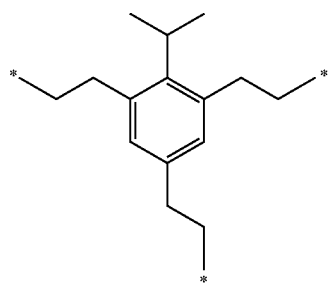

V-3

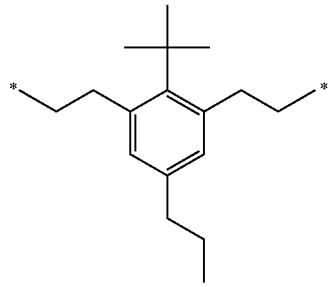

V-4

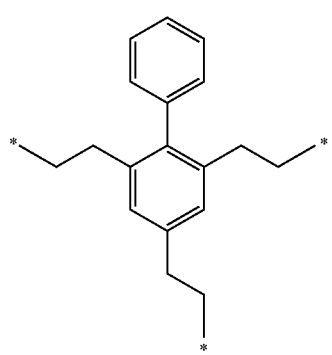

V-5

V-6 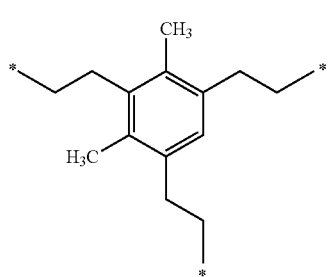
V-7 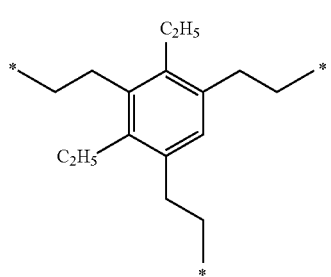
V-8 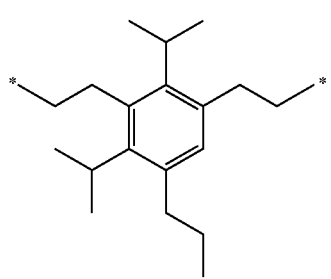
V-9 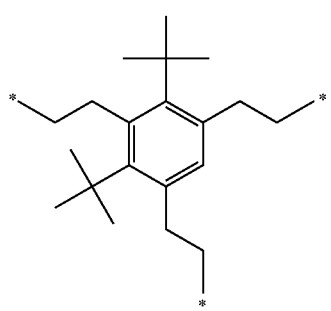
V-10 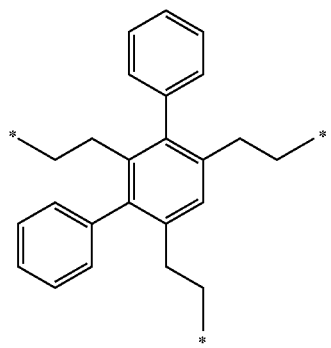
[Chemical Formula 35]
V-11 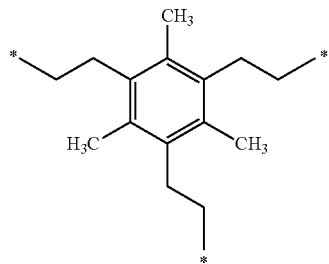
V-12 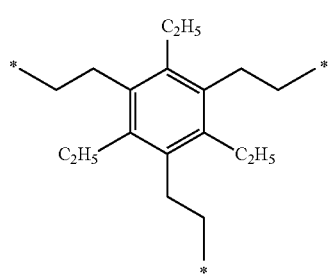
V-13 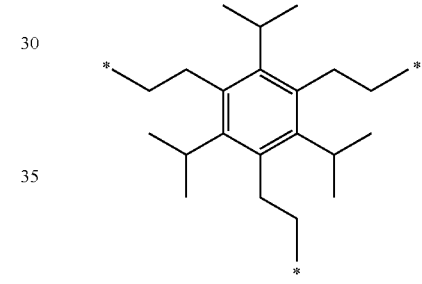
V-14 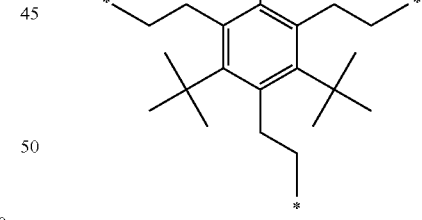
V-15 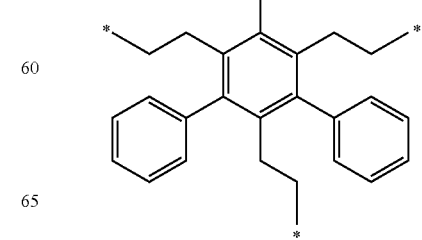

V-16
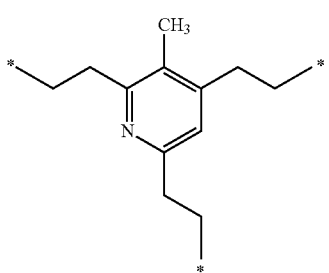
V-17
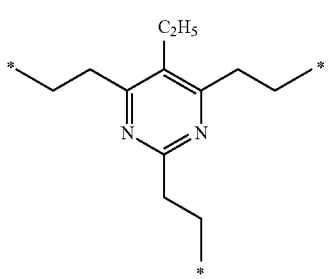
V-18
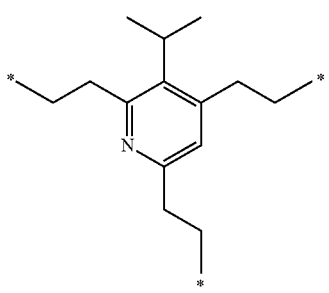
V-19
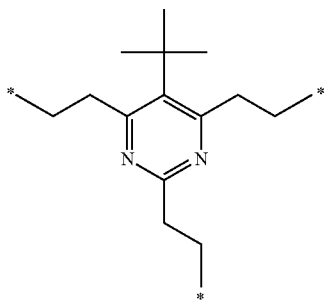
V-20
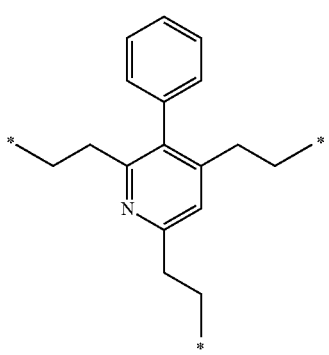
[Chemical Formula 36]
V-21
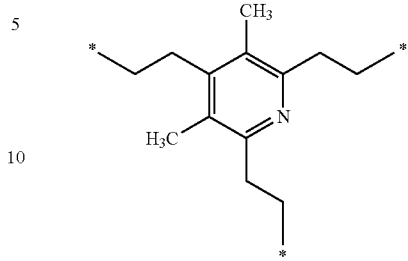
V-22
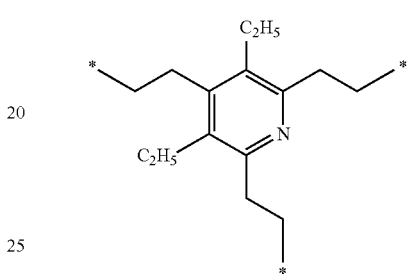
V-23
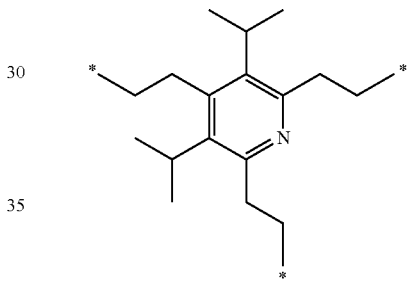
V-24
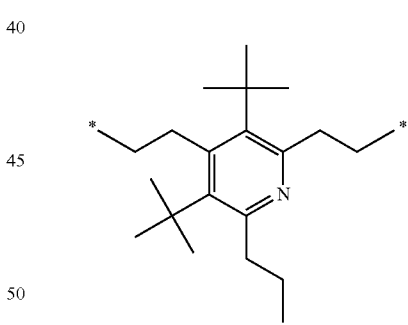
V-25
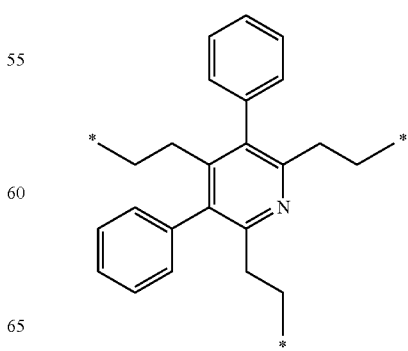

V-26 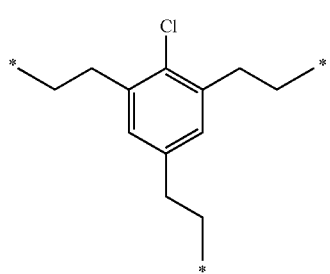
V-27 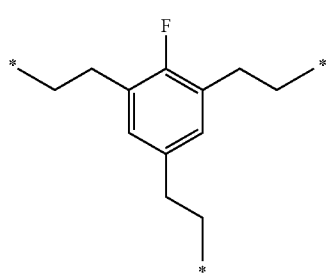
V-28 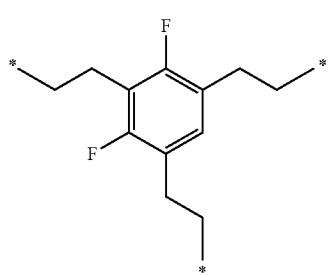
V-29 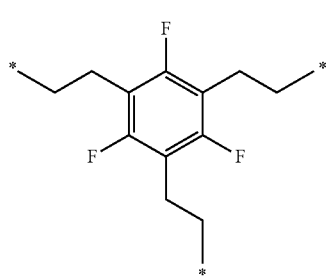
V-30 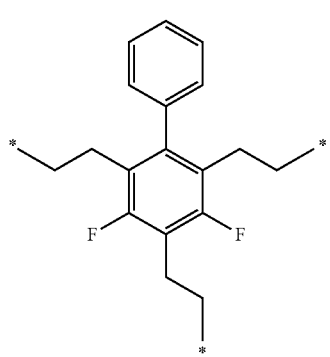
[Chemical Formula 37]
V-31 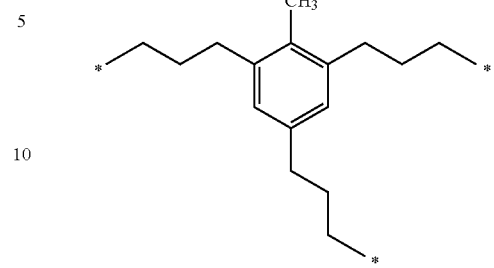
V-32 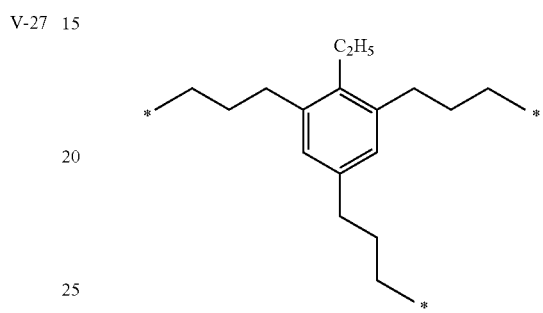
V-33 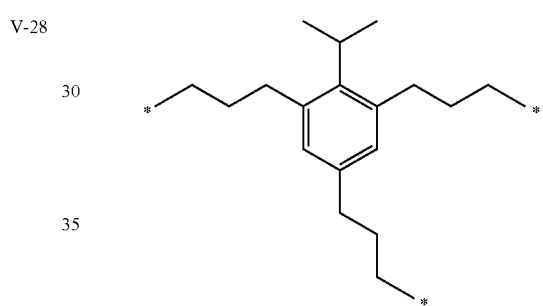
V-34 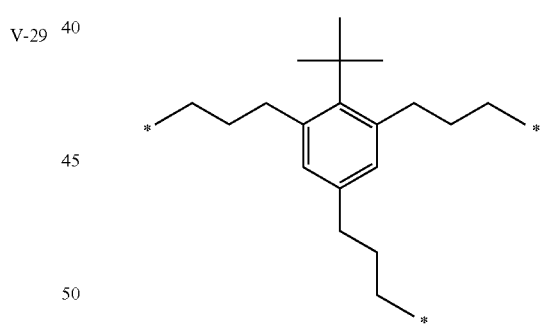
V-35 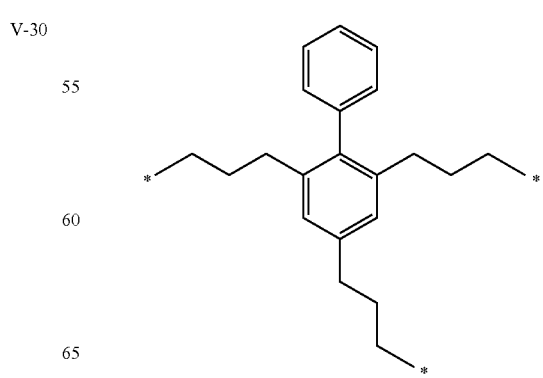

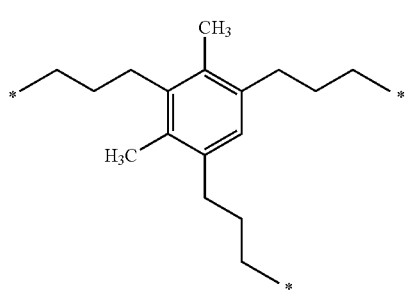 V-36
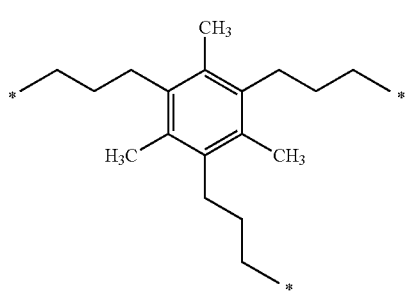 V-41
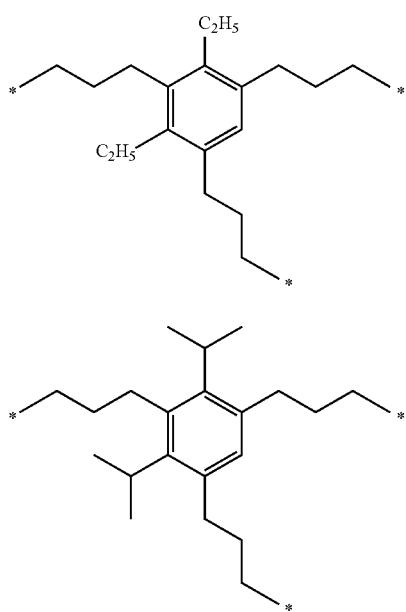 V-37
V-38
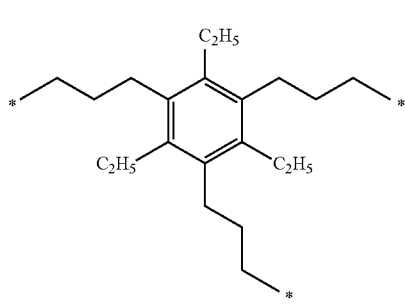 V-42
[Chemical Formula 38]
V-39
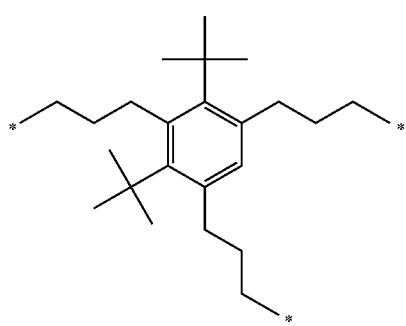 
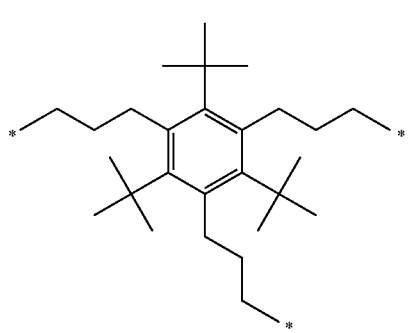 V-43
V-44
V-40
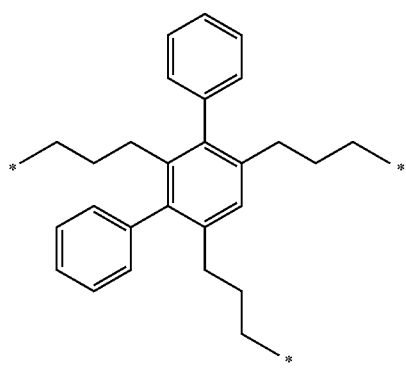
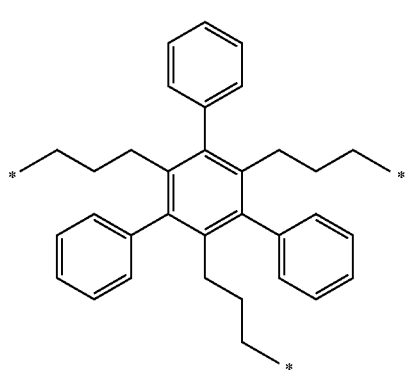 V-45

[Chemical Formula 39]
V-46 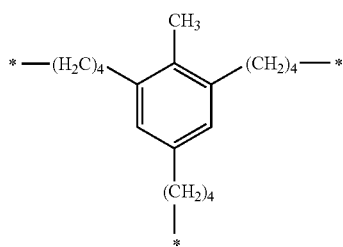
V-47 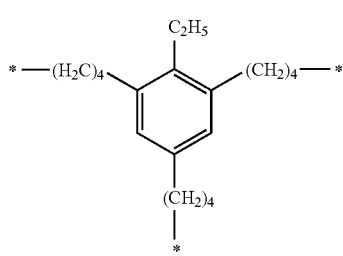
V-48 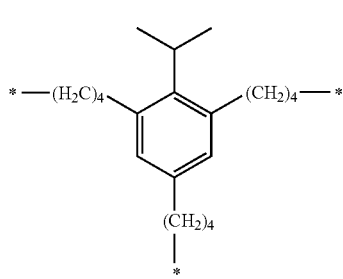
V-49 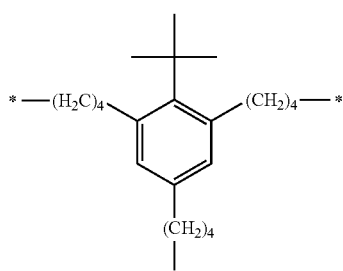
V-50 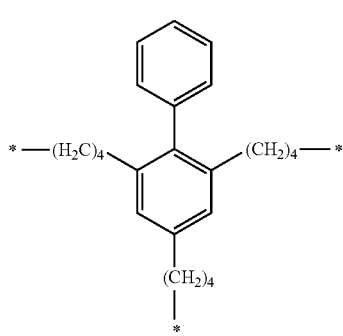
V-51 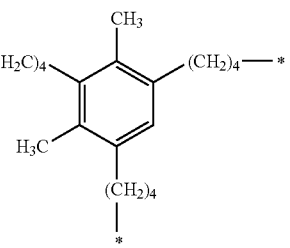
V-52 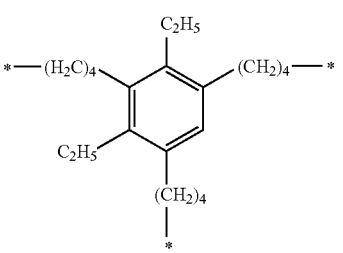
V-53 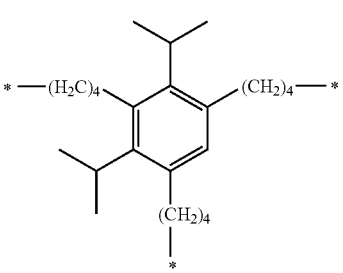
[Chemical Formula 40]
V-54 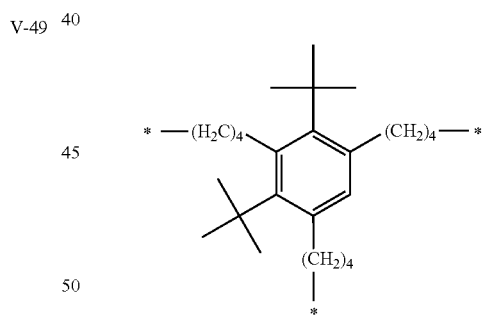
V-55 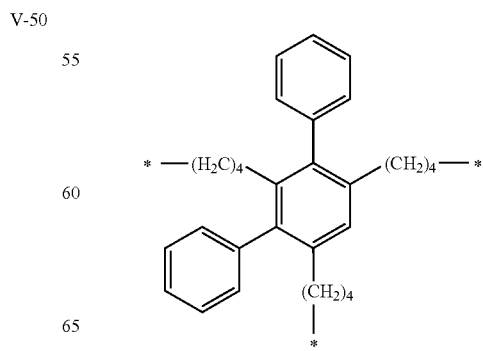

-continued
V-56 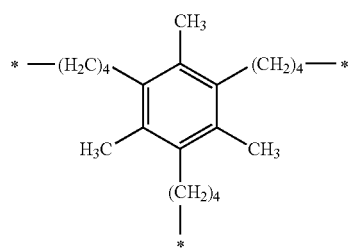
V-57 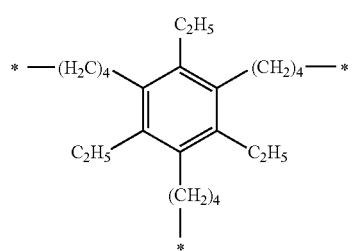
V-58 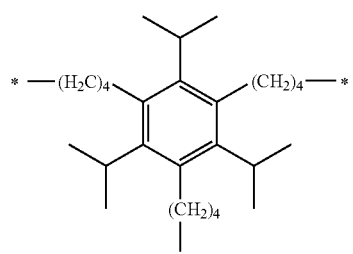
V-59 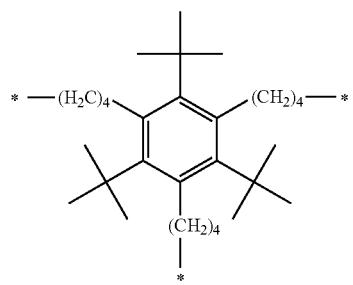
V-60 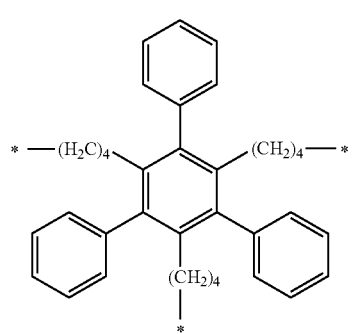
-continued
[Chemical Formula 41]
V-61 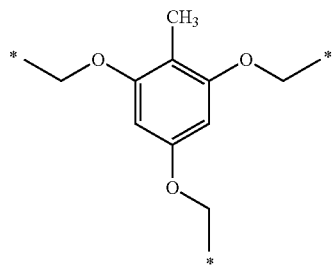
V-62 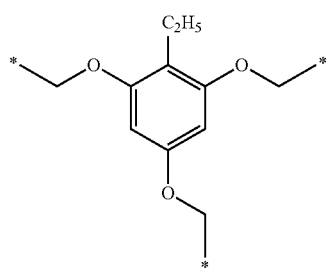
V-63 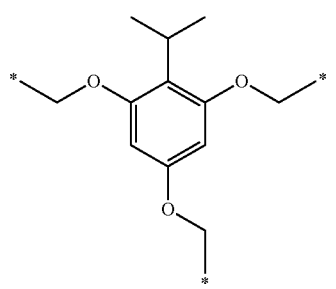
V-64 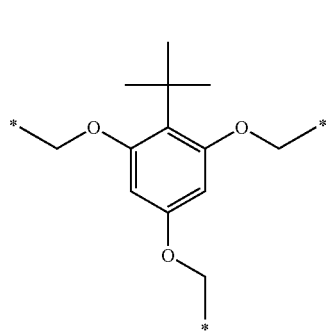
V-65 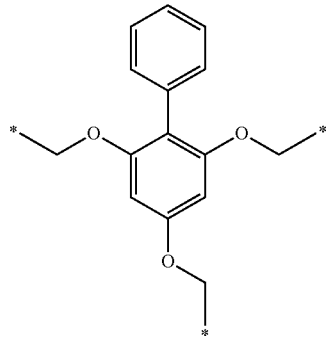

-continued
V-66
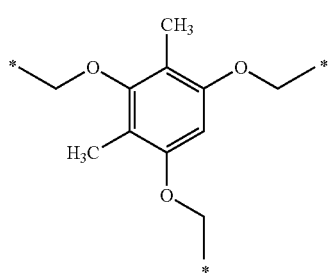
V-71
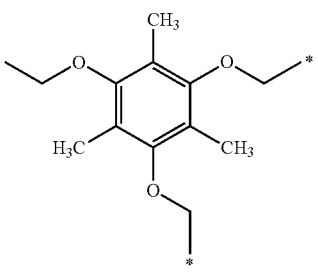
V-67
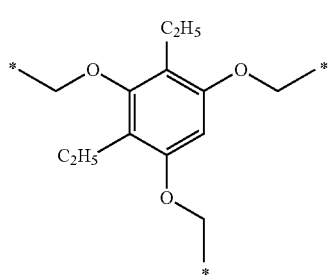
V-72
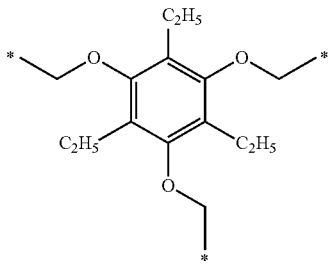
V-68
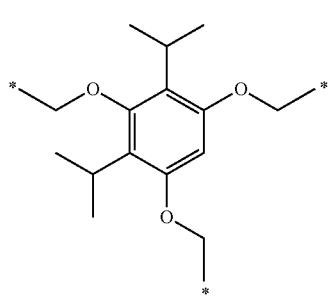
V-73
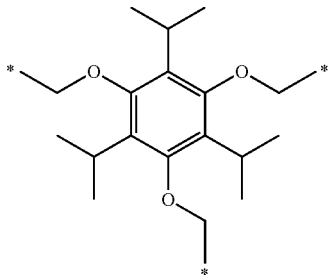
[Chemical Formula 42]
V-69
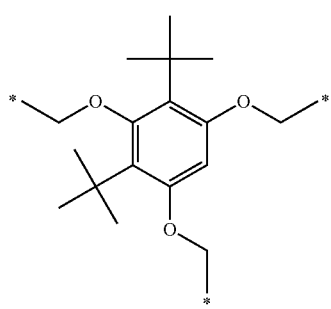
V-74
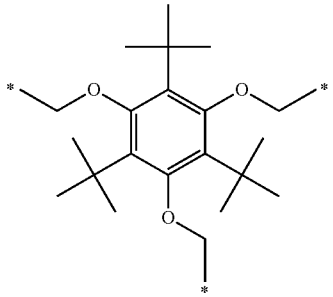
V-70
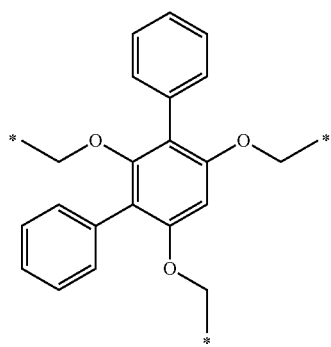
V-75
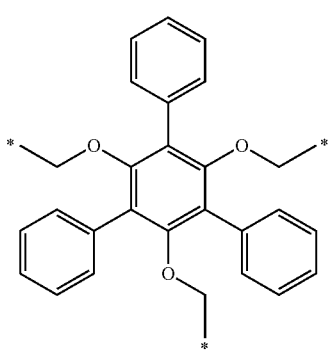

[Chemical Formula 43]
V-76 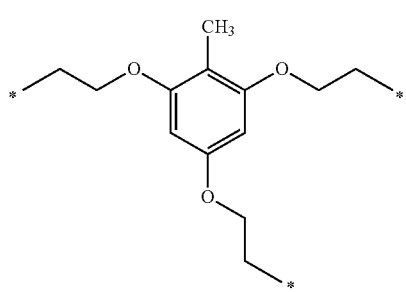
V-77 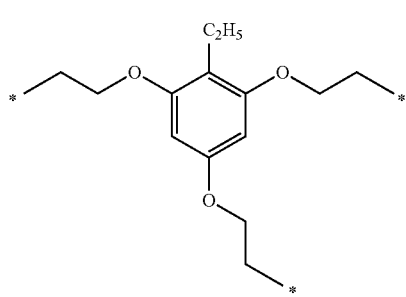
V-78 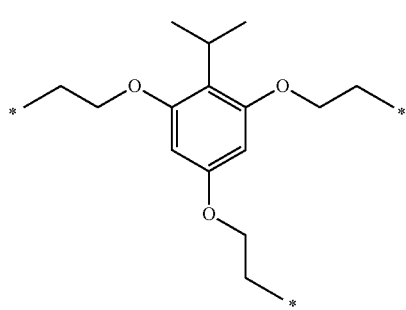
V-79 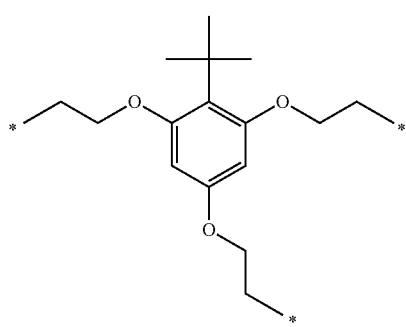
V-80 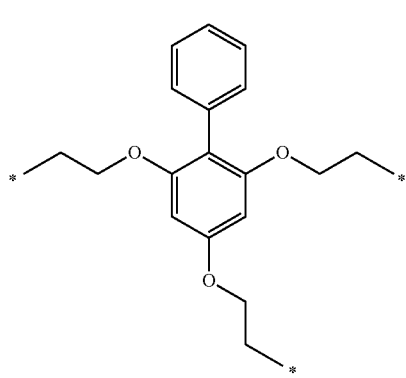
V-81 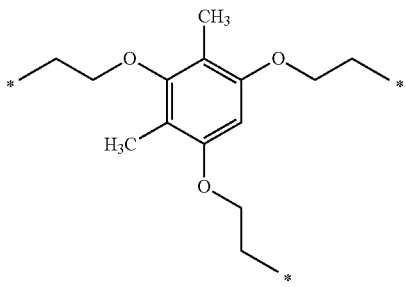
V-82 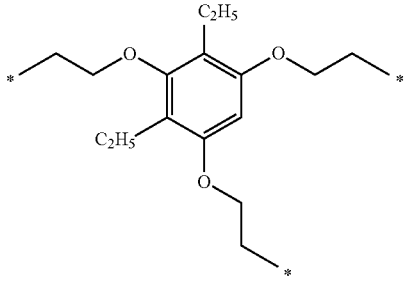
V-83 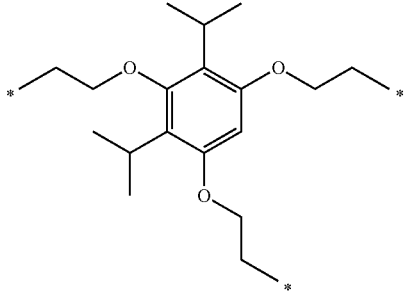
[Chemical Formula 44]
V-84 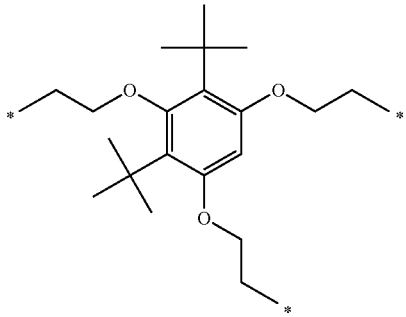
V-85 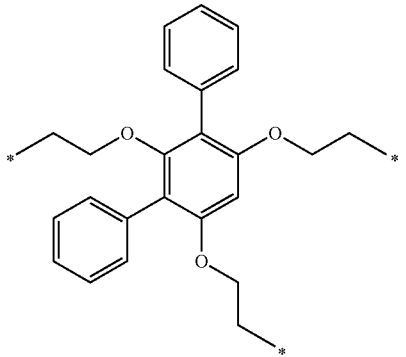

V-86
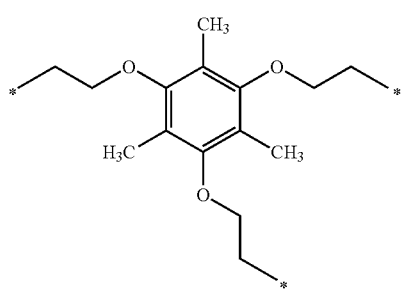
V-87
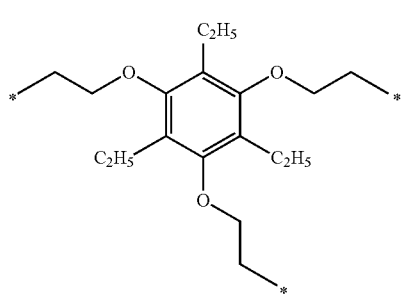
V-88
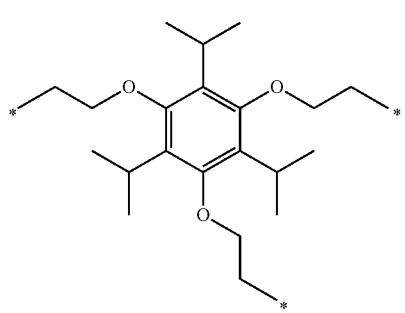
V-89
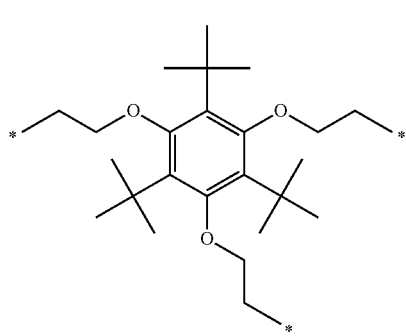
V-90
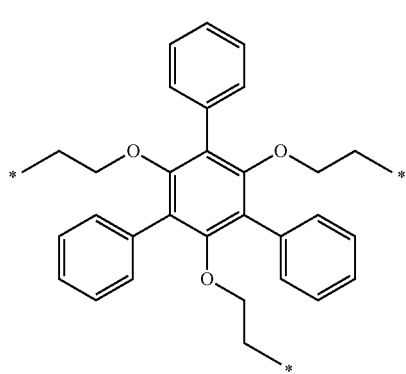
[Chemical Formula 45]
V-91
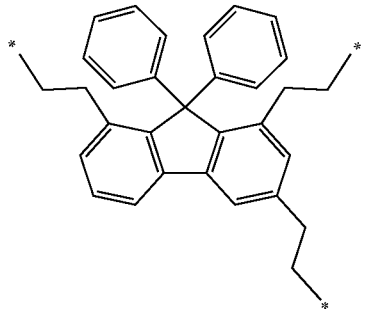
V-92
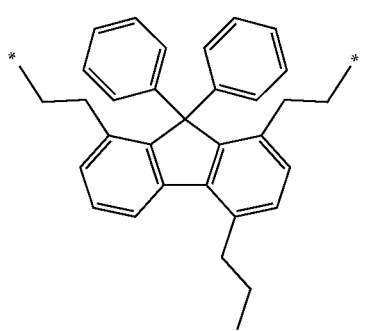
V-93
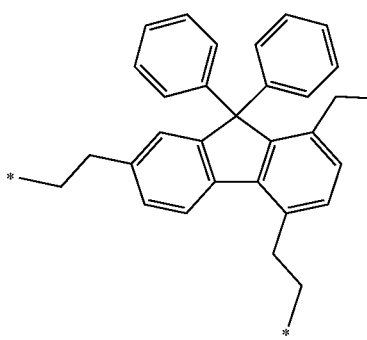
V-94
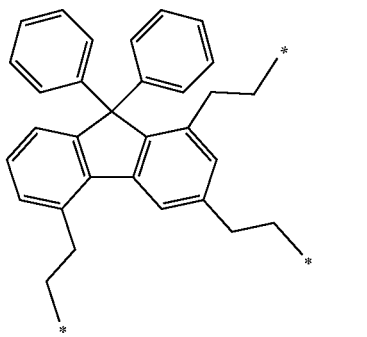
V-95
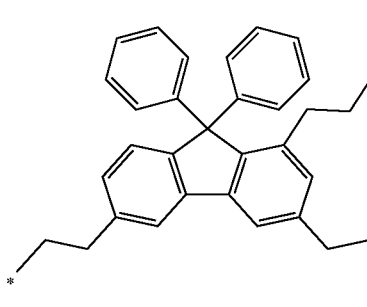

V-96
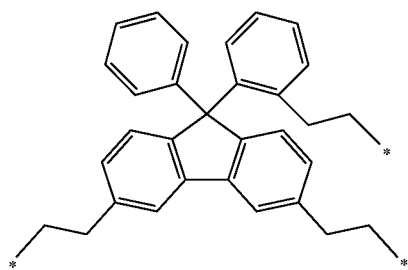
V-97
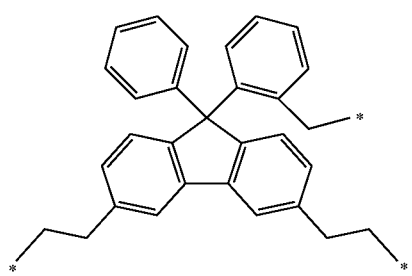
V-98
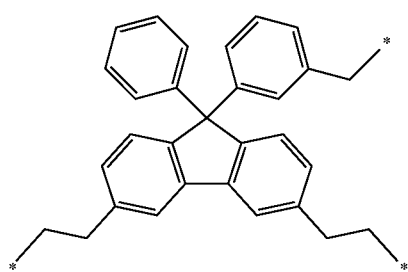
V-99
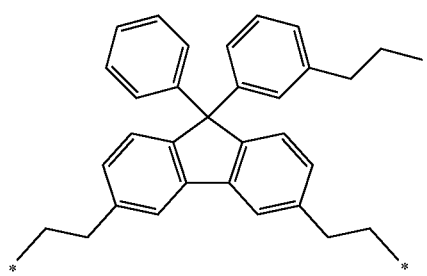
[Chemical Formula 46]
V-100
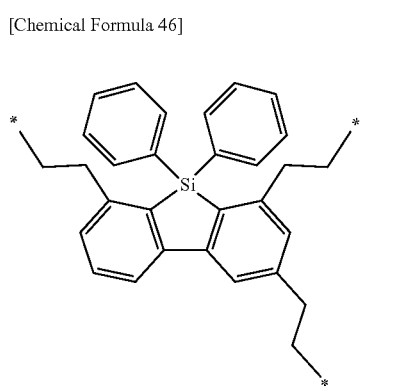
V-101
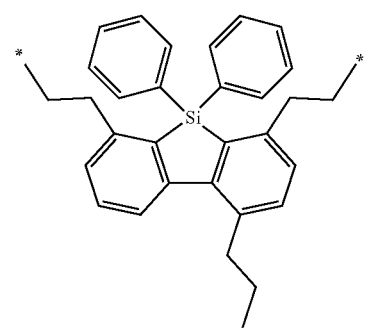
V-102
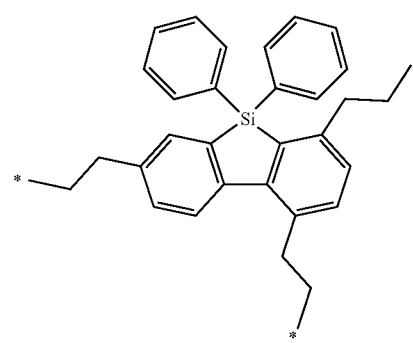
V-103
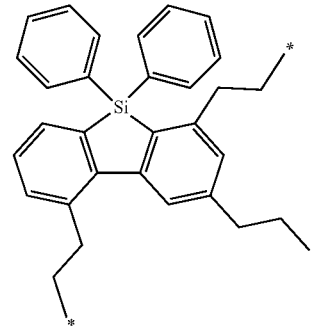
V-104
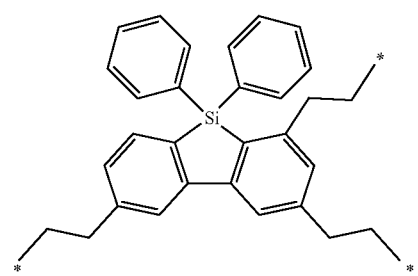
V-105
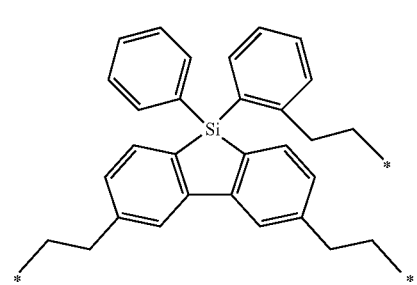

-continued
V-106
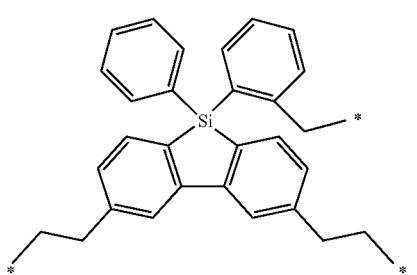
V-107
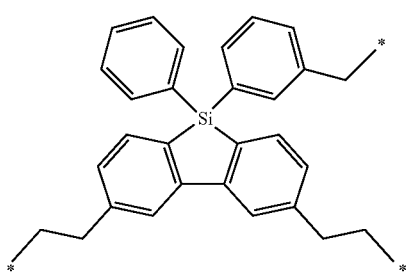
V-108
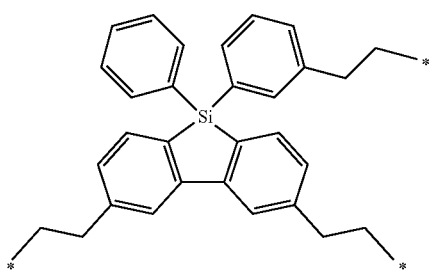
[Chemical Formula 47]
V-109
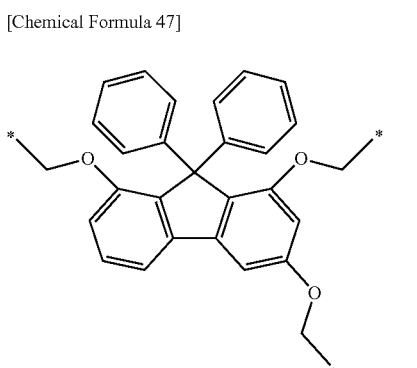
V-110
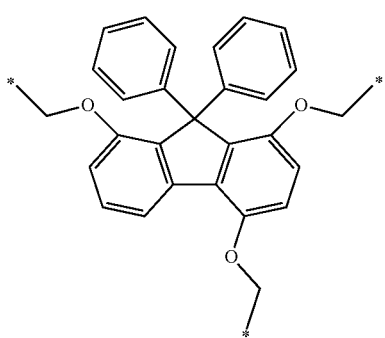
-continued
V-111
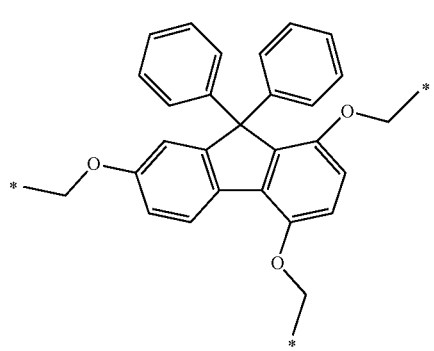
V-112
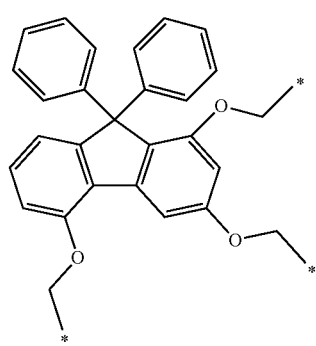
V-113
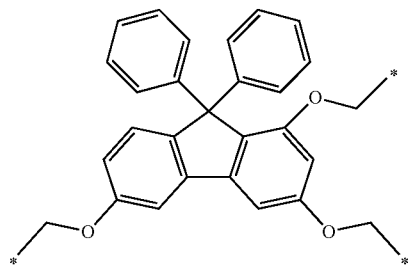
V-114
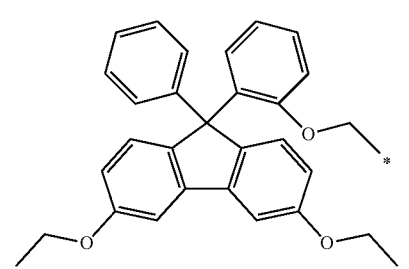
V-115
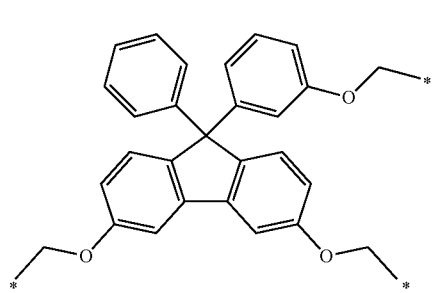

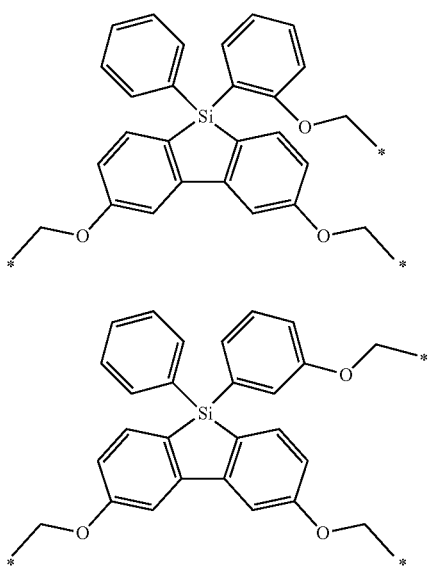

V-116

V-117

[Chemical Formula 48]

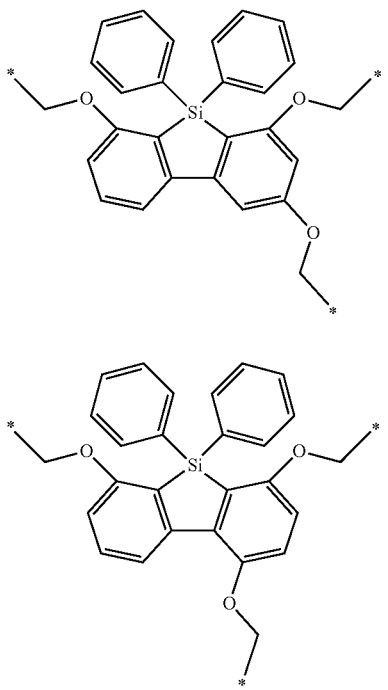

V-118

V-119

V-120

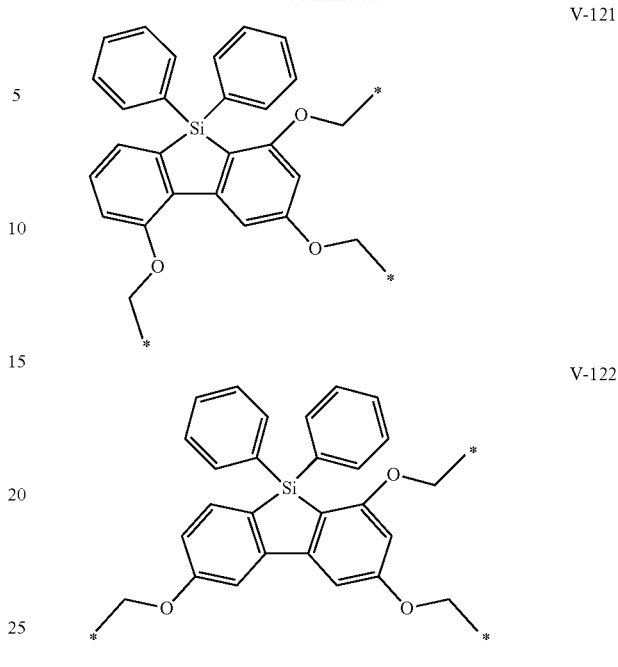

V-121

V-122

In Formula (4), $L_1$ to $L_3$ are each represented by Formula (7)

[Chemical Formula 49]

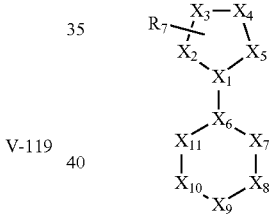

Formula (7)

In above Formula (4), two or all of $L_1$ to $L_3$ represented by above Formula (7) may have the same structure, all of $L_1$ to $L_3$ may have different structures from each other, or any one may have a different structure.

In Formula (7), $X_1$ to $X_5$ represent an atomic group forming a nitrogen-containing heterocycle and are each selected from a carbon or nitrogen atom. At least one of $X_4$ and $X_5$ represents a nitrogen atom, which is or one of which is coordinated with Ir in Formula (4).

Preferred examples of the nitrogen-containing heterocycle represented by $X_1$ to $X_5$ in Formula (7) include imidazole, pyrazolo and triazole rings, of which an imidazole ring is more preferred.

In Formula (7), $X_6$ to $X_{11}$ represent an atomic group forming a five- or six-member aromatic ring and are each selected from a carbon or nitrogen atom, and $X_7$ links with Ir in Formula (4) by a covalent bond.

Preferred examples of the five-member aromatic ring represented by $X_6$ to $X_{11}$ in Formula (7) include thiophene, imidazole, pyrazolo, and triazole rings.

Examples of the six-member aromatic ring represented by $X_6$ to $X_{11}$ in Formula (7) include benzene and pyridine rings, of which a benzene ring is preferred.

The five- or six-member aromatic rings represented by $X_6$ to $X_{11}$ may each have an optional substituent group. The substituent groups may bond together to form a condensed ring. Examples of the substituent groups include alkyl groups, such as methyl, ethyl, trifluoromethyl, and isopropyl groups; alkoxy groups, such as methoxy and ethoxy groups; halogen atoms, such as fluorine atom; cyano groups; nitro groups; dialkylamino groups, such as dimethylamino group; trialkylsilyl groups, such as trimethylsilyl group; triarylsilyl groups, such as triphenylsilyl group; triheteroarylsilyl groups, such as tripyridylsilyl group; benzyl groups; aryl groups, such as phenyl group; and heteroaryl groups, such as pyridyl and carbazolyl groups. Examples of the condensed ring include 9,9'-dimethylfluorene, carbazole, and dibenzofuran.

In Formula (7), $R_7$ represents a substituted or unsubstituted aryl group having seven or more carbon atoms. Examples of the aryl groups represented by $R_7$ in Formula (7) include phenyl, naphthyl, biphenyl, and terphenyl groups, of which a phenyl group is preferred. Examples of a substituent group bonded on the phenyl group include: alkyl groups, such as methyl, ethyl, trifluoromethyl, and isopropyl groups; alkoxy groups, such as methoxy and ethoxy groups; halogen atoms, such as fluorine atom; cyano groups; nitro groups; dialkylamino groups, such as dimethylamino group; trialkylsilyl groups, such as trimethylsilyl group; triarylsilyl groups, such as triphenylsilyl group; triheteroarylsilyl groups, such as tripyridylsilyl group; benzyl groups; aryl groups, such as phenyl group; and heteroaryl groups, such as pyridyl and carbazolyl groups, of which alkyl and aryl groups are preferred.

Formula (7) is also preferably represented by Formula (7A):

[Chemical Formula 50]

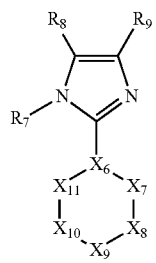

Formula (7A)

In Formula (7A), $R_7$ and the atomic group represented by $X_6$ to $X_{11}$ respectively have the same definition as that of $R_7$ and $X_6$ to $X_{11}$ in Formula (7). In Formula (7A), $R_8$ and $R_9$ each represent a hydrogen atom or a substituent group.

In Formula (4), preferably, at least one of $L_1$ to $L_3$ is represented by (7B).

[Chemical Formula 51]

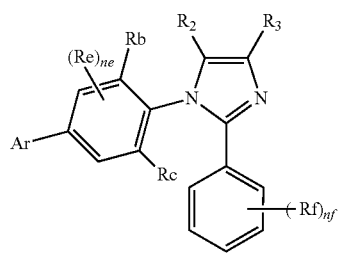

Formula (7B)

In Formula (7B), Rb, Rc and Re each represent a substituent group. Examples of the substituent group represented by Rb, Rc and Re include those exemplified as the substituent group optionally included on the aromatic ring formed by the atomic group represented by $X_6$ to $X_{11}$ in Formula (7). Rb and Rc are preferably an alkyl group, such as methyl, ethyl, and isopropyl groups, a cycloalkyl group, such as cyclohexyl group, or an aryl group, such as phenyl group.

In Formula (7B), ne represents an integer of 0 to 2.

In Formula (7B), $R_2$ and $R_3$ each represent a hydrogen atom or a substituent group. Examples of the substituent group represented by $R_2$ and $R_3$ include those exemplified as the substituent group optionally included on the aromatic ring formed by the atomic group represented by $X_6$ to $X_{11}$ in Formula (7).

In Formula (7B), Ar represents an aryl group, such as phenyl, naphthyl, biphenyl, and terphenyl groups, or a heteroaryl group, such as pyridyl and carbazolyl groups. Ar is preferably a phenyl group.

In Formula (7B), Rf represents a substituent group. Examples of the substituent group represented by Rf include those exemplified as the substituent group optionally included on the aromatic ring formed by the atomic group represented by $X_6$ to $X_{11}$ in Formula (7). In Formula (7B), of represents an integer of 0 to 3.

Non-limiting specific examples of the ortho-metalated iridium complex of the present invention will now be described.

In the ortho-metalated iridium complex of the present invention, any three of the ligands exemplified below are linked by a trivalent linking group represented by V described above. Combination of ligands and corresponding linking group is shown in Table 1 below. In each of the ligands described below, the symbol "*" is a binding site to the linking group and the symbol "**" is a binding site to Ir in Formula (4).

[Chemical Formula 52]

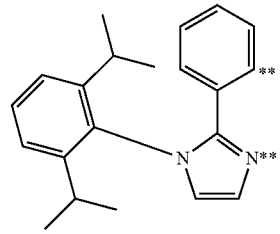

L-1

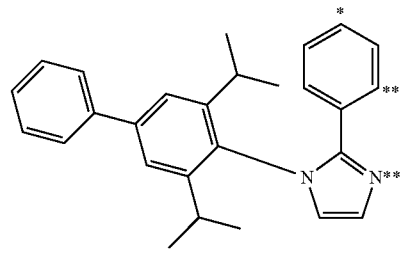

L-2

-continued
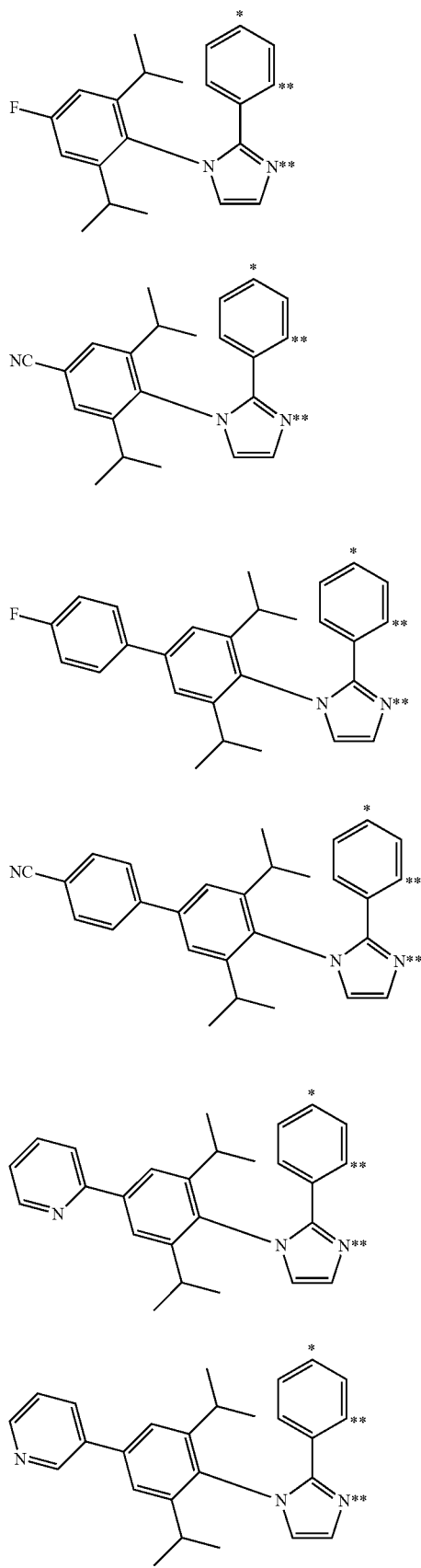
L-3
L-4
L-5
L-6
L-7
L-8
-continued
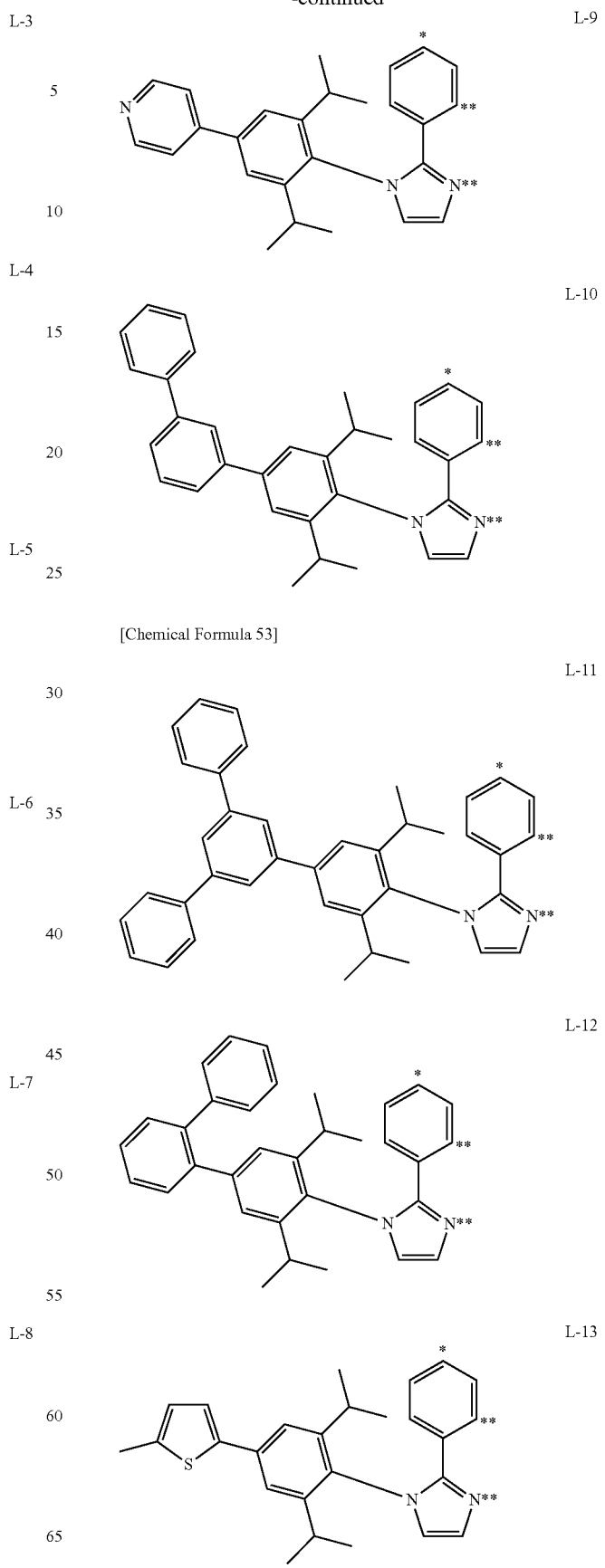
L-9
L-10
[Chemical Formula 53]
L-11
L-12
L-13

L-14
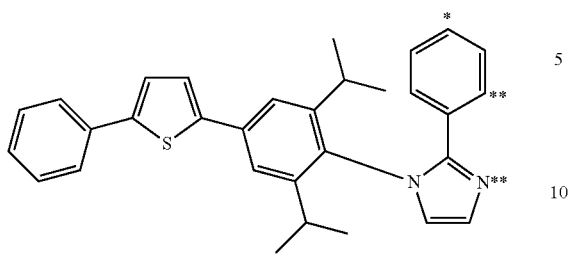
L-15
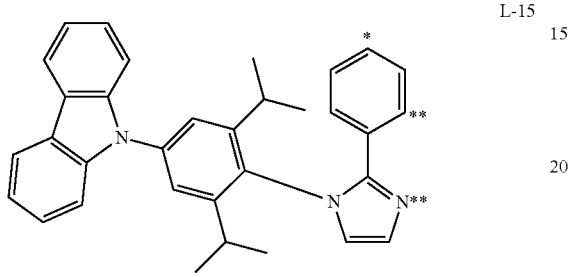
L-16
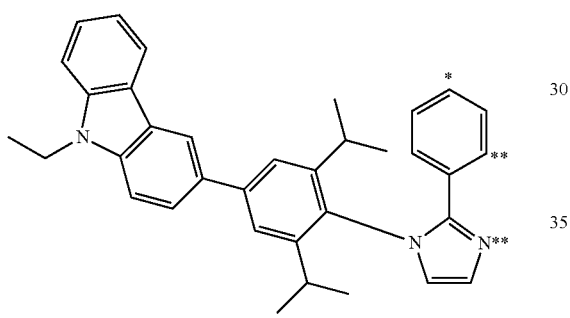
L-17
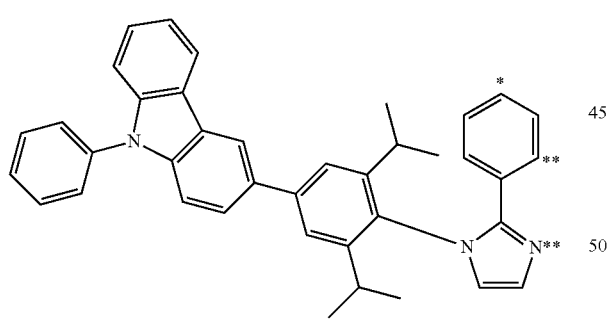
L-18
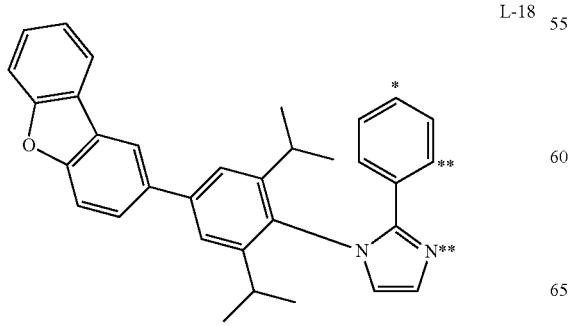
L-19
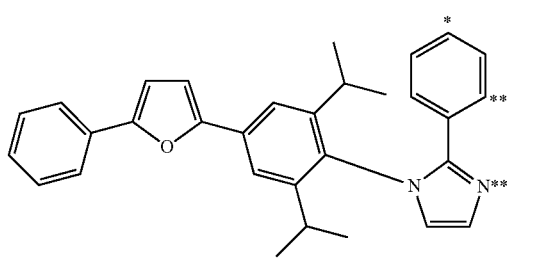
L-20
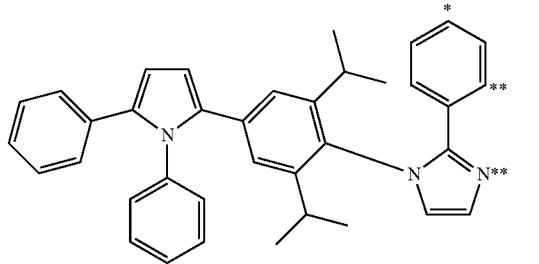
[Chemical Formula 54]
L-21
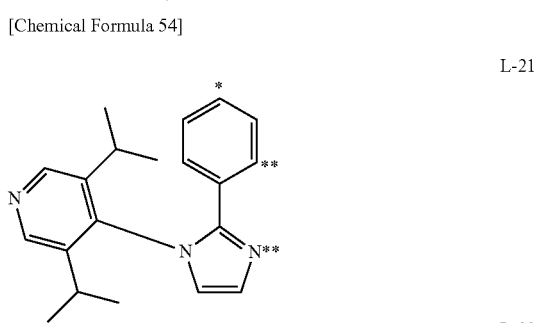
L-22
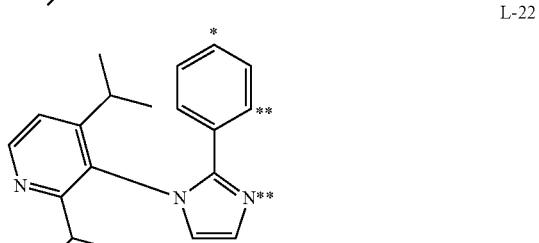
L-23
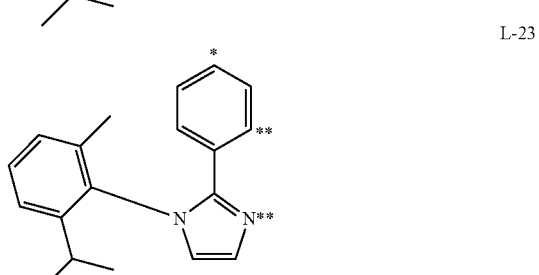
L-24
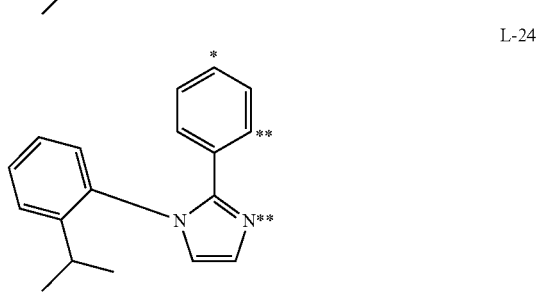

L-25 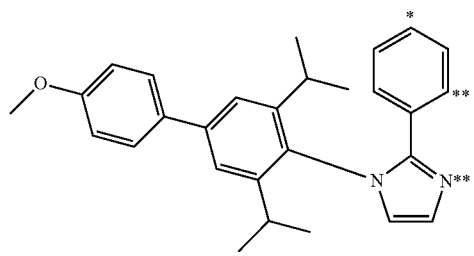
L-26 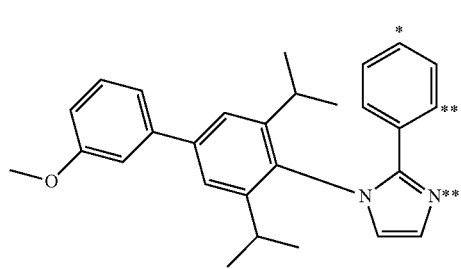
L-27 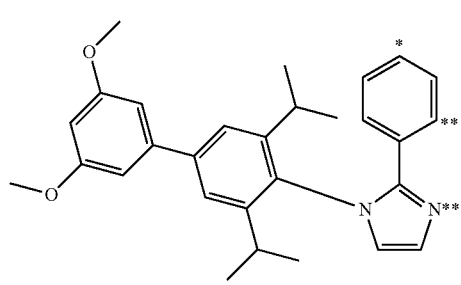
L-28 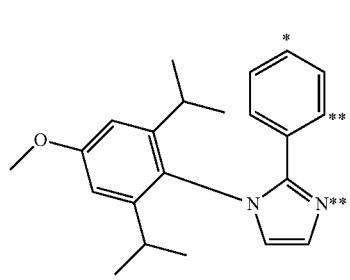
L-29 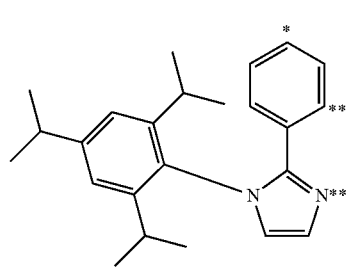
L-30 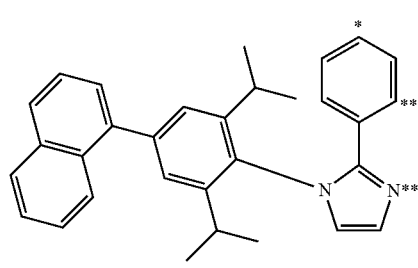
L-31 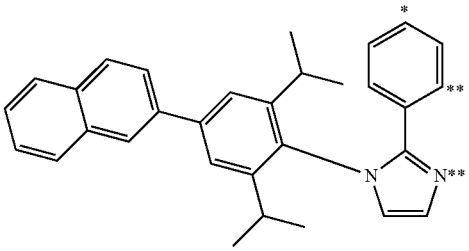
L-32 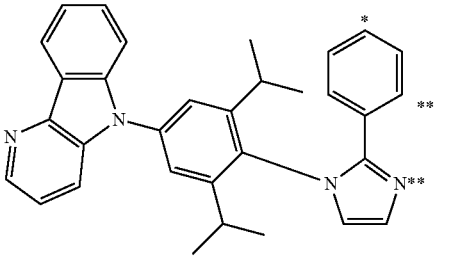
[Chemical Formula 55]
L-33 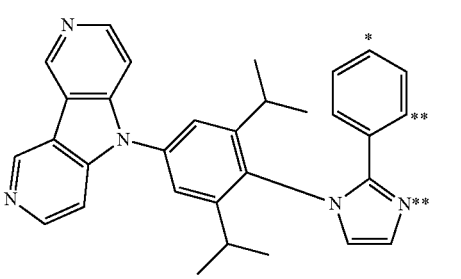
L-34 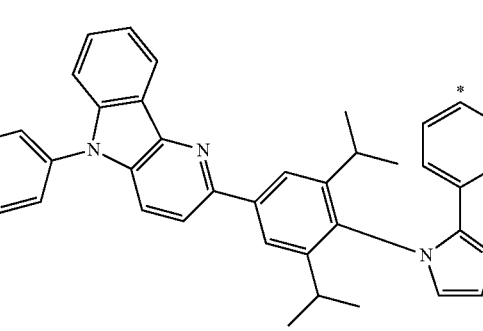
L-35 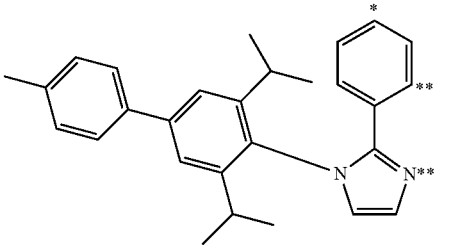
L-36 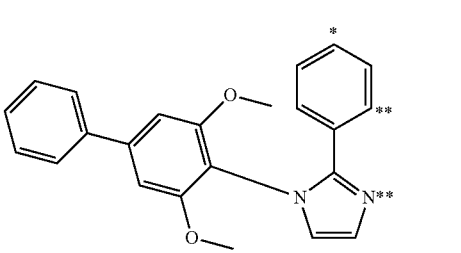

L-37
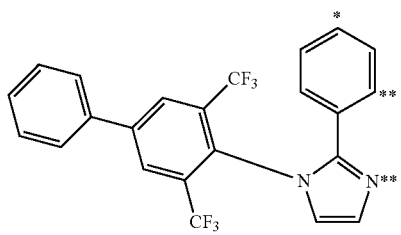
L-38
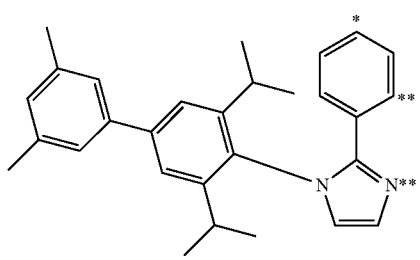
L-39
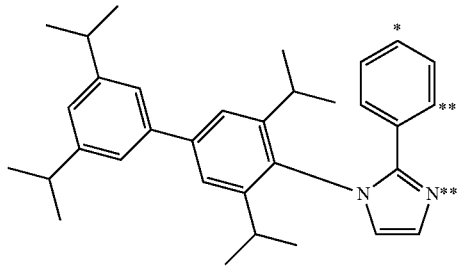
L-40
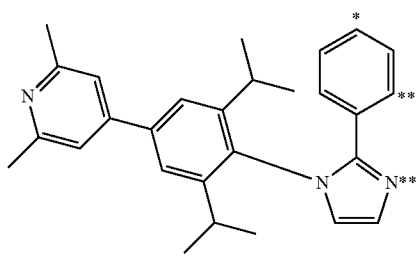
L-41
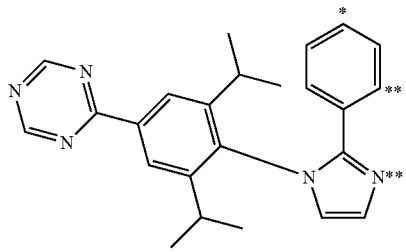
L-42
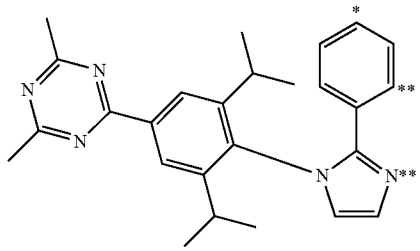
[Chemical Formula 56]
L-43
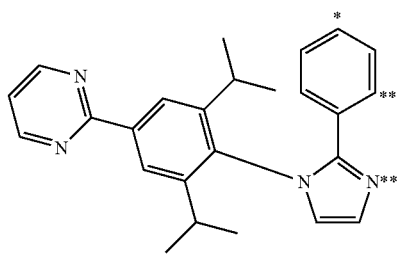
L-44
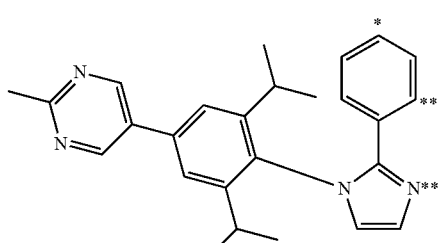
L-45
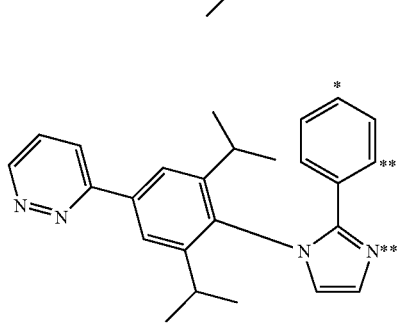
L-46
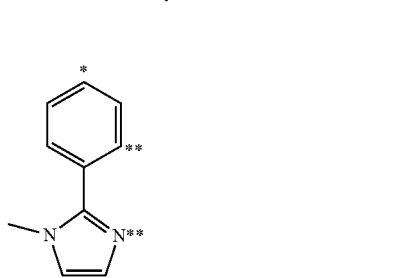
L-46-2
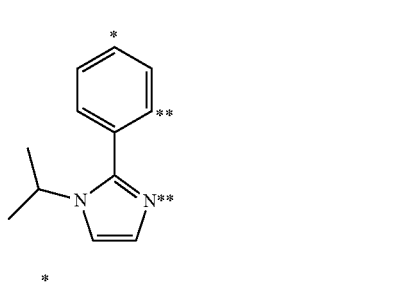
L-47
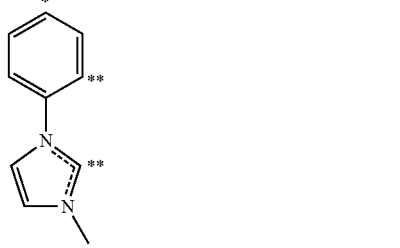

L-48 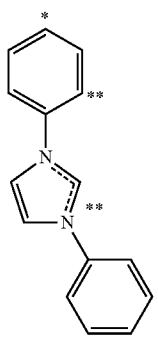
L-49 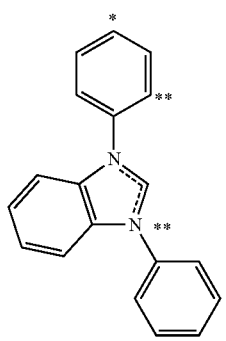
L-50 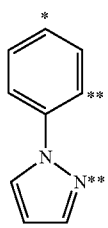
L-51 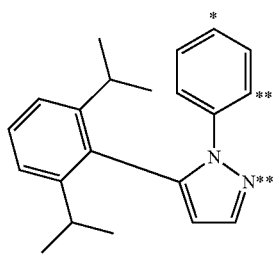
L-52 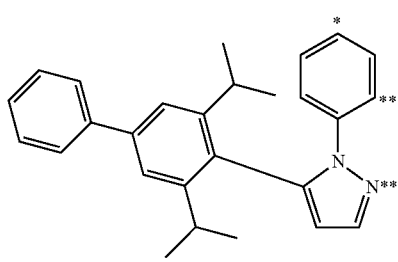
L-53 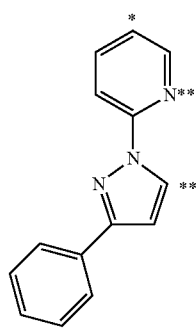
L-54 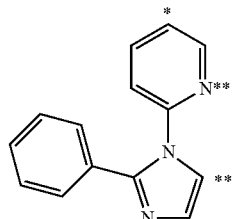
L-55 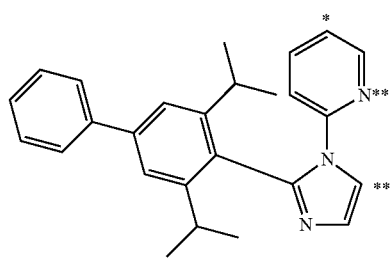
[Chemical Formula 57]
L-56 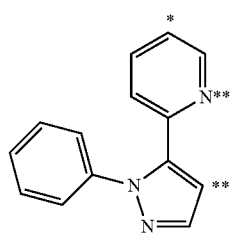
L-57 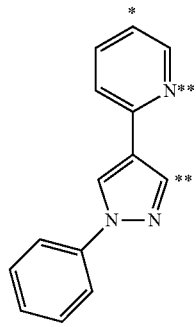

-continued
L-58
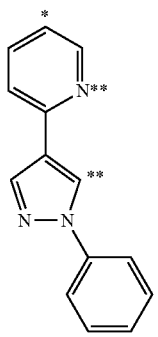
L-59
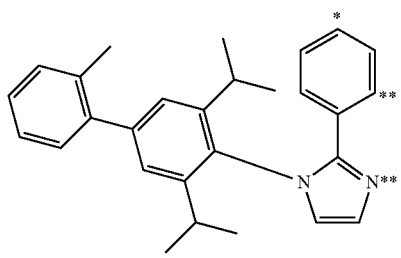
L-60
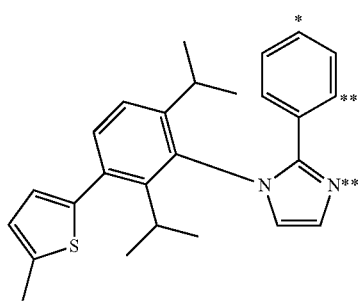
L-62
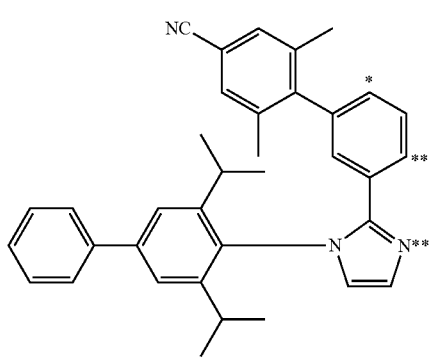
L-63
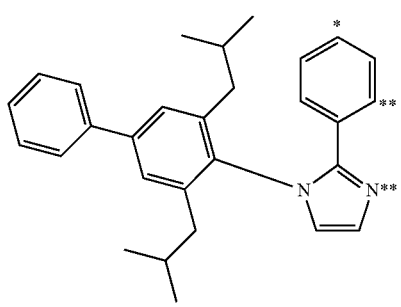
-continued
L-64
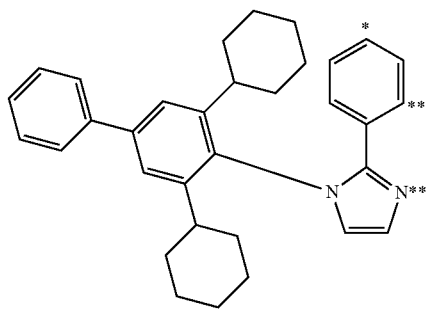
[Chemical Formula 58]
L-65
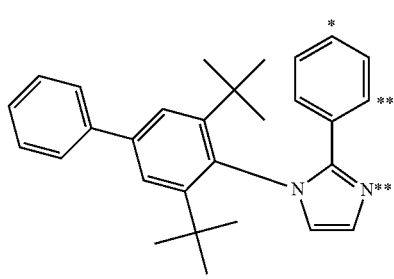
L-66
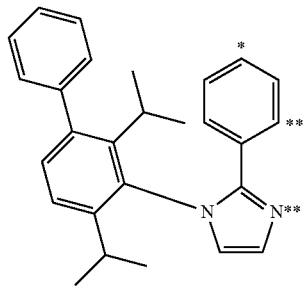
L-67
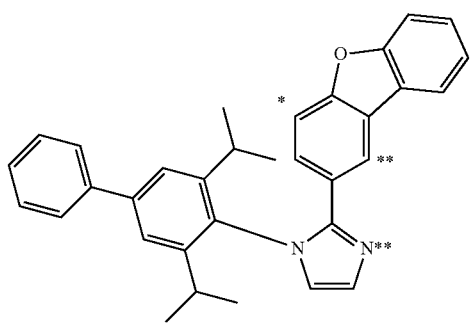
L-68
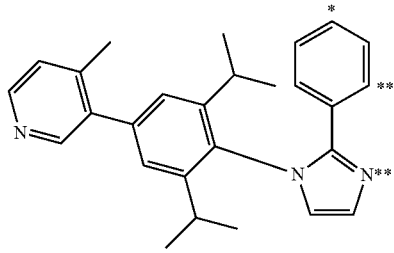

L-69 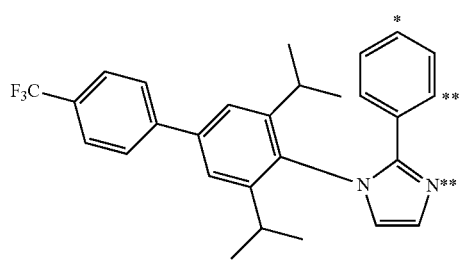
L-70 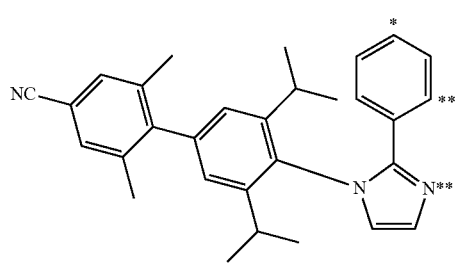
L-74 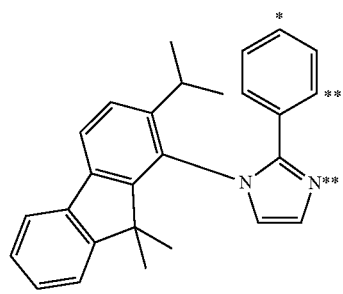
L-75 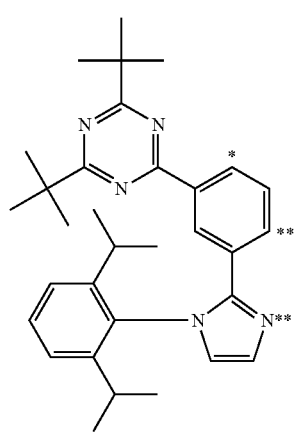
[Chemical Formula 59]
L-76 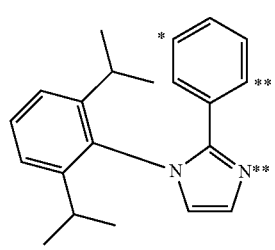
L-77 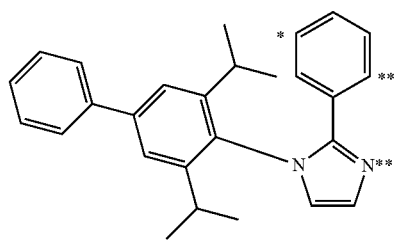
L-78 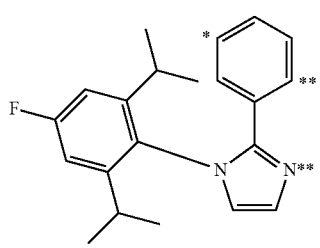
L-79 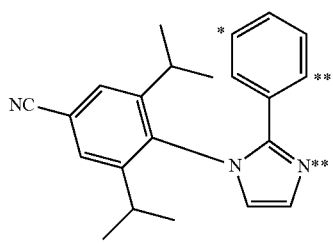
L-80 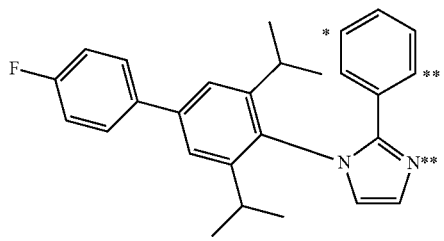
L-81 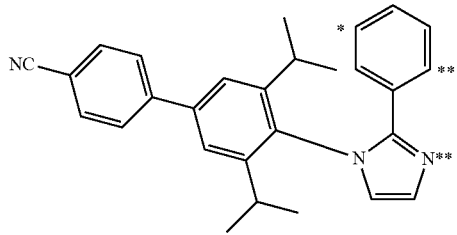
L-82 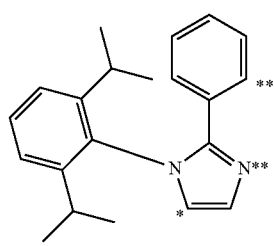

-continued
L-83
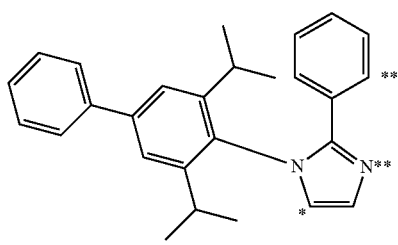
L-84
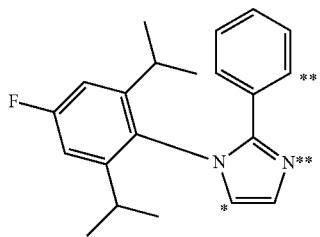
L-85
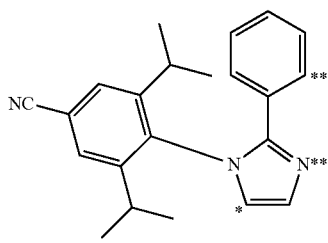
L-86
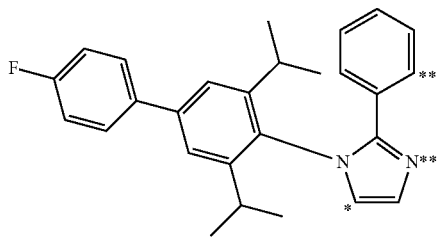
L-87
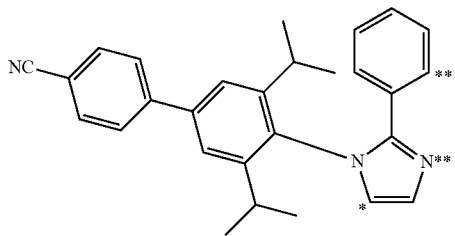
[Chemical Formula 60]
L-88
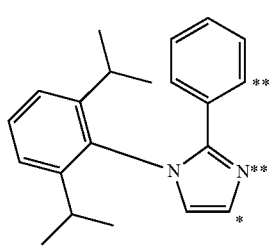
-continued
L-89
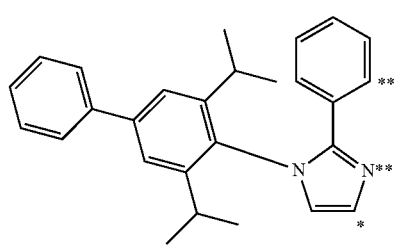
L-90
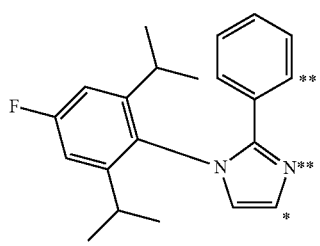
L-91
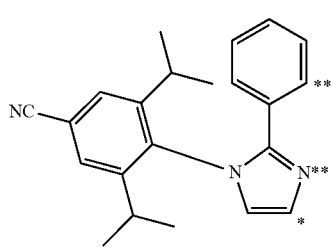
L-92
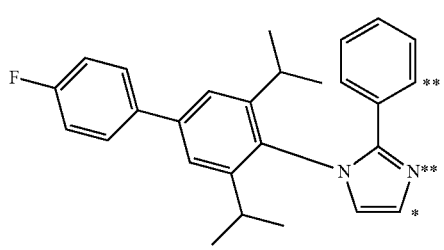
L-93
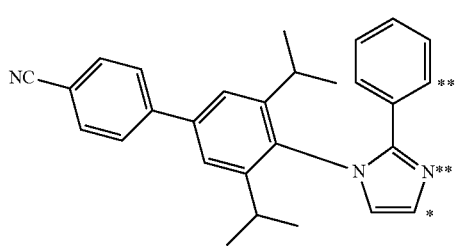
L-94
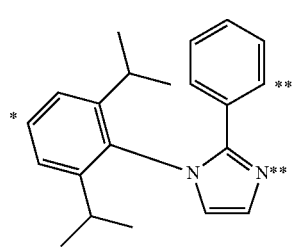

L-95
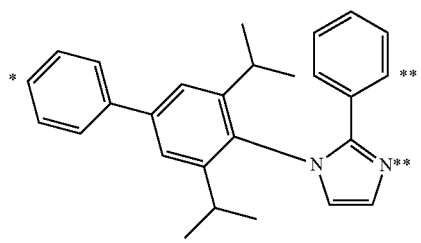
L-96
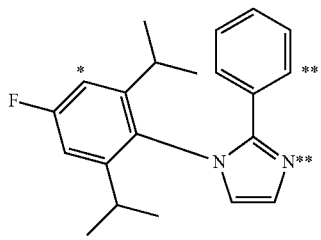
L-97
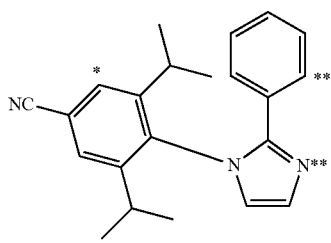
L-98
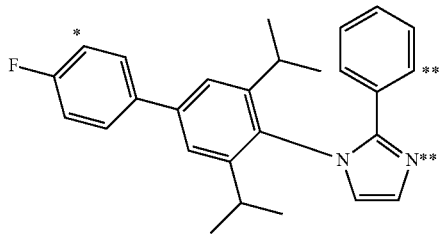
L-99
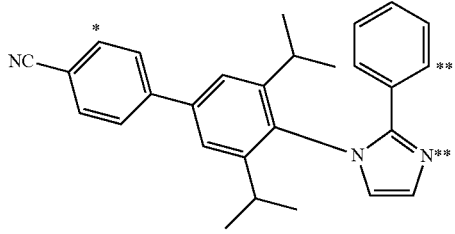
[Chemical Formula 61]
L-100
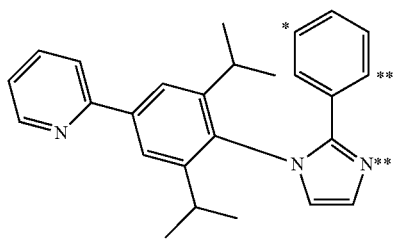
L-101
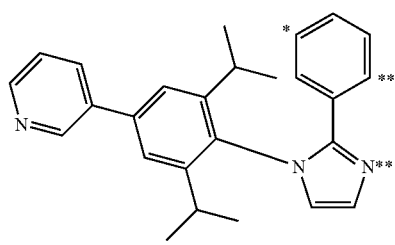
L-102
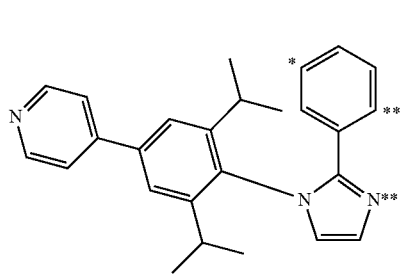
L-103
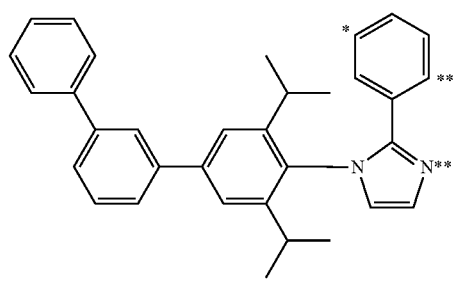
L-104
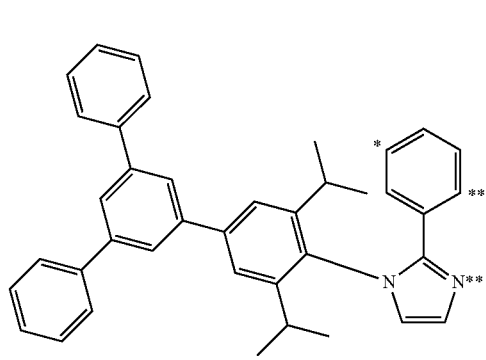
L-105
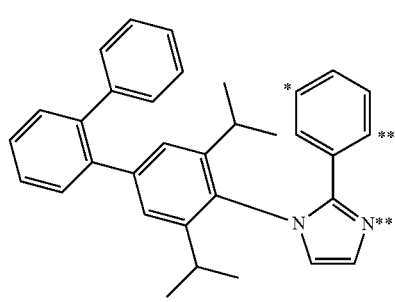

L-106
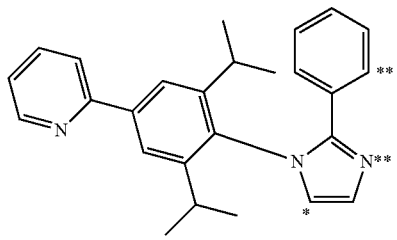
L-107
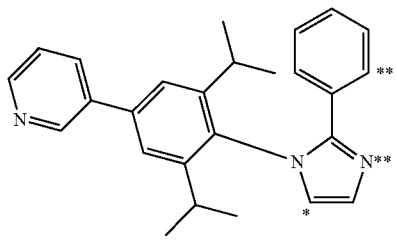
L-108
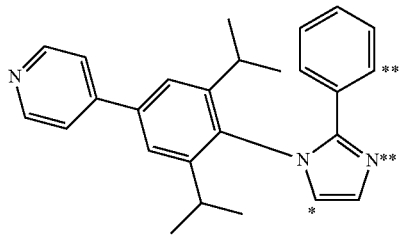
L-109
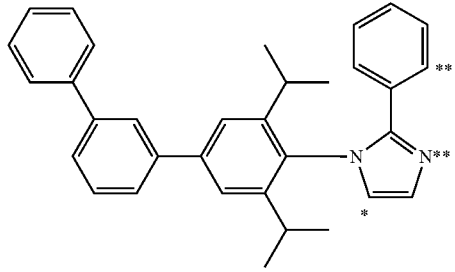
L-110
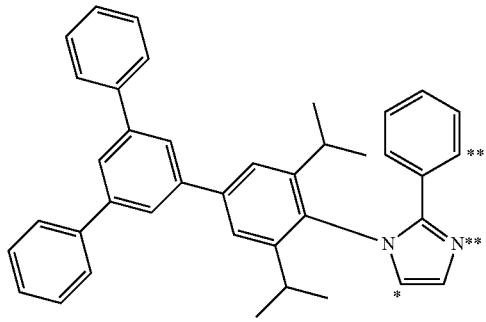
L-111
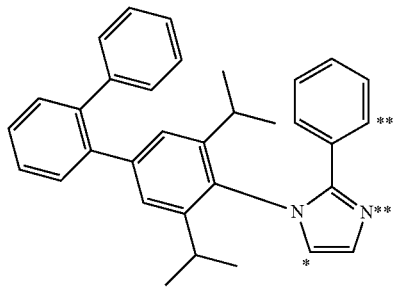
[Chemical Formula 62]
L-112
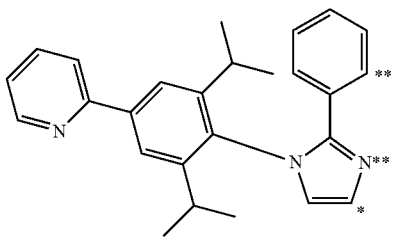
L-113
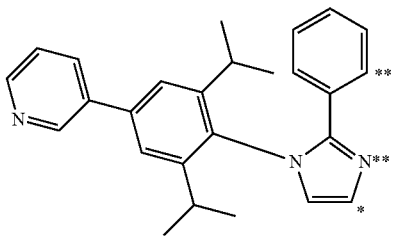
L-114
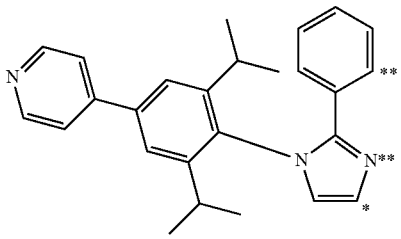
L-115
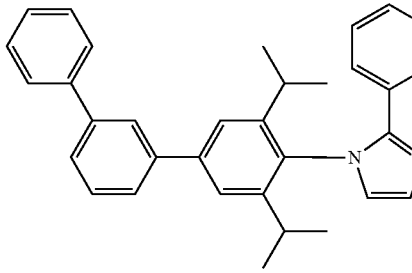
L-116
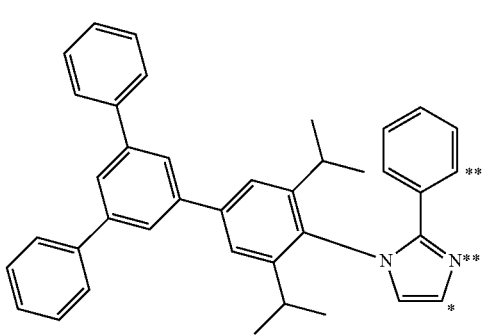

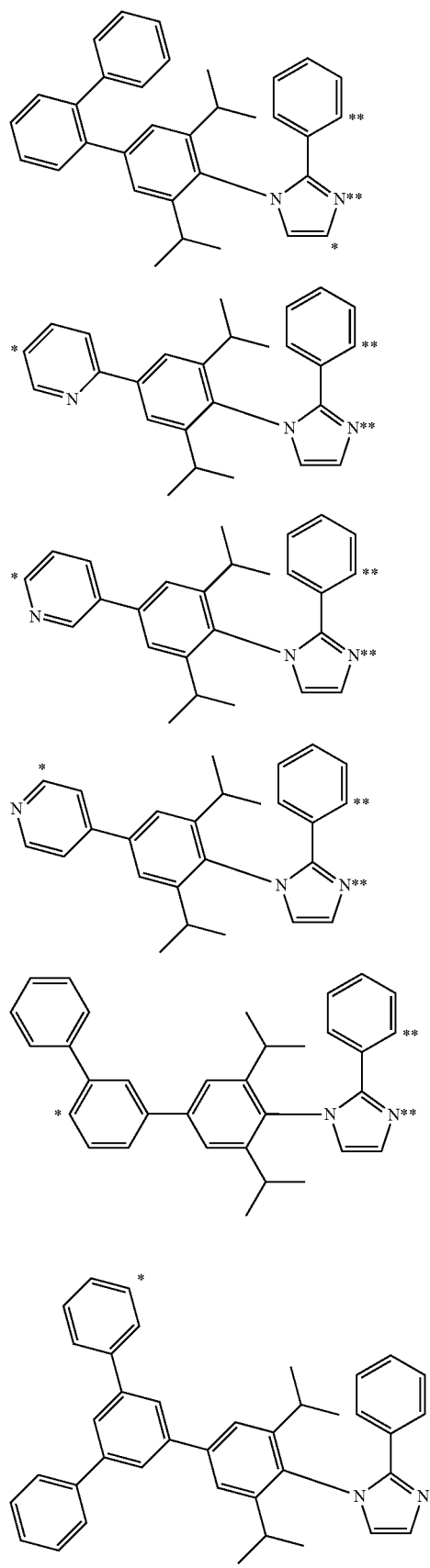
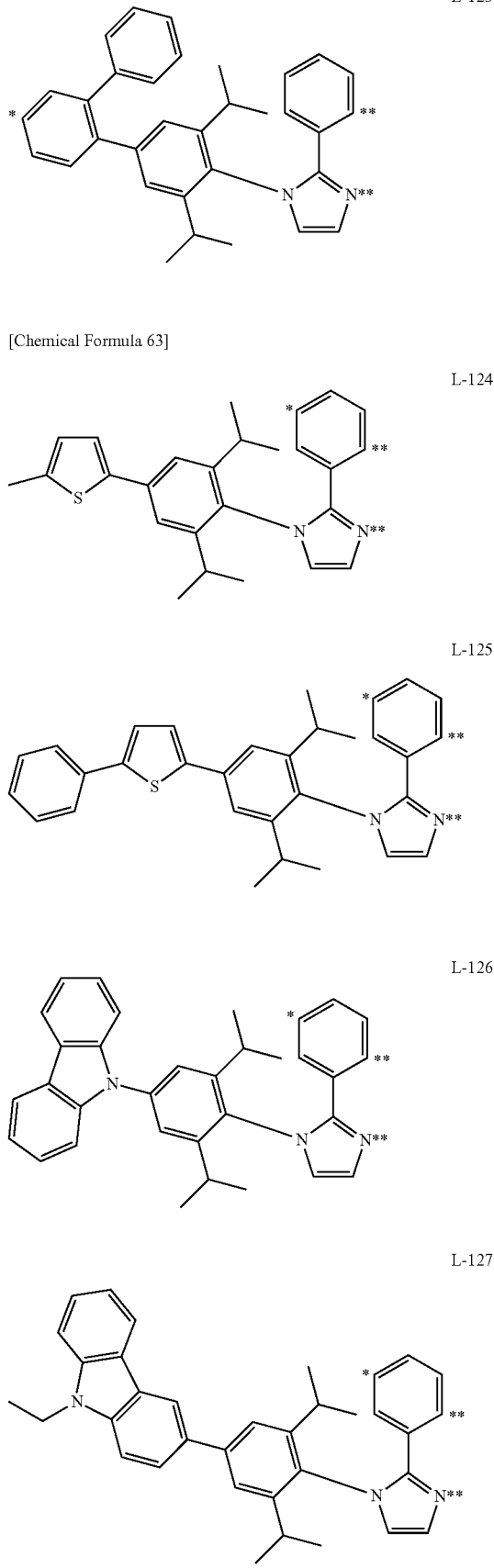
[Chemical Formula 63]

L-128
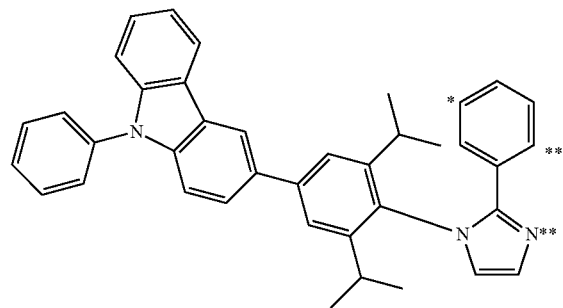
L-129
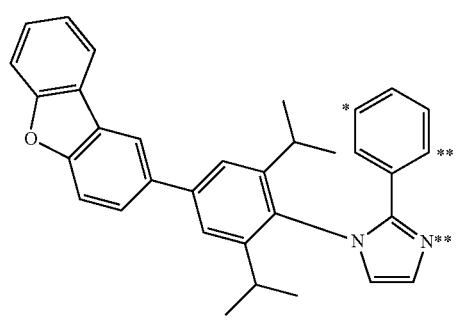
L-130
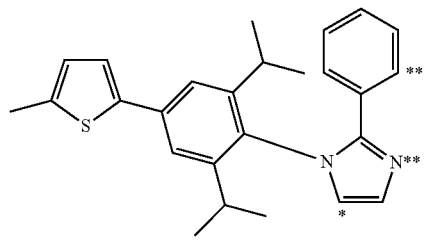
L-131
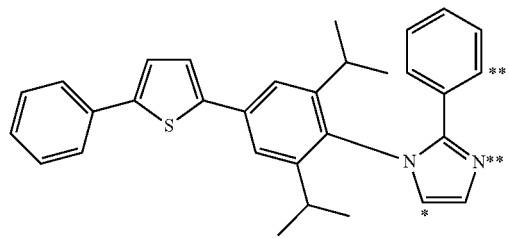
L-132
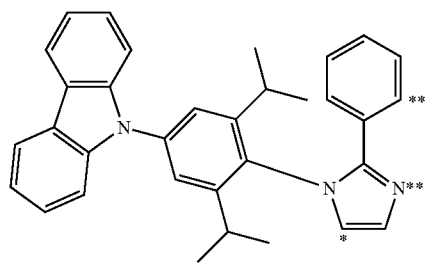
L-133
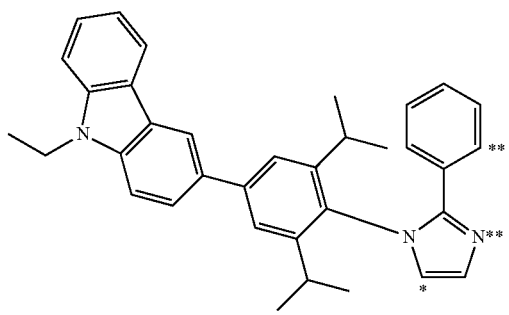
L-134
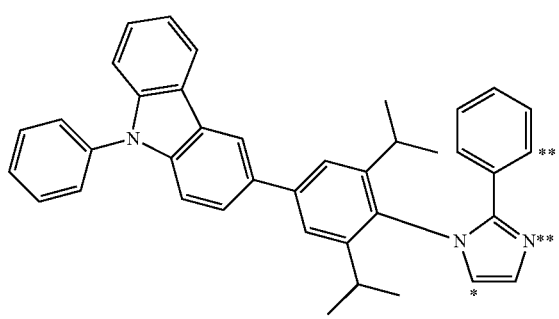
L-135
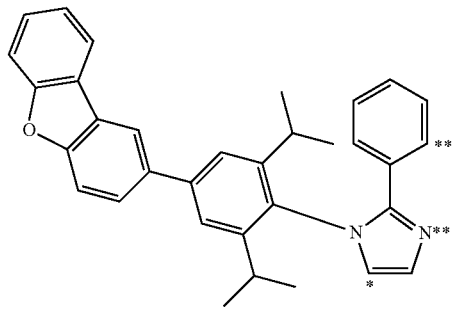
[Chemical Formula 64]
L-136
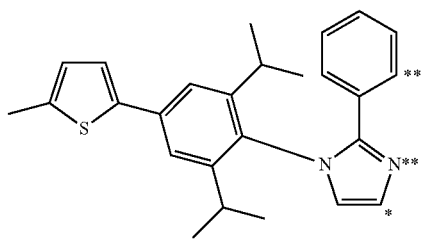

L-137
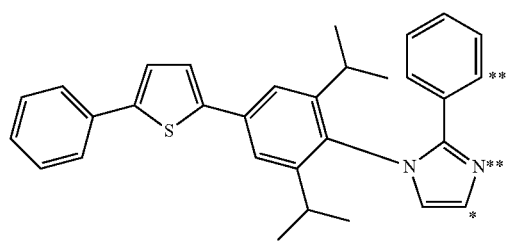
L-138
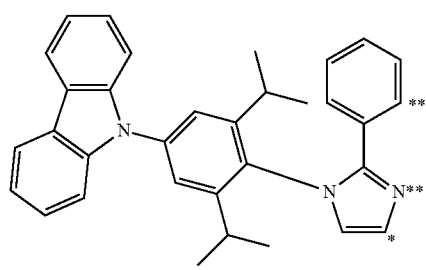
L-139
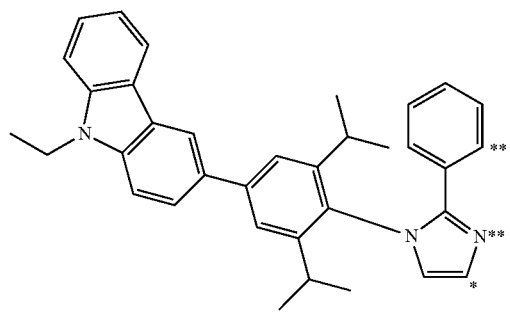
L-140
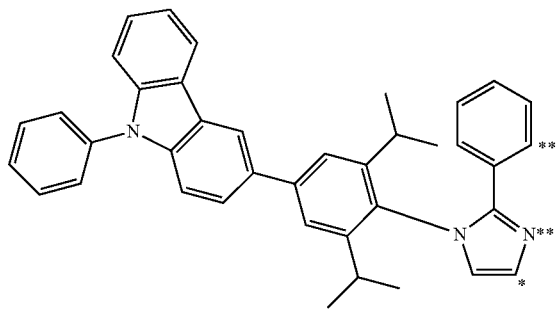
L-141
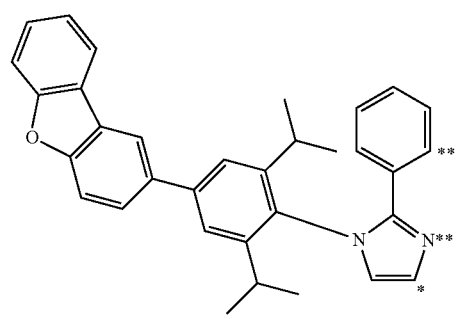
Non-limiting specific examples of the phosphorescent compounds represented by Formulae (1), (2), (3) and (4) will now be described.
<Specific Examples of the Phosphorescent Compounds Represented by Formulae (1) and (2)>
[Chemical Formula 65]
D-1
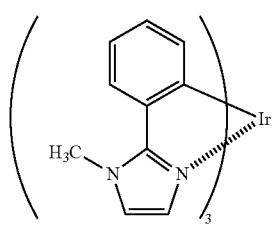
D-2
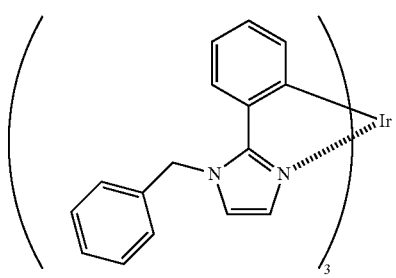
D-3
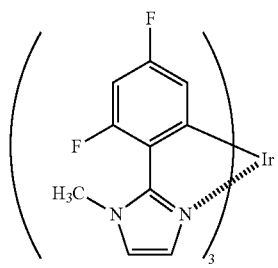
D-4
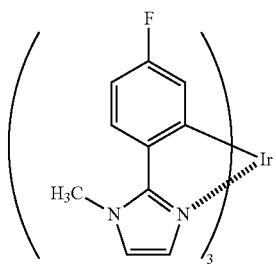

-continued
D-5
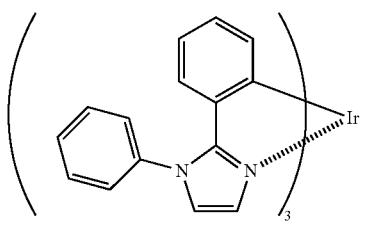
D-6
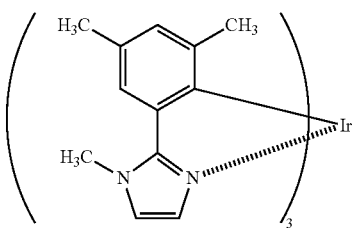
D-7
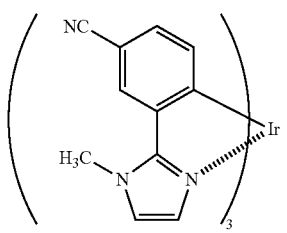
D-8
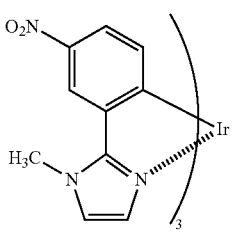
D-9
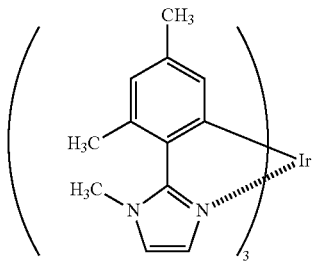
D-10
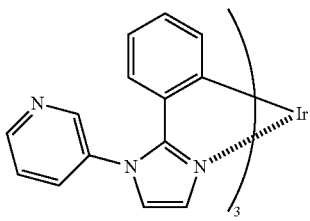
D-11
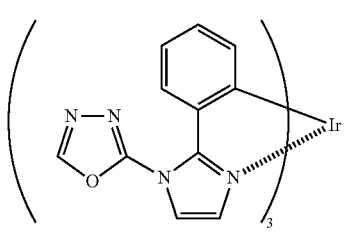
D-12
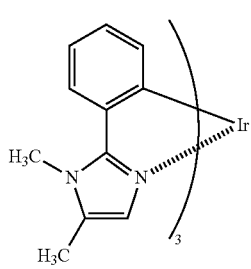
D-13
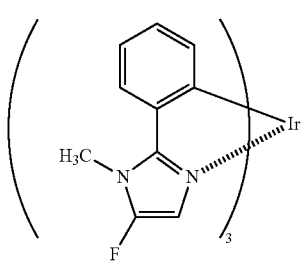
D-14
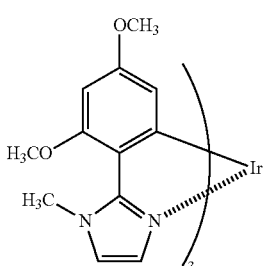
D-15
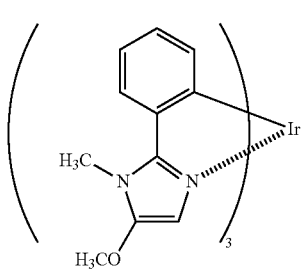

[Chemical Formula 66]
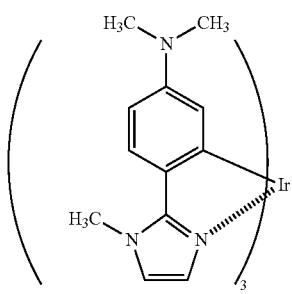 D-16
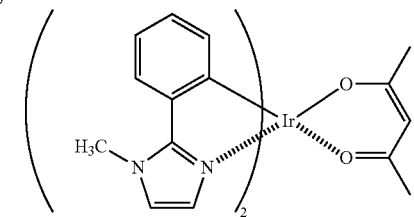 D-17
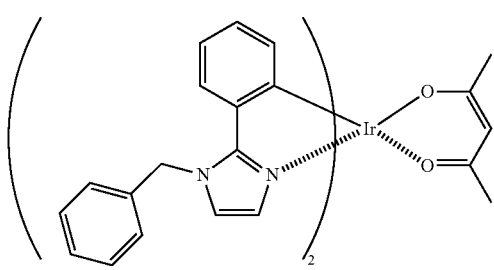 D-18
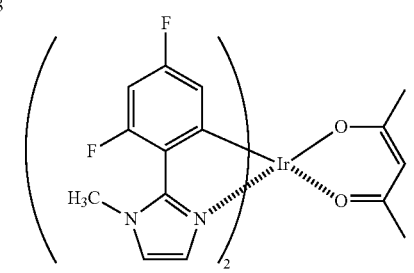 D-19
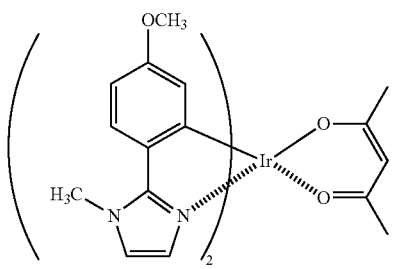 D-20
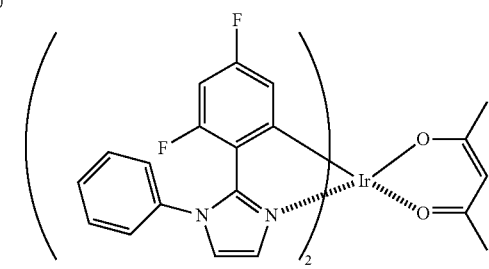 D-21
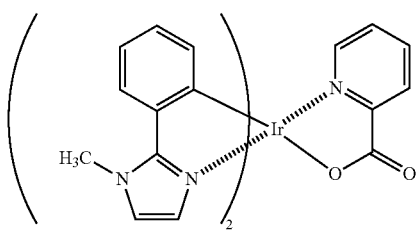 D-22
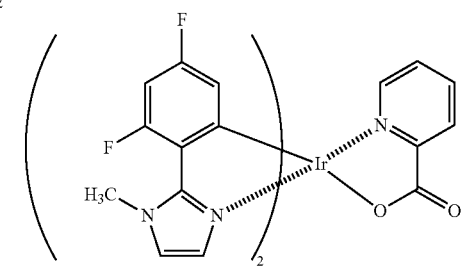 D-23
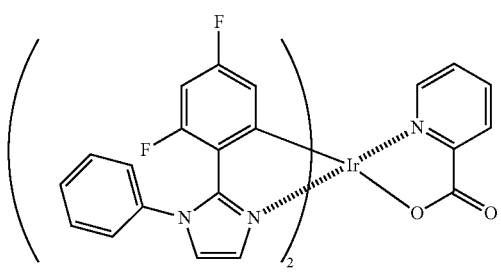 D-24
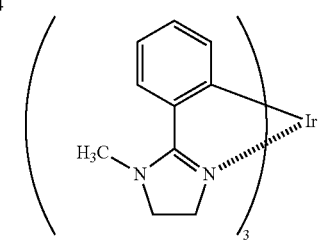 D-25

[Chemical Formula 67]
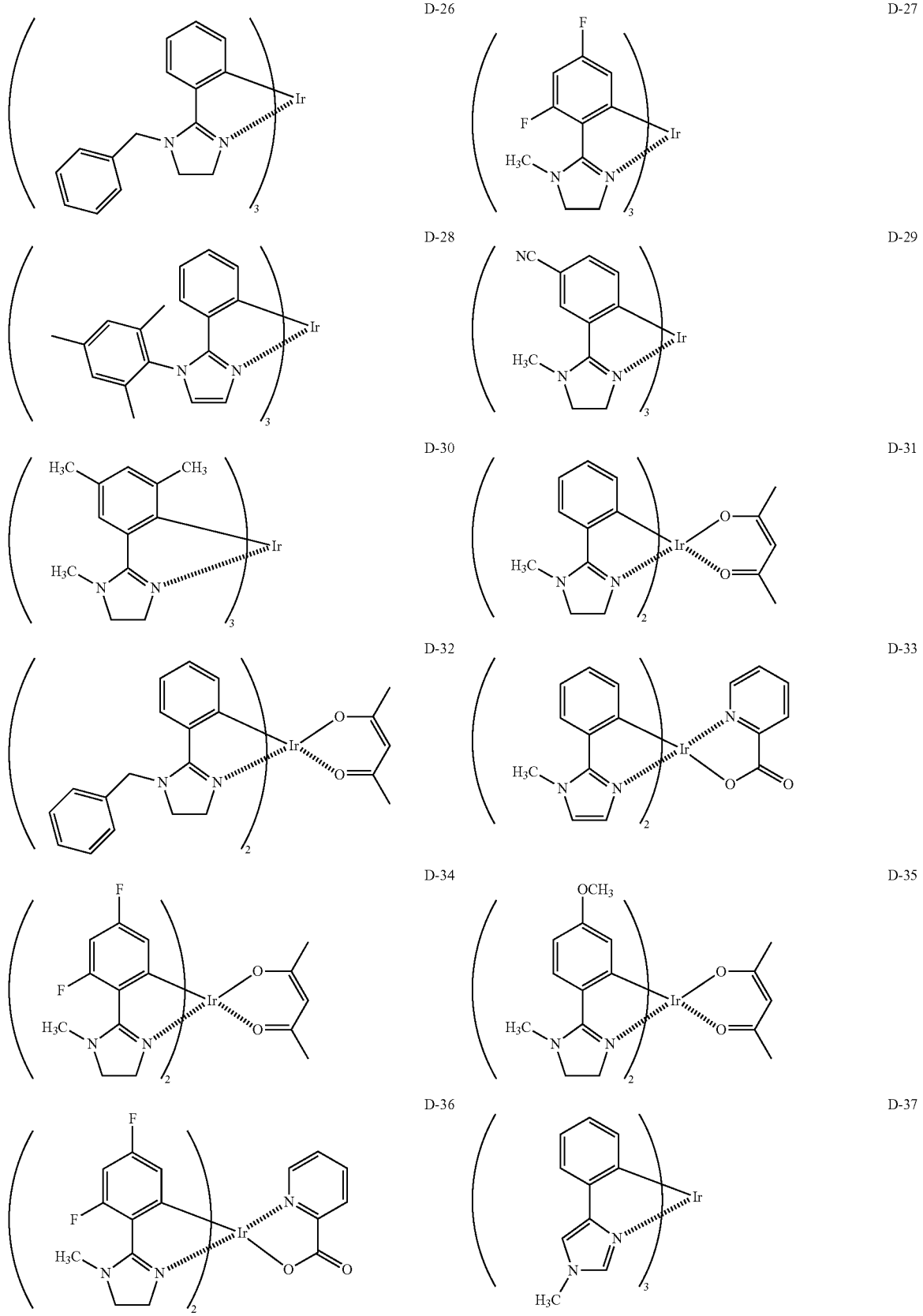

-continued
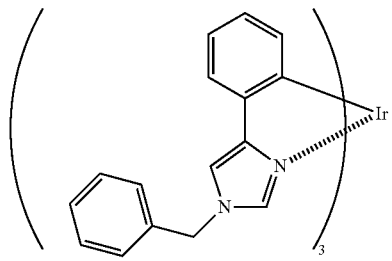
[Chemical Formula 68]
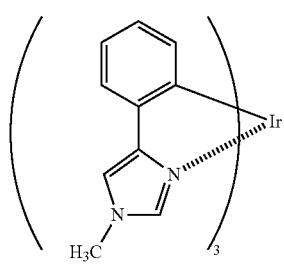
D-39
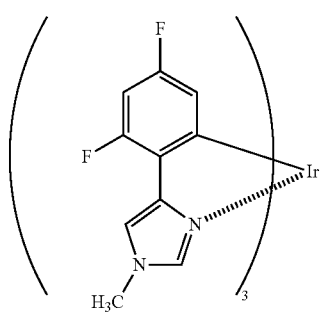
D-40
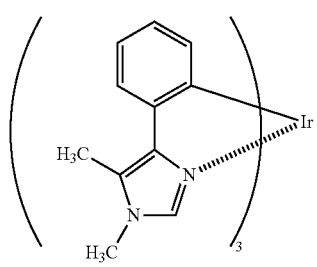
D-41
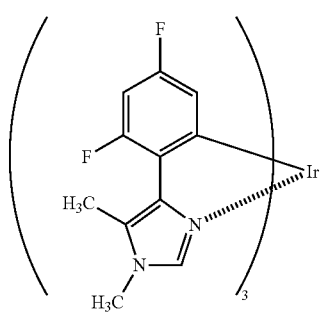
D-42
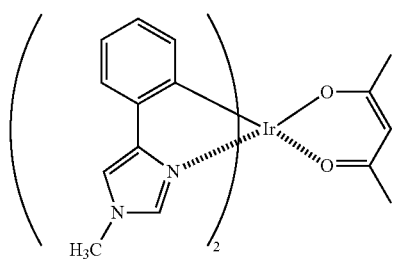
D-43
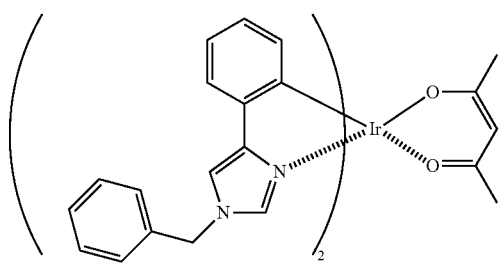
D-44
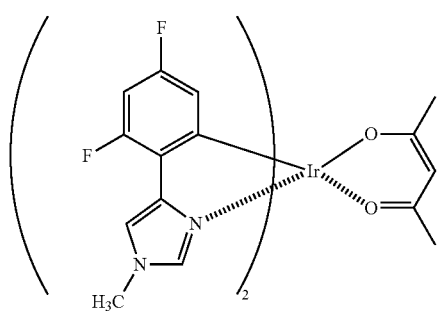
D-45
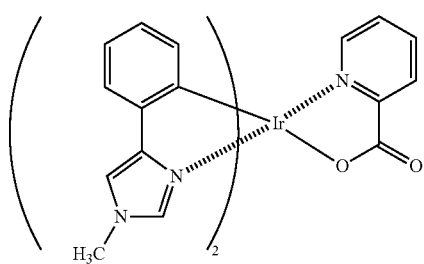
D-46
D-38

-continued
D-47 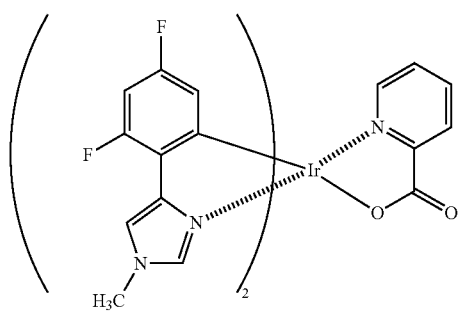
D-48 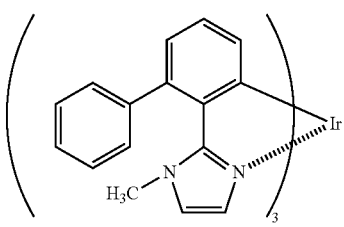
D-49 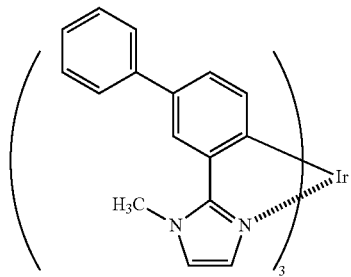
D-50 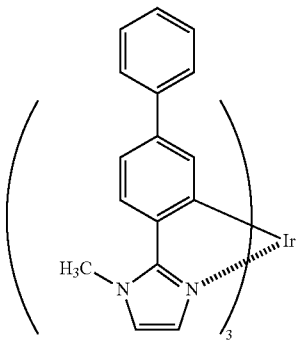
D-51 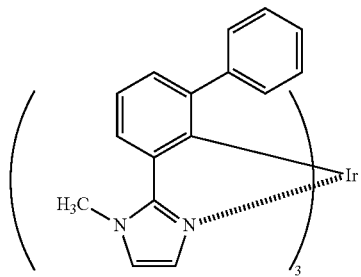
[Chemical Formula 69]
D-52 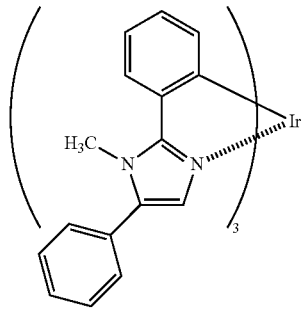
D-53 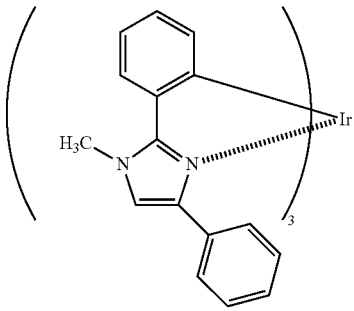
D-54 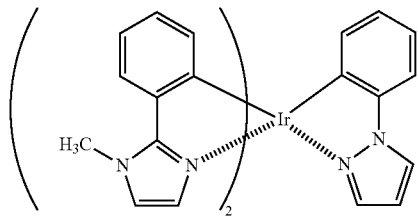
D-55 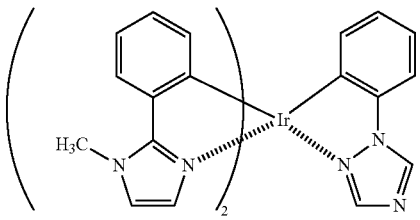

-continued
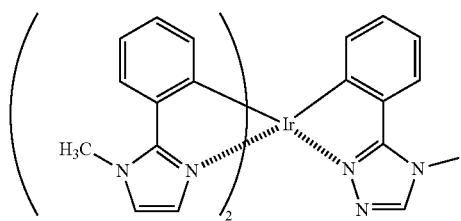
D-56
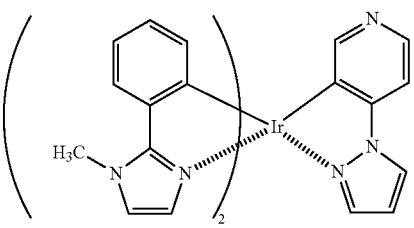
D-57
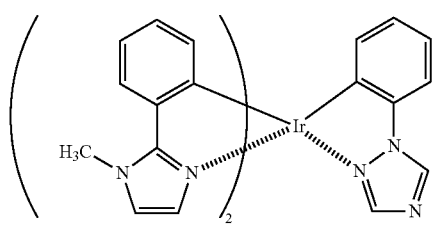
D-58
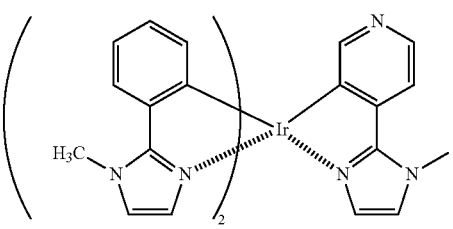
D-59
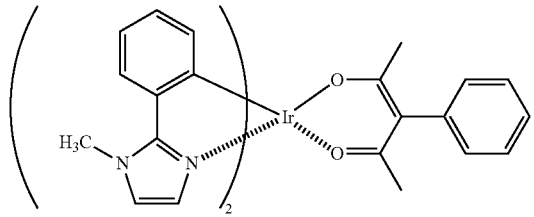
D-60
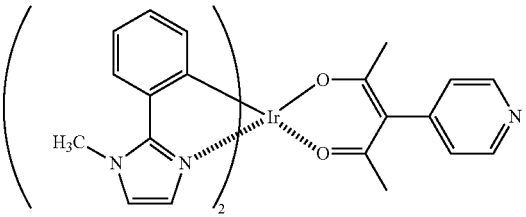
D-61
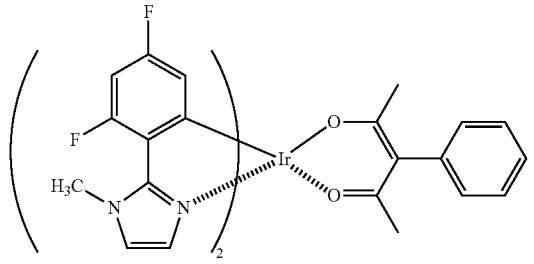
D-62
[Chemical Formula 70]
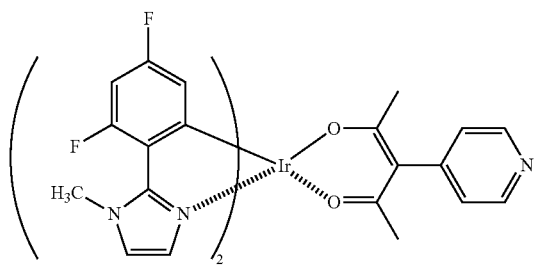
D-63
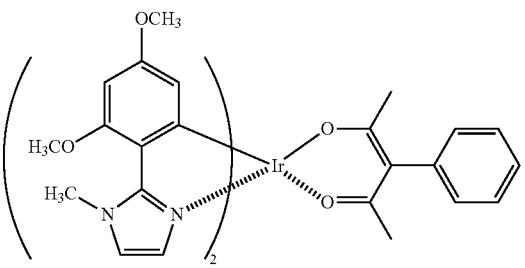
D-64
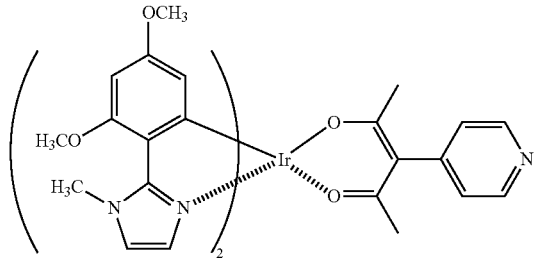
D-65
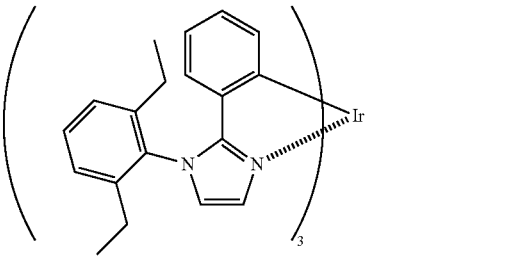
D-66

[Chemical Formula 71]
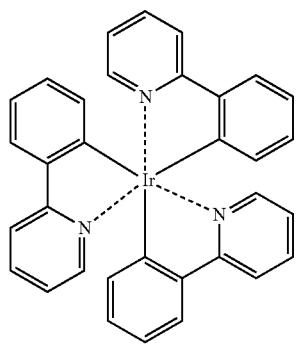
D-67
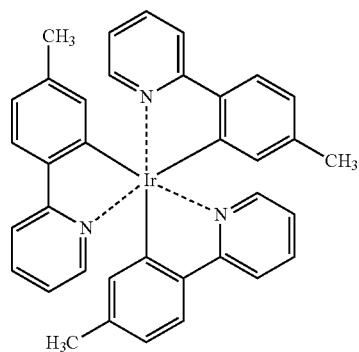
D-68
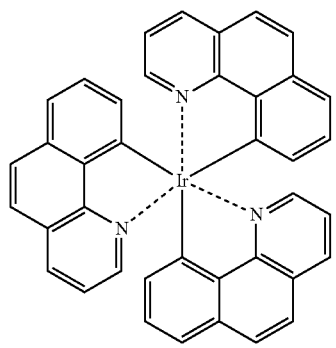
D-69
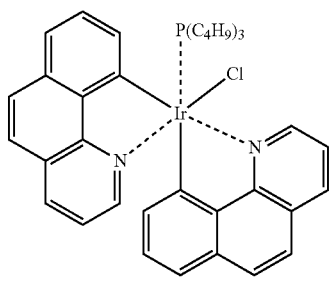
D-70
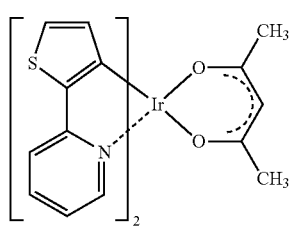
D-71
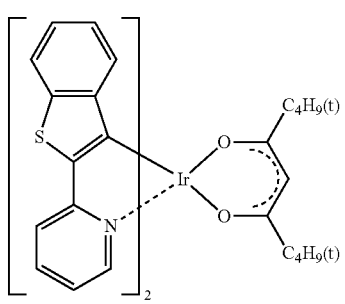
D-72
[Chemical Formula 72]
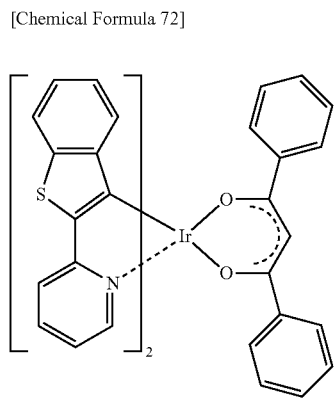
D-73
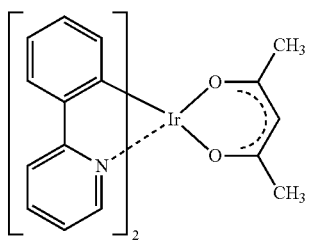
D-74

-continued
D-75 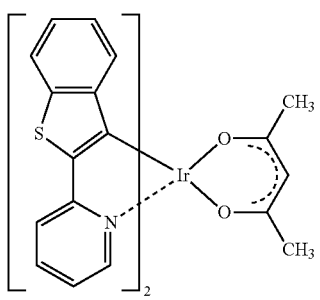
D-76 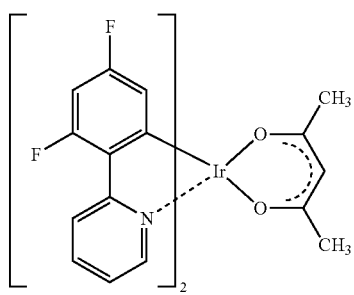
D-77 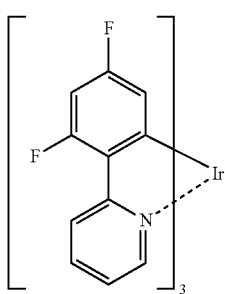
D-78 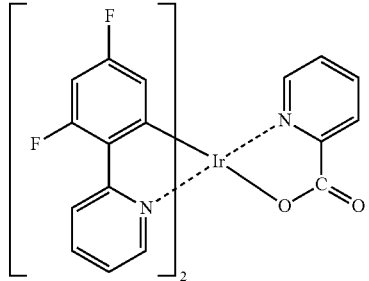
D-79 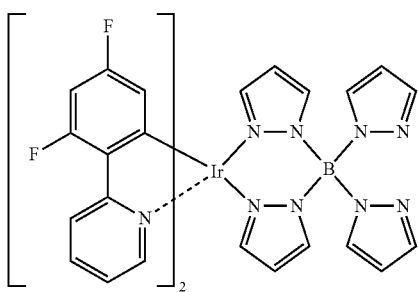
D-80 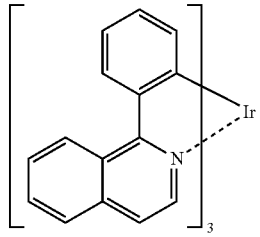
[Chemical Formula 73]
D-81 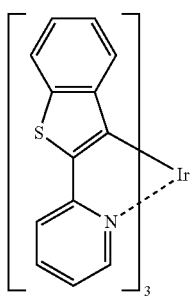
D-82 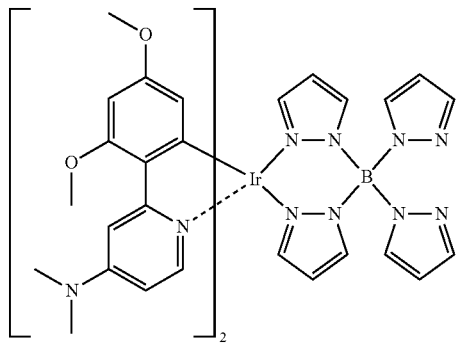
[Chemical Formula 74]
D-83 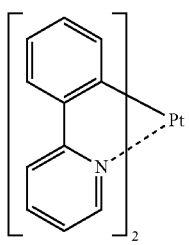
D-84 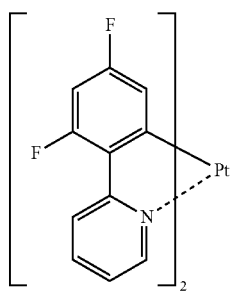

-continued
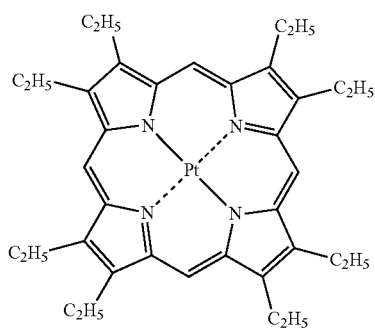
D-85
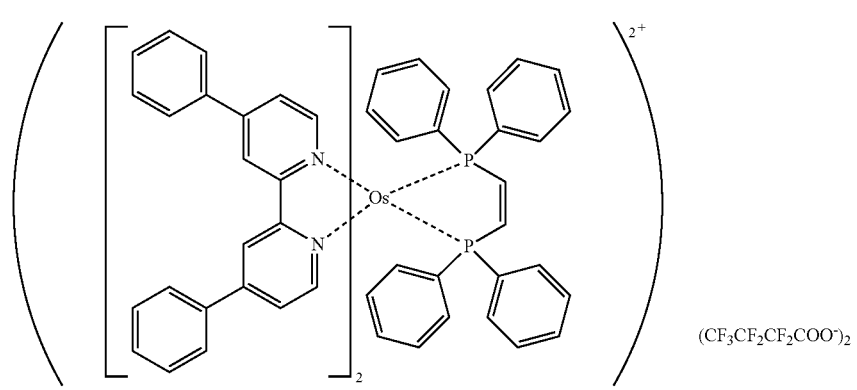
D-86
[Chemical Formula 75]
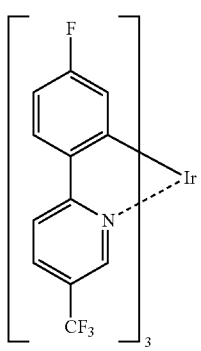
D-87
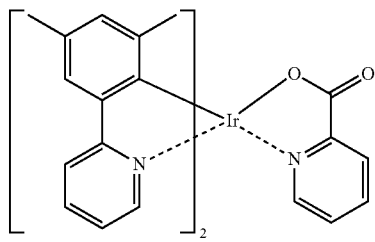
D-88
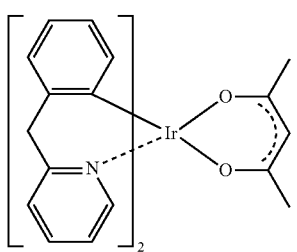
D-89
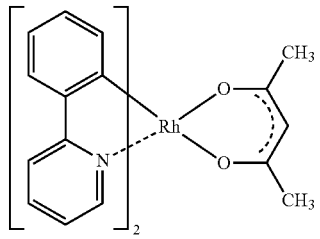
D-90
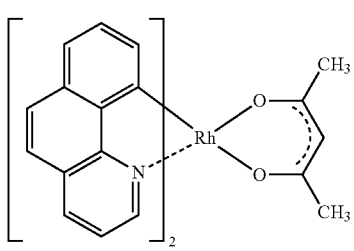
D-91
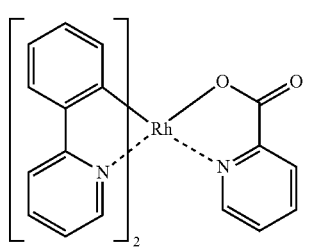
D-92

-continued
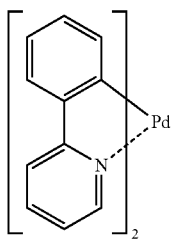 D-93
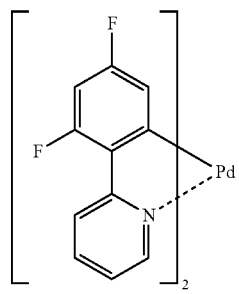 D-94
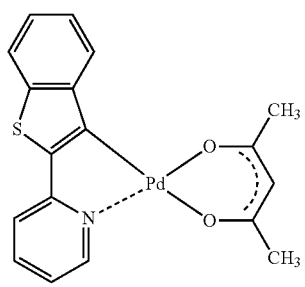 D-95
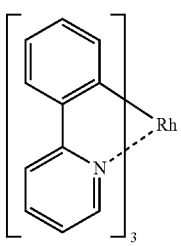 D-96
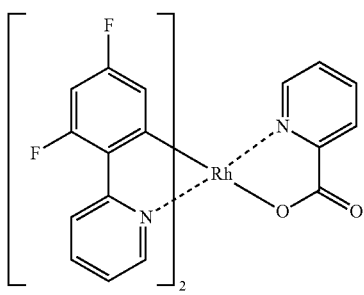 D-97
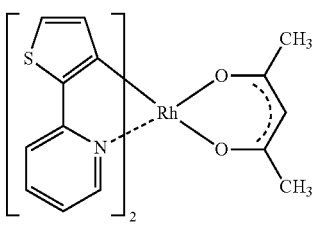 D-98
[Chemical Formula 76]
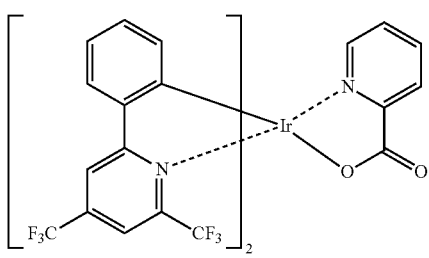 D-99
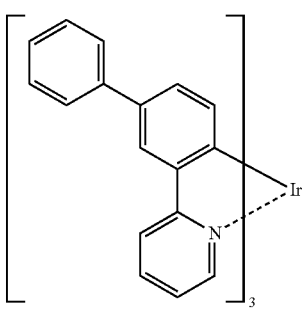 D-100
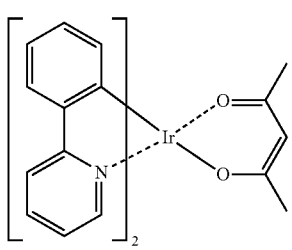 D-101
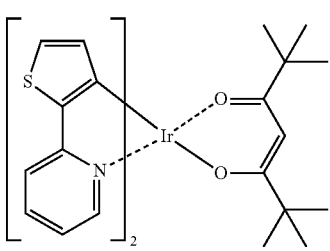 D-102

-continued
D-103
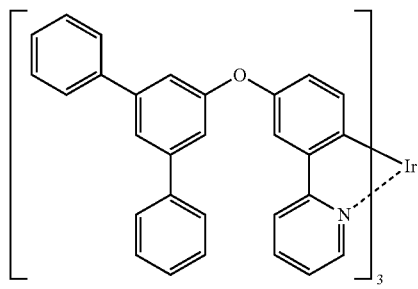
D-104
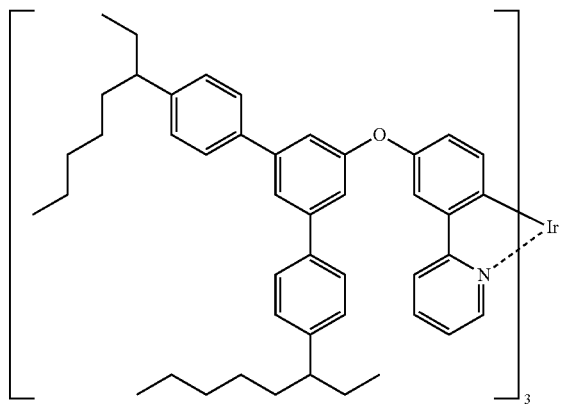
D-105
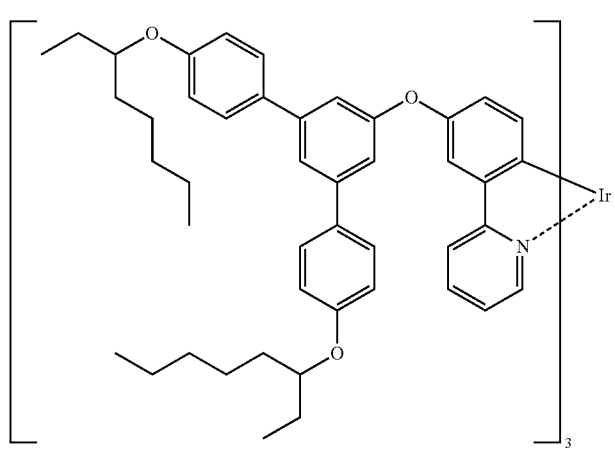
[Chemical Formula 77]
D-106
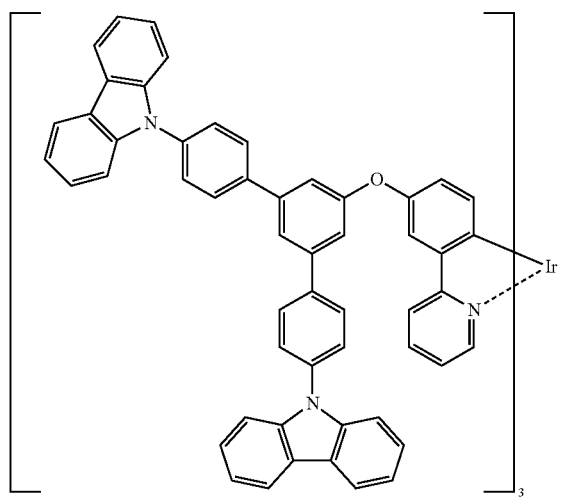
D-107
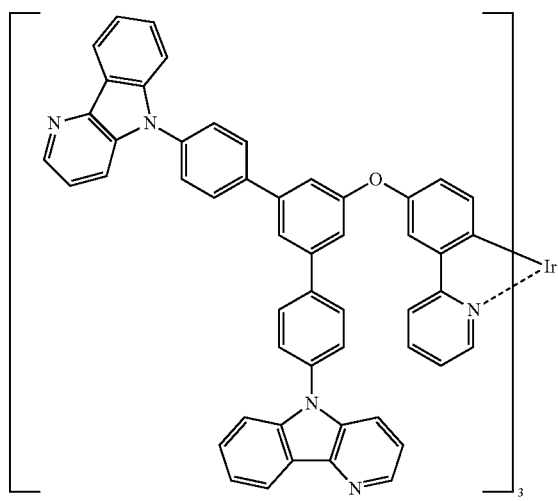

-continued
D-108
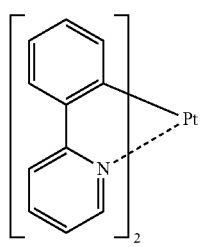
D-109
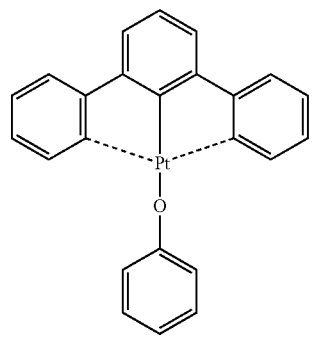
D-110
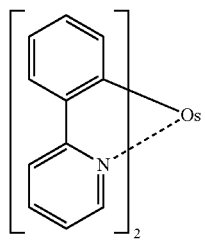
D-111
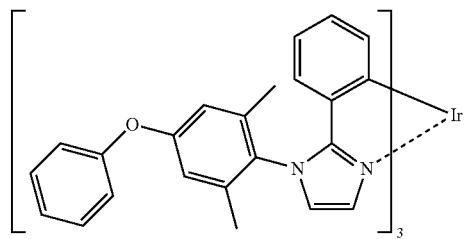
[Chemical Formula 78]
D-112
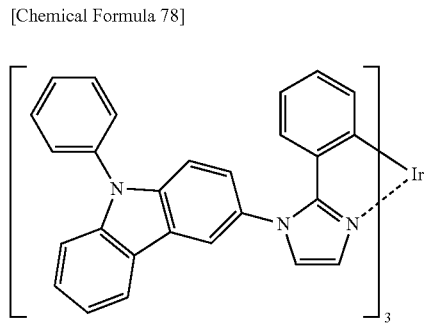
D-113
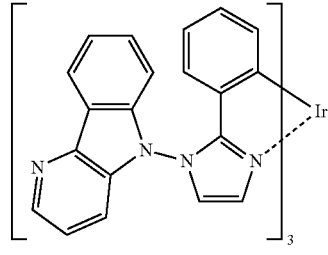
D-114
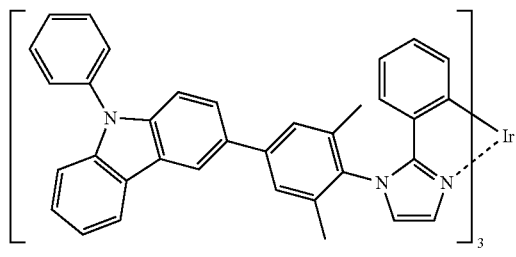
D-115
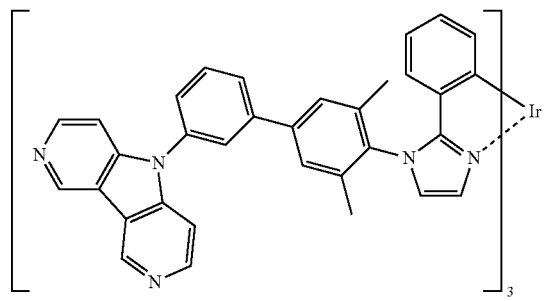
D-116
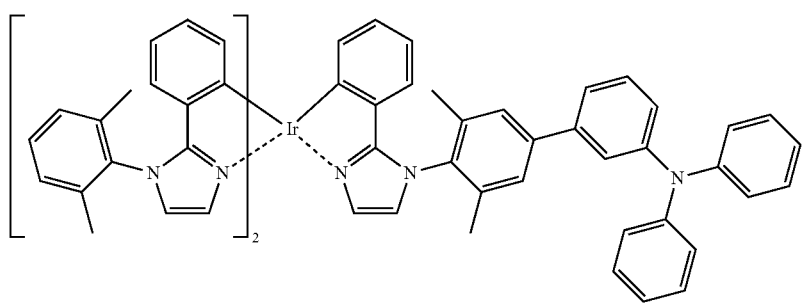

-continued
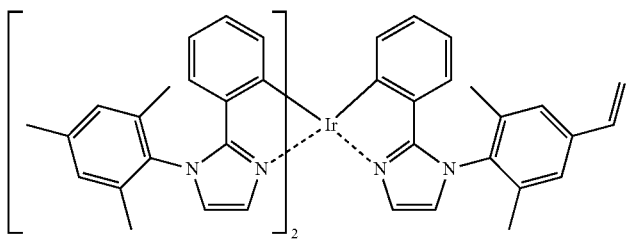
D-117
[Chemical Formula 79]
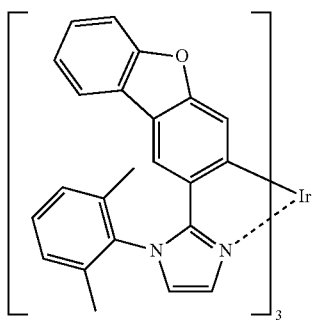
D-118
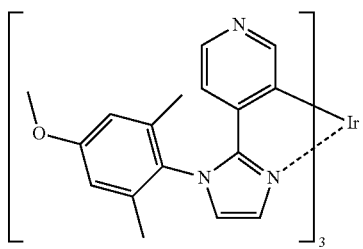
D-119
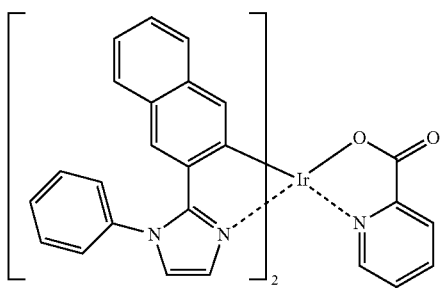
D-120
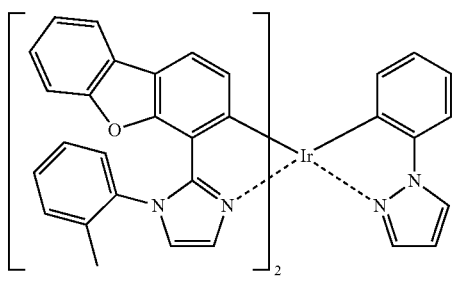
D-121
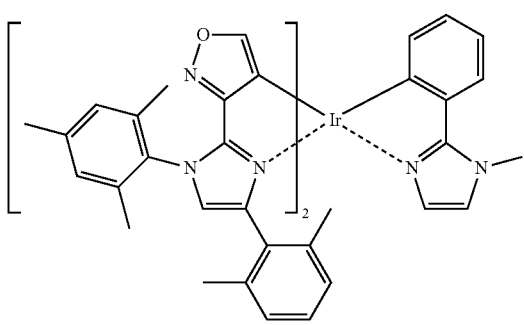
D-122
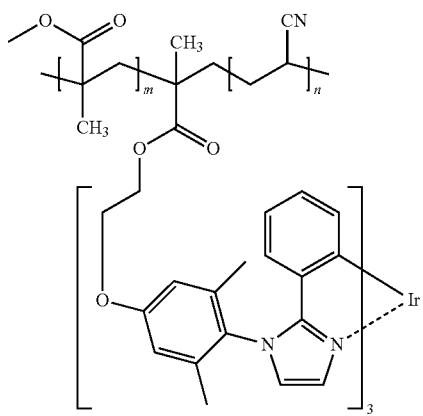
D-123

[Chemical Formula 80]
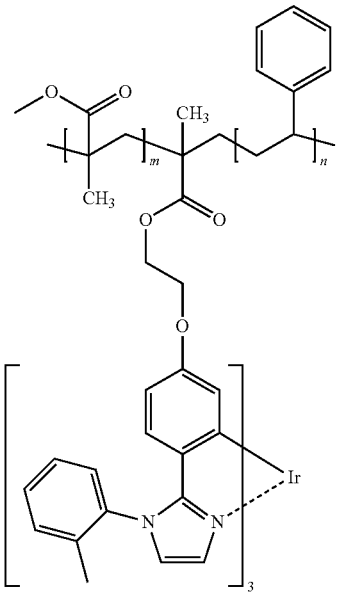
D-124
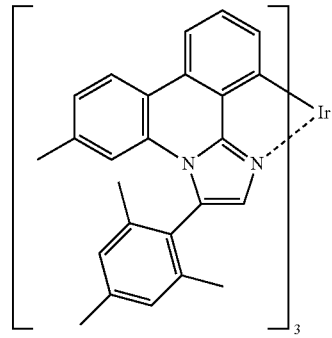
D-125
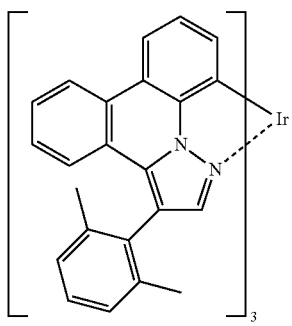
D-126
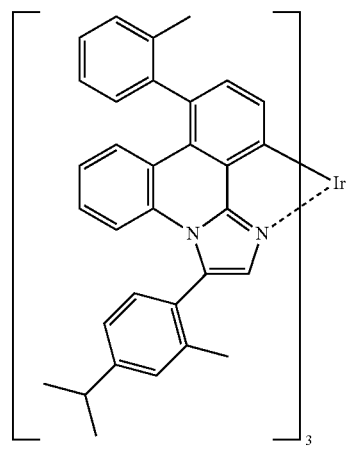
D-127
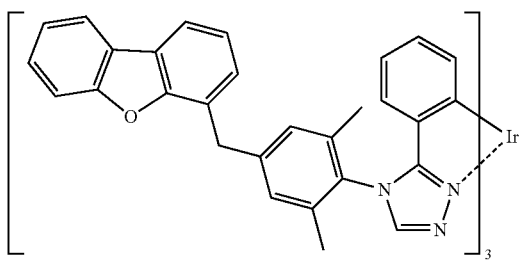
D-128
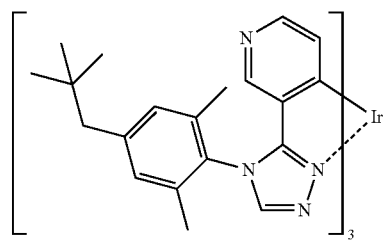
D-129

[Chemical Formula 81]
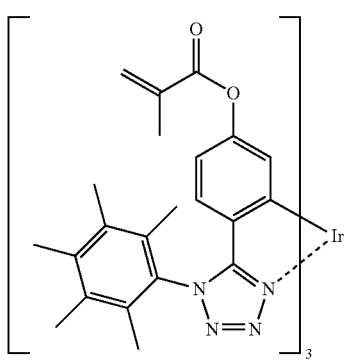
D-130
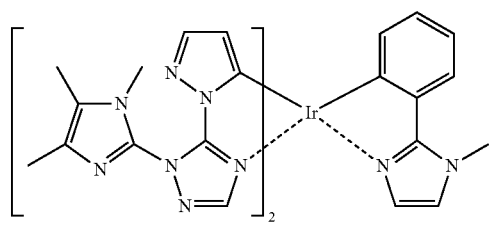
D-131
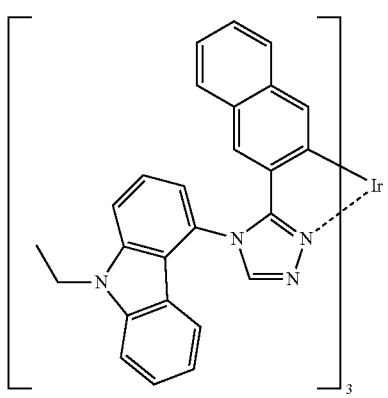
D-132
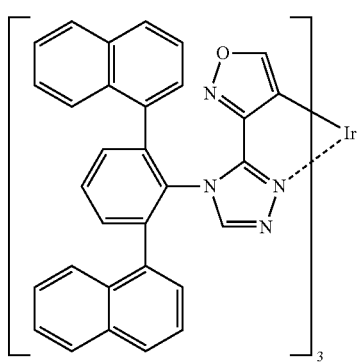
D-133
[Chemical Formula 82]
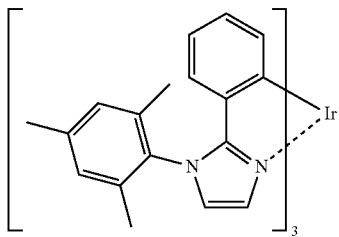
D-134
D-135
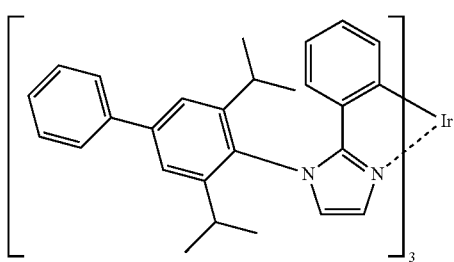
D-136

<Specific Examples of the Phosphorescent Compound Represented by Formula (3)>
[Chemical Formula 83]
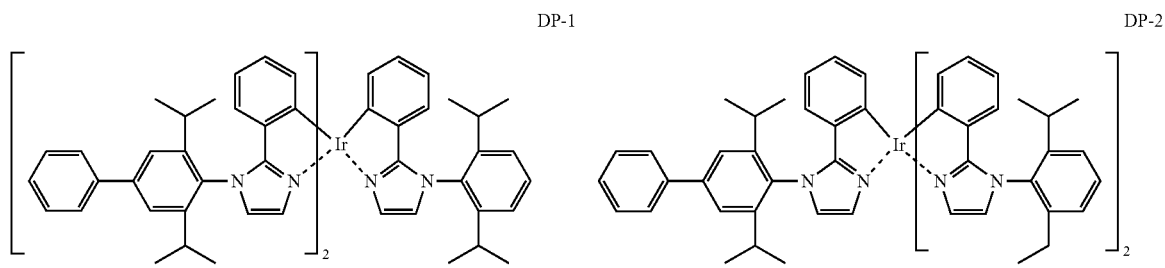
DP-1　　DP-2
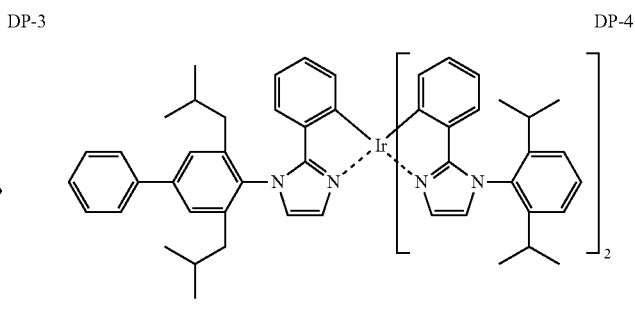
DP-3　　DP-4
DP-5
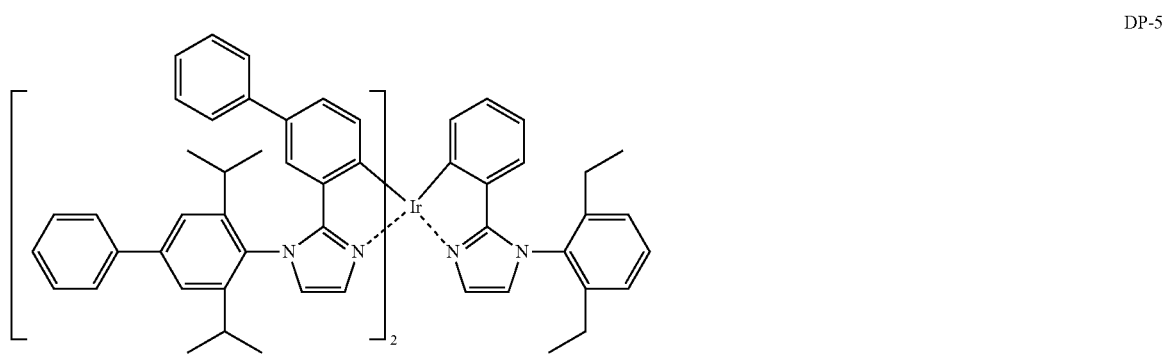
[Chemical Formula 84]
DP-6　　DP-7
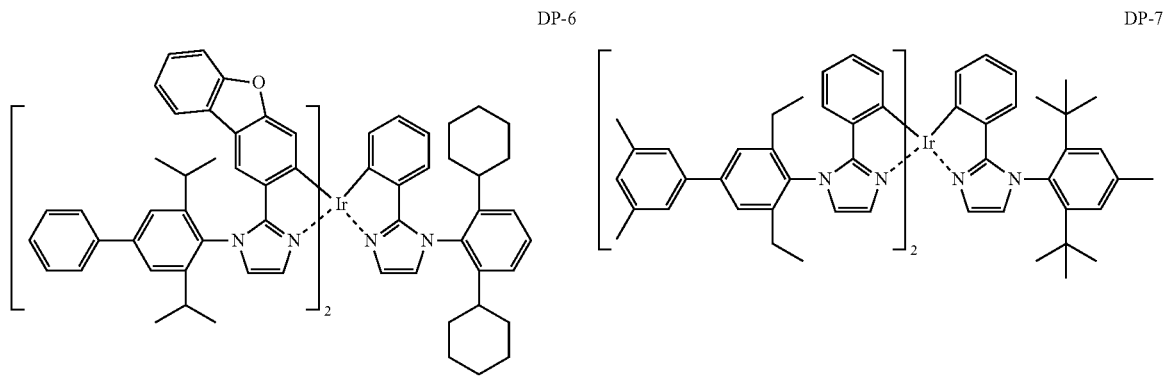

-continued
DP-8
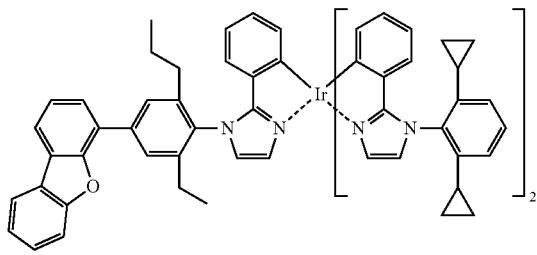
DP-9
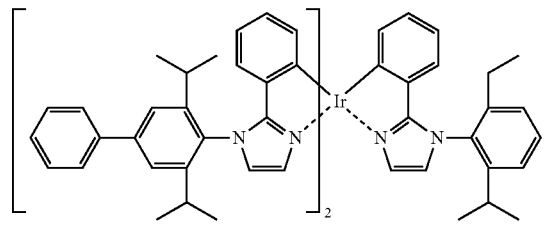
[Chemical Formula 85]
DP-10
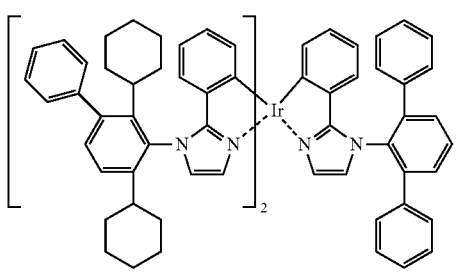
DP-11
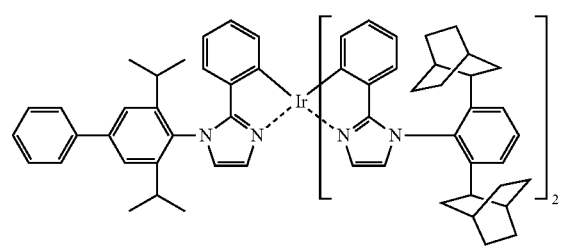
DP-12
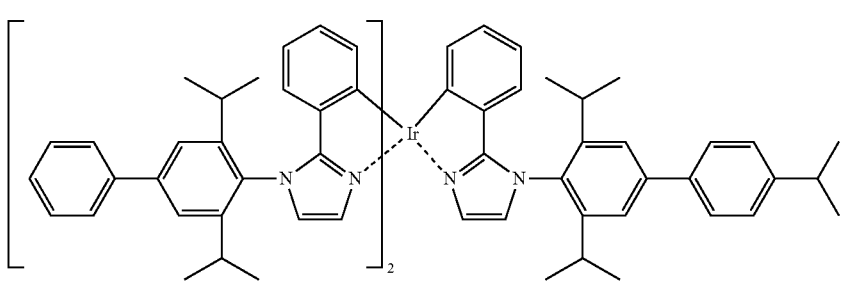
DP-13
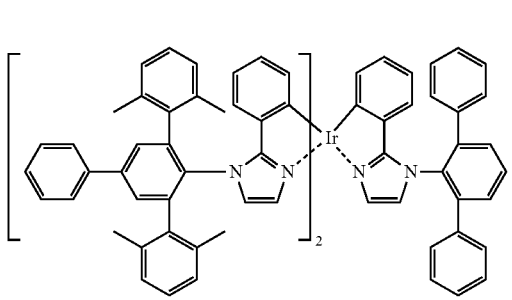
DP-14
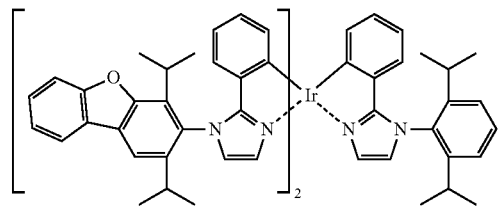
[Chemical Formula 86]
DP-15
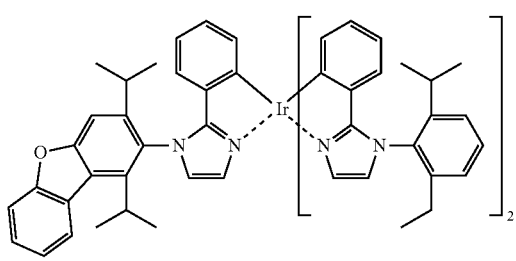
DP-16
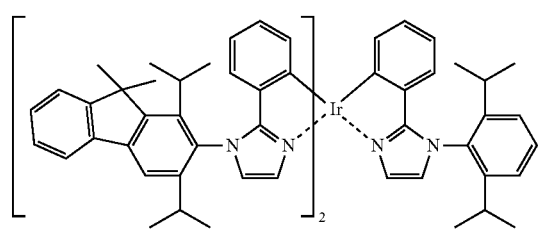

-continued
DP-17
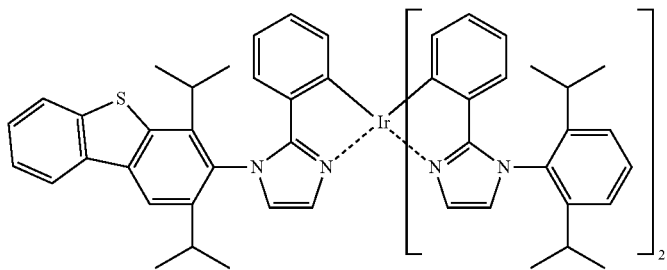
DP-18
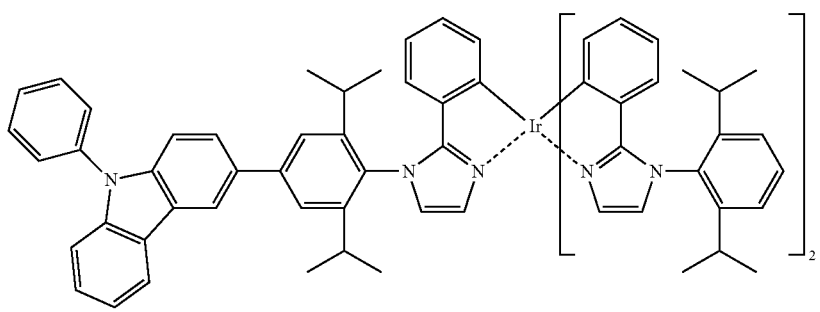
DP-19
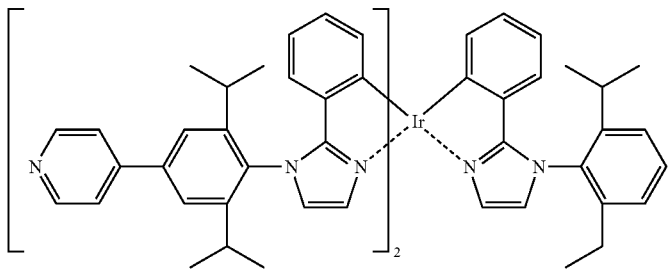
[Chemical Formula 87]
DP-20
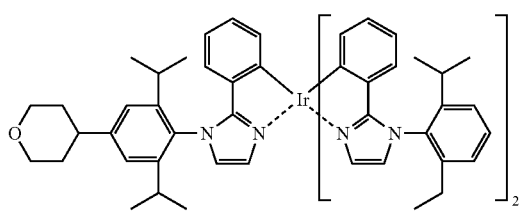
DP-21
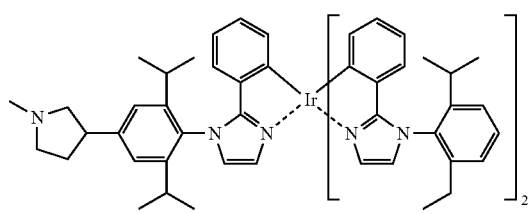
DP-22
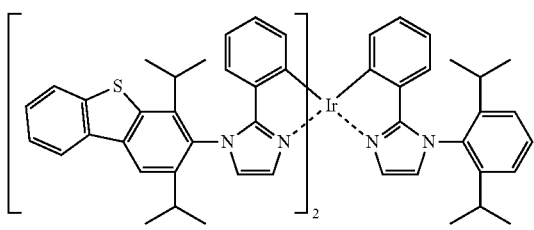
DP-23
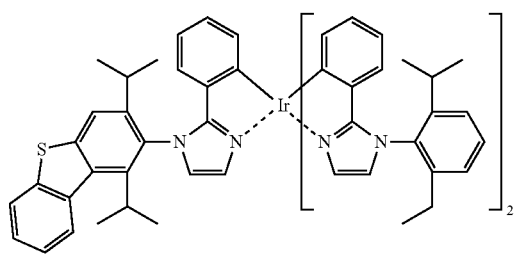

-continued
DP-24
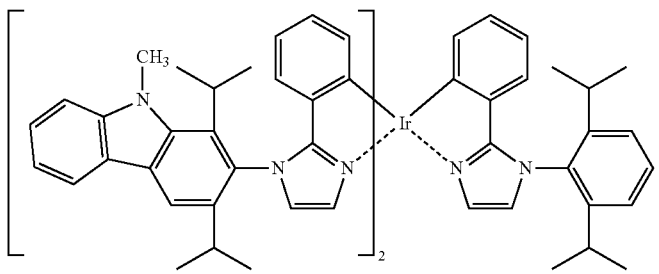
[Chemical Formula 88]
DP-25
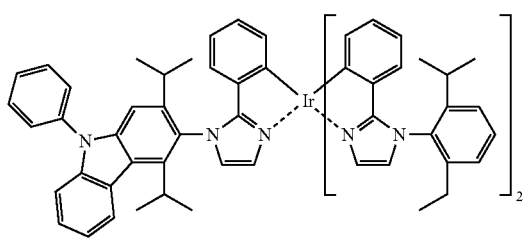
DP-26
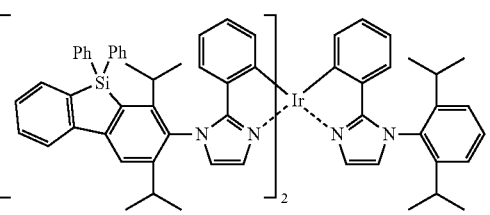
DP-27
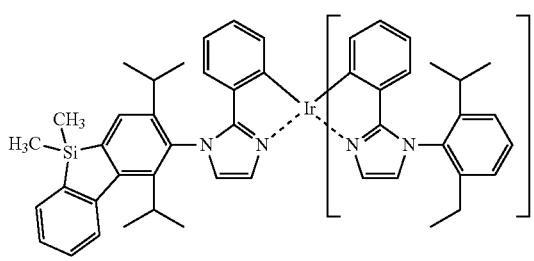
DP-28
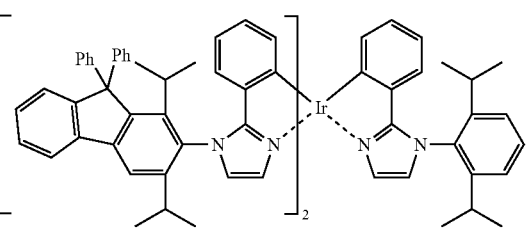
DP-29
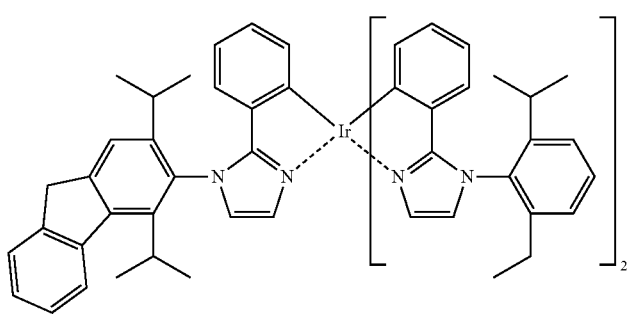
[Chemical Formula 89]
DP-30
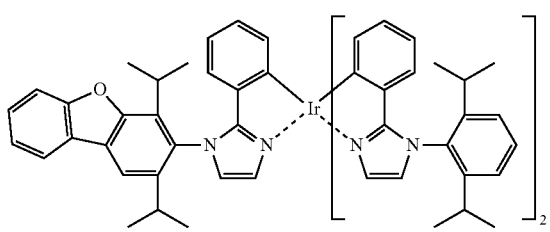
DP-31
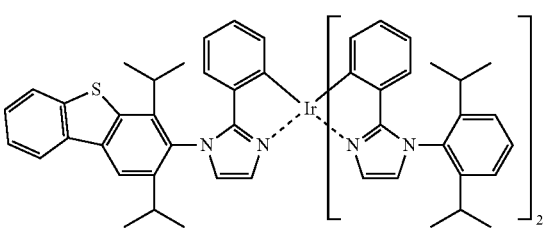

-continued

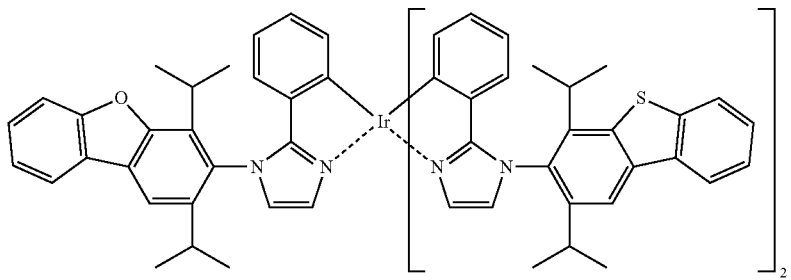
DP-32

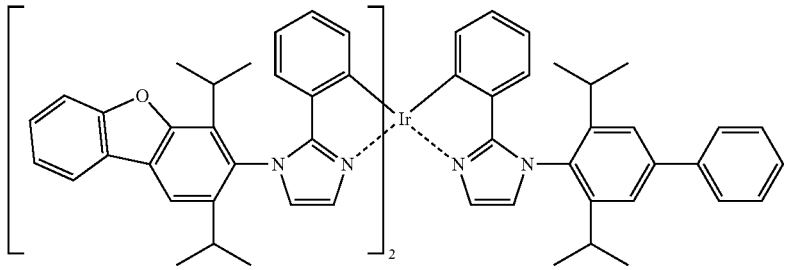
DP-33

[Chemical Formula 90]

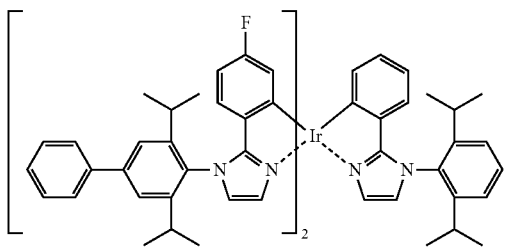
DP-34

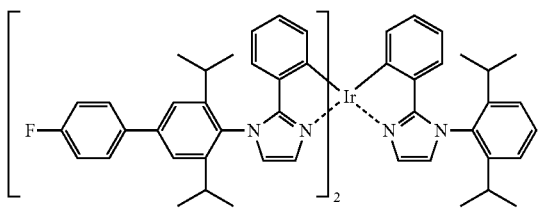
DP-36

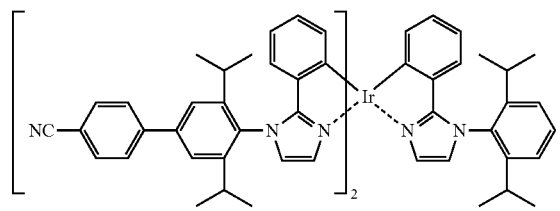

<Specific Examples of the Phosphorescent Compound Represented by Formula (4)>

TABLE 1

| DOPANT | LIGAND | | | LINKING GROUP |
| --- | --- | --- | --- | --- |
| | $L_1$ | $L_2$ | $L_3$ | V |
| COMPOUND 1 | L-1 | L-1 | L-1 | V-1 |
| COMPOUND 2 | L-2 | L-2 | L-2 | V-1 |
| COMPOUND 3 | L-5 | L-5 | L-5 | V-1 |
| COMPOUND 4 | L-10 | L-10 | L-10 | V-1 |
| COMPOUND 5 | L-17 | L-17 | L-17 | V-1 |
| COMPOUND 6 | L-31 | L-31 | L-31 | V-1 |
| COMPOUND 7 | L-43 | L-43 | L-43 | V-1 |
| COMPOUND 8 | L-63 | L-63 | L-63 | V-1 |
| COMPOUND 9 | L-65 | L-65 | L-65 | V-1 |
| COMPOUND 10 | L-1 | L-1 | L-2 | V-1 |
| COMPOUND 11 | L-2 | L-2 | L-2 | V-5 |
| COMPOUND 12 | L-11 | L-11 | L-11 | V-5 |
| COMPOUND 13 | L-20 | L-20 | L-20 | V-5 |
| COMPOUND 14 | L-74 | L-74 | L-74 | V-5 |
| COMPOUND 15 | L-1 | L-1 | L-2 | V-5 |
| COMPOUND 16 | L-2 | L-2 | L-2 | V-15 |

TABLE 1-continued

| DOPANT | LIGAND | | | LINKING GROUP |
| --- | --- | --- | --- | --- |
| | $L_1$ | $L_2$ | $L_3$ | V |
| COMPOUND 17 | L-49 | L-49 | L-49 | V-15 |
| COMPOUND 18 | L-75 | L-75 | L-75 | V-15 |
| COMPOUND 19 | L-1 | L-2 | L-31 | V-15 |
| COMPOUND 20 | L-1 | L-1 | L-2 | V-15 |
| COMPOUND 21 | L-2 | L-2 | L-2 | V-16 |
| COMPOUND 22 | L-5 | L-5 | L-5 | V-16 |
| COMPOUND 23 | L-10 | L-10 | L-10 | V-16 |
| COMPOUND 24 | L-89 | L-89 | L-89 | V-16 |
| COMPOUND 25 | L-2 | L-20 | L-20 | V-16 |
| COMPOUND 26 | L-5 | L-5 | L-5 | V-29 |
| COMPOUND 27 | L-10 | L-10 | L-10 | V-29 |
| COMPOUND 28 | L-20 | L-20 | L-20 | V-29 |
| COMPOUND 29 | L-49 | L-49 | L-49 | V-29 |
| COMPOUND 30 | L-1 | L-1 | L-2 | V-29 |
| COMPOUND 31 | L-1 | L-1 | L-1 | V-30 |
| COMPOUND 32 | L-2 | L-2 | L-2 | V-30 |
| COMPOUND 33 | L-26 | L-26 | L-26 | V-30 |
| COMPOUND 34 | L-63 | L-63 | L-63 | V-30 |
| COMPOUND 35 | L-2 | L-2 | L-13 | V-30 |

TABLE 1-continued

| DOPANT | LIGAND L₁ | L₂ | L₃ | LINKING GROUP V |
|---|---|---|---|---|
| COMPOUND 36 | L-2 | L-2 | L-2 | V-35 |
| COMPOUND 37 | L-39 | L-39 | L-39 | V-35 |
| COMPOUND 38 | L-44 | L-44 | L-44 | V-35 |
| COMPOUND 39 | L-1 | L-1 | L-2 | V-35 |
| COMPOUND 40 | L-1 | L-1 | L-9 | V-35 |

TABLE 2

| DOPANT | LIGAND L₁ | L₂ | L₃ | LINKING GROUP V |
|---|---|---|---|---|
| COMPOUND 41 | L-2 | L-2 | L-2 | V-46 |
| COMPOUND 42 | L-7 | L-7 | L-7 | V-46 |
| COMPOUND 43 | L-17 | L-17 | L-17 | V-46 |
| COMPOUND 44 | L-75 | L-75 | L-75 | V-46 |
| COMPOUND 45 | L-1 | L-1 | L-2 | V-46 |
| COMPOUND 46 | L-2 | L-2 | L-2 | V-50 |
| COMPOUND 47 | L-21 | L-21 | L-21 | V-50 |
| COMPOUND 48 | L-35 | L-35 | L-35 | V-50 |
| COMPOUND 49 | L-74 | L-74 | L-74 | V-50 |
| COMPOUND 50 | L-75 | L-75 | L-88 | V-50 |
| COMPOUND 51 | L-2 | L-2 | L-2 | V-60 |
| COMPOUND 52 | L-4 | L-4 | L-4 | V-60 |
| COMPOUND 53 | L-49 | L-49 | L-49 | V-60 |
| COMPOUND 54 | L-1 | L-1 | L-88 | V-60 |
| COMPOUND 55 | L-1 | L-2 | L-43 | V-60 |
| COMPOUND 56 | L-1 | L-1 | L-1 | V-61 |
| COMPOUND 57 | L-6 | L-6 | L-6 | V-61 |
| COMPOUND 58 | L-34 | L-34 | L-34 | V-61 |
| COMPOUND 59 | L-63 | L-63 | L-63 | V-61 |
| COMPOUND 60 | L-1 | L-1 | L-89 | V-61 |
| COMPOUND 61 | L-2 | L-2 | L-2 | V-65 |
| COMPOUND 62 | L-15 | L-15 | L-15 | V-65 |
| COMPOUND 63 | L-17 | L-17 | L-17 | V-65 |
| COMPOUND 64 | L-53 | L-53 | L-53 | V-65 |
| COMPOUND 65 | L-5 | L-5 | L-75 | V-65 |
| COMPOUND 66 | L-2 | L-2 | L-2 | V-75 |
| COMPOUND 67 | L-11 | L-11 | L-11 | V-75 |
| COMPOUND 68 | L-52 | L-52 | L-52 | V-75 |
| COMPOUND 69 | L-63 | L-63 | L-63 | V-75 |
| COMPOUND 70 | L-2 | L-2 | L-49 | V-75 |
| COMPOUND 71 | L-2 | L-2 | L-2 | V-76 |
| COMPOUND 72 | L-8 | L-8 | L-8 | V-76 |
| COMPOUND 73 | L-20 | L-20 | L-20 | V-76 |
| COMPOUND 74 | L-31 | L-31 | L-31 | V-76 |
| COMPOUND 75 | L-49 | L-49 | L-88 | V-76 |
| COMPOUND 76 | L-5 | L-5 | L-5 | V-80 |
| COMPOUND 77 | L-17 | L-17 | L-17 | V-80 |
| COMPOUND 78 | L-21 | L-21 | L-21 | V-80 |
| COMPOUND 79 | L-68 | L-68 | L-68 | V-80 |
| COMPOUND 80 | L-1 | L-2 | L-3 | V-80 |

TABLE 3

| DOPANT | LIGAND L₁ | L₂ | L₃ | LINKING GROUP V |
|---|---|---|---|---|
| COMPOUND 81 | L-2 | L-2 | L-2 | V-90 |
| COMPOUND 82 | L-7 | L-8 | L-9 | V-90 |
| COMPOUND 83 | L-4 | L-13 | L-14 | V-90 |
| COMPOUND 84 | L-1 | L-1 | L-2 | V-90 |
| COMPOUND 85 | L-2 | L-2 | L-49 | V-90 |
| COMPOUND 86 | L-1 | L-1 | L-1 | V-95 |
| COMPOUND 87 | L-2 | L-2 | L-2 | V-95 |
| COMPOUND 88 | L-18 | L-18 | L-18 | V-95 |
| COMPOUND 89 | L-34 | L-34 | L-34 | V-95 |
| COMPOUND 90 | L-1 | L-1 | L-2 | V-95 |
| COMPOUND 91 | L-1 | L-1 | L-1 | V-98 |
| COMPOUND 92 | L-4 | L-4 | L-4 | V-98 |
| COMPOUND 93 | L-44 | L-44 | L-44 | V-98 |
| COMPOUND 94 | L-73 | L-73 | L-73 | V-98 |
| COMPOUND 95 | L-2 | L-2 | L-10 | V-98 |
| COMPOUND 96 | L-2 | L-2 | L-2 | V-104 |
| COMPOUND 97 | L-16 | L-16 | L-16 | V-104 |
| COMPOUND 98 | L-29 | L-29 | L-29 | V-104 |
| COMPOUND 99 | L-43 | L-43 | L-43 | V-104 |
| COMPOUND 100 | L-2 | L-2 | L-49 | V-104 |
| COMPOUND 101 | L-2 | L-2 | L-2 | V-108 |
| COMPOUND 102 | L-22 | L-22 | L-22 | V-108 |
| COMPOUND 103 | L-49 | L-49 | L-49 | V-108 |
| COMPOUND 104 | L-88 | L-88 | L-88 | V-108 |
| COMPOUND 105 | L-1 | L-1 | L-2 | V-118 |

Each of these phosphorescent dopant can be synthesized by applying a method described in, for example, Organic Letter, vol. 3, No. 16, pp. 2579-2581 (2001), Inorganic Chemistry, vol. 30, No. 8, pp. 1685-1687 (1991), J. Am. Chem. Soc., vol. 10, 123, p. 4304 (2001), Inorganic Chemistry, vol. 40, No. 7, pp. 1704-1711 (2001), Inorganic Chemistry, vol. 41, No. 12, pp. 3055-3066 (2002), New Journal of Chemistry, vol. 26, p. 1171 (2002), European Journal of Organic Chemistry, vol. 4, pp. 695-709 (2004), United States Patent Application Publication No. 2010/176390, and International Publication WO2007/97149 and cited references therein.

Non-limiting typical examples of the synthesis will now be described.

<Example of the Phosphorescent Compound Represented by Formula (3)>

Below will be described a method of synthesizing Exemplary Compound DP-1 as a typical example of the phosphorescent compound represented by Formula (3).

Exemplary Compound DP-1 can be synthesized in accordance with the following scheme.

[Chemical Formula 91]

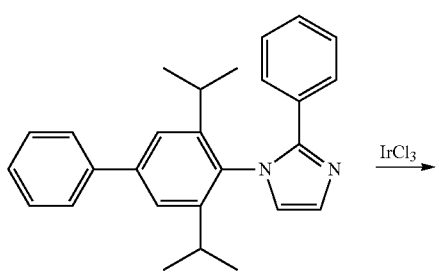

Intermediate A

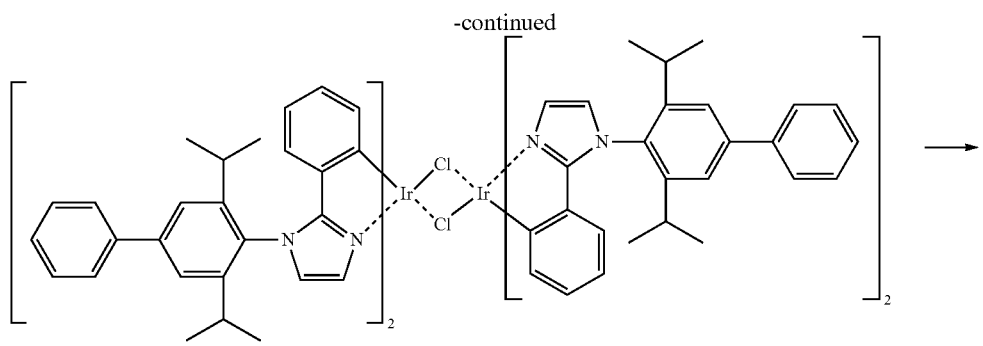

Intermediate B

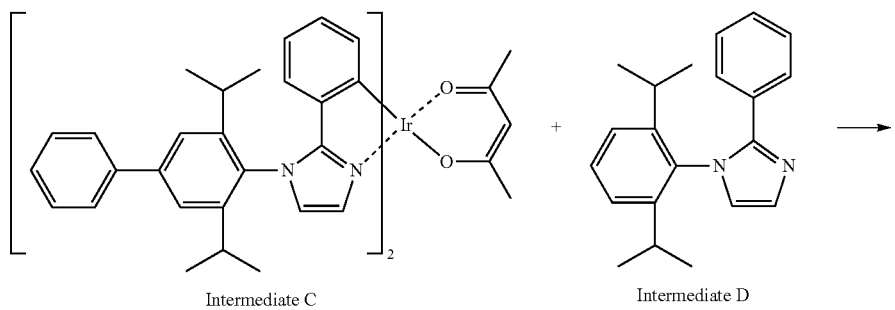

Intermediate C    Intermediate D

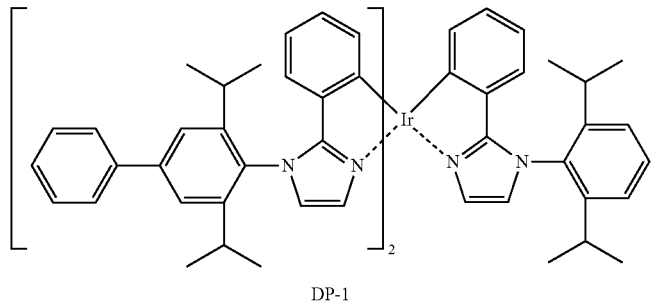

DP-1

(Step 1)

In a three-necked flask, 5 g of Intermediate A, 1.9 g of iridium chloride, 100 ml of ethoxyethanol and 30 ml of water were placed, and the mixture was stirred at 100° C. for four hours under a nitrogen atmosphere.

The deposited crystals were separated by filtration and were washed with methanol, thereby obtaining 4.5 g of Intermediate B.

(Step 2)

In a three-necked flask, 4.0 g of Intermediate B obtained in Step 1, 2.5 g of acetylacetone, 7 g of potassium carbonate and 100 ml of ethoxyethanol were placed, and the mixture was stirred at 80° C. for five hours under a nitrogen atmosphere.

The deposited crystals were separated by filtration and were washed with methanol and subsequently with water, thereby obtaining 2.8 g of Intermediate C.

(Step 3)

In a three-necked flask, 2.8 g of Intermediate C obtained in Step 2, 1.6 g of Intermediate D and 50 ml of ethylene glycol were placed, and the mixture was stirred at 150° C. for seven hours under a nitrogen atmosphere.

The deposited crystals were separated by filtration and were washed with methanol and then separated and purified by silica gel column chromatography, thereby obtaining 0.7 g of Exemplary Compound DP-1.

The structure of Exemplary Compound DP-1 was observed by mass spectrometry and $^1$H-NMR.

MASS spectrum (ESI): m/z=1179[M$^+$]

$^1$H-NMR (CD$_2$Cl$_2$, 400 MHz) δ: 7.71 (2H, d, J=28.3 Hz), 7.42 (1H, t, J=28.3 Hz), 7.33-7.57 (6H, m), 7.34 (4H, t, J=33.2 Hz), 6.96 (2H, S), 6.81-6.86 (6H, m), 6.69 (2H, d, J=33.2 Hz), 6.56-6.60 (2H, m), 6.44 (1H, t, J=23.4 Hz), 6.38 (2H, d, J=17.6 Hz), 6.32 (1H, d, J=23.4 Hz), 6.16 (2H, d, J=44.9 Hz), 2.65-2.80 (3H, m, CH of iso-Pr), 2.29-2.41 (3H, m, CH of iso-Pr), 1.26 (3H, d, J=26.3 Hz, CH$_3$ of iso-Pr), 1.21 (6H, d, J=20.5 Hz, CH$_3$ of iso-Pr), 0.92-1.08 (m, 27H, CH$_3$ of iso-Pr)

<Synthetic Example of Phosphorescent Compound Represented by Formula (4)>

Below will be described a method of synthesizing Compound 2 described in Table 1 as a typical example of the phosphorescent compound represented by Formula (4).

Compound 2 can be synthesized in accordance with the following scheme.

As described below, Ligand 2 was synthesized in the first step, and then Compound 2 was synthesized in the second step.

<First Step: Synthesis of Ligand 2>
[Chemical Formula 92]
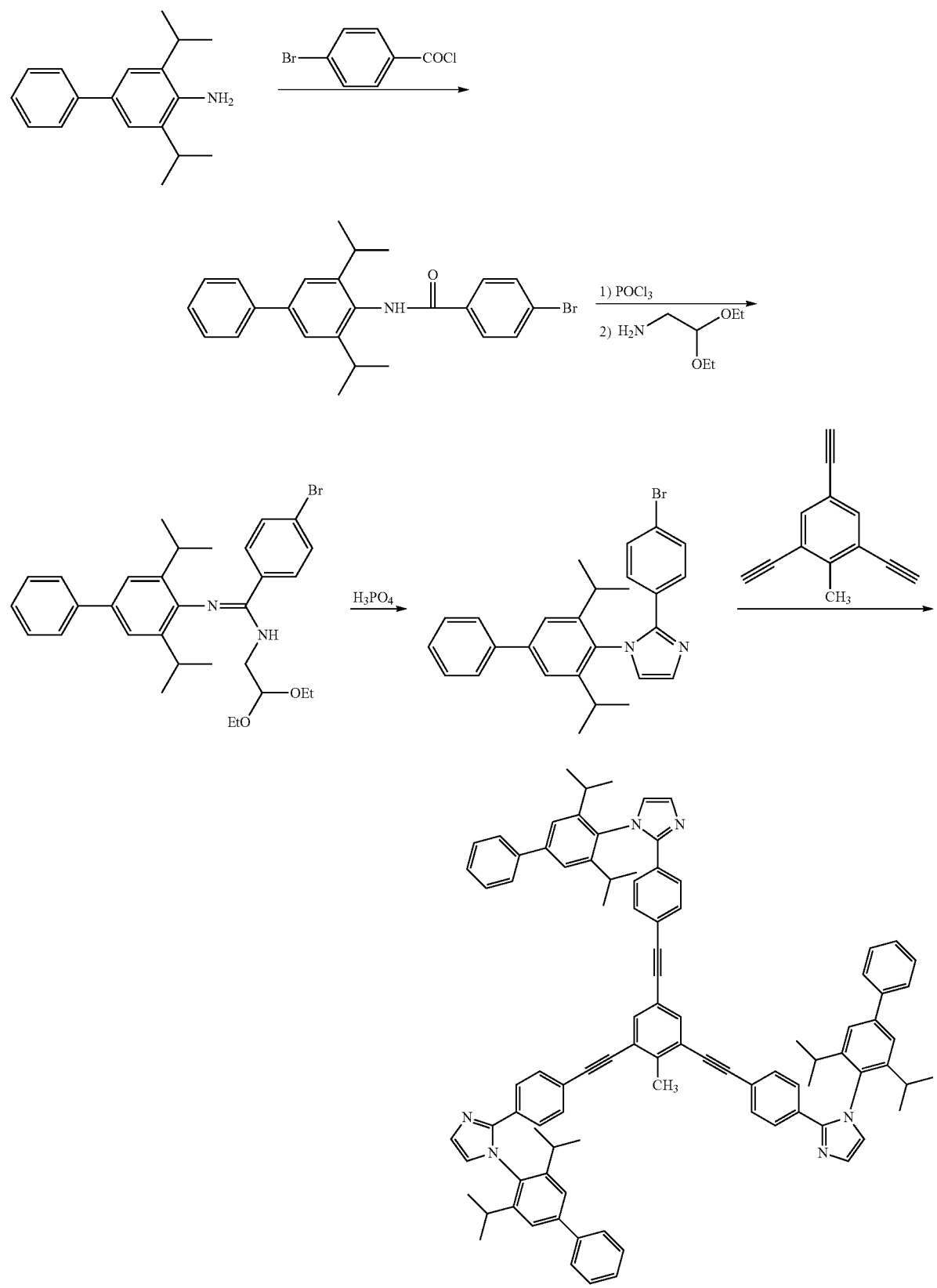

[Chemical Formula 93]

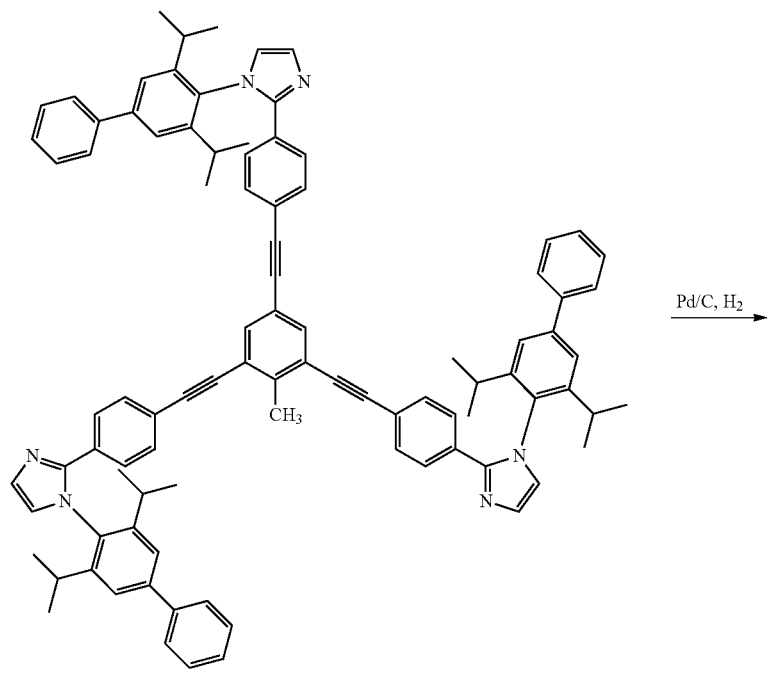

Pd/C, H₂ →

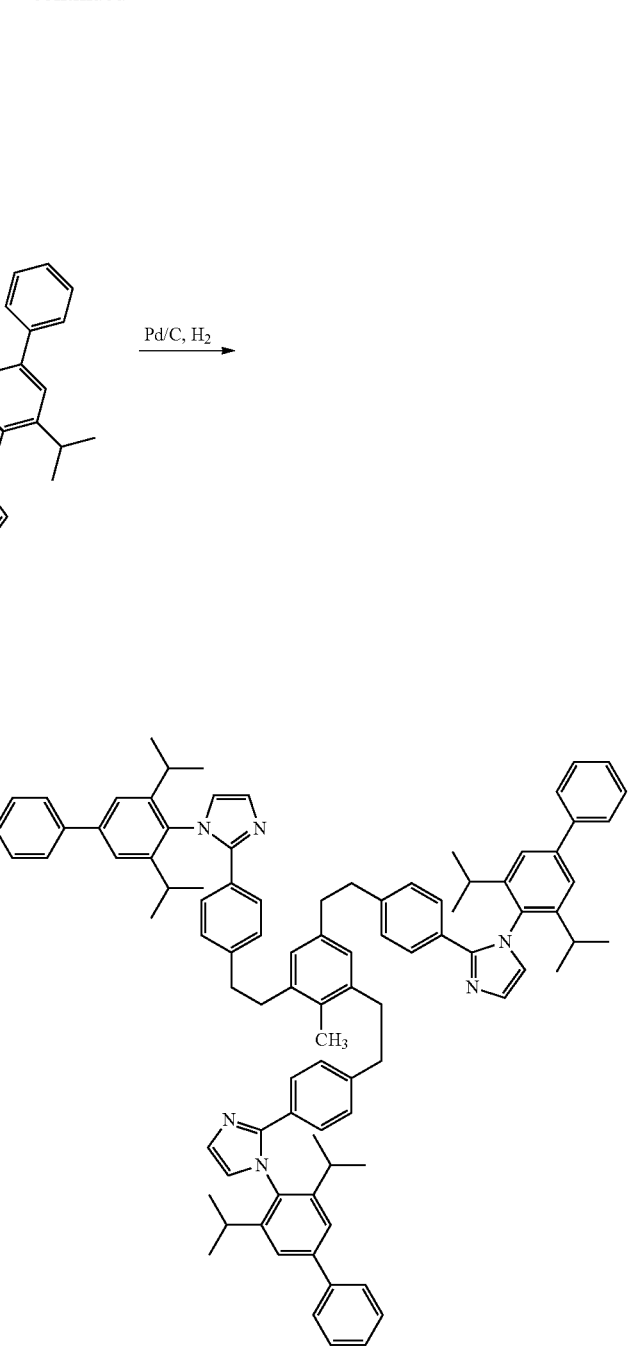

LIGAND 2

(Step 1)

In 320 ml of toluene, 20 g of 2,6-diisopropyl-4-phenyl aniline was dissolved. To the resulting solution, 41 ml of triethylamine was added, and solution prepared by dissolving 34 g of o-bromobenzoyl chloride in 20 ml of toluene was added dropwise while solution was cooled with water. After finishing the addition, the resulting solution was stirred at a room temperature for 1.5 hours, and insoluble matter was separated by filtration. The separated white crystals were subsequently placed in 1 L of water and were suspended for one hour, and water was then separated by filtration, thereby obtaining 45 g (approximately theoretical amount) of white crystals of 4-bromo-N-3,5-diisopropyl-1,1'-biphenyl-4-yl-benzamide.

(Step 2)

To 200 ml of toluene, 35 g of 4-bromo-N-3,5-diisopropyl-1,1'-biphenyl-4-yl-benzamide obtained in Step 1 was dissolved, and 12.5 ml of phosphoryl chloride was added. The mixture was stirred at an internal temperature of 90° C. for two hours, and then was allowed to cool. Subsequently, 50.2 g of aminoacetaldehyde diethyl acetal was dissolved in 200 ml of acetonitrile, and 67 ml of triethylamine was added to the solution. The resulting solution was then added dropwise into the solution previously allowed to cool, under conditions of an internal temperature of 50° C. or lower. Subsequently, 200 ml of ethyl acetate and 50 ml of saturated brine were added, and liquid separation was performed. The organic layer was then removed by drying with magnesium sulfate, and the solution was then condensed, thereby obtaining crude crystals of amidine as an intermediate.

(Step 3)

All the crude crystals of amidine prepared in Step 2 was dissolved in 150 ml of toluene, and 33 g of phosphoric acid and 60 ml of water were added to the solution. The resulting mixture was refluxed for two hours using an ester column, and then a solution prepared by dissolving 36 g of potassium hydroxide in 57 ml of water was added dropwise into the mixture while the solution was cooled with ice for 30 minutes. Subsequently, 200 ml of ethyl acetate and 50 ml of saturated brine were added to the solution, and the resulting mixture was subjected to diatomaceous earth filtration and then to liquid separation. The organic layer was then dried with magnesium sulfate. The solution was then condensed and the resultant was recrystallized in heptane-ethyl acetate, thereby obtaining 26 g of 2-(4-bromophenyl)-1-(3,5-diisopropyl-(1,1'-biphenyl)-4-yl)-1H-imidazole as white solid.

(Step 4)

Under a nitrogen atmosphere, 6.8 g of the bromo compound prepared in Step 3 was dissolved in 35 ml of dehydrated toluene, and 35 ml of dehydrated diisopropylamine and 1.0 g of 1,3,5-triethynyl-2-methylbenzene were added to the resulting solution. Under stirring, 0.7 g of tetrakis(triphenylphosphine) palladium (0) and 0.08 g of copper iodide (I) were added, and the mixture was stirred at an internal temperature of 60° C. for two days. Subsequently, 50 ml of ethyl acetate and 50 ml of saturated brine were added to the resulting solution. The resulting solution was then subjected to liquid separation. The organic layer was then dried with magnesium sulfate. Subsequently, the solution was condensed and the resultant was purified by silica gel column chromatography, thereby obtaining 3.0 g of a precursor of Ligand 2.

(Step 5)

In 50 ml of tetrahydrofuran and 20 ml of ethanol, 500 mg of the precursor obtained in Step 4 was dissolved, and 0.25 g of palladium-carbon (5%) was added. The mixture was then hydrogenated, thereby obtaining 500 mg (approximately stoichiometric amount) of Ligand 2.

<Second Step> Synthesis of Compound 2

[Chemical Formula 94]

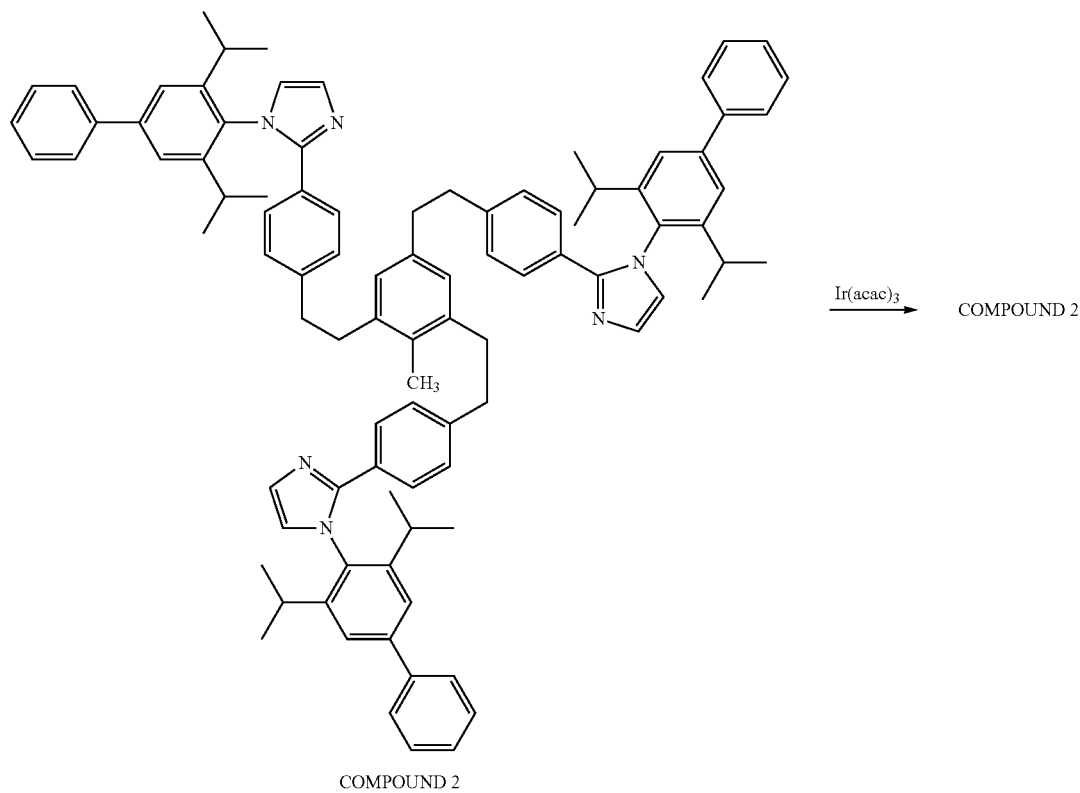

COMPOUND 2

(Step 6)

Under a nitrogen atmosphere, 263 mg of tris(acetylacetonato)iridium(III), 35 ml of ethylene glycol and 10 ml of glycerin were added to 500 mg of Ligand 2 obtained in Step 5, and the mixture was heated at an internal temperature of 160° C. for 15 hours. The reaction solution was returned to room temperature and then was diluted with 50 ml of methanol, and the precipitate was separated by filtration. The resulting precipitate was further washed with methanol and dried, thereby obtaining 110 mg of Compound 2.

The structure of Compound 2 was observed by mass spectrometry and $^1$H-NMR.

(4.3) Quantum Dots

According to the present invention, a luminous layer or an adjacent layer thereto contains quantum dots.

In the present invention, the adjacent layer to the luminous layer is a layer formed adjacent to the luminous layer. For example, a hole transport layer and an electron transport layer are adjacent layers.

Figure 2:
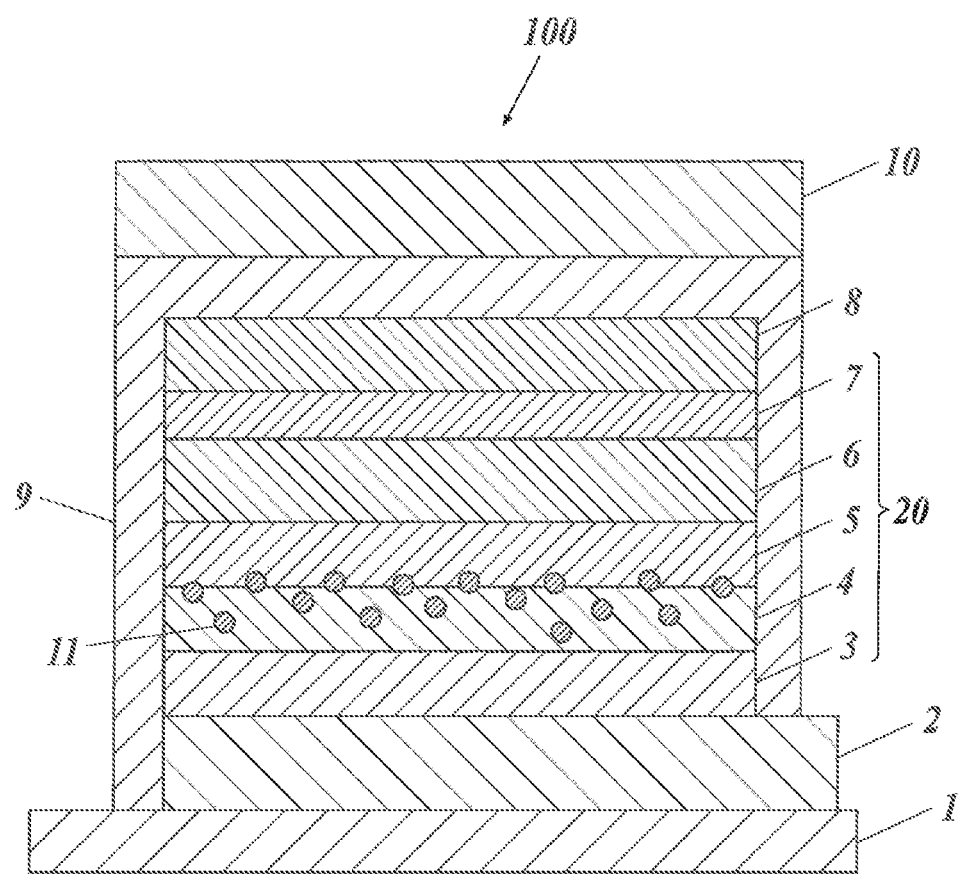
FIG. 2 is an outline cross-sectional view illustrating a modified example of the configuration of the organic electroluminescent element of the present invention.
Figure 3:
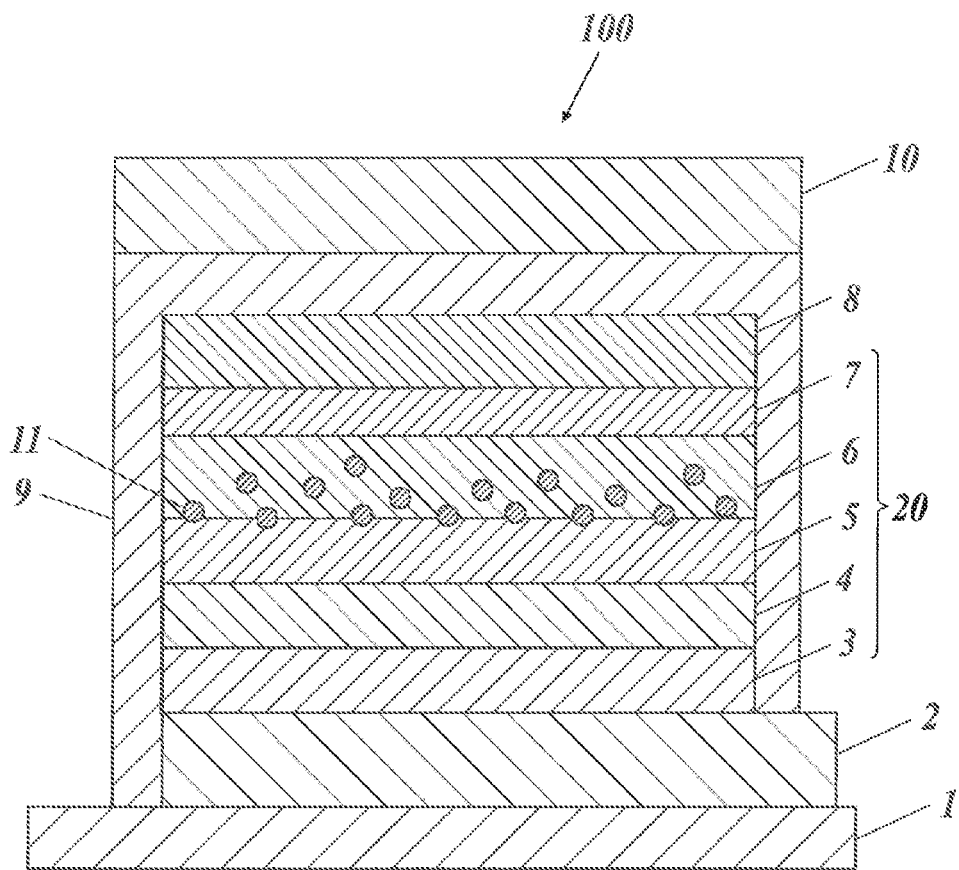
FIG. 3 is an outline cross-sectional view illustrating another modified example of the configuration of the organic electroluminescent element of the present invention.

That is, quantum dots 11 may be contained in the luminous layer 5, as shown in FIG. 1 explained above, or contained in a layer (hole transport layer 4 or electron transport layer 6, for example) adjacent to luminous layer 5, as shown in FIGS. 2 and 3. Quantum dots 11 of the present invention may also be present on a boundary surface between the luminous layer 5 and a layer adjacent to the luminous layer 5. In a particularly preferred embodiment of the present invention, quantum dots 11 are present at least in the luminous layer 5, as shown in FIG. 1.

Quantum dots of the present invention are particles of a predetermined size, formed of crystals of a semiconductor material and having a quantum confinement effect. The quantum dots are fine particles having a particle size of several nanometers to several tens of nanometers and having a quantum dot effect descried below.

The specific particle size of the quantum dots (fine particles) of the present invention is preferably within the range of 1 to 20 nm, and is more preferably within the range of 1 to 10 nm.

Defining Planck's constant as "h", an effective mass as "m," and a radius of the fine particles as "R", the energy level E of such quantum dots is represented by Formula (I).

$$E \propto h^2/mR^2 \quad \text{Formula (I):}$$

As indicated in Formula (I), the band gap of quantum dots increases in proportion to "$R^{-2}$" to provide a so-called quantum dot effect. Thus, the band gap value of quantum dots can be determined by a controlled particle size of quantum dots. In other words, the control of the size of fine particles provides the particles with diversity which is not possessed by ordinary atoms. Thus, as a result of optical excitation of the quantum dots or application of voltage to an organic EL element including the quantum dots, electrons and holes are confined into quantum dots and caused to be recombined therein, which recombination converts electrical energy into light of desired wavelength and emits such light. In the present invention, such luminescent quantum dot materials are defined as the quantum dots of the present invention.

The average particle size of quantum dots ranges from several nanometers to several tens of nanometers, as described above. When quantum dots are used as one of luminescent materials for emission of white light, their average particle size is set to an average particle size necessary for a desired color of light to be emitted. For example, if emission of red light is desired, the average particle size of the quantum dots is preferably set within the range of 3.0 to 20 nm. If emission of green light is desired, the average particle size of the quantum dots is preferably set within the range of 1.5 to 10 nm. If emission of blue light is desired, the average particle size of the quantum dots is preferably set within the range of 1.0 to 3.0 nm.

An average particle size of quantum dots can be measured by any known method. Examples of such a method include observation of quantum dot particles with a transmission electron microscope (TEM) followed by determination of the number average particle size based on the observed particle size distribution, and measurement with a particle sizer based on dynamic light scattering, such as "ZETASIZER Nano Series Nano-ZS" from Malvern Instruments Ltd. Another example is estimate of particle size distribution by simulative calculation of the particle size distribution of quantum dots based on spectrum observed by small-angle X-ray scattering. In the present invention, a preferred method uses a particle sizer based on dynamic light scattering ("ZETASIZER Nano Series Nano-ZS" from Malvern Instruments Ltd.).

Defining the total of all components of a layer on which quantum dots are added, an amount of quantum dots to be added is preferably within the range of 0.01 to 50 mass %, more preferably within the range of 0.05 to 25 mass %, and most preferably within the range of 0.1 to 20 mass %. When the added amount of quantum dots is 0.01 mass % or higher, white emission of light can be achieved with sufficient luminance efficiency and excellent color rendering properties. When the added amount of quantum dots is 50 mass % or lower, proper distances between quantum dot particles can be maintained, which allows the quantum dots to exhibit a sufficient quantum size effect.

The phosphorescent compounds described above have a relatively long excitation lifetime of millisecond or microsecond order. For this reason, if such a phosphorescent compound is present in a layer at an excessive concentration, excitonic energy undesirably disappears as a result of vibrational relaxation (so-called concentration quenching). However, addition of the quantum dots of the present invention in a luminous layer or an adjacent layer thereto not only achieves emission of light from the quantum dots and the phosphorescent compound themselves, but also improves the luminous efficiency of the phosphorescent compound, which is probably as a result of change in the form of the entire layer due to the addition of the quantum dots and an improvement in dispersibility of the phosphorescent compound due to the surface energy of the quantum dots, although not known in detail.

Examples of materials to form quantum dots include simple substances of Group 14 elements in the Periodic Table, such as carbon, silicon, germanium, and tin; simple substances of Group 15 elements in the Periodic Table, such as phosphorus (black phosphorus); simple substances of Group 16 elements in the Periodic Table, such as selenium and tellurium; compounds composed of a plurality of Group 14 elements in the Periodic Table, such as silicon carbide (SiC); compounds composed of a Group 14 element in the Periodic Table and a Group 16 element in the Periodic Table, such as tin oxide (IV) ($SnO_2$), tin sulfide (II, IV) (Sn(II), Sn(IV)$S_3$), tin sulfide (IV) ($SnS_2$), tin sulfide (II) (SnS), tin selenide (II) (SnSe), tin telluride (II) (SnTe), lead sulfide (II) (PbS), lead selenide (II) (PbSe), and lead telluride (II) (PbTe); compounds composed of a Group 13 element in the Periodic Table and a Group 15 element in the Periodic Table (or compound semiconductors of Group III-V), such as boron nitride (BN), boron phosphide (BP), boron arsenide (BAs), aluminum nitride (AlN), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), and indium antimonide (InSb); compounds composed of a Group 13 element in the Periodic Table and a Group 16 element in the Periodic Table, such as aluminum sulfide ($Al_2S_3$), aluminum selenide ($Al_2Se_3$), gallium sulfide ($Ga_2S_3$), gallium selenide ($Ga_2Se_3$), gallium telluride ($Ga_2Te_3$), indium oxide ($In_2O_2$), indium sulfide ($In_2S_2$), indium selenide ($In_2Se_3$), and indium telluride ($In_2Te_3$); compounds composed of a Group 13 element in the Periodic Table and a Group 17 element in the Periodic Table, such as thallium chloride (I) (TlCl), thallium bromide (I) (TlBr), and thallium iodide (I) (TlI); compounds composed of a Group 12 element in the Periodic Table and a Group 16 element in the Periodic Table (or compound semiconductors of Group II-VI), such as zinc oxide (ZnO), zinc sulfide (ZnS), zinc selenide (ZnSe), zinc telluride (ZnTe), cadmium oxide (CdO), cadmium sulfide (CdS), cadmium selenide (CdSe), cadmium telluride (CdTe), mercury sulfide (HgS), mercury selenide (HgSe) and mercury telluride (HgTe); compounds composed of a Group 15 element in the Periodic Table and a Group 16 element in the Periodic Table, such as arsenic sulfide (III) ($As_2S_2$), arsenic selenide (III) ($As_2Se_3$), arsenic telluride (III) ($As_2Te_3$), antimony sulfide (III) ($Sb_2S_2$), antimony selenide (III) ($Sb_2Se_3$), antimony telluride (III) ($Sb_2Te_3$), bismuth sulfide (III) ($Bi_2S_2$), bismuth selenide (III) ($Bi_2Se_3$) and bismuth telluride (III) ($Bi_2Te_3$); compounds composed of a Group 11 element in the Periodic Table and a Group 16 element in the Periodic Table, such as copper oxide (I) ($Cu_2O$) and copper selenide (I) ($Cu_2Se$); compounds composed of a Group 11 element in the Periodic Table and a Group 17 element in the Periodic Table, such as copper chloride (I) (CuCl), copper bromide (I) (CuBr), copper iodide (I) (CuI), silver chloride (AgCl), and silver bromide (AgBr); compounds composed of a Group 10 element in the Periodic Table and a Group 16 element in the Periodic Table, such as nickel oxide (II) (NiO); compounds composed of a Group 9 element in the Periodic Table and a Group 16 element in the Periodic Table, such as cobalt oxide (II) (CoO) and cobalt sulfide (II) (CoS); compounds composed of a Group 8 element in the Periodic Table and a Group 16 element in the Periodic Table, such as triiron tetraoxide ($Fe_3O_4$) and iron sulfide (II) (FeS); compounds composed of a Group 7 element in the Periodic Table and a Group 16 element in the Periodic Table, such as manganese oxide (II) (MnO); compounds composed of a Group 6 element in the Periodic Table and a Group 16 element in the Periodic Table, such as molybdenum sulfide (IV) ($MoS_2$) and tungsten oxide (IV) ($VO_2$); compounds composed of a Group 5 element in the Periodic Table and a Group 16 element in the Periodic Table, such as vanadium oxide (II) (VO), vanadium oxide (IV) ($VO_2$), and tantalum oxide (V) ($Ta_2O_5$); compounds composed of a Group 4 element in the Periodic Table and a Group 16 element in the Periodic Table, such as titanium oxide (such as $TiO_2$, $Ti_2O_5$, $Ti_2O_3$ and $Ti_5O_9$); compounds composed of a Group 2 element in the Periodic Table and a Group 16 element in the Periodic Table, such as magnesium sulfide (MgS) and magnesium selenide (MgSe); chalcogen spinels, such as cadmium (II) chromium (III) oxide ($CdCr_2O_4$), cadmium (II) chromium (III) selenide ($CdCr_2Se_4$), copper (II) chromium (III) sulfide ($CuCr_2S_4$), and mercury (II) chromium (III) selenide ($HgCr_2Se_4$); and barium titanate ($BaTiO_3$). Preferred examples are: compounds composed of a Group 14 element in the Periodic Table and a Group 16 element in the Periodic Table, such as $SnS_2$, SnS, SnSe, SnTe, PbS, PbSe, and PbTe; compound semiconductors of Group III-V, such as GaN, GaP, GaAs, GaSb, InN, InP, InAs, and InSb; compounds composed of a Group 13 element in the Periodic Table and a Group 16 element in the Periodic Table, such as $Ga_2O_3$, $Ga_2S_3$, $Ga_2Se_3$, $Ga_2Te_3$, $In_2O_3$, $In_2S_3$, $In Se_3$, and $In Te_3$; compound semiconductors of Group II-VI, such as ZnO, ZnS, ZnSe, ZnTe, CdO, CdS, CdSe, CdTe, HgO, HgS, HgSe, and HgTe; compounds composed of a Group 15 element in the Periodic Table and a Group 16 element in the Periodic Table, such as $As_2O_3$, $As_2S_3$, $As_2Se_3$, $As_2Te_3$, $Sb_2O_3$, $Sb_2S_3$, $Sb_2Se_3$, $Sb_2Te_3$, $Bi_2O_3$, $Bi_2S_3$, $Bi_2Se_3$, and $Bi_2Te_3$; and compounds composed of a Group 2 element in the Periodic Table and a Group 16 element in the Periodic Table, such as MgS and MgSe. Among these preferred examples, Si, Ge, GaN, GaP, InN, InP, $Ga_2O_3$, $Ga_2S_3$, $In_2O_3$, $In_2S_3$, ZnO, ZnS, CdO, and CdS are more preferred. These substances are advantageous in production of a light emitting device because they do not contain electronegative elements which are highly toxic and thus is excellent in resistance to environmental pollution and safety for living organisms, and because pure spectrum can be stably produced in a visible light region. Among these materials, CdSe, ZnSe and CdS are preferred from the perspective of light emission stability. Quantum dots of ZnO or ZnS are preferred in view of excellent luminous efficiency, refractive index, stability and economic efficiency. The materials exemplified above may be used alone or in combination.

The quantum dots described above may be optionally doped with a minute amount of various elements as impurities. Addition of such a dopant significantly improves luminescent properties.

The band gap of the quantum dots of the present invention is preferably at least 0.1 eV lower than the HOMO-LUMO gap energy of a material contained in an adjacent layer to a luminous layer, and is more preferably at least 0.1 eV lower than the band gap of the host compound contained in the luminous layer.

The band gap of at least one quantum dot is the most preferably at least 0.1 eV higher than the band bap of the blue phosphorescent compound contained in the luminous layer. Specifically, the band gap of at least one quantum dot is preferably within the range of 1.8 to 3.2 eV, more preferably within the range of 2.2 to 3 eV, and most preferably within the range of 2.6 to 3.0 eV.

The term "band gap" in the present invention, when used in the context of quantum dots which are inorganic substances, refers to energy difference between valence band and conduction band (band gap of quantum dots). In the context of phosphorescent dopant and host compound which are organic substances, "band gap (eV)" refers to energy difference between the highest occupied molecular orbital (HOMO) and the lowest unoccupied molecular orbital (LUMO).

The band gap (eV) of the quantum dots can be measured using a Tauc plot.

The Tauc plot, one of optochemical methods for band gap (eV) measurement, will be explained below.

The principle of band gap ($E_0$) measurement using the Tauc plot will be described below.

In semiconductor materials, Equation (A) is assumed to hold for light absorption coefficient α, optical energy hν (h is Planck's constant and ν is frequency), and the band gap energy $E_0$ in a region near the optical absorption edge of the longer wavelength side, where relatively high absorption is observed.

$$\alpha h\nu = B(h\nu - E_0)^2 \qquad \text{Equation (A):}$$

Accordingly, the band gap energy $E_0$ of quantum dots can be determined by measuring the absorption spectrum, plotting a graph of by versus $(\alpha h\nu)^{0.5}$ (so-called Tauc plot) based on the measured absorption spectrum, and extrapolating the linear region to determine the value of by when α=0, which is the band gap energy $E_0$ of quantum dots to be determined.

The band gap (eV) in the context of a phosphorescent dopant and a host compound which are organic substances can be determined in accordance with the method described below.

HOMO energy level was measured using photoelectron spectrometer AC-2 (manufactured by Riken Keiki Co., Ltd.), and LUMO energy level was calculated from the absorption wavelength edge (λth(nm)) using the formula below. Thus, the band energy gap (HOMO-LUMO energy gap) was determined. The numerical values are expressed as absolute values (ev).

(LUMO energy level)=(HOMO energy level)+1240/ $\lambda$th

The energy difference between the highest occupied molecular orbital (HOMO) and the lowest unoccupied molecular orbital (LUMO) determined by the aforementioned method was determined. The determined energy difference serves as the band gap (eV) for a phosphorescent dopant and a host compound which are organic substances.

Examples of alternative methods of estimating energy level of organic and inorganic functional materials include determination based on energy level measured by scanning tunneling spectroscopy, ultraviolet photoelectron spectroscopy, X-ray photoelectron spectroscopy, or Auger electron spectroscopy, and optical estimation of the band gap.

Use of the quantum dots also may be used for not only emission of light produced by direct recombination of holes and electrons in the quantum dots but also emission of light from the core of the quantum dots caused by the absorbance of energy of excitons produced in an organic electron-blocking hole transport layer, an organic luminous layer, or a hole-blocking electron transport layer. Since the quantum dots are lightly doped, it can emit light through absorbance of energy of excitons in other phosphorescent compounds.

Quantum dots preferably have surfaces coated with a coating layer of an inactive inorganic substance or a coating formed of organic ligands. That is, the surfaces of the quantum dots preferably have a core/shell structure having a structure having a core region composed of a quantum dot material and a shell region composed of a coating layer of an inactive inorganic substance or inorganic ligands.

The core/shell structure is preferably formed of at least two types of compounds. The two or more types of compounds may form a gradient structure. This can effectively prevent aggregation of quantum dots in a coating liquid, which improves dispersion of the quantum dots and the luminance efficiency and prevents color shift during continuous driving. The presence of the coating layer ensures stable luminescent properties.

Coating the surfaces of the quantum dots with coating layers (shell region) also ensures loading of a surface modifier described below near the surfaces of the quantum dots.

The coating (shell region) may have any thickness, which is preferably within the range of 0.1 to 10 nm, more preferably within the range of 0.1 to 5 nm.

In general, the color of emitted light can be determined by a controlled average particle size of quantum dots. If the thickness of the coating is within the ranges indicated above, the thickness of the coating ranges from a thickness of several atoms to a thickness less than one quantum dot. With such a thickness of the coating, quantum dots can be compounded at high density, and thus sufficient emission of light can be achieved. The presence of the coating also prevents undesired nonradiative electronic energy transfer on the surface of each core particle due to electron trapping to dangling bonds, thereby preventing a decrease in quantum efficiency.

(4.4) Functional Surface Modifier

When a functional organic layer containing quantum dots is formed by wet coating process, quantum dots in a coating liquid used in the process preferably contain a surface modifier adhering near the surfaces thereof, which allows especially excellent dispersion stability of the quantum dots in the coating liquid. Adhesion of a surface modifier on surfaces of quantum dots in the production thereof also provides especially excellent quantum dots, because it provides the resulting quantum dots with high sphericity and narrow particle size distribution.

A functional surface modifier applicable in the present invention may be directly bonded to surfaces of quantum dots, or may be bonded through a shell (that is, the surface modifier is directly bonded to the shell but is not in contact with the core of the quantum dots).

Examples of the surface modifier include polyoxyethylene alkyl ethers, such as polyoxyethylene lauryl ethers, polyoxyethylene stearyl ethers, and polyoxyethylene oleyl ethers; trialkylphosphines, such as tripropylphosphine, tributylphosphine, trihexylphosphine, and trioctylphosphine, polyoxyethylene alkylphenyl ethers, such as polyoxyethylene n-octylphenyl ethers and polyoxyethylene n-nonylphenyl ethers; tertiary amines, such as tri(n-hexyl) amine, tri(n-octyl)amine, and tri(n-decyl)amine; organic phosphorus compounds, such as tripropylphosphine oxide, tributylphosphine oxide, trihexylphosphine oxide, trioctylphosphine, and tridecylphosphine oxide; polyethylene glycol diesters, such as polyethylene glycol dilaurate and polyethylene glycol distearate; organic nitrogen compounds such as nitrogen-containing aromatic compounds e.g., pyridine, lutidine, corydine, and quinolines; aminoalkanes, such as hexylamine, octylamine, decylamine, dodecylamine, tetradecylamine, hexadecylamine, and octadecylamine; dialkyl sulfides, such as dibutyl sulfide; dialkyl sulfoxides, such as dimethyl sulfoxide and dibutyl sulfoxide; organic sulfur-containing aromatic compounds, such as sulfur-containing aromatic compounds e.g., thiophene; higher fatty acids, such as palmitic acid, stearic acid, and oleic acid; alcohols; sorbitan fatty acid esters; fatty acid-modified polyesters; tertiary amine-modified polyurethanes; and polyethyleneimines. If quantum dots are prepared by methods described below, the surface modifier is preferably a substance which coordinates to quantum dot fine particles and is stabilized in the high-temperature liquid phase. Specifically, trialkylphosphines, organic phosphorus compounds, aminoalkanes, tertiary amines, organic nitrogen compounds, dialkyl sulfides, dialkyl sulfoxides, organic sulfur compounds, higher fatty acids, and alcohols are preferred. Use of such a surface modifier provides the quantum dots with especially excellent dispersibility in a coating liquid. It also provides the quantum dots with higher sphericity in form in production thereof, and sharper particle distribution.

In the present invention, the size (average particle size) of quantum dots is preferably within the range of 1.0 to 20 nm, as described above. In the present invention, the size of quantum dots represents the total size of a core region formed of a quantum dot material, a shell region formed of a coating layer of an inactive inorganic substance or organic ligands, and a surface modifier. If such a surface modifier and shell are not contained, the size of quantum dots represents the size without them.

(4.5) Method of Producing Quantum Dots

Quantum dots can be produced by any conventional method, as is described below. The methods described below are non-limiting examples, and any conventionally-known method can be used. Quantum dots can also be commercially available from Aldrich, CrystalPlex, or NNLab.

Examples of a process under high vacuum include molecular beam epitaxy and CVD. Examples of a liquid-phase production process include reverse micelle process in which reverse micelles of an aqueous raw material solution are formed in a nonpolar organic solvent, such as alkanes e.g., n-heptane, n-octane, and isooctane, or aromatic hydrocarbons e.g., benzene, toluene, and xylene, to cause crystal growth in the reverse micelles; a hot soap process in which a thermally decomposable raw material is injected into a high-temperature liquid-phase organic medium to induce crystal growth; and a solution reaction process in which acid-base reaction is used as driving force, as in the hot soap process, and crystal growth is induced at a relatively low temperature. Any of these methods can be used, but a liquid-phase production process is particularly preferred.

In a synthesis of quantum dots through a liquid-phase production process, an organic surface modifier present on quantum dot surfaces is referred to as "initial surface modifier." Examples of the initial surface modifier in the hot soap process include trialkylphosphines, trialkylphosphine oxides, alkylamines, dialkyl sulfoxides, and alkane phosphonic acids. These initial surface modifiers are preferably exchanged for the functional surface modifier described above through an exchange reaction.

For example, an initial surface modifier obtained by the hot soap process, such as trioctylphosphine oxide, can be exchanged for a functional surface modifier described above through an exchange reaction performed in a liquid phase containing the functional surface modifier.

Examples of a method of producing the quantum dots will now be described.

<1> Preparation Example 1 of Quantum Dots

CdO powder (1.6 mmol, 0.206 g; Aldrich, +99.99%) and oleic acid (6.4 mmol, 1.8 g; Aldrich, 95%) were mixed in 40 mL of trioctylamine (abbreviated as TOA; Aldrich, 95%). The mixed solution (Cd-containing mixture) was subjected to a thermal treatment at 150° C. under vigorous stirring, and the temperature was raised to 300° C. under a $N_2$ stream. Subsequently, 0.2 ml of Se (Alfa Aesar) of 2.0 mol/L blended with trioctylphospine (abbreviated as TOP; Strem, 97%) was injected into the Cd-containing mixture at high rate at 300° C.

After 90 seconds, 1.2 mmol of n-octanethiol blended with TOA (210 μl in 6 ml) was injected into the solution prepared above using a syringe pump at a rate of 1 ml/min, and the resulting mixture was allowed to react for 40 minutes. The resultant is referred to as a Cd-containing reaction medium.

Subsequently, 0.92 g of zinc acetate and 2.8 g of oleic acid were dissolved in 20 ml of TOA at 200° C. under $N_2$ atmosphere, thereby preparing a Zn precursor solution of 0.25 mol/L.

Subsequently, 16 ml aliquot of the Zn-oleic acid solution (the Zn precursor solution heated at 100° C.) was injected into the Cd-containing reaction medium at a rate of 2 ml/min. Subsequently, 6.4 mmol of n-octanethiol in TOA (1.12 ml in 6m1) was injected using a syringe pump at a rate of 1 ml/min.

The overall reaction was performed for 2 hours. After completion of the reaction, the resulting product was cooled to a temperature of approximately 50 to 60° C., followed by centrifugation (5,600 rpm) to remove any organic sludge. Ethanol (Fisher, HPLC grade) was added until the opaque mass was dissolved, followed by centrifugation. The precipitate was then dissolved in toluene (Sigma-Aldrich, Anhydrous 99.8%), thereby obtaining a colloidal solution of quantum dots having a CdSe/CdS/ZnS core/shell structure.

<2> Preparation Example 2 of Quantum Dots

In preparing quantum dots having a CdSe/ZnS core/shell structure, a precursor material, such as $(CH_3)_2Cd$ (dimethyl cadmium) and TOPSe (TriOctyl Phosphine Selenide), which corresponds to the core material (CdSe), was injected into an organic solvent containing TOPO (TriOctyl Phosphine Oxide) as a surfactant to cause formation of crystals. The mixture was maintained at a high temperature for a specific time to allow the crystals to grow to a uniform size. Subsequently, a precursor material corresponding to a shell (ZnS) was injected into the core to form a shell on the surfaces of the core previously produced. Thus, CdSe/ZnS quantum dots capped with TOPO could be obtained.

<3> Preparation Example 3 of Quantum Dots

Under an argon gas stream, 2.9 g of stearic acid (KANTO KAGAKU), 620 mg of n-tetradecylphosphonic acid (AVOCADO), and 250 mg of cadmium oxide (Wako Pure Chemical Industries, Ltd.) were added to 7.5 g of TriOctyl Phosphine Oxide (TOPO) (KANTO KAGAKU), and the mixture was heated and mixed at 370° C. The resulting mixture was allowed to cool spontaneously to 270° C. Subsequently, a solution previously prepared by dissolving 200 mg of selenium (STREM CHEMICAL) in 2.5 mL of tributylphosphine (KANTO KAGAKU) was added to the mixture, followed by drying under reduced pressure, thereby obtaining CdSe fine particles coated with TOPO.

Subsequently, 15 g of TOPO was added to the resulting CdSe fine particles, and the mixture was heated. While continuously maintaining the temperature at 270° C., a solution prepared by dissolving 1.1 g of zinc diethyldithiocarbamate (Tokyo Chemical Industry Co., Ltd.) in 10 mL of trioctylphosphine (TOP, Sigma-Aldrich) was added to the mixture, thereby obtaining nanoparticles containing TOPO immobilized on the surfaces thereof and containing CdSe nanocrystals as a core and ZnS as a shell (hereinafter, also referred to as "TOPO-immobilized quantum dots"). Quantum dots at such a state are soluble in organic solvents such as toluene and tetrahydrofuran (hereinafter, also referred to as THF).

Subsequently, the TOPO-immobilized quantum dots prepared above were dissolved in THF, and the solution was heated to 85° C., followed by dropwise addition of 100 mg of N—[(S)-3-mercapto-2-methylpropionyl]-L-proline (Sigma-Aldrich) dissolved in ethanol. The solution was then refluxed for approximately 12 hours. After the reflux for 12 hours, aqueous NaOh solution was added and the mixture was heated at 90° C. for two hours to vaporize THF to obtain crude quantum dots. The crude quantum dots were then subjected to purification and concentration using ultrafiltration ("Microcon" from Millipore) and a sephadex column ("MicroSpin G-25Columns" from Amersham Biosciences), thereby producing hydrophilic quantum dots with N—[(S)-3-mercapto-2-methylpropionyl]-L-proline immobilized on the surfaces thereof.

(4.6) Method of Producing a Quantum Dot Film

A quantum dot film is preferably produced by a wet process. Examples of the wet process include spin coating, casting, die-coating, blade coating, roller coating, ink jetting, printing, spray coating, curtain coating, and Langmuir Blodgett (LB) coating.

Other useful processes of producing the quantum dot are transfer coating processes, such as film transfer and stamp transfer, in which a monolayer of quantum dots is formed on any other medium and is subsequently transferred.

Each element of the organic EL element of the present invention will now be described in detail.

<<Anode>>

The anode of the organic EL element of the present invention is preferably formed of an electrode material such as a metal, an alloy, an electrically conductive compound, or a mixture thereof that has a high work function (4 eV or higher). Specific examples of such an electrode material include metals such as Au; CuI; indium-tin oxide (hereinafter, abbreviated as "ITO"); and conductive transparent materials such as $SnO_2$ and ZnO. Amorphous materials applicable to production of a transparent conductive film, such as IDIXO ($In_2O_3$—ZnO), may also be used. The anode may also be produced by forming the electrode material into a thin film by a method such as vapor deposition or sputtering, and then producing a desired shape of pattern by a method such as a photolithographic process. If high pattern accuracy (approximately 100 μm or higher) is not required, the pattern may be formed via a mask having a desired shape during the time of vapor deposition or sputtering of the electrode material. Alternatively, the film may be formed with a material which can be coated, such as an organic conductive compound through a wet process, for example, printing or coating. When luminescence is extracted from the anode, the anode preferably has a transmittance of 10% or higher. The sheet resistance of the anode is preferably several hundred ohms per sheet or lower. The thickness of the film is normally within the range of 10 to 1000 nm, preferably within the range of 10 to 200 nm, although it depends on the electrode material.

<<Cathode>>

The cathode of the organic EL element of the present invention is preferably formed of an electrode material such as a metal (hereinafter, referred to as "electron-injecting metal"), an alloy, an electrically conductive compound, or a mixture thereof that has a low work function (4 eV or lower). Specific examples of such an electrode include sodium, sodium-potassium alloys, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, and rare earth metals. From the perspective of electron injection and resistance to oxidation, it is preferable to use a mixture of a first metal as an electron-injecting metal and a second metal which is a stable metal with a higher work function than the first metal, among these materials. Preferred examples of such a mixture include mixtures of magnesium/silver, magnesium/aluminum, magnesium/indium, aluminum/aluminum oxide ($Al_2O_3$), lithium/aluminum, and aluminum. The cathode can be produced by forming such an electrode material into a thin film using any process, for example, vapor deposition or sputtering. The sheet resistance of the cathode is preferably several hundred ohms per sheet. The film thickness is normally within the range of 10 nm to 5 μm, preferably within the range of 50 to 200 nm. In order to allow the emitted light to transmit, either the anode or the cathode of the organic EL element is preferably transparent or translucent, which improves the luminance of the emitted light.

After any of the metals exemplified above is formed into a thin film with a thickness of 1 to 20 nm on a cathode, any of the transparent conductive materials exemplified in the description of the anode is formed thereon to produce a transparent or translucent cathode. This process can be applied to production of an organic EL element having an anode and a cathode that have transparency.

<<Support Substrate>>

The support substrate (hereinafter, also referred to as substrate, base, or support) of the organic EL element of the present invention can be produced from any material, for example, glass or plastic, and may be transparent or opaque. If light is extracted from the support substrate, the support substrate is preferably transparent. Examples of the preferred transparent support substrate include glass, quartz, and transparent resin films. A flexible substrate is more preferred than a rigid substrate, in view of excellent high stability under high-temperature preservation and a low variation in chromacity. Particularly, the support substrate is preferably a flexible resin film which can provide a flexible organic EL element.

Examples of the resin film include polyesters, such as poly(ethylene terephthalate) (PET) and polyethylene naphthalate (PEN); polyethylene; polypropylene; cellophane; cellulose esters and derivatives thereof, such as cellulose diacetate, cellulose triacetate (TAC), cellulose acetate butyrate, cellulose acetate propionate (CAP), cellulose acetate phthalate, and cellulose nitrate; poly(vinylidene chloride); poly(vinyl alcohol); polyethylene vinyl alcohol; syndiotactic polystyrene; polycarbonates; norbornene resins; polymethylpentene; polyether ketone; polyimides; polyethersulfone (PES); polyphenylene sulfide; polysulfones; polyetherimides; polyether ketone imides; polyamides; fluororesins; nylons; poly(methyl methacrylate); acrylics or polyarylates; and cycloolefin resins, such as ARTON (product name; manufactured by JSR) and APEL (product name; manufactured by Mitsui Chemicals, Inc.).

The surface of the resin film may be covered with a coating layer of an inorganic or organic material or a hybrid film of inorganic and organic materials. The resin film is preferably a gas barrier film having water vapor permeability (measured in accordance with JIS K 7129-1992 (25±0.5° C.; relative humidity: (90±2)% RH)) of 0.01 g/(m$^2$·24 h·atm) or lower, and is preferably a high barrier film having oxygen permeability (measured in accordance with JIS K 7126-1987) of $1\times10^{-3}$ cm$^3$/(m$^2$·24 h·atm) or lower and water vapor permeability of $1\times10^{-3}$ g/(m$^2$·24 h·atm) or lower. The water vapor permeability of the resin film is more preferably $1\times10^{-5}$ g/(m$^2$·24 h·atm) or lower.

The gas barrier layer may be composed of any material that can block infiltration of substances, such as moisture and oxygen, which causes deterioration of the organic EL element. For example, silicon oxide, silicon dioxide and silicon nitride can be used. In order to improve the brittleness of the film, the film preferably has a laminated structure composed of an inorganic layer and an organic material layer. The inorganic layers and organic functional layers may be formed in any order, but are preferably formed alternately a plurality of times in a multilayer structure.

The gas barrier layer may be formed by any method, for example, vacuum vapor deposition, sputtering, reactive sputtering, molecular beam epitaxy, cluster ion beam deposition, ion plating, plasma polymerization, atmospheric pressure plasma polymerization, plasma chemical vapor deposition (CVD), laser CVD, thermal CVD, and coating. In particular, the gas barrier layer is preferably produced by an atmospheric pressure plasma polymerization process as described in Japanese Laid-Open Patent Application No. 2004-68143.

Examples of an opaque support substrate include metal plates such as aluminum plate and stainless steel plate, films, opaque resin substrates, and ceramic substrates.

In the organic EL element of the present invention, the luminescence extraction efficiency at a room temperature is preferably 1% or higher, more preferably 5% or higher.

The extraction quantum efficiency (%) is expressed by the following equation:

Extraction quantum efficiency (%)=the number of photons emitted from the organic EL element/the number of electrons passing through the organic EL element×100.

<<Sealing>>

Examples of a sealing means applicable to the organic EL element of the present invention include adhesion of a sealing material, electrodes, and a support substrate with an adhesive for sealing.

The sealing material may be disposed to cover a display area of the organic EL element. The sealing material may have a concave or flat shape, and transparency and electric insulation are no object.

Specific examples of the sealing material include glass plates, composite materials of a polymer plate and film, and composite materials of a metal plate and film. Specific examples of materials for the glass plate include soda-lime glass, barium-strontium-containing glass, lead glass, aluminosilicate glass, borosilicate glass, barium borosilicate glass, and quartz. Examples of materials for the polymer plate include polycarbonates, acrylics, poly(ethylene terephthalate), polyether sulfides, and polyether sulfones. Examples of materials for the metal plate include one or more metals or alloys selected from the group consisting of stainless steel, iron, copper, aluminum, magnesium, nickel, zinc, chromium, titanium, molybdenum, silicone, germanium and tantalum.

In the present invention, a polymer film and a metal film may be preferably used as a sealing material, because they contributes to production of low-profile organic EL elements. The polymer film preferably has an oxygen permeability (measured in accordance with JIS K 7126-1987) of $1\times10^{-3}$ cm$^3$/(m$^2$·24 h·atm) or lower and a water vapor permeability (measured in accordance with JIS K 7129-1992 (25±0.5° C.; relative humidity: (90±2)% RH)) of $1\times10^{-3}$ g/(m$^{2\cdot24}$ h) or lower.

The sealing material may be processed into a concave shape through any process, for example, sandblasting or chemical etching.

Specific examples of the adhesive for sealing include light-curable or thermosetting adhesives having reactive vinyl groups, such as acrylic acid oligomers and methacrylic acid oligomers; moisture-curable resins, such as 2-cyanoacrylic acid esters; thermosetting a d chemically curable adhesives (two-part adhesives), such as epoxy adhesives; hot-melt adhesives, such as polyamide adhesives, polyester adhesives, and polyolefin adhesives; and cation-curable and ultraviolet-curable epoxy resin adhesives.

The adhesive for sealing can preferably cure and adhere at a temperature within the range from room temperature to 80° C. to prevent deterioration of the organic EL element during a thermal treatment. The adhesive may also contain a desiccant dispersed therein. The adhesive may be coated on a target portion with a commercially available dispenser or by a screen printing process.

It is also preferable to form a layer of inorganic or organic material which serves as a sealing film on the outer side of the electrode positioned opposite to the substrate across the organic functional layer, so that the layer of the organic or organic material covers the electrode and the organic functional layer and is in contact with the support substrate. The sealing film may be composed of any material that can block infiltration of substances, such as moisture and oxygen, which causes deterioration of the organic EL element. For example, silicon oxide, silicon dioxide and silicon nitride can be used. In order to improve the brittleness of the sealing film, the film preferably has a laminated structure composed of an inorganic layer and an organic material layer. The sealing film may be formed by any method, for example, vacuum vapor deposition, sputtering, reactive sputtering, molecular beam epitaxy, cluster ion beam deposition, ion plating, plasma polymerization, atmospheric pressure plasma polymerization, plasma chemical vapor deposition (CVD), laser CVD, thermal CVD, and coating.

The gap between the sealing material and the display area of the organic EL element is preferably filled with an inactive gas, such as nitrogen gas and argon gas, or an inactive liquid, such as fluorohydrocarbon and silicon oil, for the purpose of forming a gaseous or a liquid phase. The gap may also be a vacuum or filled with a moisture-absorbing compound.

Examples of the moisture-absorbing compound include metal oxides, such as sodium oxide, potassium oxide, calcium oxide, barium oxide, magnesium oxide, and aluminum oxide; sulfates, such as sodium sulfate, calcium sulfate, magnesium sulfate, and cobalt sulfate; metal halides, such as calcium chloride, magnesium chloride, cesium fluoride, tantalum fluoride, cerium bromide, magnesium bromide, barium iodide, and magnesium iodide; and perchlorates, such as barium perchlorate and magnesium perchlorate. Sulfates, metal halides, and anhydrous perchlorates are preferably used.

Sealing may be performed by casing sealing (can sealing) or adhesion sealing (solid sealing). From the perspective of thinning of the element, solid sealing is preferred. In production of a flexible organic EL element, solid sealing is preferred, because the sealing material should also have flexibility.

A preferred embodiment including solid sealing will now be described.

The adhesive for sealing of the present invention may be a thermosetting adhesive or an uv-curable resin, and is preferably a thermosetting adhesives, such as an epoxy resin, acrylic resin, and silicon resin, more preferably a thermosetting epoxy adhesive resin, which has excellent moisture and water resistances and exhibits low shrinkage during the curing.

The adhesive for sealing of the present invention preferably has a water content of 300 ppm or lower, more preferably 0.01 to 200 ppm, and most preferably 0.01 to 100 ppm.

In the present invention, the water content can be measured by any method. Examples of the measuring method include measurements using a volumetric moisture meter (Karl Fischer), an infrared moisture meter, a microwave transmission type of moisture meter, gravimetric measurements by heating and drying, GC/MS, IR, DSC (differential scanning calorimeter), and TDS (thermal desorption spectroscopy). The moisture content can also be determined with an accurate moisture analyzer such as AVM-3000 (Omni-Tek) based on the increase in pressure resulting from moisture evaporation, thereby determining the moisture content of the film or solid film.

In the present invention, the water content of the adhesive for sealing can be adjusted by varying the time of leaving the adhesive under a nitrogen atmosphere under conditions of a dew-point temperature of −80° C. or less and an oxygen concentration of 0.8 ppm, for example. The adhesive for sealing can also be dried under vacuum with a pressure of 100 Pa or lower for a varying time of leaving the adhesive. The adhesive for sealing may be dried alone, or may be placed in the sealing material and then dried.

In adhesion sealing (solid sealing), a sealing material can be used which has a laminated structure of a poly(ethylene terephthalate) (PET) film with a thickness of 50 μm and an aluminum foil (with a thickness of 30 μm), for example. Adhesion sealing (solid sealing) can be performed with such a sealing material as follows: the adhesive for sealing is placed on the aluminum side of the sealing material by uniformly coating it with a dispenser; a resin substrate and the sealing material are aligned and then are crimped together (under a pressure of 0.1 to 3 MPa); and adhesion is performed at a temperature of 80 to 180° C.

The heating time and crimping time vary depending on the type, amount, and area of the adhesive, but the pressure applied in the pre-adhesion may be selected within the range of 0.1 to 3 MPa, and the time for thermosetting may be selected within the range of five seconds to ten minutes, at a temperature of 80 to 180° C.

A heated pressure roller may be preferably used, because thus the crimping (pre-adhesion) and heating can be performed simultaneously and the air gap inside can also be removed at the same time.

The adhesive layer can be formed by a coating process or printing process, such as roller coating, spin coating, screen printing, and spray, which is selected depending on the material of the layer, with a dispenser.

Solid sealing is a sealing form in which the sealing material and the substrate of the organic EL element are covered with a cured resin without any gap between the sealing material and the substrate.

Examples of the sealing material include metals, such as stainless steel, aluminum, and magnesium alloys; plastics, such as poly(ethylene terephthalate), polycarbonate, polystyrene, nylon, and poly(vinyl chloride), and composites thereof; and glass. For a resin film, the sealing material may optionally have a gas barrier layer overlaid thereon, which is formed of aluminum, aluminum oxide, silicon oxide, or silicon nitride, as in the case of the resin substrate.

The gas barrier layer may be formed on one or both sides of the sealing material before the shaping of the sealing material through a process such as sputtering or vapor deposition, or may be formed on one or both sides of the sealing material after the sealing through a similar process. This gas barrier layer also preferably has an oxygen permeability of $1 \times 10^{-3}$ ml/(m$^2 \cdot$24 h·atm) or lower and a water vapor permeability (25±0.5° C.; relative humidity: (90±2)% RH)) of $1 \times 10^{-3}$ g/(m$^2 \cdot$24 h) or lower.

The sealing material may also be a film with a metal foil, such as aluminum, overlaid thereon. In a method of overlaying a polymer film on one side of the metal foil, any commonly used laminating machine can be used. Examples of usable adhesive include polyurethane adhesives, polyester adhesives, epoxy adhesives, and acrylic adhesives. A curing agent may be optionally used in combination with such an adhesive. A dry lamination process is preferred, while a hot-melt lamination, extrusion lamination or co-extrusion lamination process may also be used.

If the metal foil is formed by sputtering or vapor deposition and if the electrode is formed with a fluid electrode material such as conductive paste, a polymer film may be used as a substrate and the metal foil is formed on the polymer film.

<<Protective Film and Protective Plate>>

In order to enhance the mechanical strength of the organic EL element, a protective film or plate may be provided on the outer side of the sealing film which is opposite to the support substrate across the organic functional layer. If the sealing is performed by a sealing film, the mechanical strength of the organic EL element is not necessarily high, and thus such a protective film or plate is preferably formed. Examples of a material usable for such a protective film or plate include the same glass plates, composite materials of a polymer plate and film, and composite materials of a metal plate and film as those which can be used for the sealing. A polymer film is preferably used, from the perspective of weight saving and thinning of the organic EL element.

In the present invention, the organic EL element preferably has a light extraction member between a flexible support substrate and an anode or at any position between the flexible support substrate and the light exit side.

Examples of the light extraction member include prism sheets, lens sheets, and diffusion sheets. Other examples are diffraction grating and diffusing structures which are disposed in an interface or in any medium where total reflection occurs.

In an organic electroluminescent element which emits light from a substrate, part of the light emitted from a luminous layer causes total reflection at the interface between the substrate and the air, which results in undesired optical loss. In order to solve this problem, the substrate is processed so as to have a surface with a prism or lens shape, or a prism, lens or diffusion sheet is attached onto the surface of the substrate, thereby preventing the total reflection and thus improving the light extraction efficiency.

Another known method of enhancing the light extraction efficiency is use of a diffraction grating or diffusing structure at the interface or any medium where total reflection occurs.

<<Charge Generating Layer>>

[Structure of Charge Generating Layer]

The structure of the charge generating layer (CGL) applicable to the organic EL element of the present invention will be described. The charge generating layer of the present invention can be composed of one or more of the sublayers described below. In the present invention, the charge generating layer is preferably, but is not necessarily, formed of at least one layer. The charge generating layer preferably has conductivity equal to or higher than that of semiconductors.

The charge generating layer of the present invention generates holes and electrons when an electric field is generated. The holes and electrons may be generated in the electron generating layer, or near the interface between the charge generating layer and any other layer. For example, if the charge generating layer is a single layer, the charge of the electrons and holes may be generated in the charge generating layer or at the interface between the charge generating layer and the adjacent layer.

In the present invention, the charge generating layer is more preferably composed of two or more sublayers, and preferably has a structure including either or both of a p-type semiconductor sublayer and an n-type semiconductor sublayer.

The charge generating layer may also serve as a hole injection layer, hole transport layer, electron transport layer, or electron injection layer, and can be used as the same layer as such layers. The charge generating layer is defined as a layer generating holes and electrons, or a layer having an interface where holes and electrons are generated, as described above.

The structure of the charge generating layer of the present invention is as follows.

1. luminous unit/bipolar layer (single layer)/luminous unit
2. luminous unit/n-type semiconductor sublayer/p-type semiconductor sublayer/luminous unit
3. luminous unit/n-type semiconductor sublayer/intermediate sublayer/p-type semiconductor sublayer/luminous unit The bipolar sublayer can generate and transport holes and electrons inside the sublayer under an external electric field. The n-type semiconductor sublayer is a charge transport sublayer in which the majority carriers are electrons, and preferably has conductivity equal to or higher than that of ordinal semiconductors. The p-type semiconductor sublayer is an electron transport sublayer in which the majority carriers are holes, and preferably has conductivity equal to or higher than that of ordinal semiconductors. The intermediate sublayer may be optionally provided for improving generation of charge and long-term stability. Examples of the intermediate sublayer include sublayers for preventing diffusion of the n-type semiconductor sublayer and the p-type semiconductor sublayer, layers for preventing a p-n reaction, and sublayers for adjusting the charge level of the p-type semiconductor sublayer and the n-type semiconductor sublayer.

The organic EL element of the present invention may also have a bipolar sublayer, p-type semiconductor sublayer, and n-type semiconductor sublayer between the luminous unit and the charge generating layer. These sublayers may optionally be provided if the generated charge is rapidly injected into the luminous unit. In the present invention, these sublayers are included in the luminous unit, and are not regarded as charge generating layers.

In the present invention, the charge generating layer is preferably composed of at least two sublayers, and preferably has a function of injecting holes to the direction of the cathode of the element and electrons to the direction of the anode, upon application of voltage.

In a charge generating layer composed of two or more sublayers, the interface between the sublayers of the charge generating layer may have a distinct interface (heterointerface or homointerface), and may form a multidimensional interface such as a bulk hetero-structure, an island structure, and phase separation.

Each of the two sublayers preferably has a thickness within the range of 1 to 100 nm, more preferably within the range of 10 to 50 nm.

The charge generating layer of the present invention preferably has a high light transmittance with respect to light emitted from the luminous layer. In order to extract sufficient light to achieve sufficient luminance, the charge generating layer preferably has a light transmittance of 50% or higher, more preferably 80% or higher, at a wavelength of 550 nm.

In the charge generating layer composed of two or more sublayers, one sublayer is preferably composed of an inorganic or organic compound with a work function of 3.0 eV or lower. Another or the other sublayer is preferably formed of an inorganic or organic compound with a work function of 4.0 eV or higher. In a more preferred structure, one sublayer of the charge generating layer is composed of a metal, inorganic oxide, inorganic salt, organic metal complex, or organic salt that has a work function of 3.0 eV or lower, and another or the other sublayer is composed of a metal, inorganic oxide, inorganic salt, organic metal complex, or organic salt that has a work function of 4.0 eV or higher.

Preferred example structures of the charge generating layer will now be described.

i) A molybdenum sublayer may be used as apart of the charge generating layer disposed between the luminous units, as used in a well-known structure: ITO/EL-unit/Li/Al/MoO$_3$/EL-unit/Al.

As used herein, the EL-unit refers to a luminous unit. The luminous unit may have any layer configuration including at least one luminous layer. In addition to the luminous layer, the luminous unit may include a hole transport layer and an electron transport layer, or may also have a known structure including a hole injection layer, a hole transport luminous layer, an electron injection layer, and an electron transport luminous layer. For example, one luminous unit may be composed of hole injection/transport layers, a luminous layer and electron injection/transport layers.

ii) An element having two luminous units, as described in the Japanese Laid-Open Patent Application No. 2010-192719, has the following structure: ITO/EL-unit/LiF/Al/HAT/EL-unit/Al. An element with three or more luminous units has the following structure: ITO/EL-unit/LiF/Al/HAT/EL-unit/ . . . /LiF/Al/HAT/EL-unit/Al. The description on the luminous unit is the same as described above.

In the organic EL element of the present invention, the charge generating layer may be formed of materials such as nanocarbon materials, compounds represented by Formulae (A), (D), (F), (G), (H) and (J), imidazole radicals, metallocene derivatives, polycyano derivatives, and polynitro derivatives.

Non-limiting specific examples of materials for the charge generating layer of the present invention will now be described.

<Nanocarbon Materials>

Nanocarbon materials are carbonaceous materials having an average particle size within the range of 1 to 500 nm. Typical examples of the nanocarbon materials include carbon nanotubes, carbon nanofibers, fullerenes and derivatives thereof, carbon nanocoils, carbon onion fullerenes and derivatives thereof, diamonds, diamond-like carbons, and graphites.

Fullerenes and fullerene derivatives can be preferably used. The fullerenes in the present invention are closed polyhedral cage molecules composed of 20 or more carbon atoms, which has 12 pentagons and (n/2-10) hexagons. Derivatives thereof are referred to as fullerene derivatives. The carbon number of the fullerene skeleton may be any carbon number of 20 or more, preferably 60, 70 or 84. Non-limiting examples of fullerenes and fullerene derivatives of the present invention will now be described.

[Chemical Formula 95]

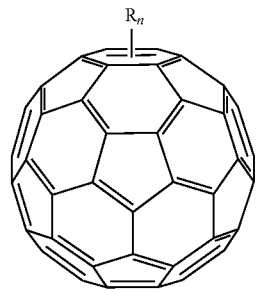

(1)

R represents a hydrogen atom or a substituent group, and n represents an integer of 1 to 12.

Preferred examples of the substituent group represented by R include alkyl groups, such as methyl, ethyl, i-propyl, hydroxyethyl, methoxymethyl, trifluoromethyl, t-butyl, cyclopentyl, cyclohexyl, and benzyl groups; aryl groups, such as phenyl, naphthyl, p-tolyl, and p-chlorophenyl groups; heteroaryl groups, such as pyrrole, imidazolyl, pyrazolyl, pyridyl, benzimidazolyl, benzothiazoyl, benzoxazolyl, triazolyl, oxadiazolyl, thienyl, and carbazolyl groups; alkenyl groups, such as vinyl, propenyl, and styryl groups; alkynyl groups, such as ethynyl group; alkyloxy groups, such as methoxy, ethoxy, i-propoxy, and butoxy groups; aryloxy groups, such as phenoxy group; alkylthio groups, such as methylthio, ethylthio, and i-propylthio groups; arylthio groups, such as phenylthio group; amino groups; alkylamino groups, such as dimethylamino, diethylamino, and ethylmethylamino groups; arylamino groups, such as anilino and diphenylamino groups; halogen atoms, such as fluorine, chlorine, bromine and iodine atoms; cyano groups; nitro groups; nonaromatic heterocyclic ring groups, such as pyrrolidyl, pyrazolyl, and imidazolyl groups; silyl groups, such as trimethylsilyl, t-butyldimethylsilyl, dimethylphenylsilyl, and triphenylsilyl groups. Each substituent group may have a further substituent group.

[Chemical Formula 96]

(2-1)

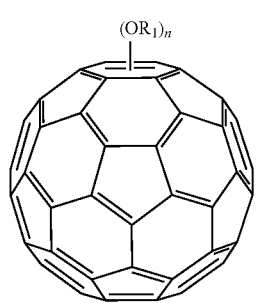

(2-2)

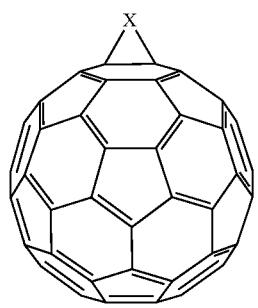

(2-3)

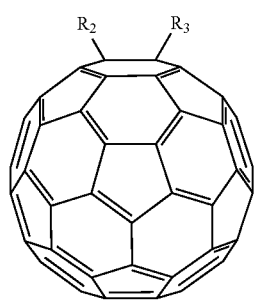

In these structures, $R_1$, $R_2$ and $R_3$ each independently represent a hydrogen atom or a substituent group, as in R described above, and X represents a divalent group represented by —$(CR^1R^2)m$— or —$CH_2$—$NR^3$—$CH_2$—. $R^1$, $R^2$ and $R^3$ each represent a hydrogen atom or a substituent group, n represents an integer of 1 to 12, and m represents an integer of 1 to 4. The substituent group has the same definition as that of the substituent group represented by R described above.

[Chemical Formula 97]

(3-1)

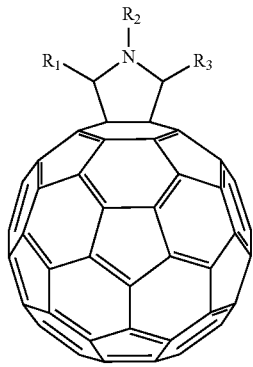

(3-2)

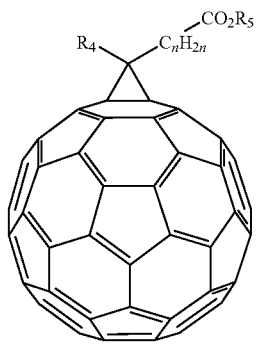

(3-3)

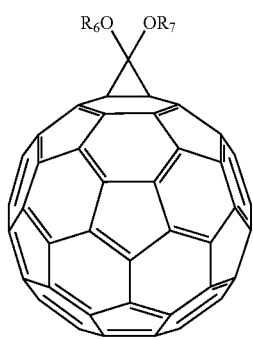

(3-4)

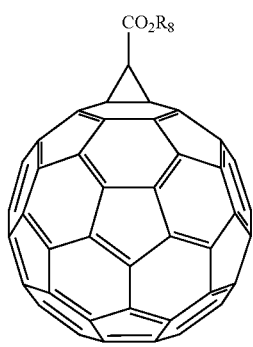

-continued (3-5)

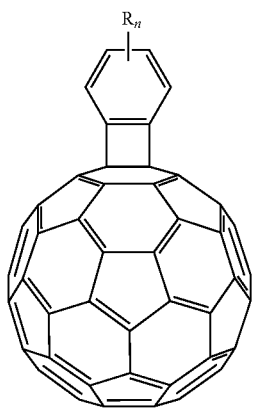

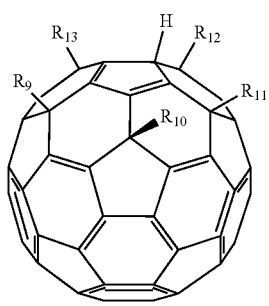

(3-6)

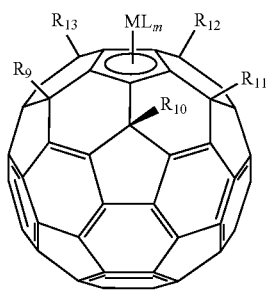

(3-7)

In the structures, $R_1$ to $R_{13}$ each represent a hydrogen atom or a substituent group. The substituent groups represented by $R_1$ to $R_{13}$ have the same definition as that of the substituent group represented by R described above. n represents an integer of 1 to 4. M represents a transition metal atom, and L represents a ligand which coordinates to the metal atom. The ligand may be any molecule or ion which forms a ligand in an ordinary metal complex. m represents an integer of 1 to 5.

Non-limiting specific examples of the fullerenes and fullerene derivatives will be shown below.

[Chemical Formula 98]

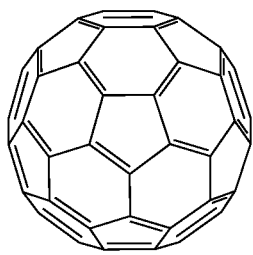

NC-1

-continued

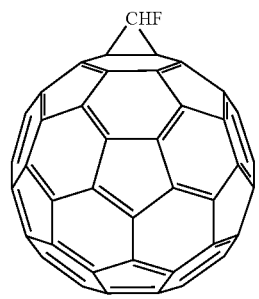

NC-2

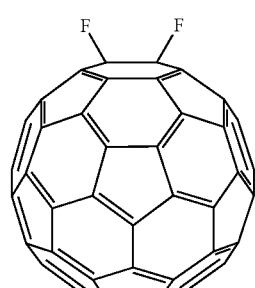

NC-3

NC-4

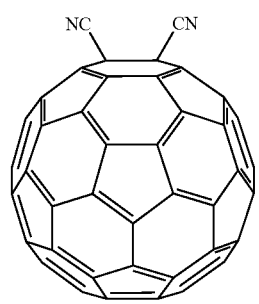

NC-5

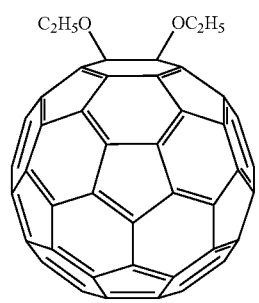

NC-6

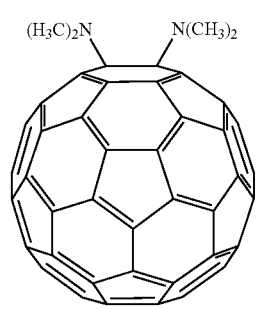

NC-7
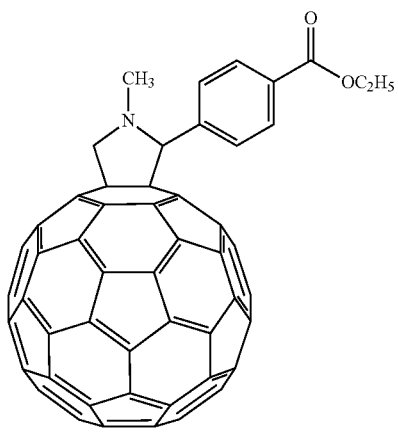
NC-8
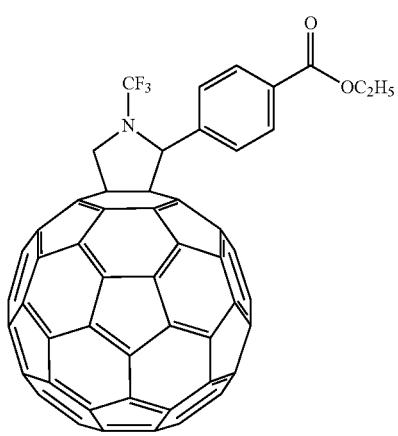
NC-9
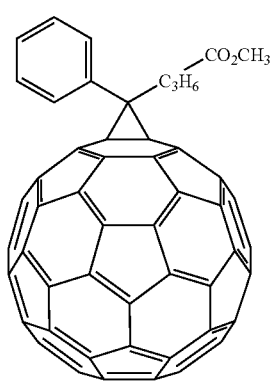
NC-10
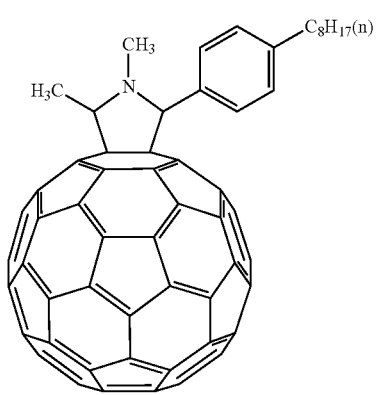
[Chemical Formula 99]
NC-11
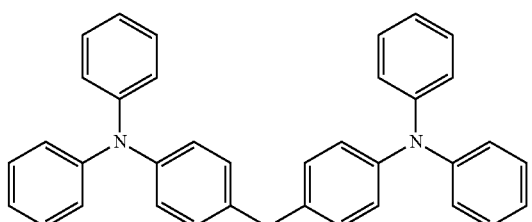
NC-12
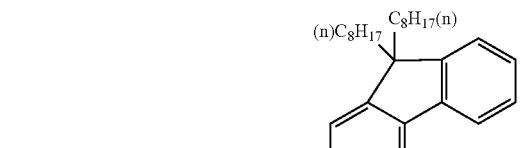
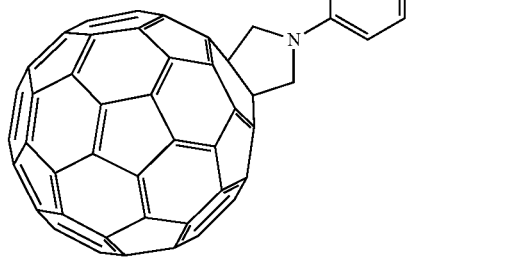
NC-13
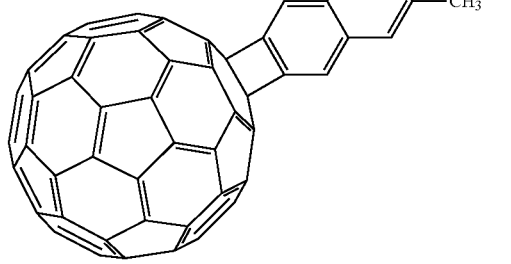
NC-14
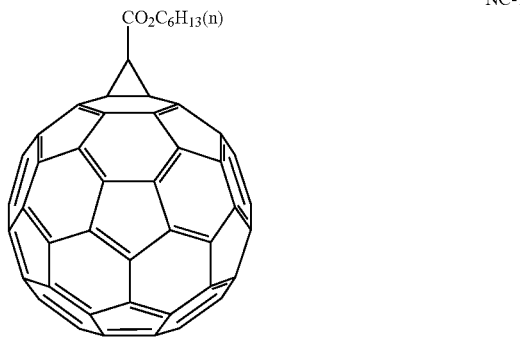

-continued
NC-15
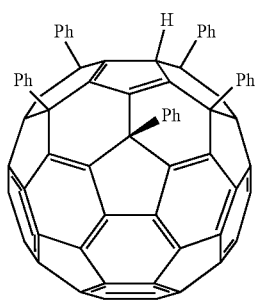
NC-16
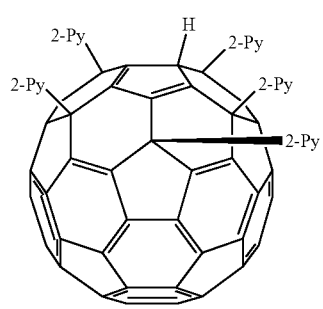
NC-17
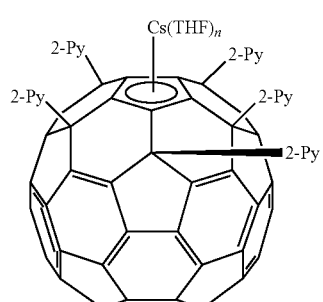
NC-18
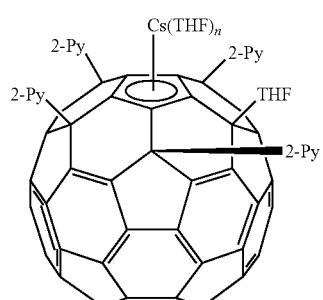
[Chemical Formula 100]
NC-19
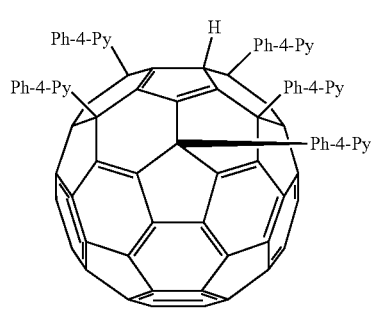
-continued
NC-20
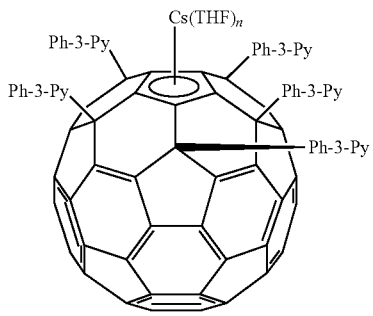
NC-21
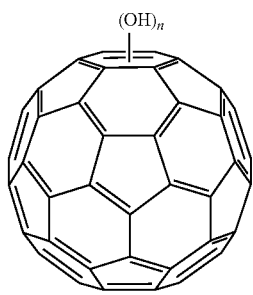
NC-22
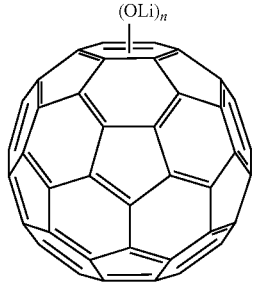
NC-23
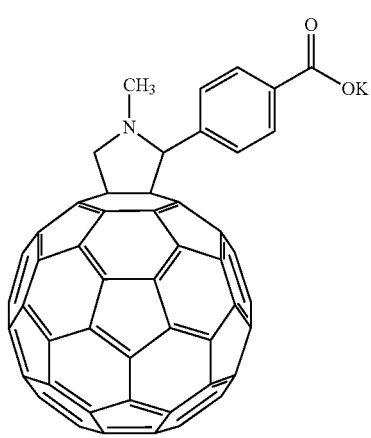

NC-24
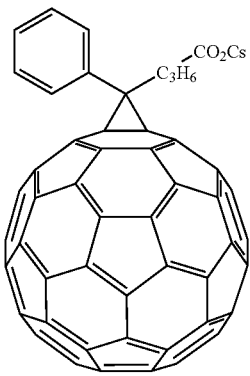
NC-25
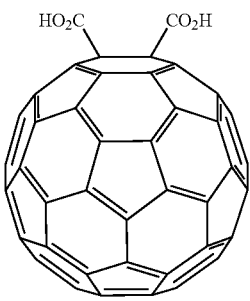
NC-26
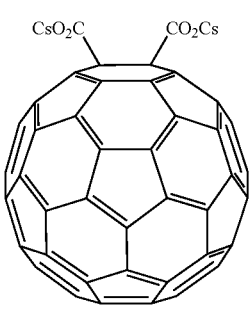
NC-27
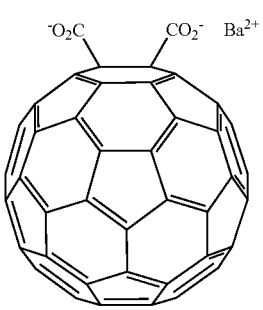
[Chemical Formula 101]
NC-28
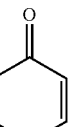
NC-29
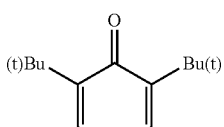
NC-30
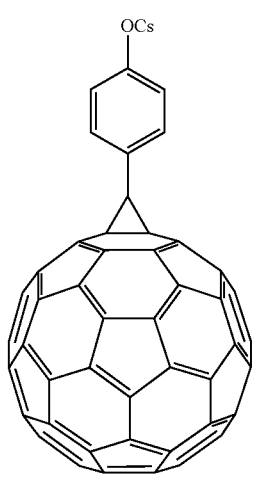

NC-31

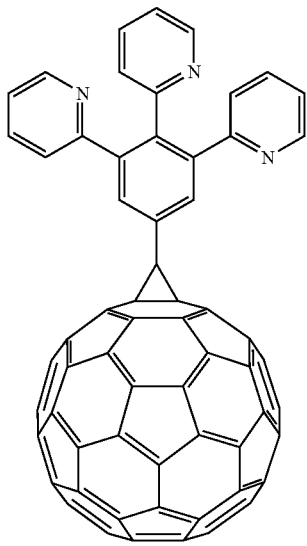

NC-34

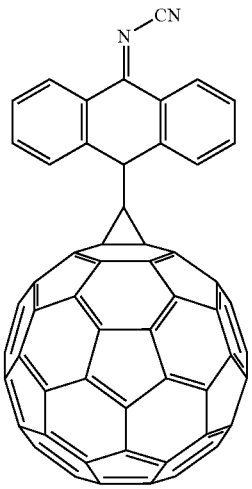

NC-35

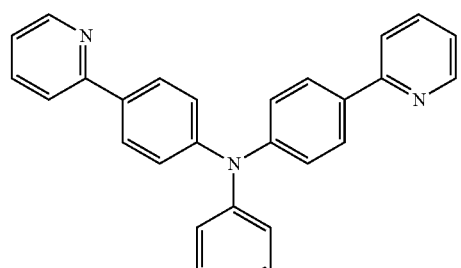

NC-32

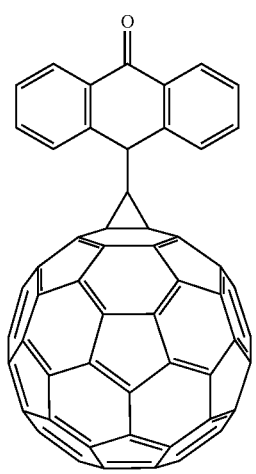

NC-33

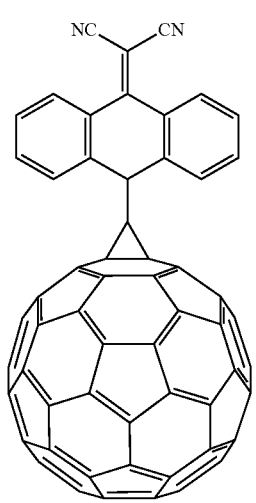

Details of the substituent groups indicated by abbreviations in the structures shown above are as follows:

Ph: phenyl

Py: pyridyl

THF: tetrahydrofuran

Bu: butyl.

Examples of each organic compound forming the charge generating layer of the present invention will now be described.

(1) Examples of the material for the charge generating layer of the present invention include compounds represented by Formula (A).

[Chemical Formula 102]

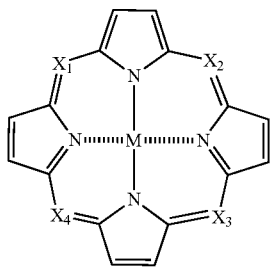

Formula (A)

In Formula (A), $X_1$, $X_2$, $X_3$ and $X_4$ are each independently a nitrogen atom or —CR. R represents a hydrogen atom, or an alkyl, alkoxy, aryl or heteroaryl group. M represents a metal atom, $H_2$, TiO or VO. The porphyrin ring may have a substituent group. The metal represented by M is Co, Fe, Mg, $Li_2$, Ru, Zn, Cu, Ni, $Na_2$, $Cs_2$ or Sb. $X_1$, $X_2$, $X_3$ and $X_4$ are preferably a nitrogen atom or —CAr (Ar(aryl) represents an aromatic hydrocarbon or a heteroaryl ring), and more preferably —CPh (phenyl group). M is preferably Co, $Li_2$, Zn, Cu, Ni, $Na_2$ or $Cs_2$, more preferably Co.

Non-limiting specific examples of porphyrin derivatives of the present invention will be shown below.

[Chemical Formula 103]

DB-1

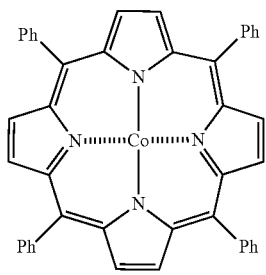

DB-2

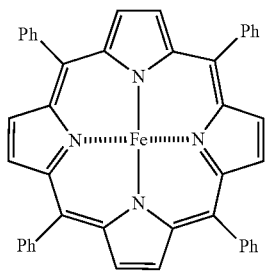

DB-3

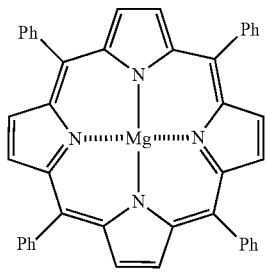

DB-4

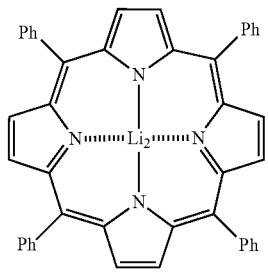

DB-5

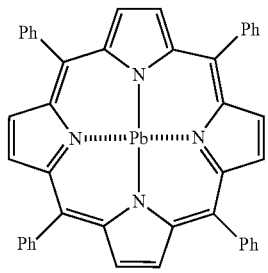

DB-6

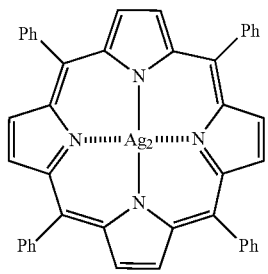

DB-7

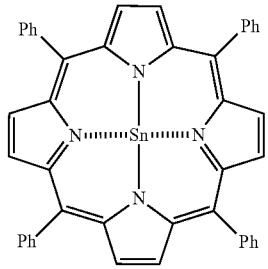

DB-8

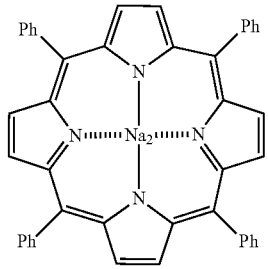

-continued
DB-9
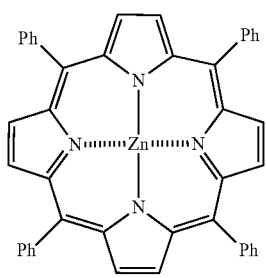
DB-10
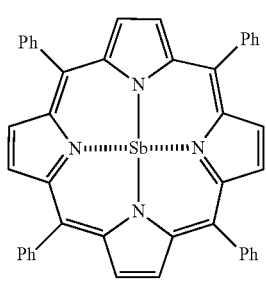
DB-11
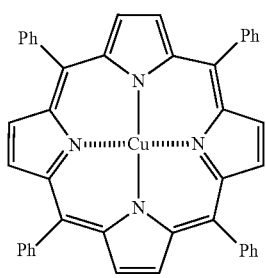
[Chemical Formula 104]
DB-12
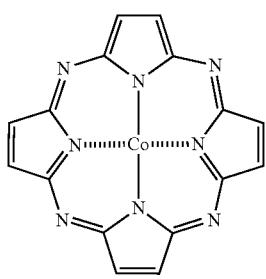
DB-13
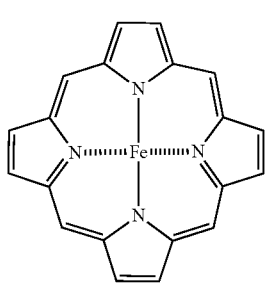
-continued
DB-14
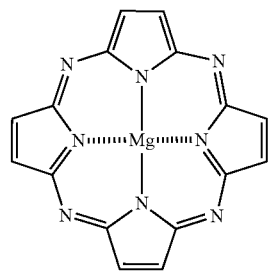
DB-15
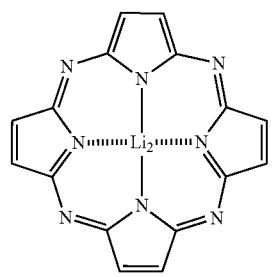
DB-16
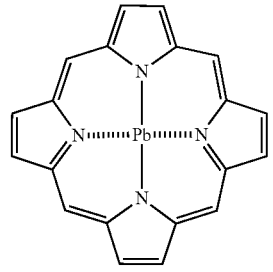
DB-17
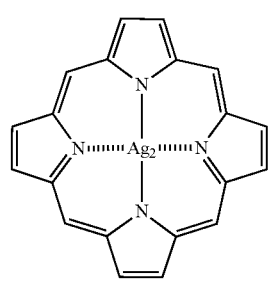
DB-18
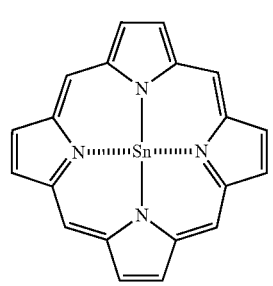

-continued
DB-19
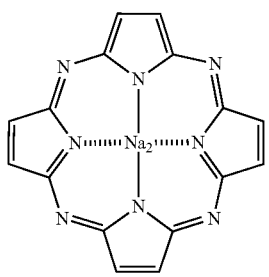
[Chemical Formula 105]
AQ-1
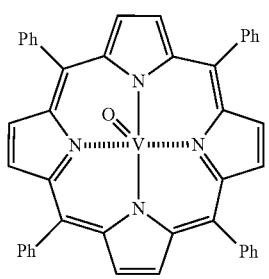
AQ-2
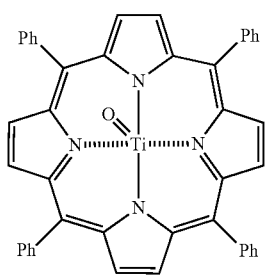
(2) Examples of the imidazole radicals forming the charge generating layer of the present invention include compounds which produce an imidazole radical by light or heat.
Non-limiting specific examples of imidazole radical derivatives of the present invention will be shown below.
[Chemical Formula 106]
DE-1
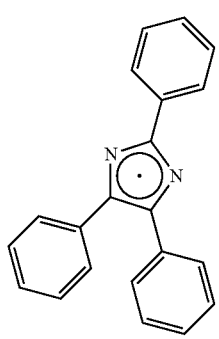
-continued
DE-2
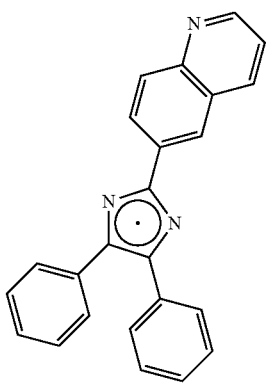
DE-3
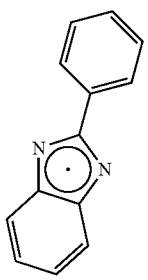
DE-4
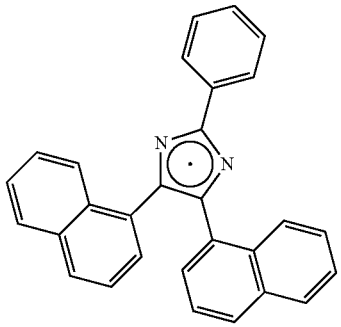
DE-5
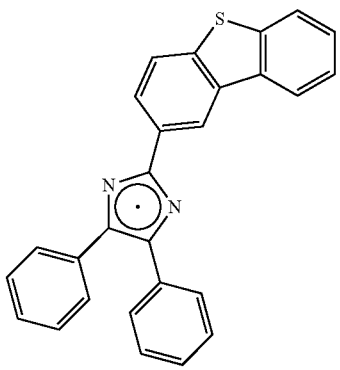

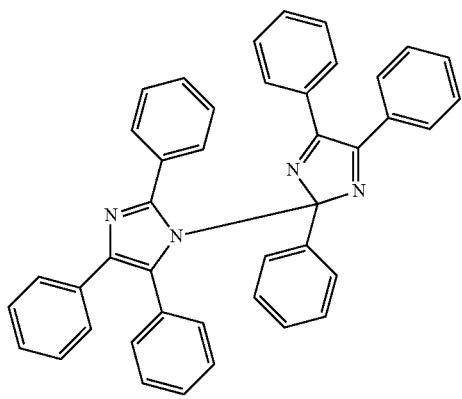

DE-6

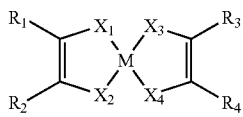

DE-7

(3) Examples of the material for the charge generating layer of the present invention include compounds represented by Formula (D)

[Chemical Formula 107]

Formula (D)

$$\begin{array}{c} R_1 \\ \diagdown \\ R_2 \end{array} \begin{array}{c} X_1 \\ \diagup \\ X_2 \end{array} M \begin{array}{c} X_3 \\ \diagdown \\ X_4 \end{array} \begin{array}{c} R_3 \\ \diagup \\ R_4 \end{array}$$

In the compound represented by Formula (D), $X_1$, $X_2$, $X_3$ and $X_4$ are each independently S, Se, Te or NR. R represents a hydrogen atom, or an alkyl, alkoxy, aryl or heteroaryl group. $R_1$, $R_2$, $R_3$ and $R_4$ each independently represent a hydrogen atom or a substituent group, and $R_1$ and $R_2$ and $R_3$ and $R_4$ may bond together to form a ring. M is $H_2$, Co, Fe, Mg, $Li_2$, Ru, Zn, Cu, Ni, $Na_2$, $Cs_2$ or Sb.

$X_1$, $X_2$, $X_3$ and $X_4$ are preferably sulfur atoms. $R_1$, $R_2$, $R_3$ and $R_4$ are preferably aromatic hydrocarbon or heteroaryl rings, more preferably an aromatic hydrocarbon. M is preferably Co, Fe, Zn, Cu or Ni, more preferably Ni.

Non-limiting specific examples of compounds represented by Formula (D) will be shown below.

[Chemical Formula 108]

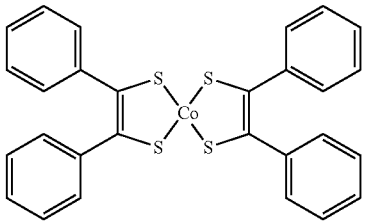

DF-1

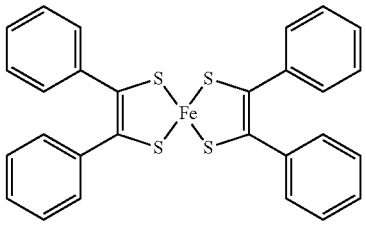

DF-2

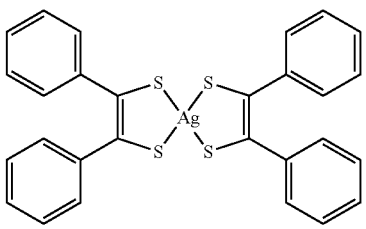

DF-3

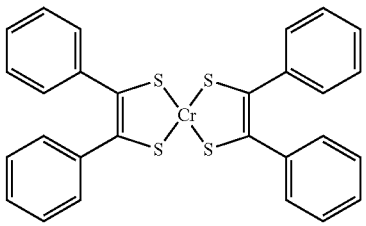

DF-4

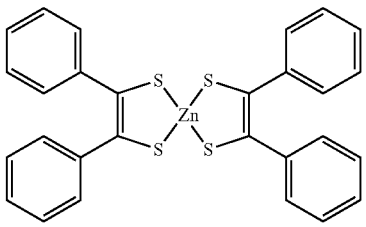

DF-5

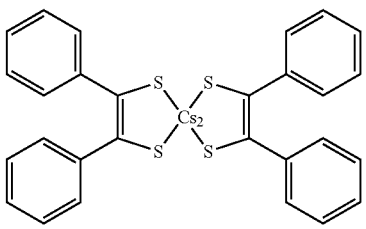

DF-6

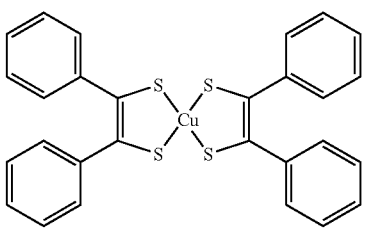

DF-7

DF-8

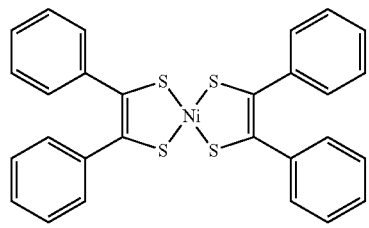

DF-9

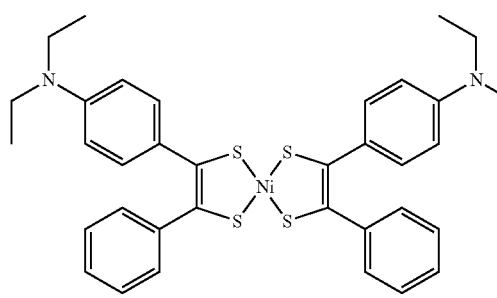

DF-10

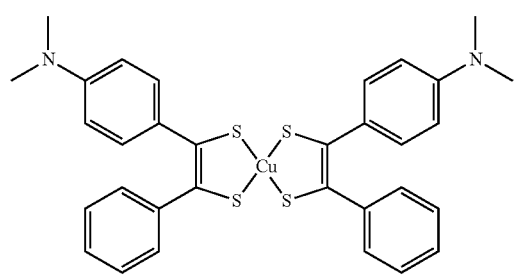

DF-11

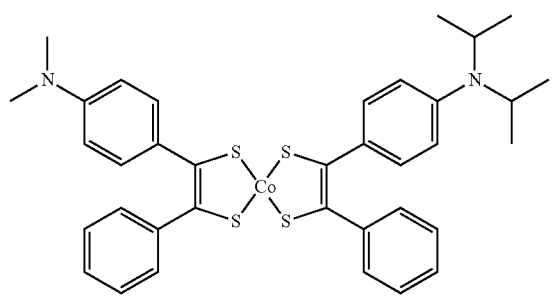

DF-12

DF-13

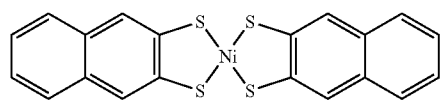

[Chemical Formula 109]

AI-1

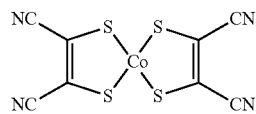

AI-2

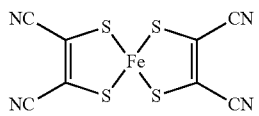

AI-3

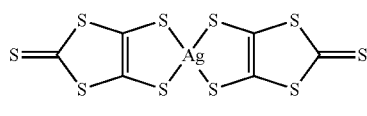

AI-4

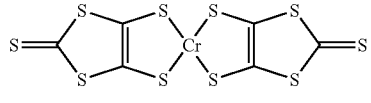

AI-5

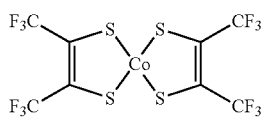

AI-6

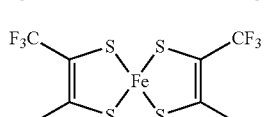

AI-7

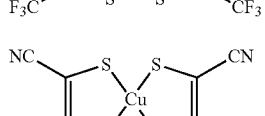

AI-8

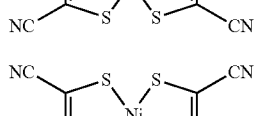

AI-9

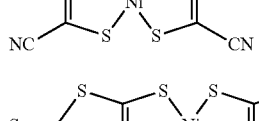

AI-10

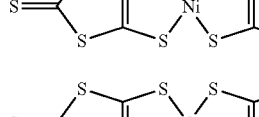

(4) Examples of the material for the charge generating layer of the present invention include compounds represented by Formula (G).

[Chemical Formula 110]

Formula (G)

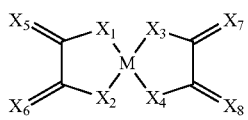

In Formula (G), $X_1$, $X_2$, $X_3$ and $X_4$ are each independently S, Se, Te or NR. $X_5$, $X_6$, $X_7$ and $X_8$ are each independently O, S, Se or Te, and M is $H_2$, Co, Fe, Mg, $Li_2$, Ru, Zn, Cu, Ni, $Na_2$, $Cs_2$ or Sb.

M is preferably Co, Fe, Mg, Zn, Cu or Ni, more preferably Ni.

Specific examples of compounds represented by Formula (G) will be shown below.

[Chemical Formula 111]

AJ-1
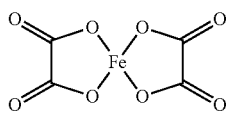

AJ-2
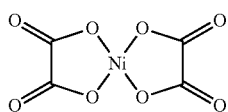

AJ-3
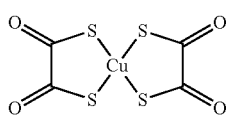

AJ-4
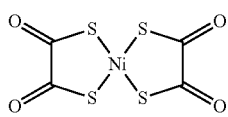

(5) Examples of the material for the charge generating layer of the present invention include compounds represented by Formula (F).

[Chemical Formula 112]

Formula (F)
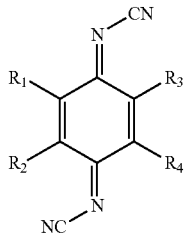

In Formula (F), $R_1$, $R_2$, $R_3$ and $R_4$ are each a hydrogen atom or a substituent group, and $R_1$ and $R_2$ and $R_3$ and $R_4$ may bond together to form a ring.

Non-limiting specific examples of compounds represented by Formula (F) (DCNQI derivatives) will be shown below.

[Chemical Formula 113]

AH-1
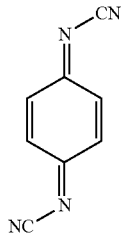

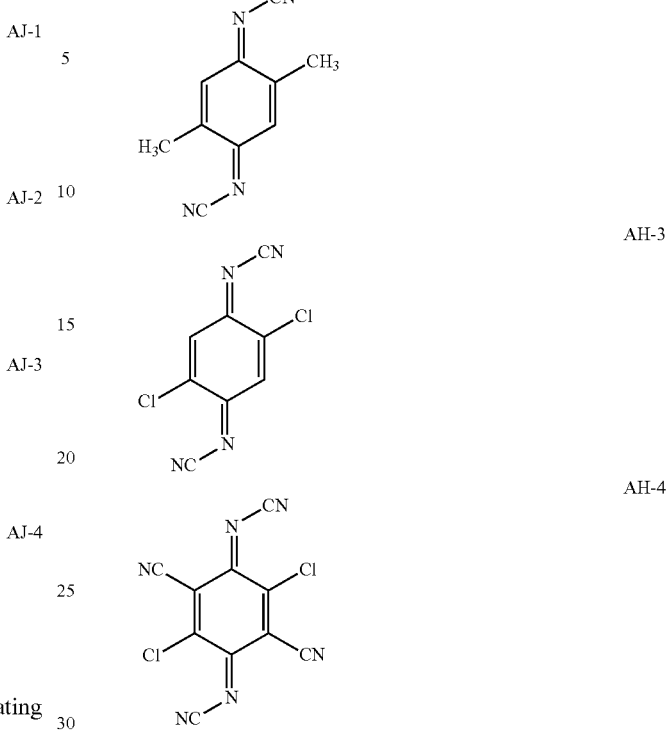

(6) Examples of the material for the charge generating layer of the present invention include compounds represented by Formula (H).

[Chemical Formula 114]

Formula (H)
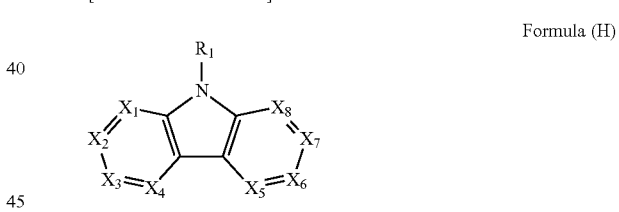

In Formula (H), $X_1$, $X_2$, $X_3$, $X_4$, $X_5$, $X_6$, $X_7$ and $X_8$ are each independently a nitrogen atom or CR. R represents a hydrogen atom, or an alkyl, alkoxy, aryl or heteroaryl group. $R_1$ is a hydrogen atom or a substituent group.

Non-limiting specific examples of compounds represented by Formula (H) (azacarbazole, derivatives) will be shown below.

[Chemical Formula 115]

AL-1
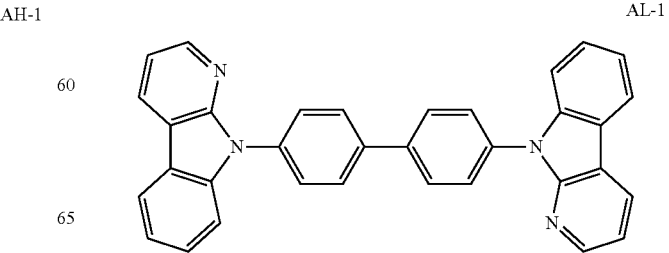

AL-2
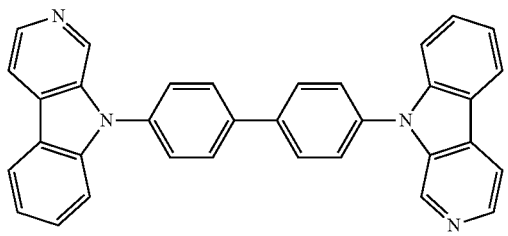
AL-3
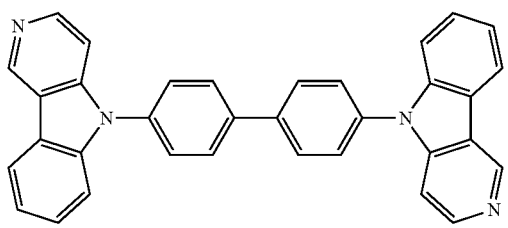
AL-4
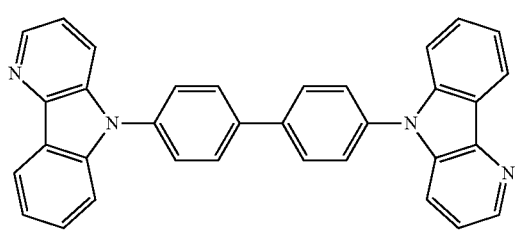
AL-5
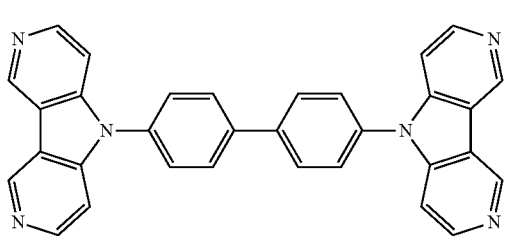
AL-6
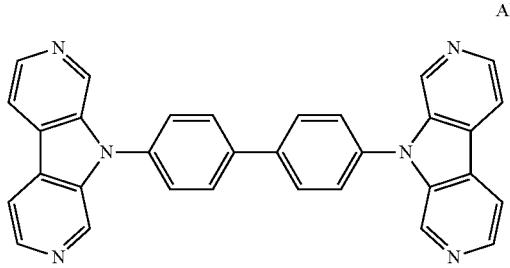
AL-7
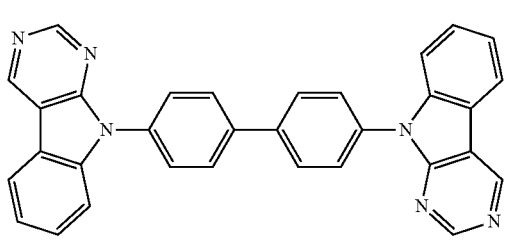
AL-8
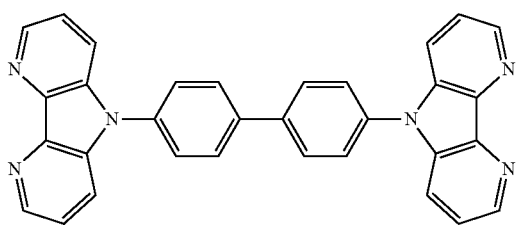
[Chemical Formula 116]
AL-9
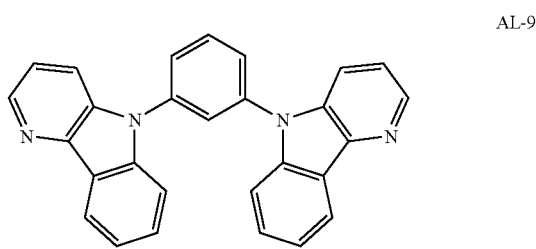
AL-10
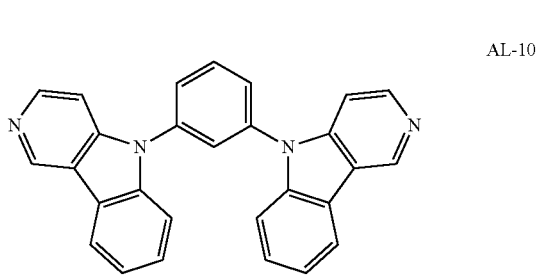
AL-11
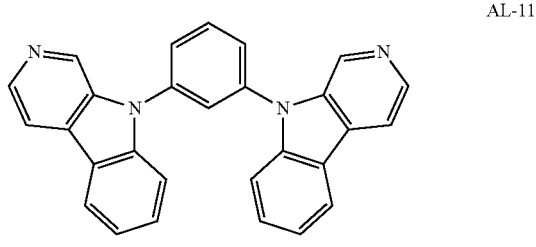
AL-12
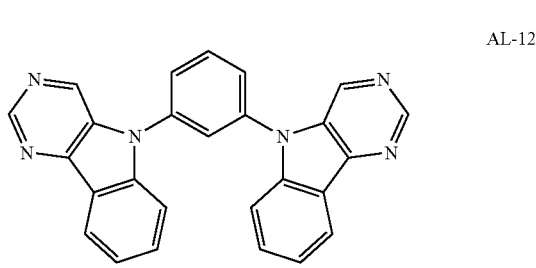
AL-13
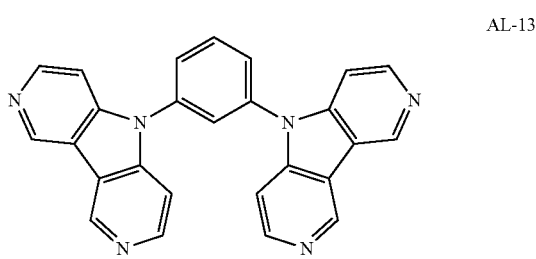

AL-14
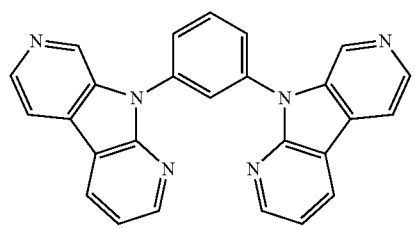
AL-15
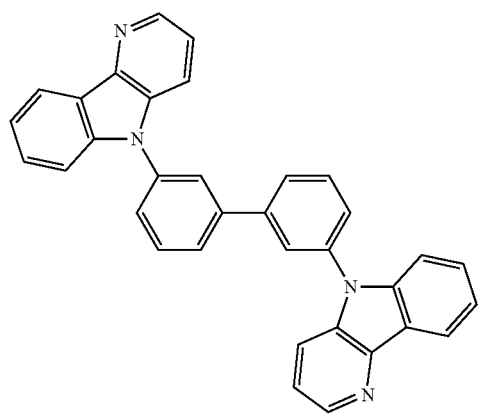
AL-16
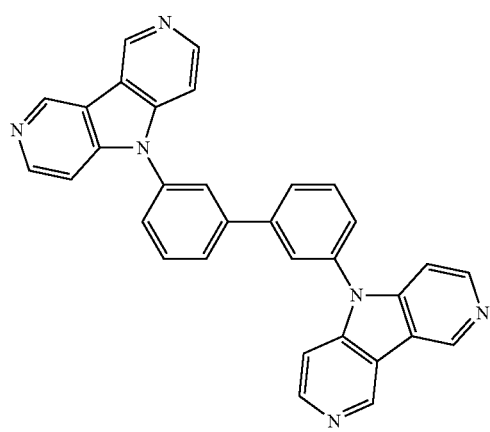
AL-17
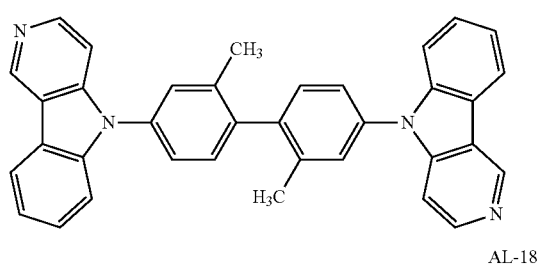
AL-18
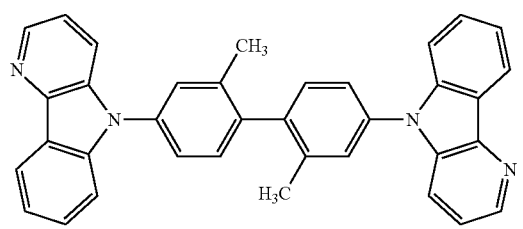
[Chemical Formula 117]
AL-19
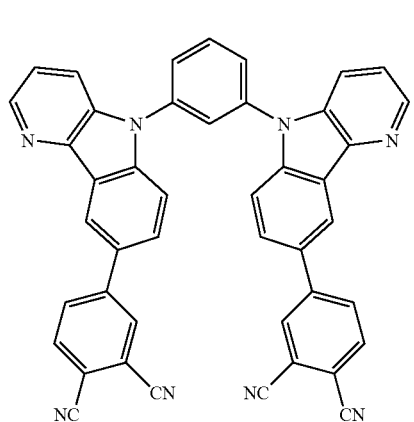
AL-20
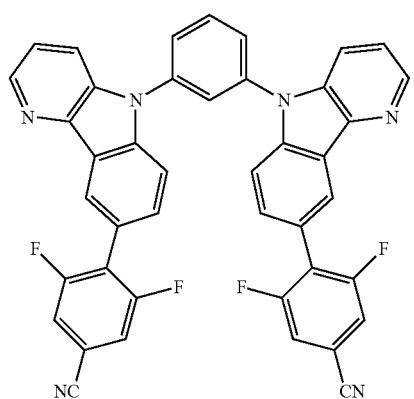
AL-21
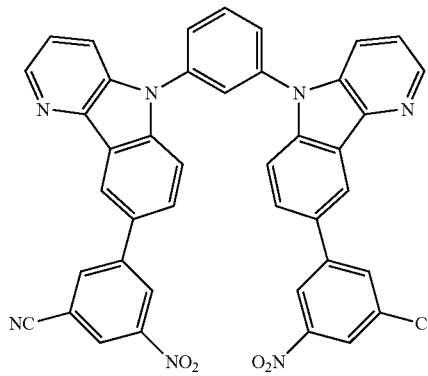
AL-22
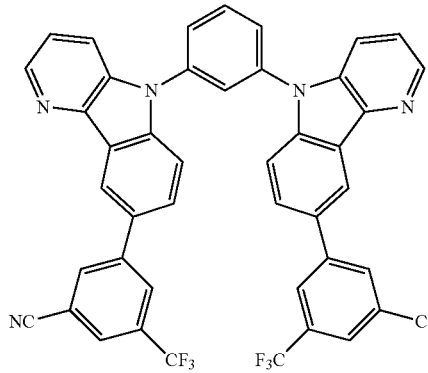
(7) Examples of the material for the charge generating layer of the present invention include compounds represented by Formula (J).

[Chemical Formula 118]

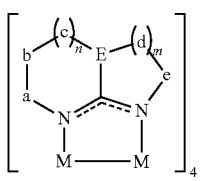

Formula (J)

In Formula (J), a, b, c, d and e are each $NR_{n1}$ or $CR_{c1}R_{c2}$, wherein $R_{n1}$, $R_{c1}$ and $R_{c2}$ are each independently a hydrogen atom or a substituent group; E is a nitrogen atom or $CR_{c3}$; and $R_{c3}$ is a hydrogen atom or a substituent group. M is Mo or W, and n and m each represent an integer of 0 to 5.

Non-limiting specific examples of the compounds represented by Formula (J) will be shown below.

[Chemical Formula 119]

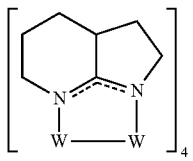  DN-1

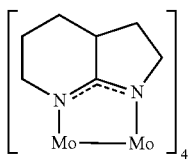  DN-2

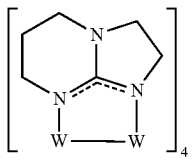  DN-3

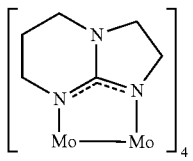  DN-4

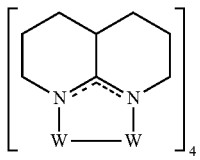  DN-5

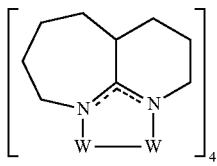  DN-6

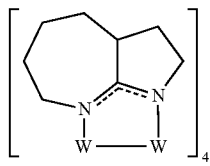  DN-7

(8) Materials for the charge generating layer of the present invention may be metallocene derivatives. Examples of the metallocene derivatives applicable to the present invention include ferrocene, cobaltocene and nickelocene. Such a metallocene derivative may have a substituent group. Examples of the metallocene derivatives include the compounds shown below, and ferrocene is preferred.

[Chemical Formula 120]

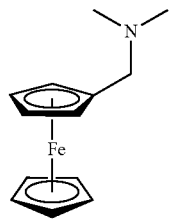  DM-1

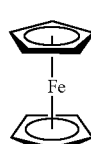  DM-2

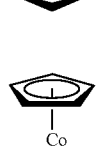  DM-3

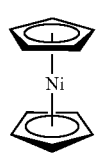  DM-4

(9) Materials for the charge generating layer of the present invention may be polycyano derivatives. Examples of the polycyano derivatives include compounds shown below.

[Chemical Formula 121]

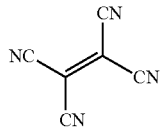  AC-1

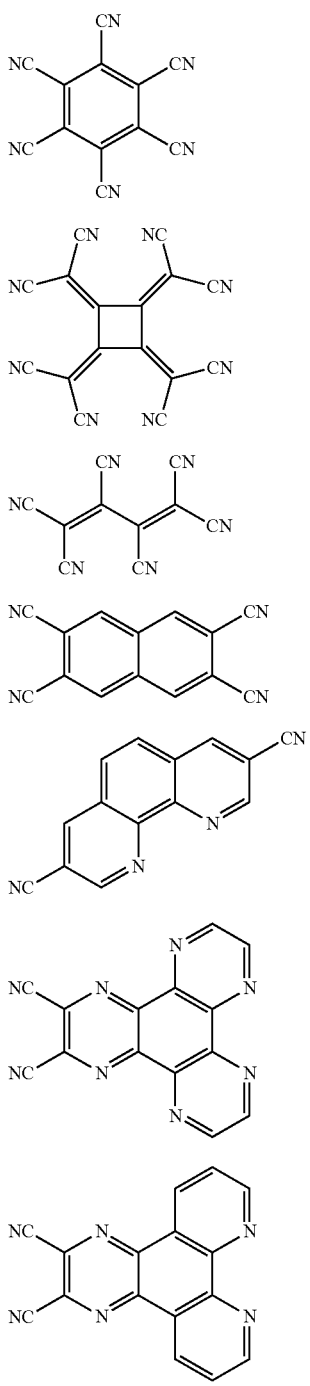

AC-2

AC-3

AC-4

AC-5

AC-6

AC-7

AC-8

(10) Materials for the charge generating layer of the present invention may be polynitro derivatives. Examples of the polynitro derivatives include trinitrobenzene, picric acid, dinitrophenol, dinitrobiphenyl, 2,4,7-trinitro-9-fluorenone, 2,4,5,7-tetranitro-9-fluorenone, 9-dicyanomethylene-2,4,7-trinitrofluorenone, and 9-dicyanomethylene-2,4,5,7-tetranitrofluorenone.

(11) Materials for the charge generating layer of the present invention may be nanocarbon derivatives. Examples of the nanocarbon derivatives include the nanocarbon materials described above, preferably fullerene derivatives.

The charge generating layer of the present invention may be formed using the materials described above alone or in combination. When two or more types of materials are used in combination, an organic donor compound and an organic acceptor compound are preferably used in combination.

Examples of the organic donor include the compounds represented by Formulae (A), (D) and (J), imidazole radicals, metallocene derivatives, and nanocarbon derivatives described above.

Examples of the organic acceptor include the compounds represented by Formulae (F), (G) and (H), polycyano derivatives, and polynitro derivatives described above.

In a combined use of two or more types of materials, the compounds described above may further be combined with any other compound.

Examples of other compounds applicable to the charge generating layer of the present invention include compounds described below.

(A) Typical examples of such a compound is phthalocyanine derivatives. Examples of the phthalocyanine derivatives include the compounds represented by Formula (11).

[Chemical Formula 122]

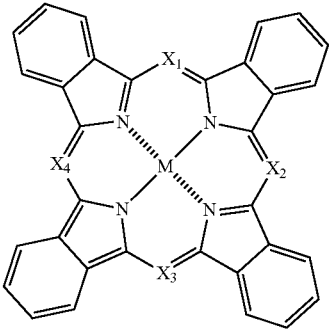

Formula (11)

In Formula (11), $X_1$, $X_2$, $X_3$ and $X_4$ are each independently a nitrogen atom or —CR. R represents a hydrogen atom, or an alkyl, alkoxy, aryl or heteroaryl group. M represents $H_2$ or a metal atom. The phthalocyanine ring may have a substituent group. M is preferably $H_2$, Co, Fe, Mg, $Li_e$, Ru, Zn, Cu, Ni, $Na_2$, $Cs_2$ or Sb.

Specific examples of phthalocyanine derivatives will be shown below.

[Chemical Formula 123]

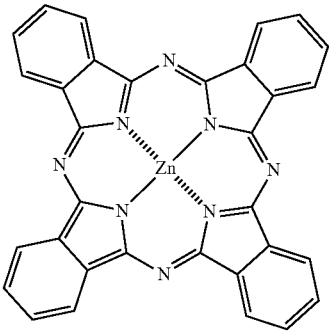

DA-1

-continued
DA-2
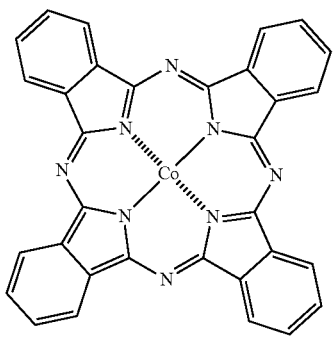
DA-3
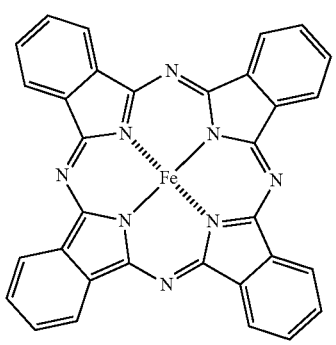
DA-4
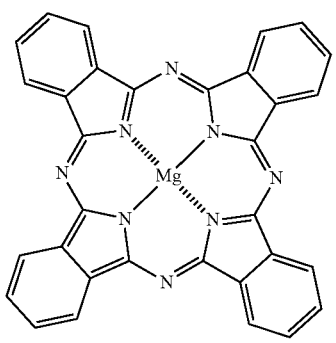
DA-5
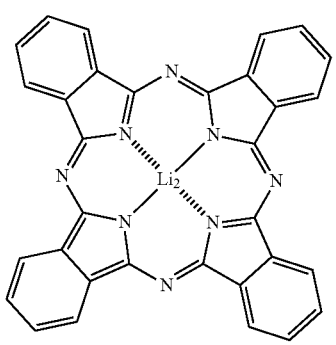
-continued
DA-6
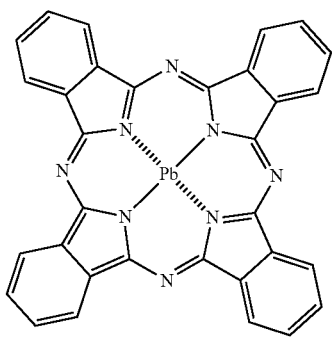
DA-7
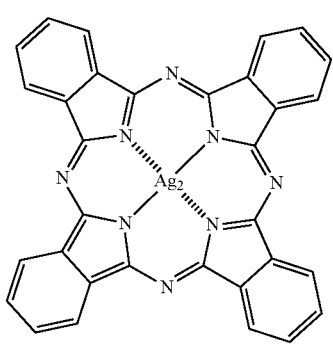
DA-8
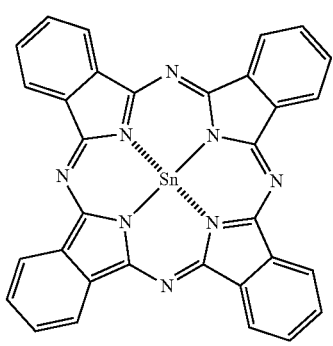
DA-9
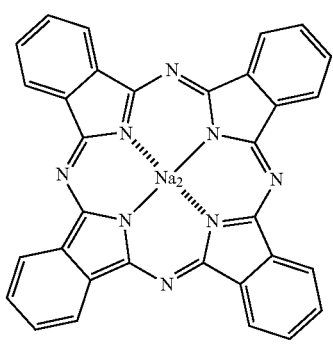

-continued
DA-10
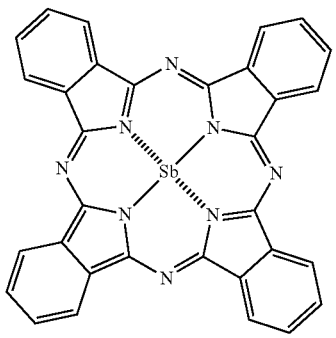
DA-11
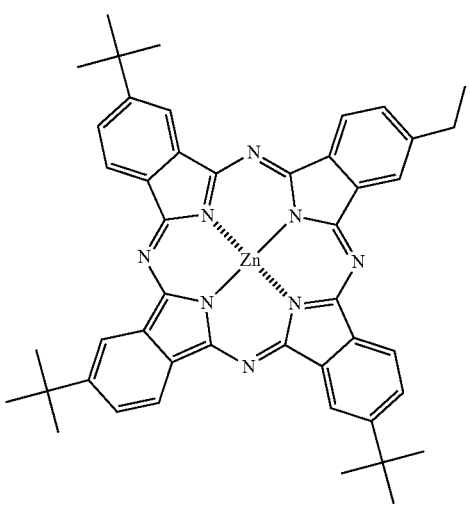
[Chemical Formula 124]
DA-12
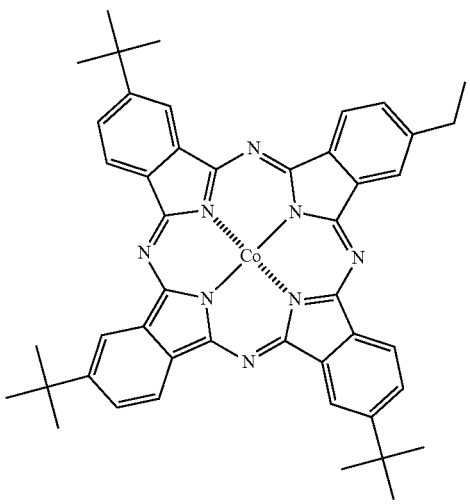
-continued
DA-13
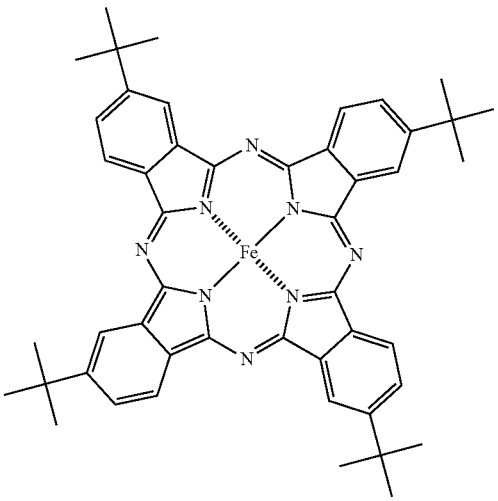
DA-14
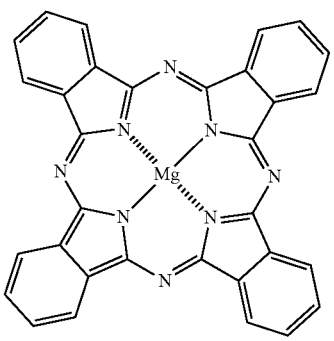
DA-15
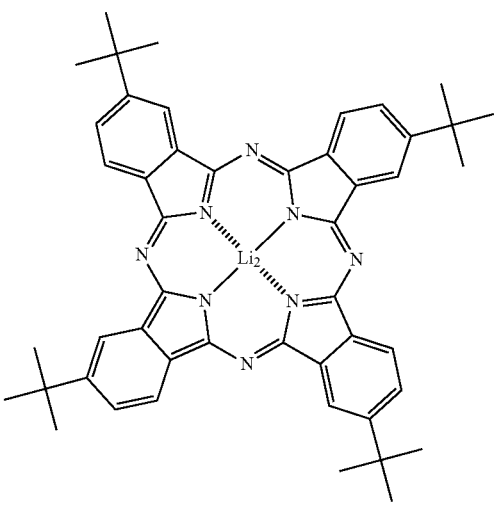

DA-16

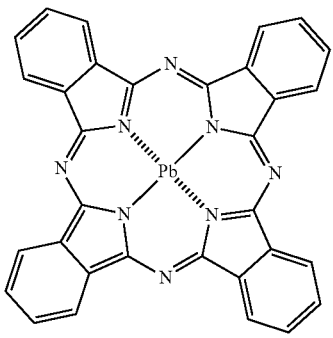

DA-17

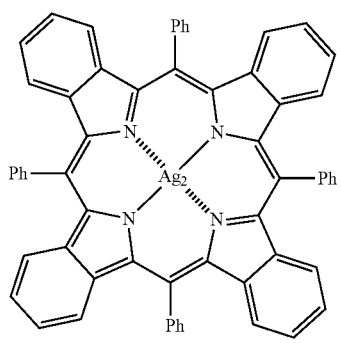

DA-18

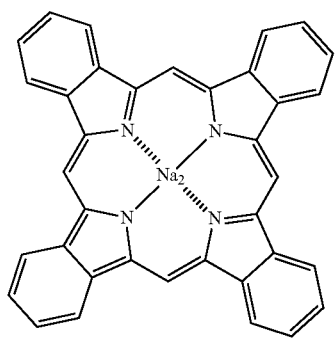

DA-19

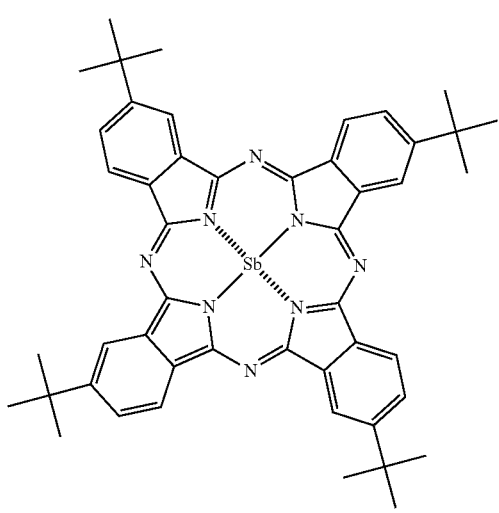

(B) Examples of other compounds applicable to the charge generating layer of the present invention include compounds represented by Formula (12).

[Chemical Formula 125]

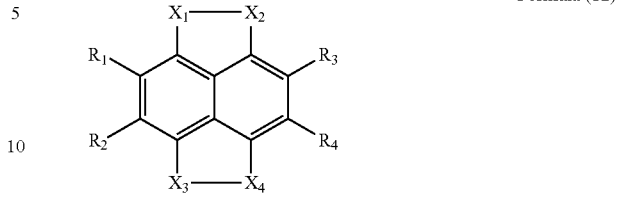

Formula (12)

In Formula (12), $X_1$, $X_2$, $X_3$ and $X_4$ are each independently S, Se or Te. $R_1$, $R_2$, $R_3$ and $R_4$ are each a hydrogen atom or a substituent group, and $R_1$ and $R_2$ and $R_3$ and $R_4$ may bond together to form a ring. $X_1$, $X_2$, $X_3$ and $X_4$ are preferably S or Se.

Specific examples of the compounds represented by Formula (12) (TTT derivatives) will be shown below.

[Chemical Formula 126]

DD-1

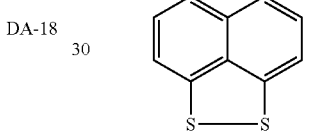

DD-2

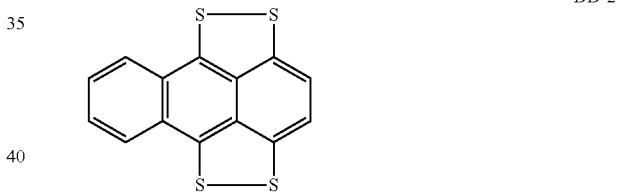

DD-3

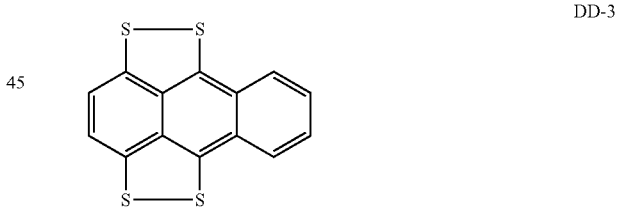

DD-4

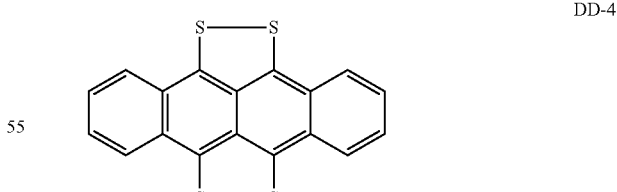

DD-5

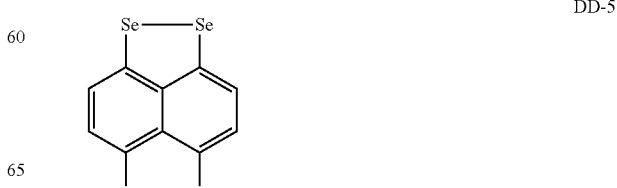

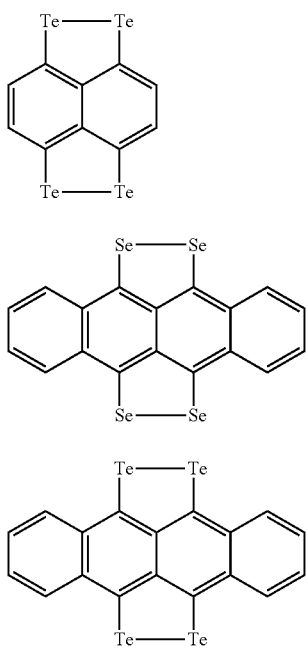

DD-6

DD-7

DD-8

(C) Examples of other compounds applicable to the charge generating layer of the present invention include tetrathiafulvalene (TTF) derivatives represented by Formula (13).

[Chemical Formula 127]

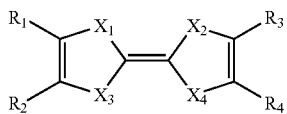

Formula (13)

In Formula (13), $X_1$, $X_2$, $X_3$ and $X_4$ are each independently S, Se or Te. $R_1$, $R_2$, $R_3$ and $R_4$ are each a hydrogen atom or a substituent group, and $R_1$ and $R_2$ and $R_3$ and $R_4$ may bond together to form a ring.

Specific examples of the TTF derivatives represented by Formula (13) will be shown below.

[Chemical Formula 128]

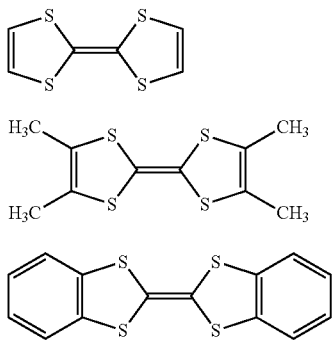

DC-1

DC-2

DC-3

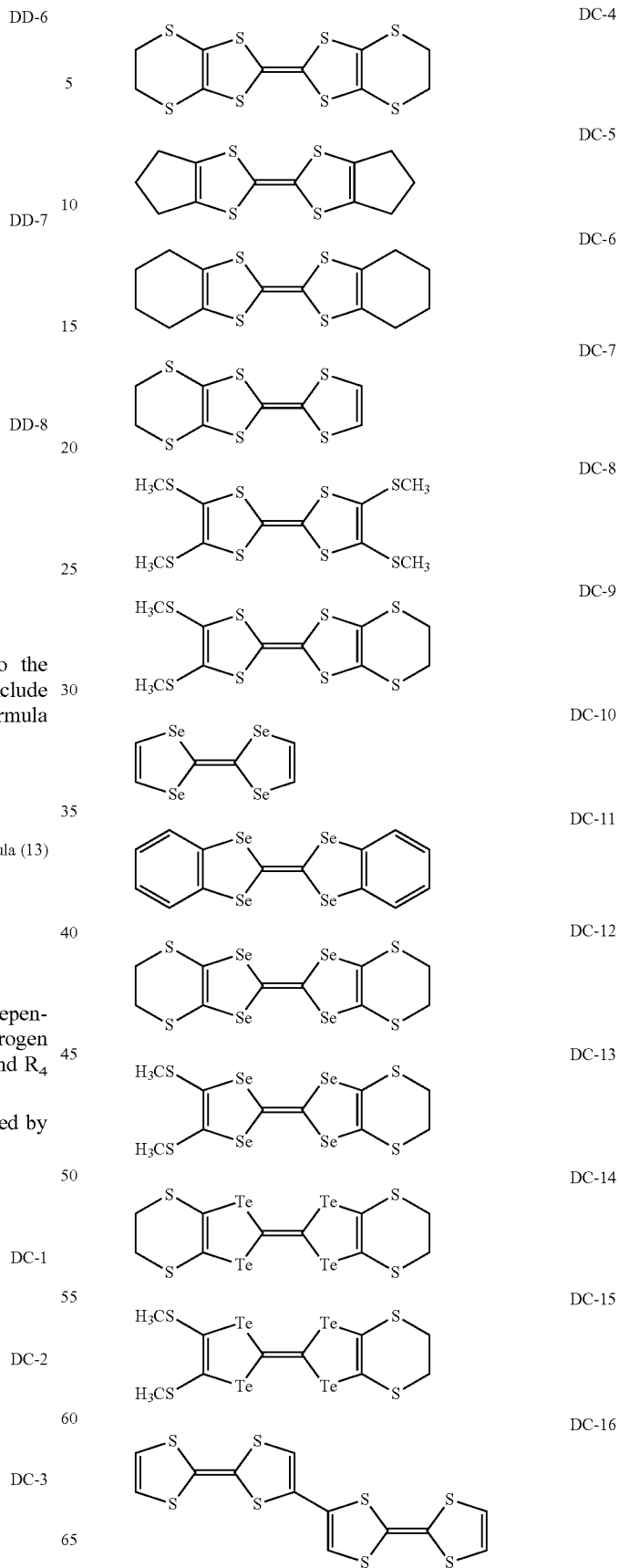

DC-4

DC-5

DC-6

DC-7

DC-8

DC-9

DC-10

DC-11

DC-12

DC-13

DC-14

DC-15

DC-16

-continued

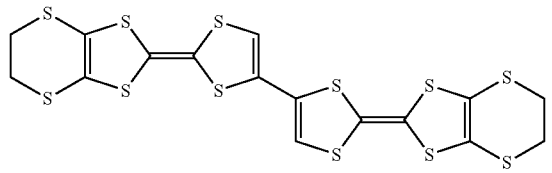
DC-17

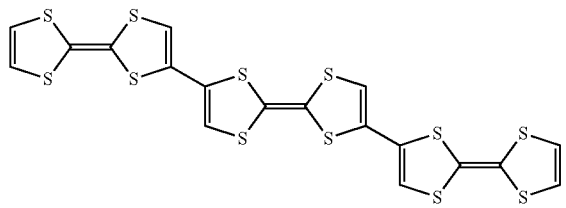
DC-18

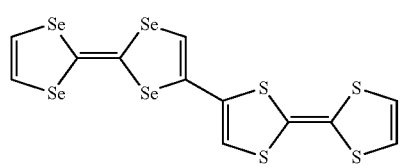
DC-19

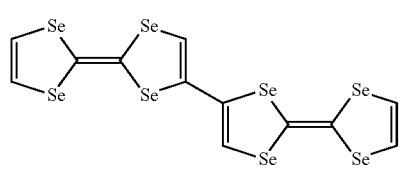
DC-20

(D) Examples of other compounds applicable to the charge generating layer of the present invention include condensed polycyclic aromatic hydrocarbons. Examples of the condensed polycyclic aromatic hydrocarbon include naphthalene, anthracene, phenanthrene, pyrene, triphenylene, chrysene, tetracene, pentacene, perylene, ovalene, circumanthracene, anthanthrene, pyranthrene, and rubrene.

(E) Examples of other compounds applicable to the charge generating layer of the present invention include arylamine derivatives. Examples of the arylamine derivatives include diethylaminobenzene, aniline, toluidine, anisidine, chloroaniline, diphenylamine, indole, skatole, p-phenylenediamine, durenediamine, N,N,N,N-tetramethyl-p-phenylenediamine, benzidine, N,N,N,N-tetramethylbenzidine, Tetrakis(dimethylamino)pyrene, tetrakis(dimethylamino)ethylene, biimidazole, 4,4',4"-tris[N-(3-methylphenyl)-N-phenylamino]triphenylamine (abbreviated as m-MTDATA), and N,N-diphenyl-N,N'-bis(1-naphthyl)-1,1'-biphenyl-4,4'-diamine (abbreviated as α-NPD).

(F) Examples of other compounds applicable to the charge generating layer of the present invention include azine derivatives. Examples of the azine derivatives include cyanin dye, carbazole, acridine, phenazine, N,N-dihydrodimethylphenazine, phenoxazine, and phenothiazine.

(G) Examples of other compounds applicable to the charge generating layer of the present invention include triarylamine derivatives. Examples of triarylamine derivatives will be shown below.

[Chemical Formula 129]

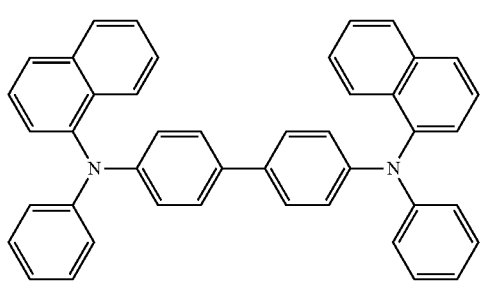
(α-NPD)

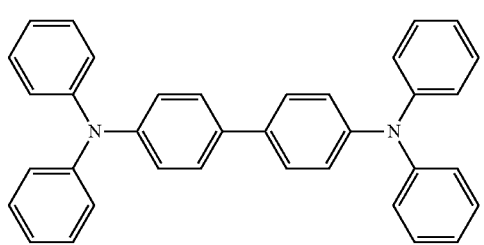
DAm-2

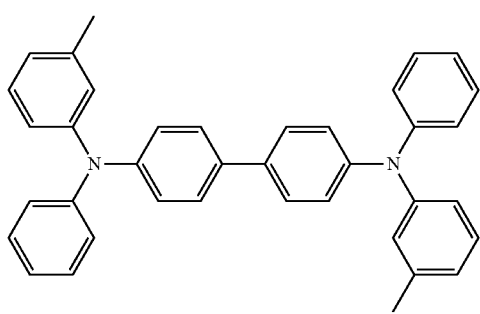
DAm-3
(TPD)

DAm-4
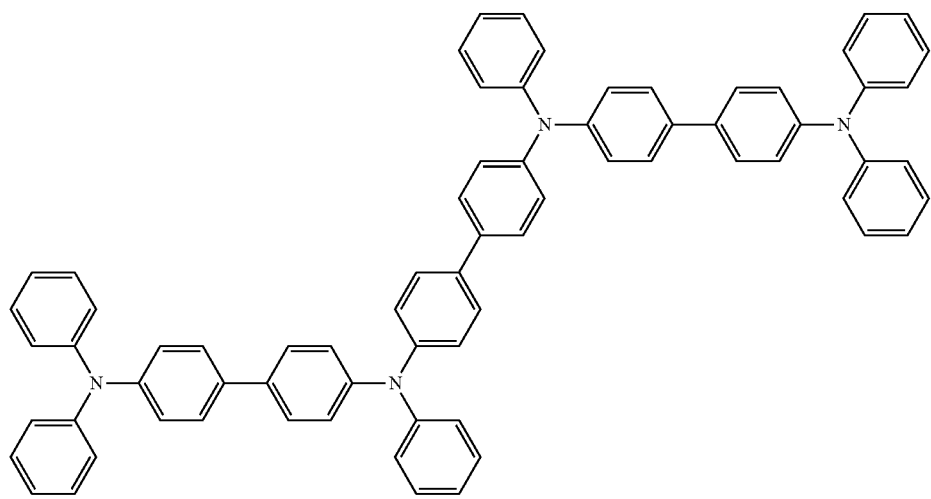
DAm-5
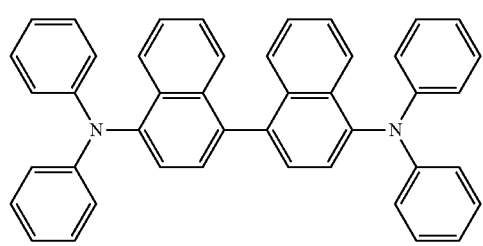
DAm-6
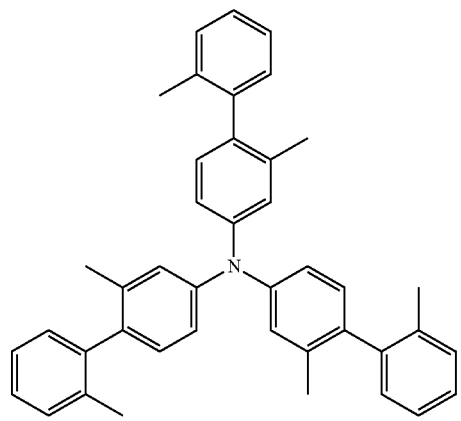
DAm-7
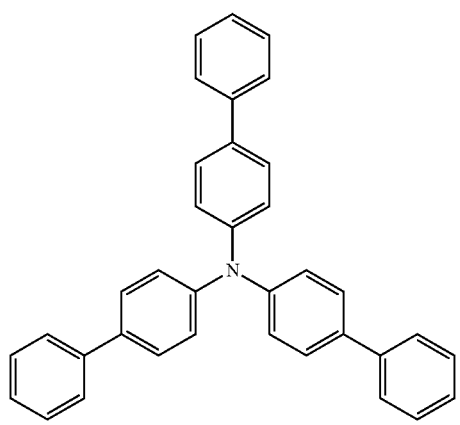

(H) Examples of other compounds applicable to the charge generating layer of the present invention include quinone derivatives. Examples of quinone derivatives are compounds represented by Formula (14).

[Chemical Formula 130]

Formula (14)

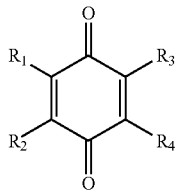

In Formula (14), $R_1$, $R_2$, $R_3$ and $R_4$ are each a hydrogen atom or a substituent group, and $R_1$ and $R_2$ and $R_3$ and $R_4$ may bond together to form a ring. Each of $R_1$, $R_2$, $R_3$ and $R_4$ is preferably a halogen atom or a cyano group.

Specific examples of the quinone derivatives represented by Formula (14) will be shown below.

[Chemical Formula 131]

AO-1

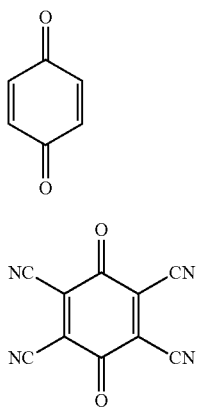

AO-2

AO-3

AO-4

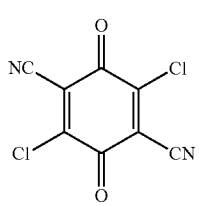

AO-5

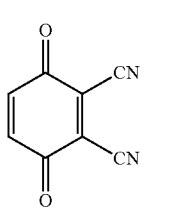

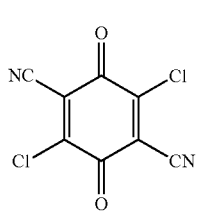

-continued

AO-6

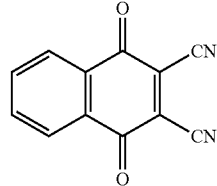

AO-7

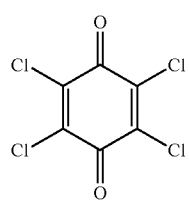

AO-8

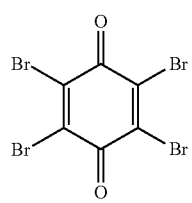

AO-9

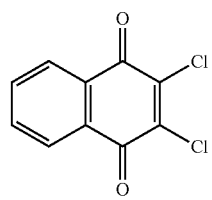

(I) Examples of other compounds applicable to the charge generating layer of the present invention include tetracyanoquinodimethane derivatives represented by Formula (15).

[Chemical Formula 132]

Formula (15)

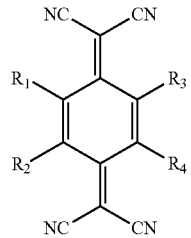

In Formula (15), $R_1$, $R_2$, $R_3$ and $R_4$ are each a hydrogen atom or a substituent group, and $R_1$ and $R_2$ and $R_3$ and $R_4$ may bond together to form a ring.

Specific examples of the tetracyanoquinodimethane derivatives represented by Formula (15) will be shown below.

[Chemical Formula 133]
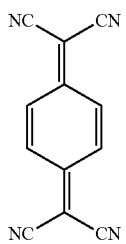
AG-1
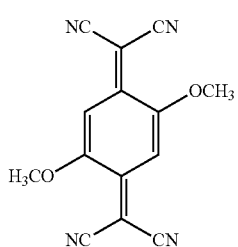
AG-2
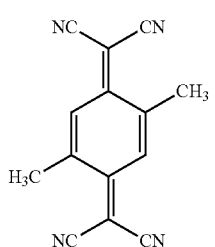
AG-3
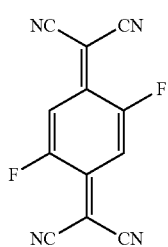
AG-4
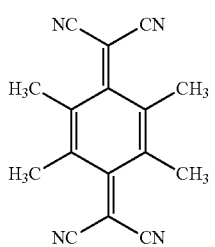
AG-5
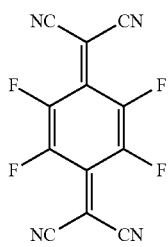
AG-6
-continued
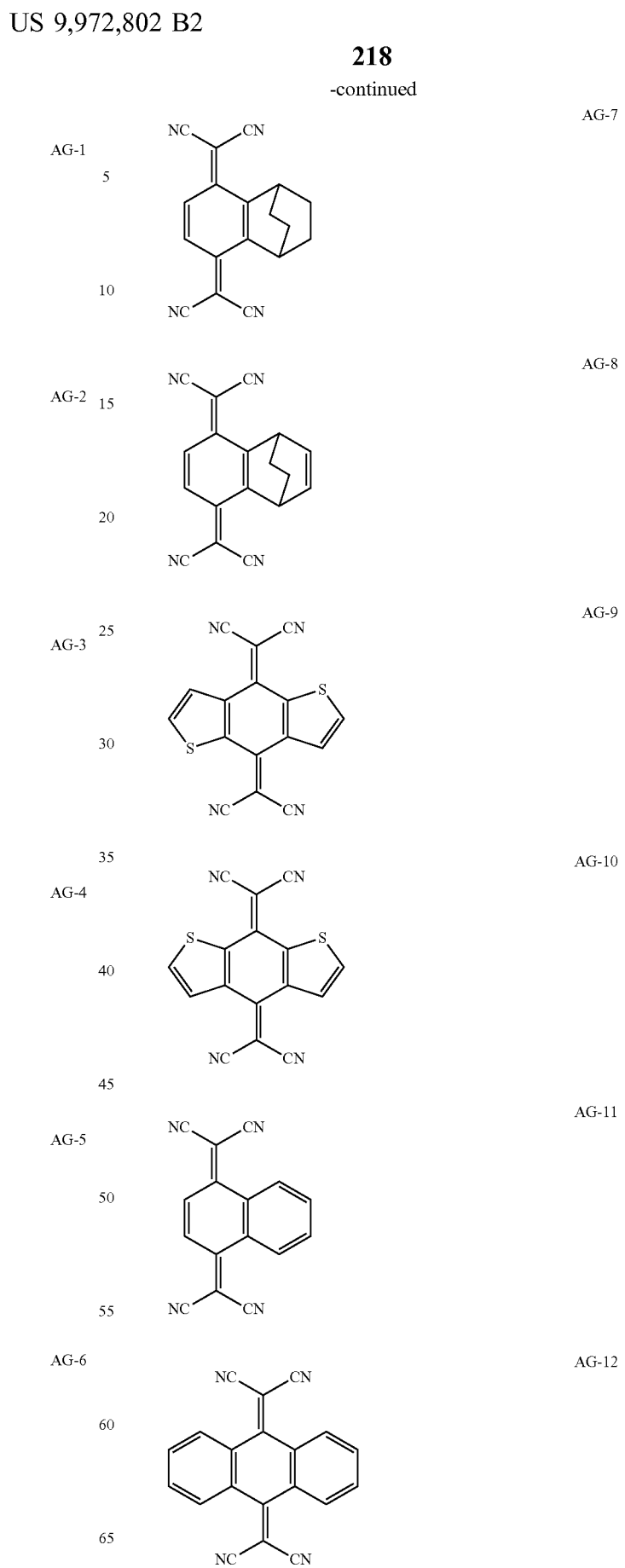

AG-13
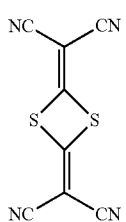

AG-14
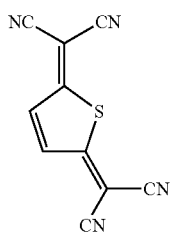

AG-15
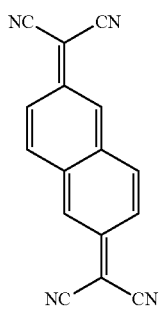

AG-16
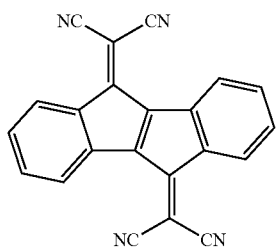

AG-17
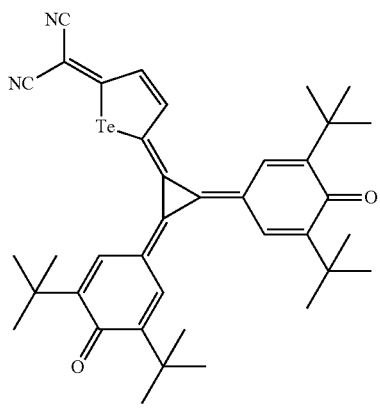

(J) Examples of other compounds applicable to the charge generating layer of the present invention include phenanthroline derivatives represented by Formula (16).

[Chemical Formula 134]

Formula (16)

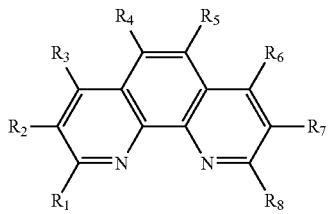

In Formula (16), $R_1$ to $R_8$ are each a hydrogen atom or a substituent group.

Specific examples of phenanthroline derivatives represented by Formula (16) will be shown below.

[Chemical Formula 135]

AK-1
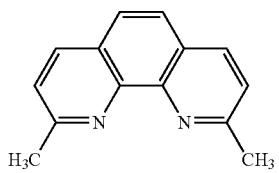

AK-2
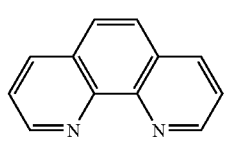

AK-3
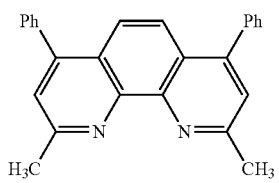

AK-4
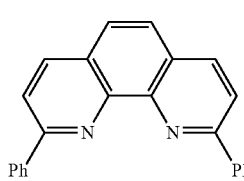

AK-5
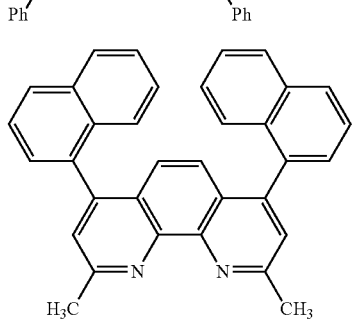

AK-6
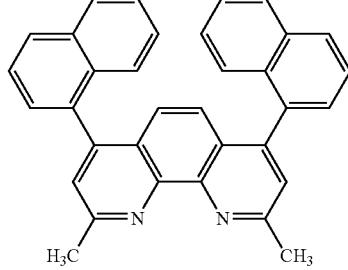

-continued

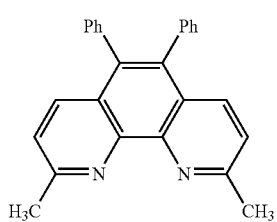
AK-7

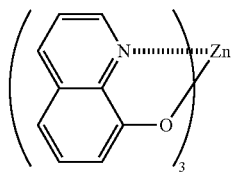
AM-4

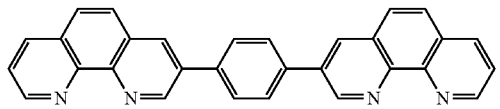
AK-8

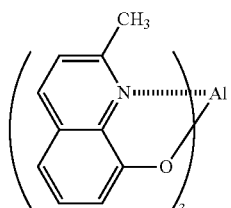
AM-5

(K) Examples of other compounds applicable to the charge generating layer of the present invention include quinolinol-metal complex derivatives represented by Formula (17).

[Chemical Formula 136]

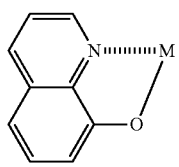
Formula (17)

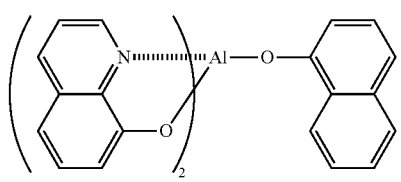
AM-6

Quinolinol-metal complex derivatives are compounds having a partial structure represented by Formula (17), wherein M is preferably Al, Co, Fe, Mg, Ru, Zn, Cu, or Ni.

Specific examples of quinolinol-metal complex derivatives having a partial structure represented by Formula (17) will be shown below.

[Chemical Formula 137]

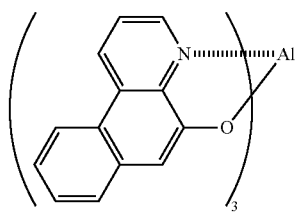
AM-7

AM-1

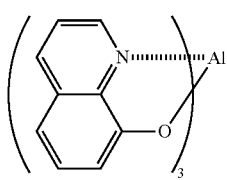

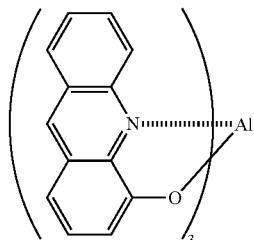
AM-8

AM-2

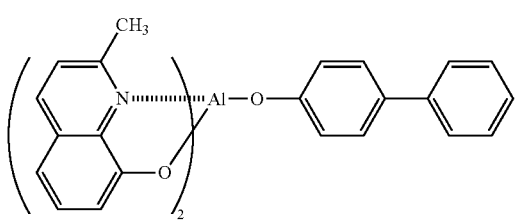

AM-9

AM-3

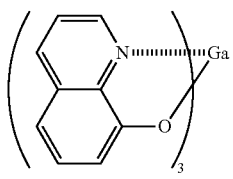

(L) Examples of other compounds applicable to the charge generating layer of the present invention include heteroaryl hydrocarbon compounds (as used herein, "heteroaryl hydrocarbon compound" refers to an aromatic hydrocarbon compound with one or more carbon atoms replaced with a heteroatom such as oxygen, sulfur, nitrogen, phosphorus, and boron), among which pyridine derivatives having substitution with a nitrogen atom is particularly preferred. Specific examples of such a compound will be shown below.

[Chemical Formula 138]
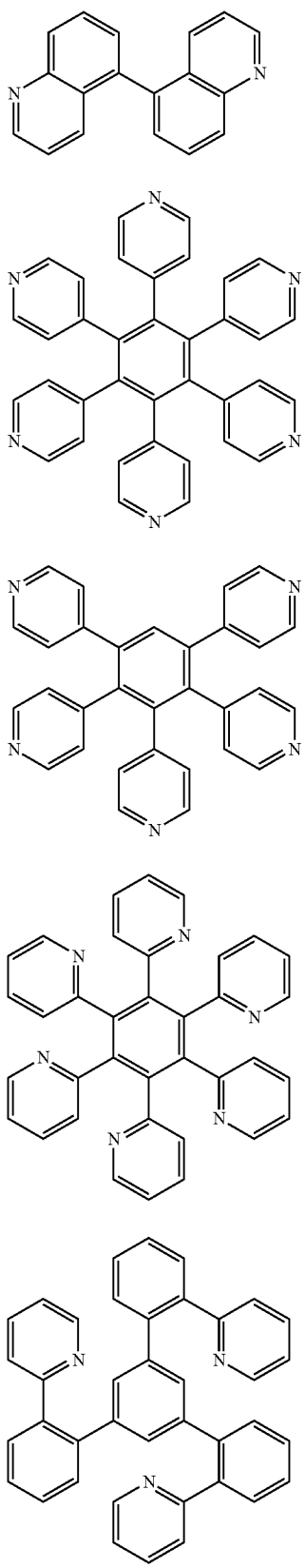
AN-1
AN-2
AN-3
AN-4
AN-5
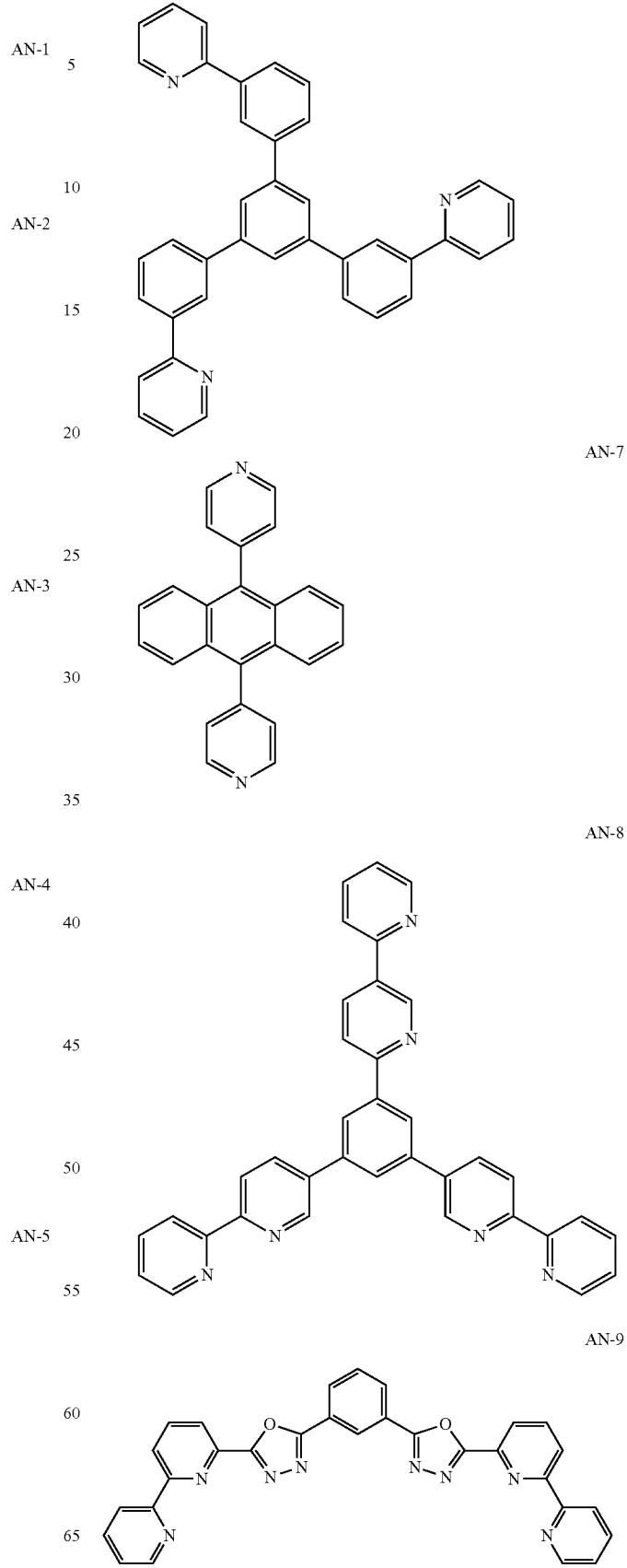
AN-6
AN-7
AN-8
AN-9

-continued
[Chemical Formula 139]
AN-10
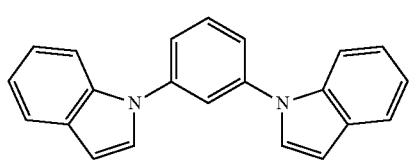
AN-11
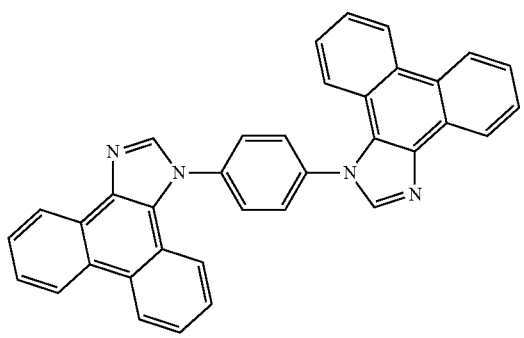
[Chemical Formula 140]
AN-12
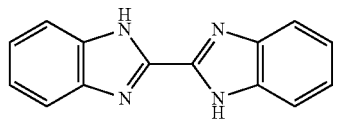
AN-13
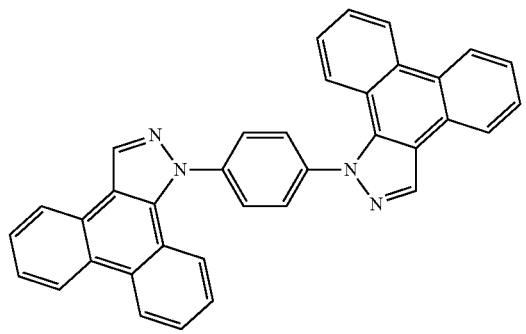
Below will be shown specific examples of low-molecular weight materials, high-molecular weight materials, and high-molecular weight polymers usable for the charge generating layer of the present invention.
NCp-1
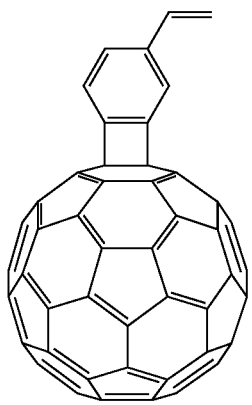
NCp-2
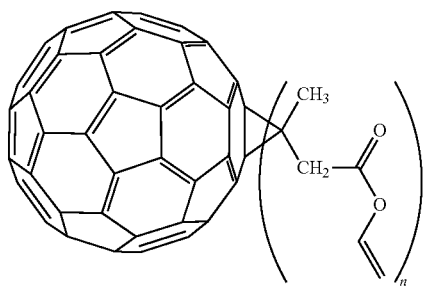
n = 1~4
NCp-3
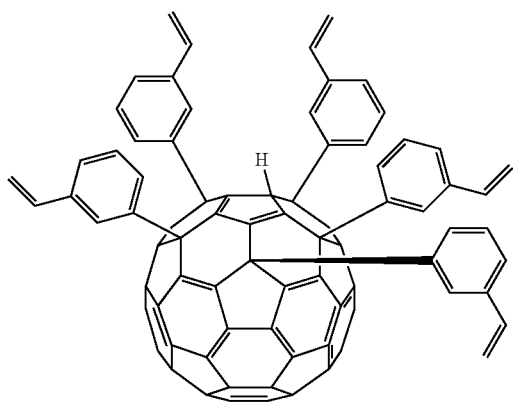
NCp-4
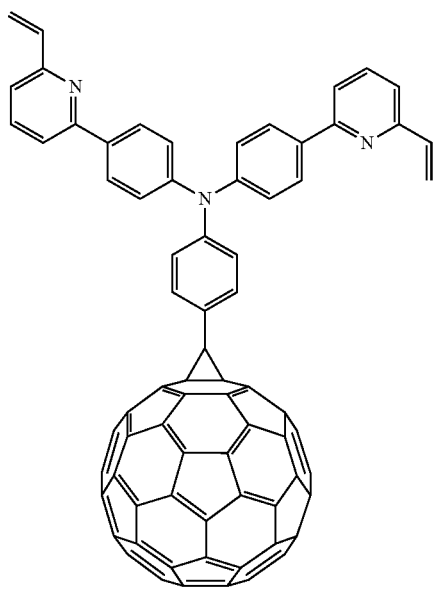

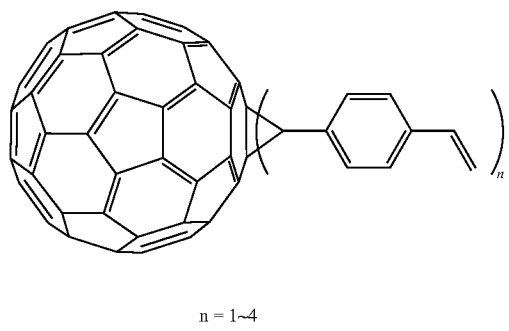
NCp-5
n = 1~4
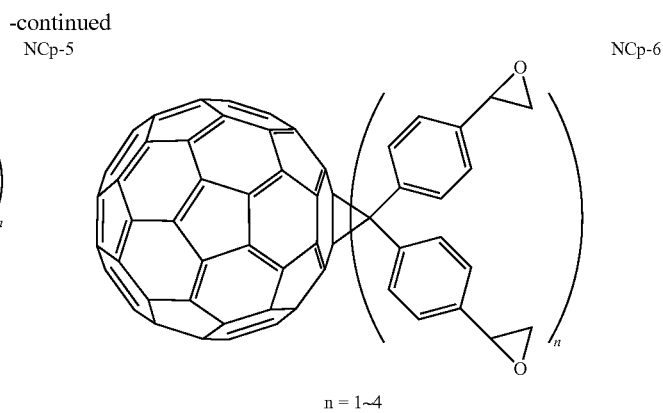
NCp-6
n = 1~4
[Chemical Formula 141]
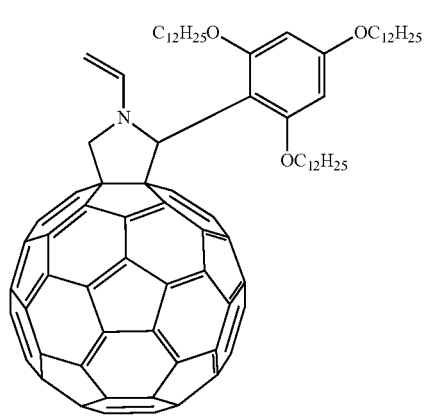
NCp-7
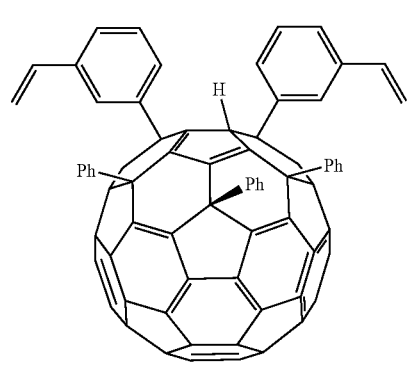
NCp-8
[Chemical Formula 142]
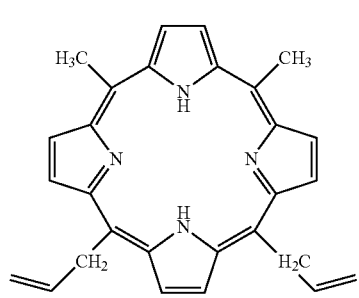
DBp-1
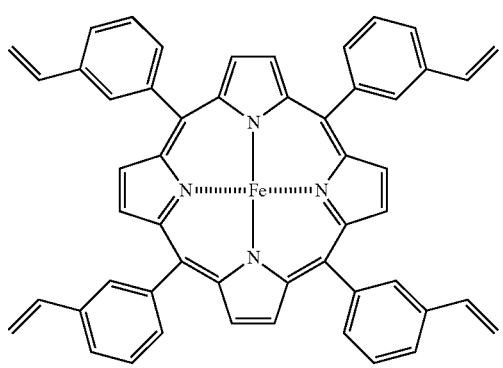
DBp-2

-continued
DBp-3
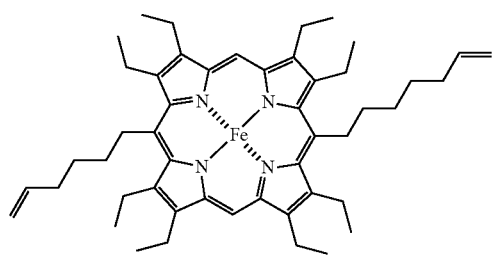
DBp-4
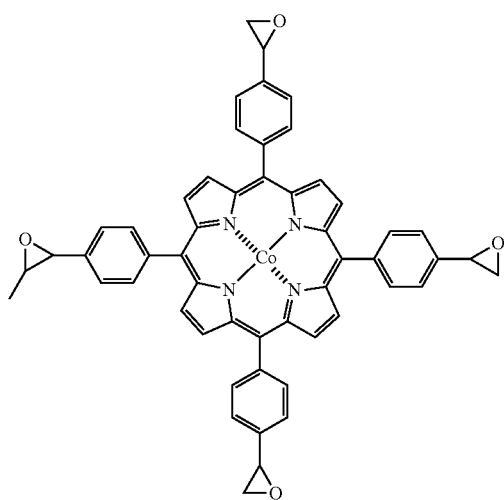
[Chemical Formula 143]
DBp-5
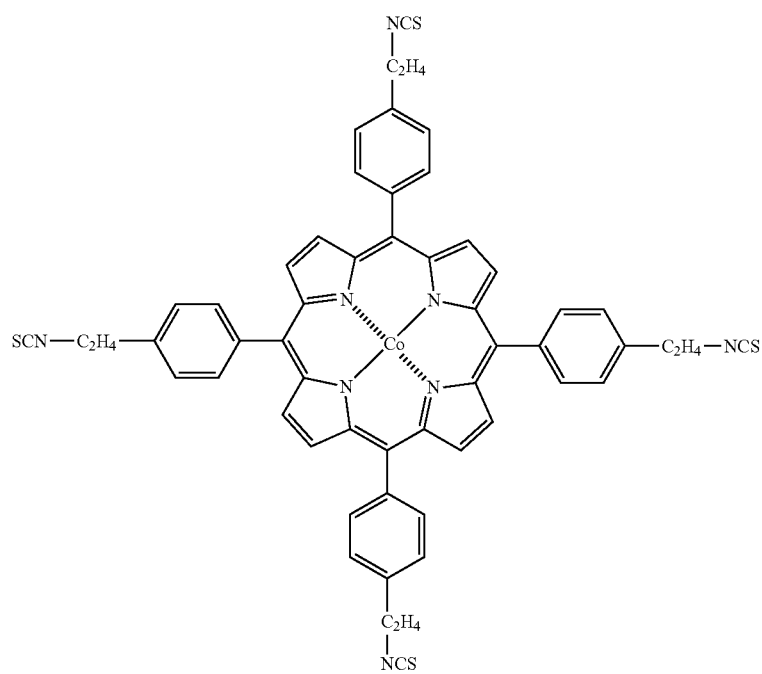
DBp-6
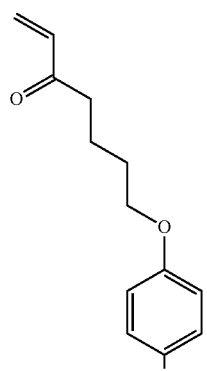

231 232
-continued
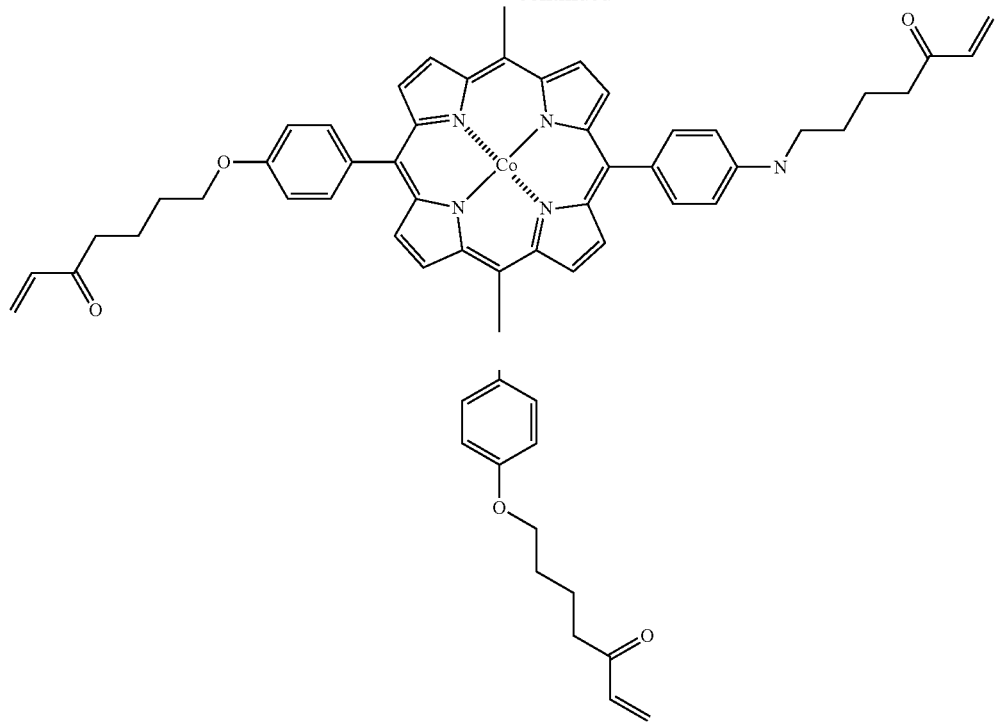
[Chemical Formula 144]
DBp-7
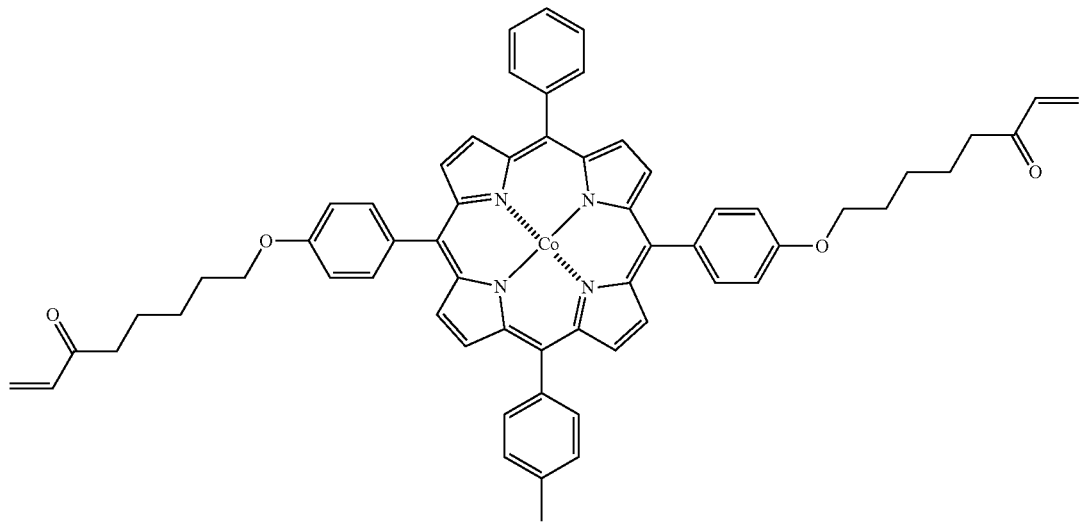

-continued
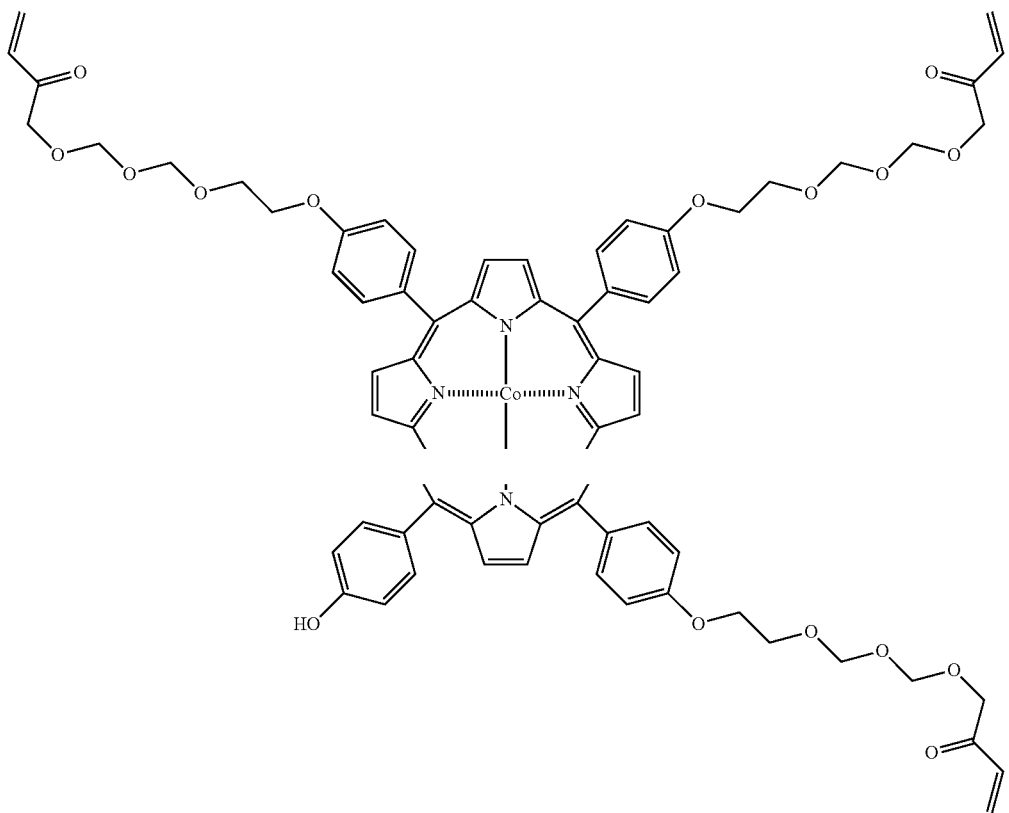
DBp-8
[Chemical Formula 145]
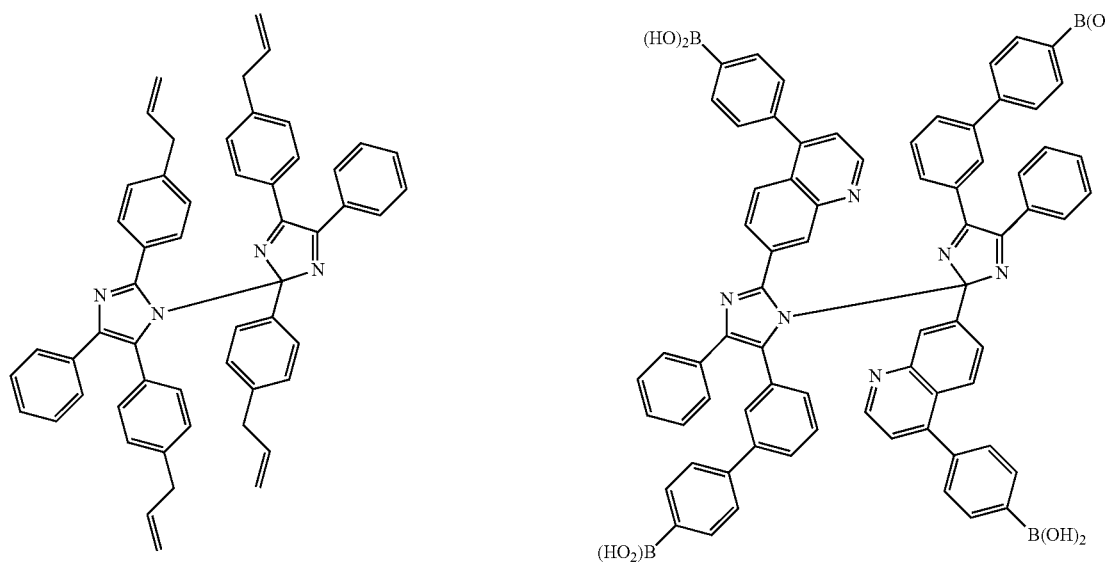
DEp-1    DEp-2

[Chemical Formula 146]
DFp-1 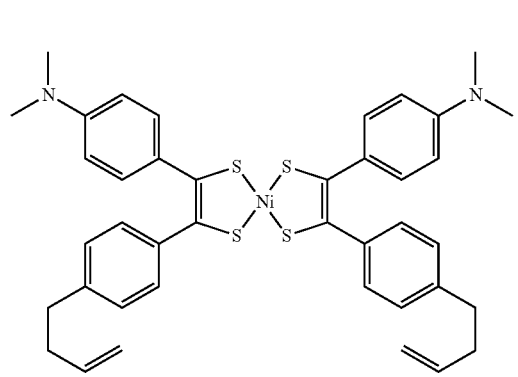
DFp-2 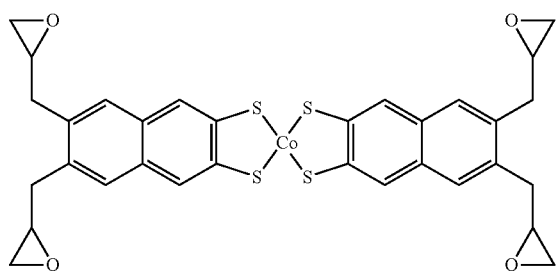
DFp-3 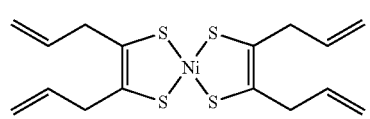
DFp-4 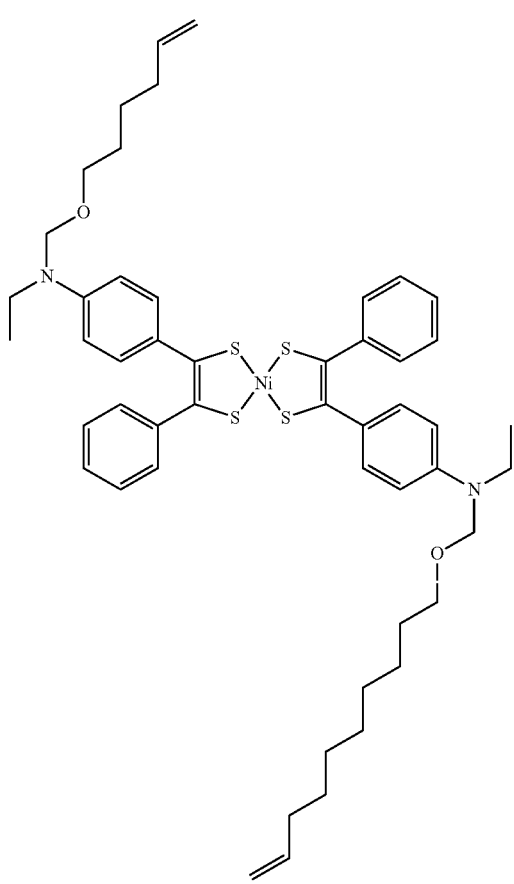
[Chemical Formula 147]
DMp-1 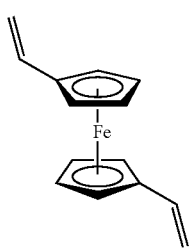
DMp-2 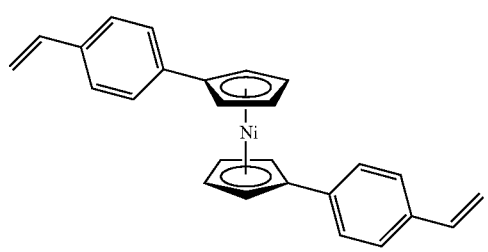

[Chemical Formula 148]
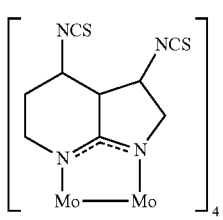
DNp-1
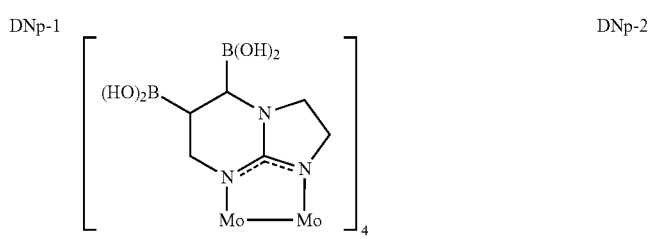
DNp-2
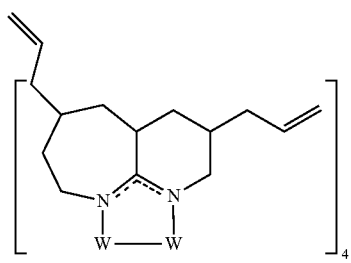
DNp-3
[Chemical Formula 149]
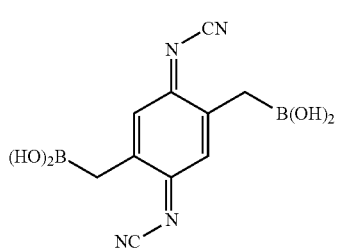
AHp-1
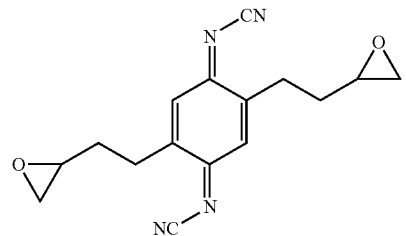
AHp-2
[Chemical Formula 150]
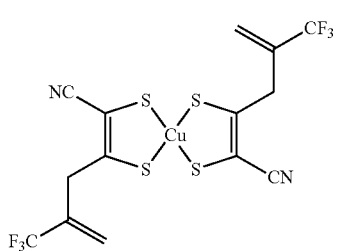
Alp-1
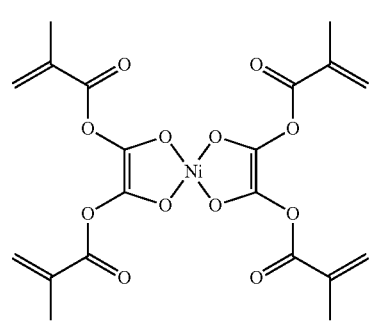
Alp-2

-continued
Alp-3
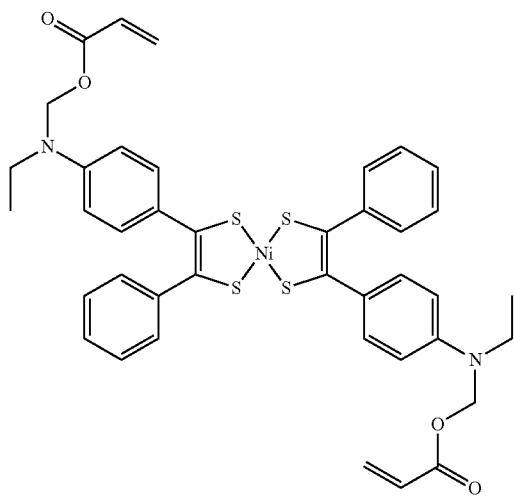
Alp-4
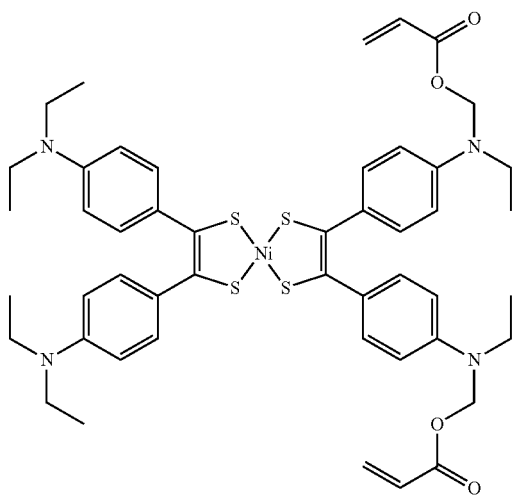
Alp-5
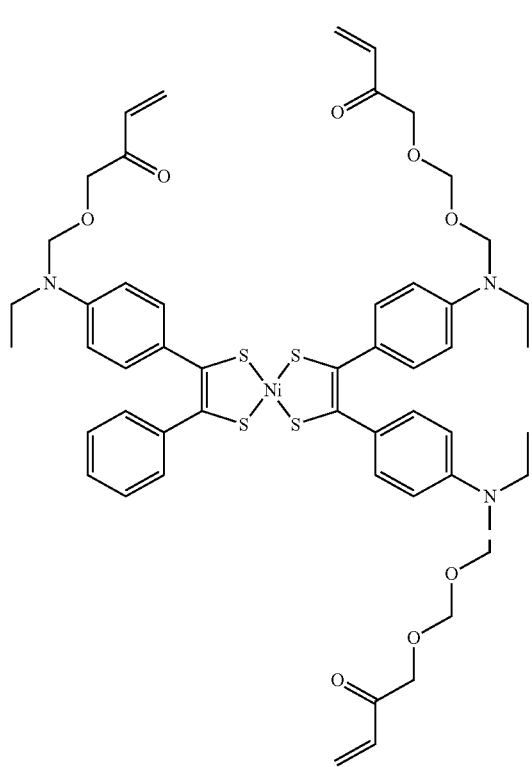

[Chemical Formula 151]
ALp-1
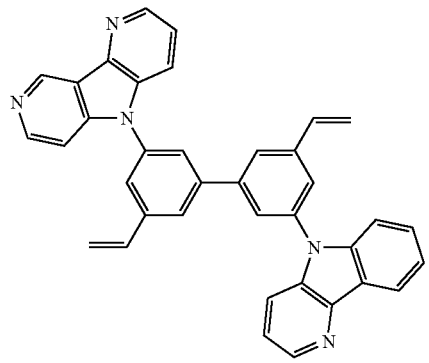
ALp-2
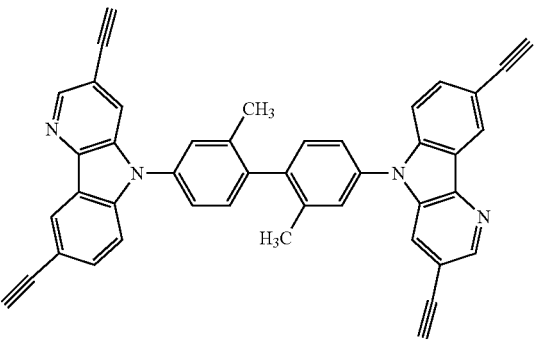
ALp-3
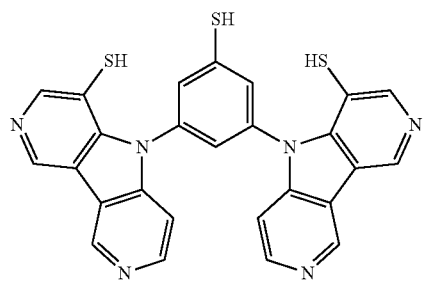
ALp-4
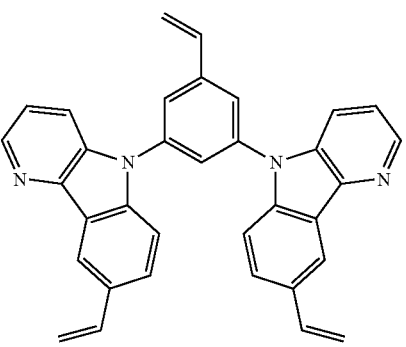
ALp-5
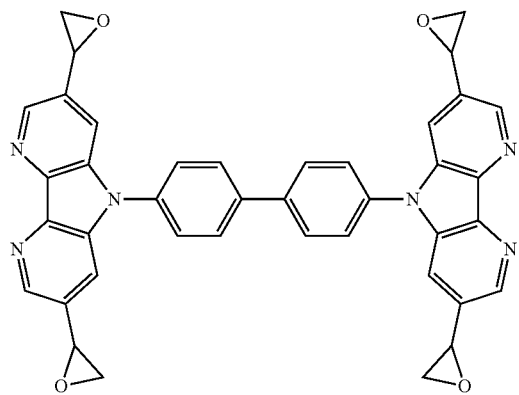
ALp-6
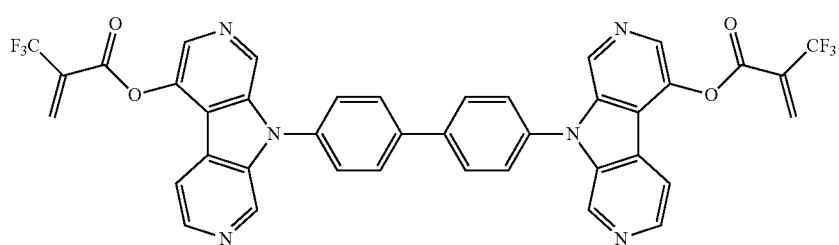

-continued
[Chemical Formula 152]
ALp-7
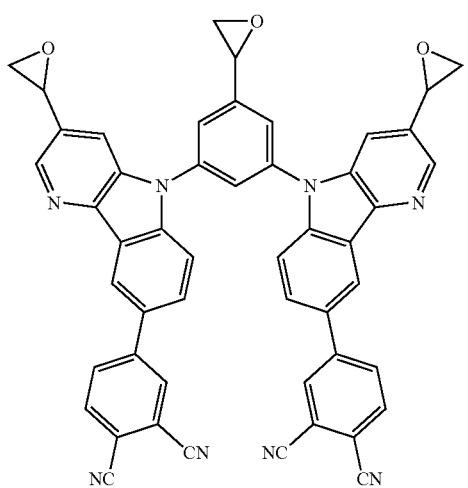
ALp-8
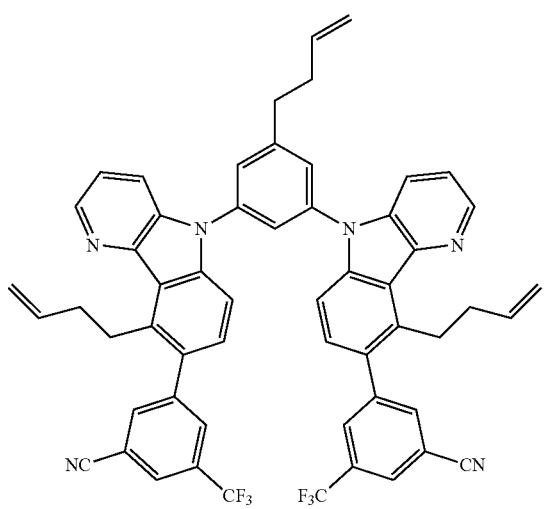
[Chemical Formula 153]
AQp-1
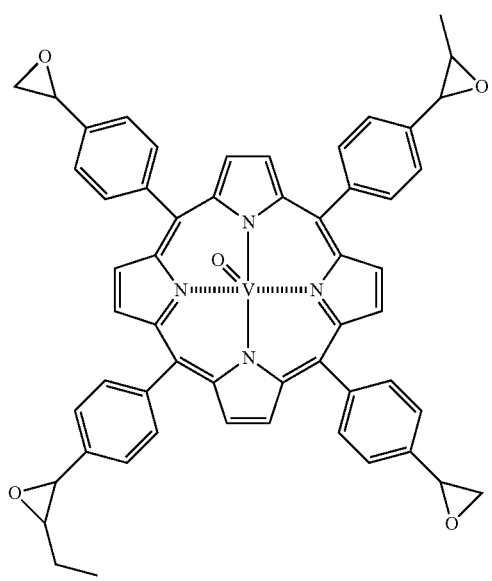
AQp-2
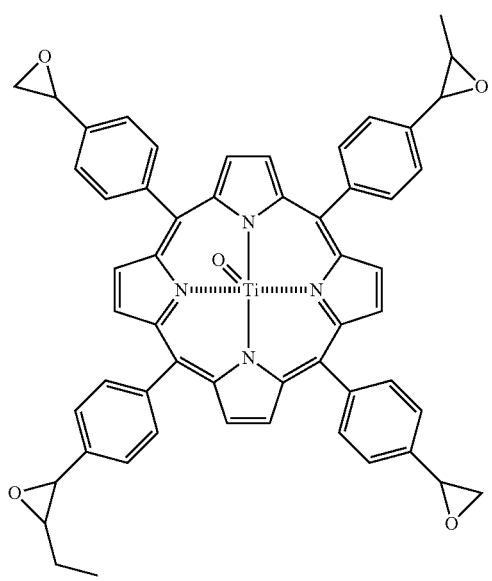
[Chemical Formula 154]
ACp-1
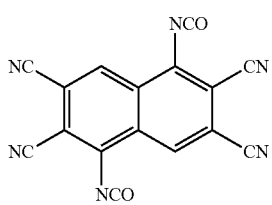
ACp-2
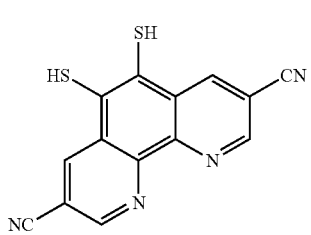

ACp-3
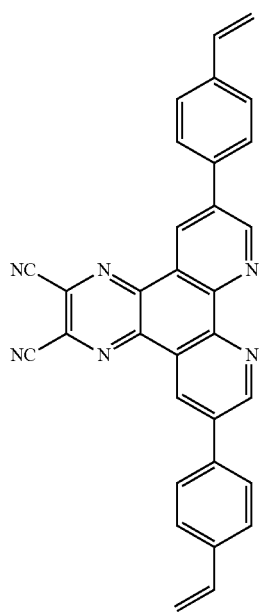
Below will be shown further specific examples of low-molecular weight materials, high-molecular weight materials and high-molecular weight polymers usable in combination in the present invention.
[Chemical Formula 155]
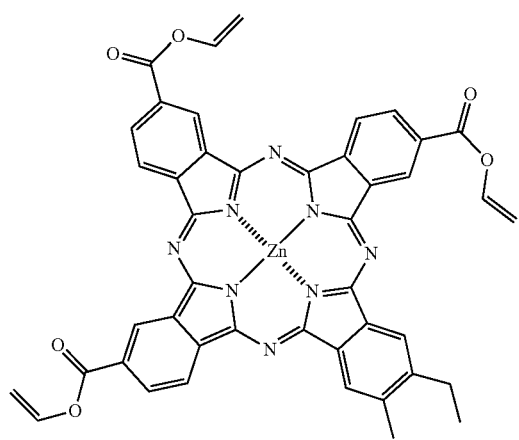
DAp-1
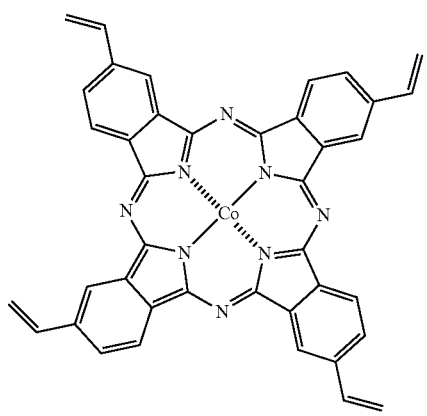
DAp-2

-continued
DAp-3
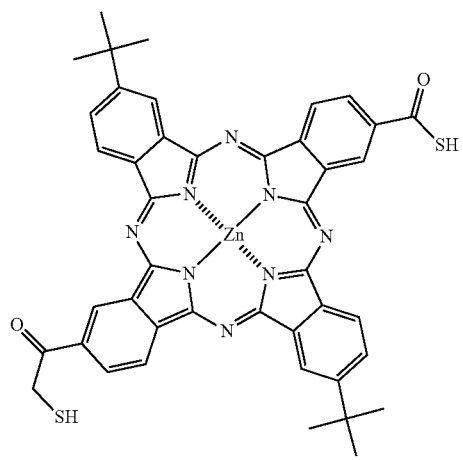
DAp-4
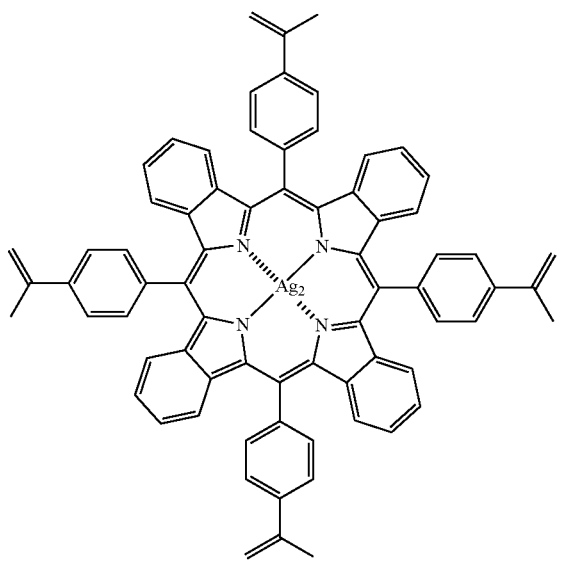
DAp-5
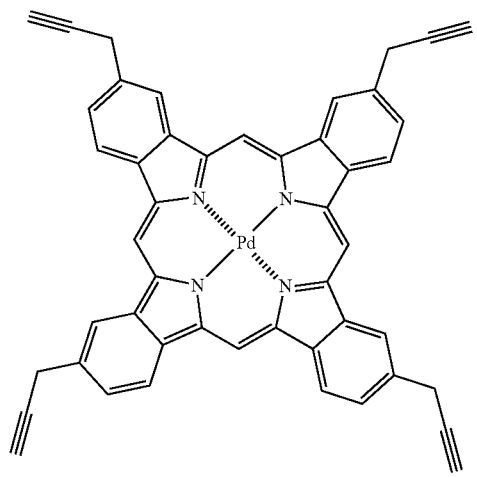
DAp-6
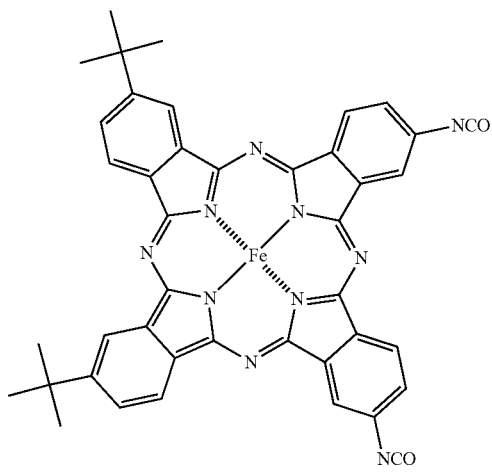
[Chemical Formula 156]
DCp-1
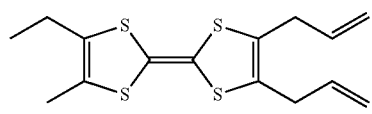
DCp-2
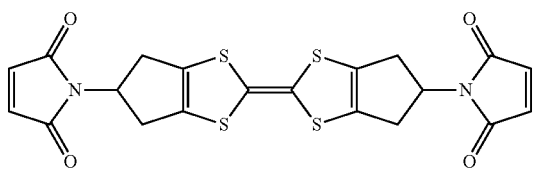
DCp-3
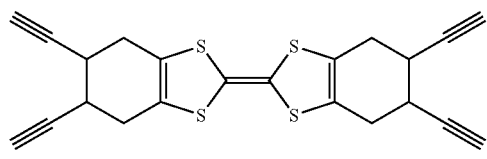
DCp-4
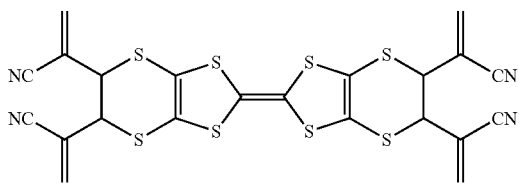

-continued
DCp-5
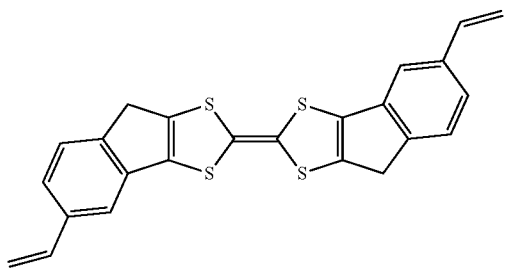
DCp-6
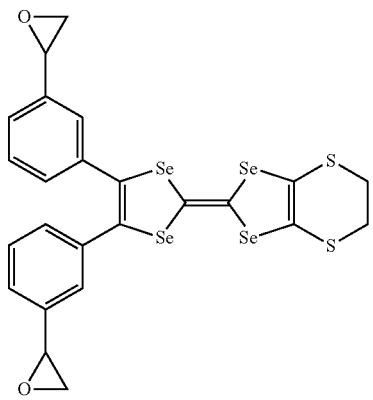
DCp-7
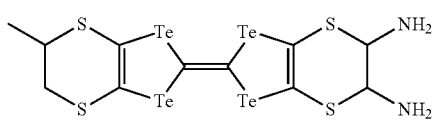
DCp-8
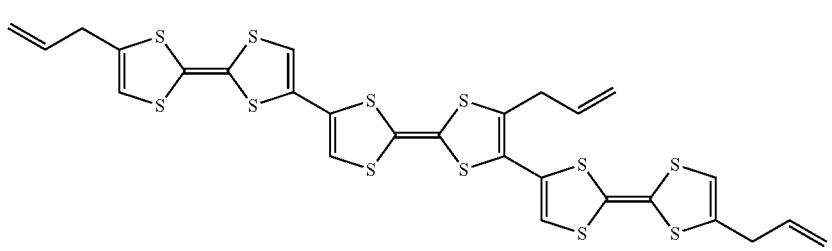
DCp-9
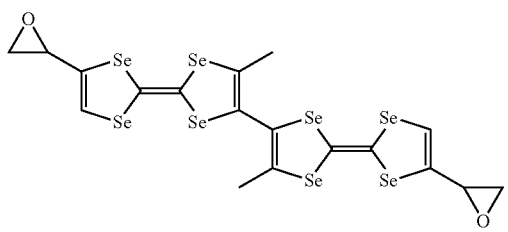
DCp-10
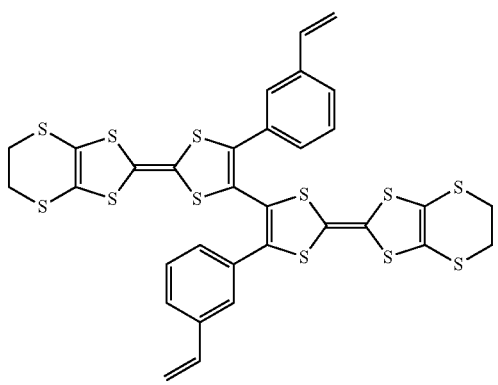
[Chemical Formula 157]
DDp-1
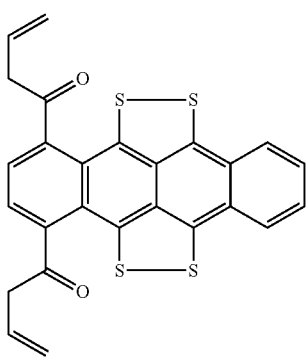
DDp-2
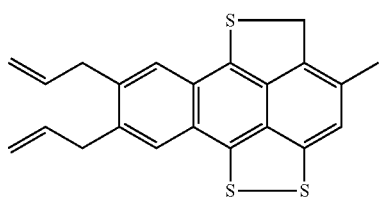

DDp-3
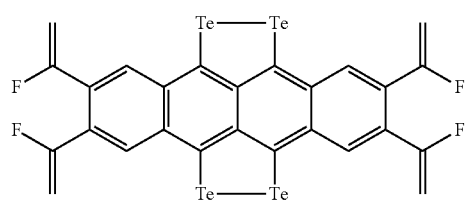
DDp-4
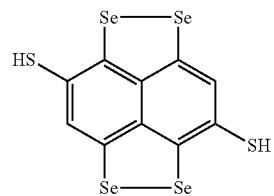
[Chemical Formula 158]
DAmp-1
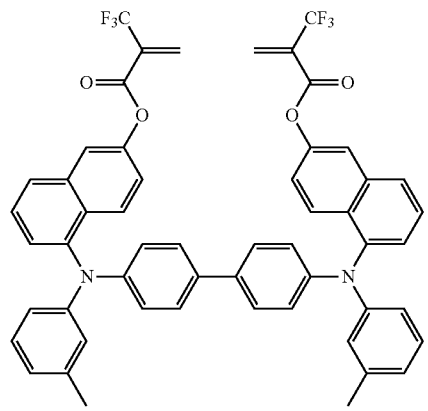
DAmp-2
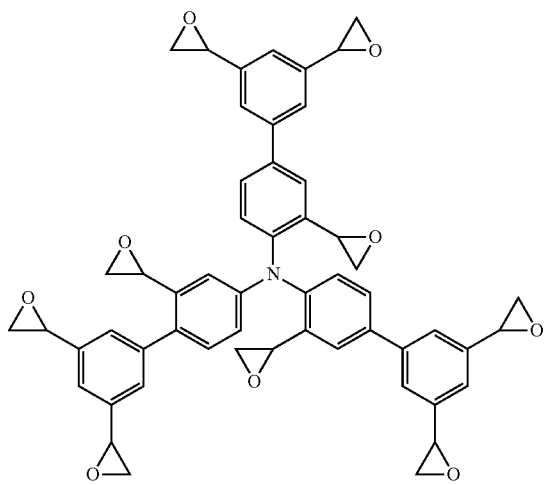
DAmp-3
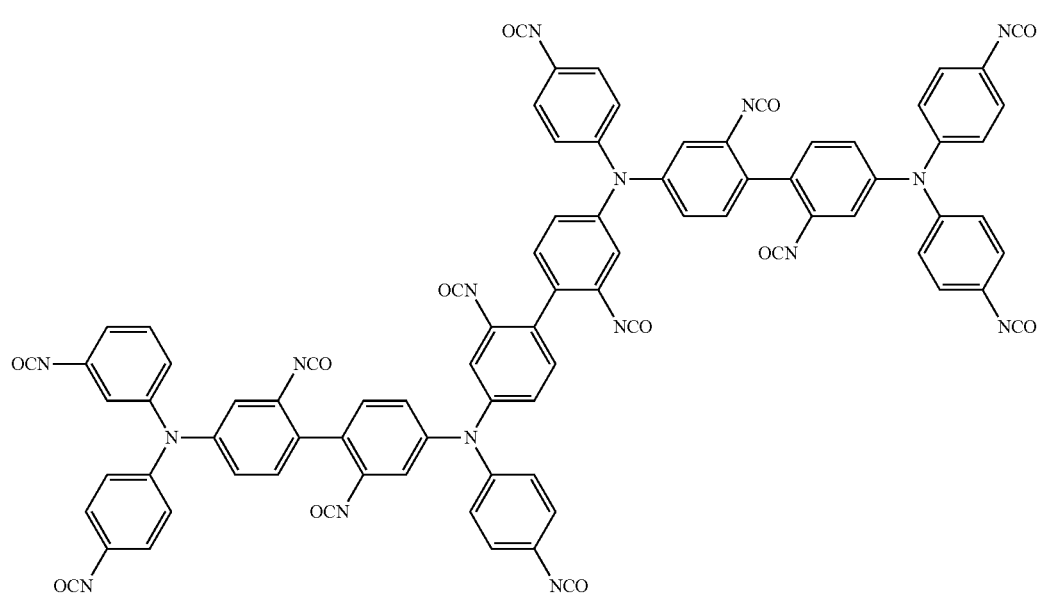

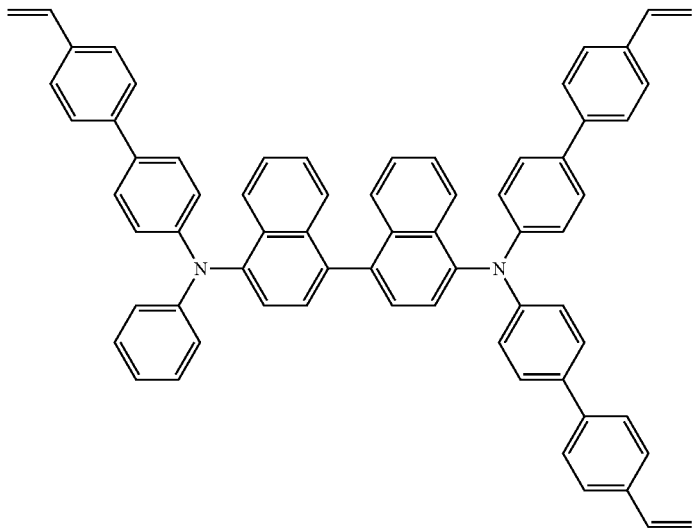
DAmp-4
[Chemical Formual 159]
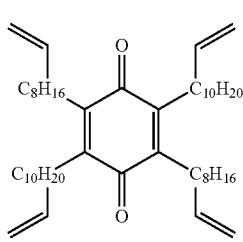
AOp-1
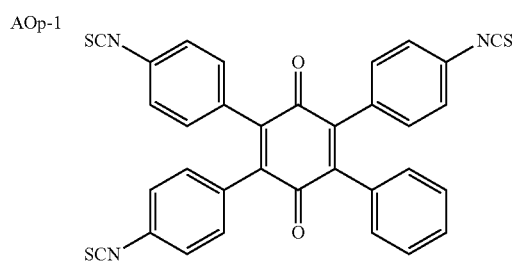
AOp-2
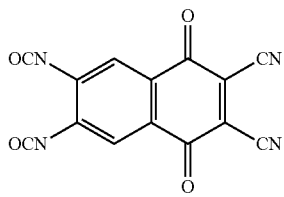
AOp-3
[Chemical Formula 160]
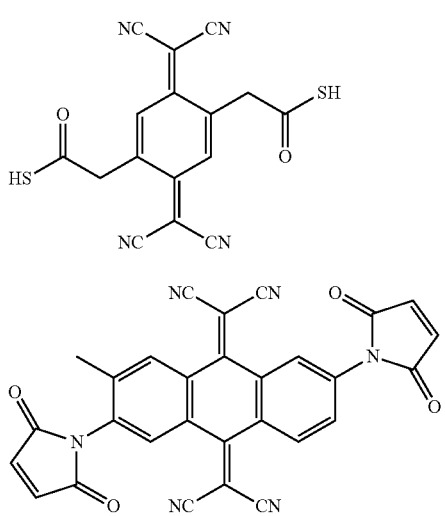
AGp-1
AGp-3
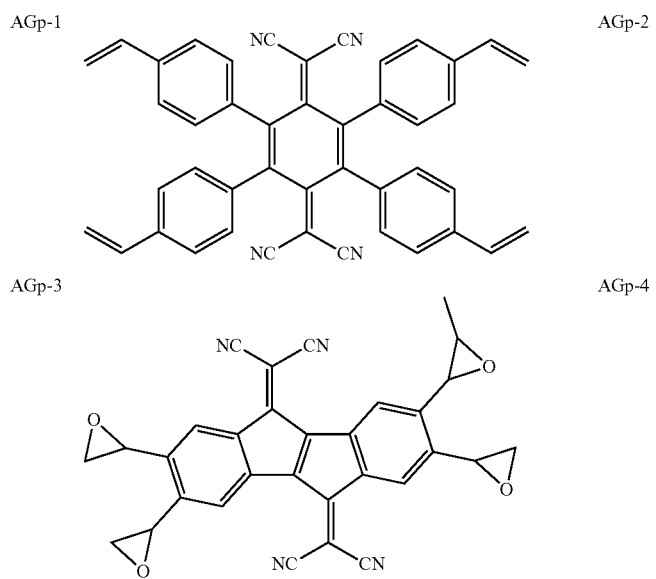
AGp-2
AGp-4

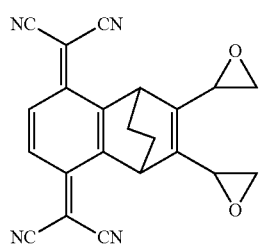
-continued
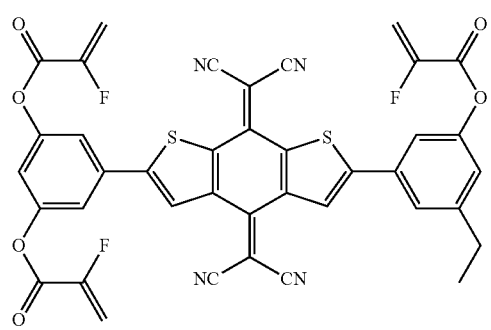
[Chemical Formula 161]
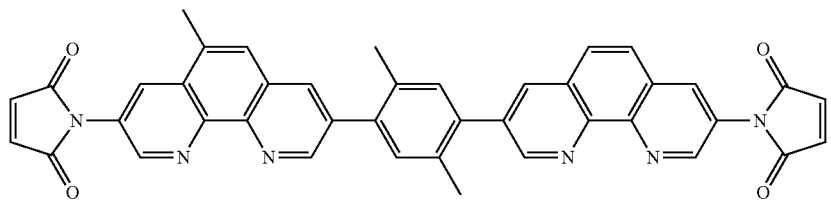
AKp-1
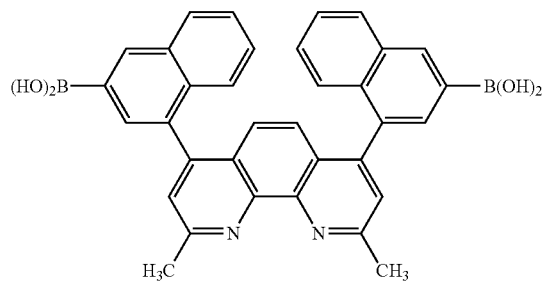
AKp-2
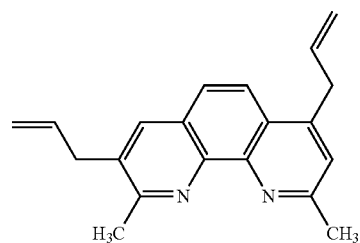
AKp-3
[Chemical Formula 162]
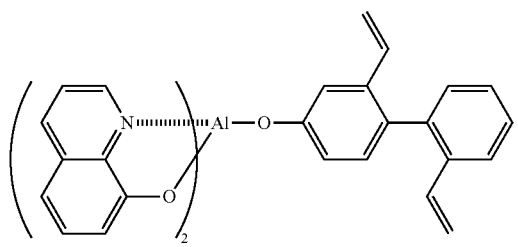
AMp-1
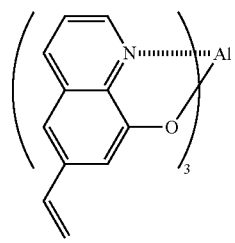
AMp-2
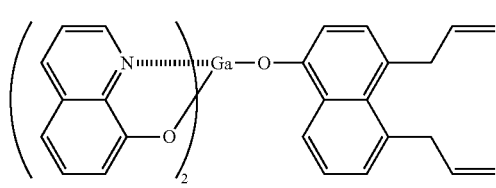
AMp-3

-continued
[Chemical Formula 163]
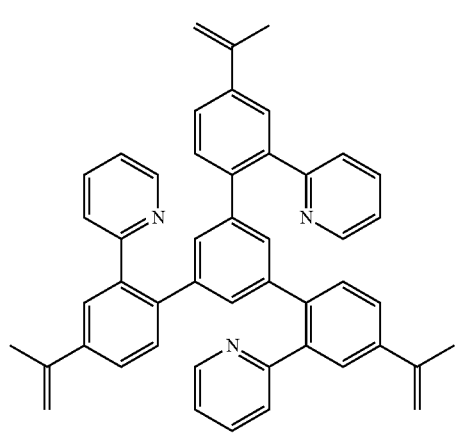 ANp-1
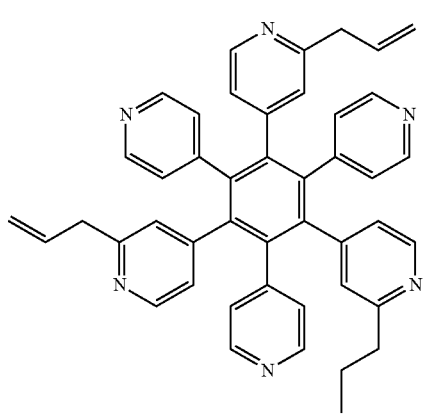 ANp-2
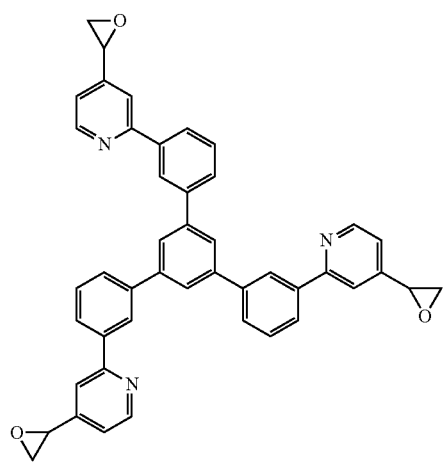 ANp-3
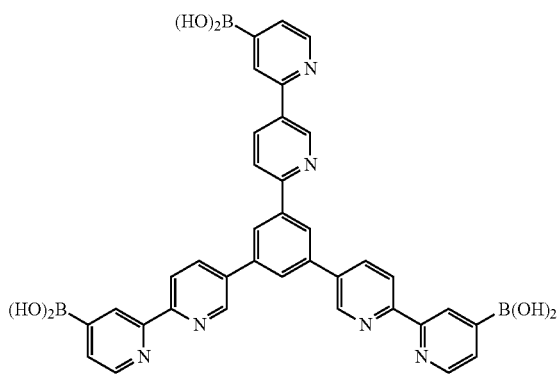 ANp-4
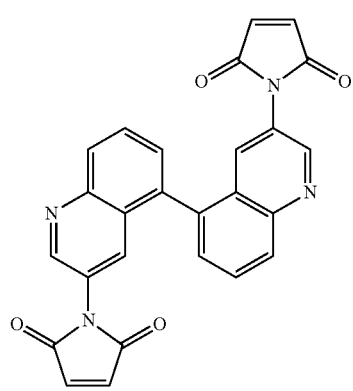 ANp-5

[Chemical Formula 164]

ANp-6

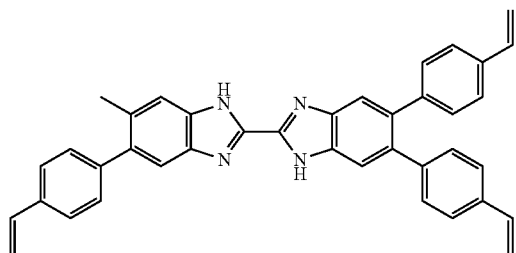

ANp-7

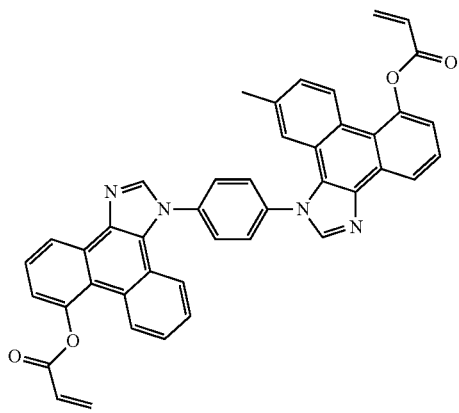

[Chemical Formula 165]

APp-1

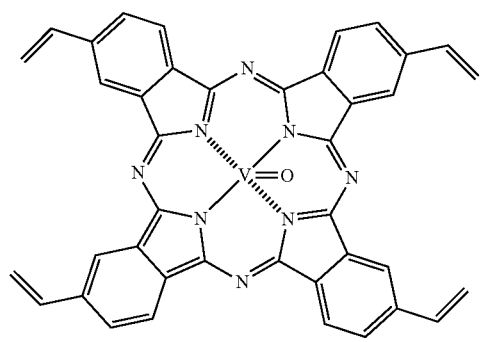

APp-2

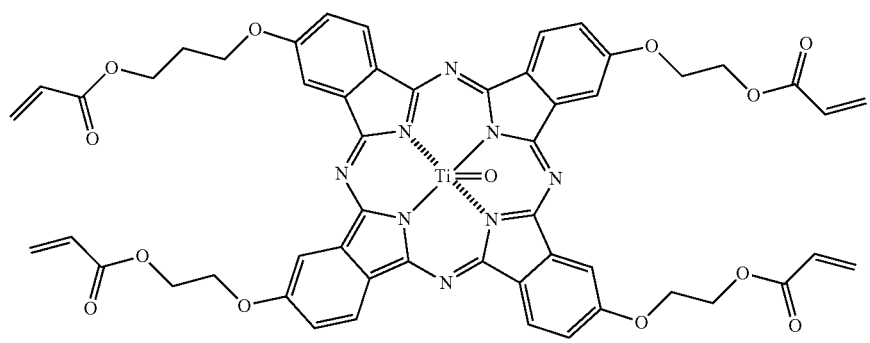

Examples of the process for forming the charge generating layer with the materials described above include an evaporation process and wet processes, such as spin coating, casting, die coating, blade coating, roller coating, inkjetting, printing, spray coating, curtain coating, and Langmuir Blodgett (LB) coating.

<<Method of Making Organic EL Element>>

A method of making the organic EL element will now be described. The organic EL element has a layer configuration including an anode, a hole injection layer, a hole transport layer, a luminous layer, an electron transport layer, an electron injection layer, and a cathode.

An intended electrode material, for example, an anode material, is deposited onto an appropriate substrate by any thin-film forming process such as evaporation or sputtering into a thickness of 1 μm or less, preferably 10 to 200 nm to form an anode.

Organic functional layers (thin organic film) including a hole injection layer, a hole transport layer, a luminous layer, an electron transport layer, and an electron injection layer are then formed with organic EL element materials on the anode.

The steps for forming the organic functional layers is primarily composed of:

(i) an applying step of applying and layering coating solutions prepared by compounding materials for individual organic functional layers in sequence on the anode on the support; and (ii) a drying step of drying the formed layers.

Each organic functional layer in the depositing step (i) may be formed, for example, by any wet process. Examples of such a process include spin coating, casting, die coating, blade coating, roller coating, ink jetting, printing, spray coating, curtain coating, and Langmuir Blodgett (LB) coating. It is preferred that at least a layer containing the quantum dot be formed by a wet process.

Organic functional layers other than the hole injection layer may also be preferably formed by any wet process, in particular, spin coating, casting, die coating, blade coating, roller coating, or ink jetting, which can readily form a homogeneous film without pin holes.

Examples of organic solvent used to dissolve or disperse the organic EL materials according to the present invention include ketones, such as methyl ethyl ketone and cyclohexanone; fatty acid esters, such as ethyl acetate; halogenated hydrocarbons, such as dichlorobenzene; aromatic hydrocarbons, such as toluene, xylene, mesitylene, and cyclohexylbenzene; aliphatic hydrocarbons, such as cyclohexane, decaline, and dodecane; and misculeneous organic solvents, such as dimethylformamide (DMF) and dimethylsulfoxide (DMSO). The materials can be dispersed by any appropriate method, such as ultrasonic wave dispersion, high-shearing force dispersion, or media dispersion.

Preferably, the preparation of the coating solution involving dissolution or dispersion of the organic EL materials according to the present invention and the application of the coating solution onto the substrate are carried out in an inert gas atmosphere. Since some materials can be used for the formation of the relevant layers without impairing the properties of the organic EL element in any atmosphere other than the inert gas atmosphere, all the steps do not always need the inert gas atmosphere. Such a measure can favorably reduce production costs.

In the drying step (ii), the applied and layered organic functional layers are dried.

The drying in the specification indicates a reduction of the solvent content from 100 mass % immediately after the coating to 0.2 mass % or less.

The drying can be performed by any common means, for example, drying under reduced or raised pressure, drying by heating, drying by blowing, IR drying, or microwave drying. Among these means, drying by heating is preferred. Preferably, each organic functional layer should be dried at a temperature higher than the lowest boiling point among the boiling points of the solvents used for preparation of the coating solution for the organic functional layers and lower than the lowest glass transition temperature of the organic functional layer materials+20° C. The actual range of the drying temperature in the present invention is preferably from 80 to 150° C., more preferably from 100 to 130° C.

The drying atmosphere for the applied and layered layers preferably contains 200 ppm or less in volume of gas other than the inert gas. Like the preparation and applying processes, the drying process may be performed in any atmosphere in some cases. Such a process is more preferred in view of a reduction in production cost.

Preferred examples of the inert gas include nitrogen and rare gases such as argon. In view of production cost, nitrogen is most preferred.

The applying and layering and the drying of these organic functional layers may be carried out by a batch process or a continuous process (in-line process). Although the drying process may be carried out on a transfer line, it should be preferably carried out by deposition or contactless winding into a roll.

After these applied layers are dried, a cathode material is formed thereon by evaporation or sputtering into a thin cathode film of 1 μm or less, preferably in the range of 50 to 200 nm, to give an intended organic EL element.

After heat treatment, the sealing member, the electrode, and the substrate are sealed or bonded with an adhesive to give an organic EL element <<Application>>

The organic EL element of the present invention is applicable to display devices and various light emitting sources.

Examples of the light emitting sources include domestic lighting fixtures, automobile lighting fixtures, backlights of watches, clocks, and liquid crystal devices, advertising displays, traffic signals, light sources of optical memory media, light sources of electrophotographic copying machines, light sources of optical communication processors, light sources of photosensors, and household electric appliance equipped with displays. In particular, the organic EL element is suitable for backlights of liquid crystal devices and light sources for lighting fixtures.

The organic EL element of the present invention may be subjected to patterning during the forming process through a metal mask or by ink jet printing, if necessary. The patterning is targeted to only the electrode (s), both the electrode (s) and the luminous layer, or all the layers of the element. The element can be prepared by any known process.

EXAMPLES

The present invention will now be described in more detail byway of examples. The present invention should not be limited to these examples. Throughout the examples, the symbol "%" indicates "mass %" unless otherwise stated.

Example 1

<<Preparation of Organic EL Element>>

Blue luminescent organic EL elements 11 to 16 were prepared in accordance with the procedure described below.
[Preparation of Inventive Organic EL Element 11]

(1.1) Preparation of Flexible Gas-Barrier Film

On an entire face (for formation of a first electrode) of a flexible poly(ethylene naphthalate) film (hereinafter referred to as PEN film) available from Teijin DuPont Films Japan Limited, an inorganic gas-barrier $SiO_x$ film was continuously formed into a thickness of 500 nm with an atmospheric plasma discharge system described in Japanese Unexamined Patent Application Publication No. 2004-68143. The resulting flexible gas-barrier film had an oxygen permeability of 0.001 ml/(m$^2$·day·atm) or less and a moisture permeability of 0.001 g/(m$^2$·day·atm) or less.

(1.2) Formation of First Electrode Layer

Indium tin oxide (ITO) with a thickness of 120 nm was deposited by sputtering on the flexible gas-barrier film and was etched by photolithography to form a pattern of a first electrode (anode) layer having an emission area of 50 mm square.

(1.3) Formation of Hole Injection Layer

The ITO substrate provided with the pattern of the first electrode layer was cleaned with isopropyl alcohol by ultrasonic agitation, was dried in a dry nitrogen gas atmosphere, and was cleaned in a UV ozone environment for 5 minutes. A solution of 70% poly(3,4-ethylene dioxythiophene)-polyethylenesulfonate (hereinafter, simply PEDOT/PSS), Baytron P Al 4083 available from Bayer) in pure water was applied by spin coating on the ITO substrate at 3000 rpm for 30 seconds. The coating film was dried at 200° C. for one hour. A 30 nm thick hole injection layer was thereby formed.

(1.4) Formation of Hole Transport Layer

The substrate provided with the hole injection layer was transferred into an atmosphere of nitrogen (grade G1), and a solution of 0.5% exemplified hole injection compound (60) (Mw=80,000, depicted in Chemical Formula 14) in chlorobenzene was applied by spin coating at 1500 rpm for 30 seconds onto the substrate. The substrate was dried at 160° C. for 30 minutes. A 30 nm thick hole transport layer was thereby formed.

(1.5) Formation of Luminous Layer

A luminous layer composition 1 described below was applied by spin coating at 1500 rpm for 30 seconds and the resulting film was dried at 120° C. for 30 minutes to form a 40 nm thick luminous layer.

| <Luminous Layer Composition 1> | |
|---|---|
| Exemplified compound a-1 (depicted in Chemical Formula 16) | 13.95 parts by mass |
| Exemplified compound D-134 (depicted in Chemical Formula 82) | 2.45 parts by mass |
| Quantum dot 1; core: CdSe (average particle diameter: 2 nm)/shell: ZnS (octadecylamine), average particle diameter: 12 nm | 0.30 parts by mass |
| Toluene | 2000 parts by mass |

The quantum dot 1 was prepared as follows:

<Preparation of Quantum Dot 1>

Under an argon stream, a mixture of tri-n-octylphosphine oxide (TOPO) (7.5 g) available from Kanto Kagaku, stearic acid (2.9 g) available from Kanto Kagaku, n-tetradecylsulfonic acid (620 mg) available from AVOCADO, and cadmium oxide (250 mg) available from Wako Pure Chemical Industries, Ltd. was mixed at 370° C. After the mixture was spontaneously cooled to 270° C., a stock solution of selenium (200 mg) available from STREMCHEMICAL in tributylphosphine (2.5 ml) available from Kanto Kagaku was added. The mixture was dried under reduced pressure to give TOPO-coated CdSe fine particles.

TOPO (15 g) was added to the resulting CdSe fine particles, and the mixture was heated. A solution of zinc diethyldithiocarbamate (1.1 g) available from Tokyo Chemical Industry Co., Ltd. in trioctylphosphine (10 ml) available from Sigma-Aldrich was added at 270° C. A quantum dot 1 (average particle diameter: 12 nm) composed of CdSe nanocrystalline (average particle diameter: 2 nm) core and a ZnS shell on which TOPO is fixed. The average particle diameter of the quantum dot 1 was determined with a particle size analyzer by dynamic light scattering, ZETA-SIZER Nano Series Nano-ZS made by Malvern.

(1.6) Formation of Electron Transport Layer

Using a solution of electron transport compound A (20 mg) in tetrefluoropropanol (TFPO) (4 ml), a film was prepared by spin coating at 1500 rpm for 30 seconds and was dried at 120° C. for 30 minutes to give a 30 nm thick electron transport layer.

[Chemical Formula 166]

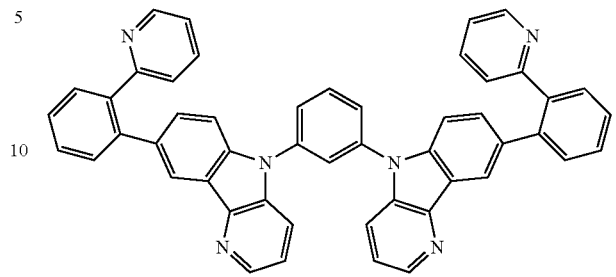

Compound A (1.7) Formation of Electron Injection Layer and Cathode

The substrate was placed into a vacuum evaporation system without exposition to the atmosphere. Molybdenum resistive heating boats containing sodium fluoride and potassium fluoride, respectively, were attached to the vacuum evaporation system. After the vacuum vessel was evacuated to $4 \times 10^{-5}$ Pa, the boat was electrically heated to deposit sodium fluoride at a rate of 0.02 nm/sec on the electron transport layer into a thickness of 1 nm then to deposit potassium fluoride at a rate of 0.02 nm/sec on sodium fluoride to give a 1.5 nm thick electron injection layer. A 100 nm thick aluminum film was then deposited by evaporation to form a cathode.

(1.8) Sealing and Preparation of Organic EL Element

A sealing member was bonded with a commercially available roller laminator to give an organic EL element 11 of the present invention.

The sealing member used was a laminate of a flexible aluminum foil with a thickness of 30 μm (Toyo Aluminum K.K.) and a poly(ethylene terephthalate) (PET) film with a thickness of 12 μm, which were bonded with a two-component reactive urethane adhesive (thickness of the adhesive layer: 1.5 μm).

A thermosetting sealing adhesive was applied onto the shiny face of the aluminum foil into a uniform thickness of 20 μm by using a dispenser and was dried for 12 hours under a vacuum of 100 Pa or less. The product was then transferred to a nitrogen atmosphere with a dew point of −80° C. or less and an oxygen content of 0.8 ppm to be dried for 12 hours or more until the sealing adhesive had a moisture content of less than 100 ppm.

The thermosetting sealing adhesive used was an epoxy adhesive that was a mixture of the following components (A) to (C):

(A) Bisphenol A diglycidyl ether (DGEBA)

(B) Dicyandiamide (DICY)

(C) Epoxy adduct hardening accelerator

A sealing substrate was disposed so as to cover the extracting electrode and the connection of the electrode lead in accordance with the configuration shown in FIG. 1, and the laminate was sealed with compression rollers under a roller temperature of 120° C., a pressure of 0.5 MPa, and a roller rate of 0.3 m/min, to prepare an organic EL element 11 including an luminous layer containing the quantum dots.

[Preparation of Inventive Organic EL Element 12]

An organic EL element 12 was prepared as in the organic EL element 11 except that the luminous layer was formed with the following luminous layer composition 2.

| <Luminous Layer Composition 2> | |
|---|---|
| Exemplified compound a-6 (depicted in Chemical Formula 16) | 13.95 parts by mass |
| Exemplified compound DP-1 (depicted in Chemical Formula 83) | 2.45 parts by mass |
| Quantum dot 2; core: CdSe (average particle diameter: 2 nm)/ shell: ZnS (octadecylamine), average particle diameter: 12 nm | 0.30 parts by mass |
| Toluene | 2000 parts by mass |

[Preparation of Inventive Organic EL Element 13]

An organic EL element 13 was prepared as in the organic EL element 11 except that the luminous layer was formed with the following luminous layer composition 3.

| <Luminous Layer Composition 3> | |
|---|---|
| Exemplified compound a-31 (depicted in Chemical Formula 21) | 13.95 parts by mass |
| Exemplified compound 2 (Compound 2 shown in Table 1) | 2.45 parts by mass |
| Quantum dot 2; core: CdSe (average particle diameter: 2 nm)/ shell: ZnS (octadecylamine), average particle diameter: 12 nm | 0.30 parts by mass |
| Toluene | 2000 parts by mass |

[Preparation of Inventive Organic EL Element 14]

An organic EL element 14 was prepared as in the organic EL element 11 except that the luminous layer was formed with the following luminous layer composition 4.

| <Luminous Layer Composition 4> | |
|---|---|
| Exemplified compound a-31 (depicted in Chemical Formula 21) | 13.95 parts by mass |
| Exemplified compound D-114 (depicted in Chemical Formula 78) | 2.45 parts by mass |
| Quantum dot 3 having a CdSe core (an average particle diameter of 2 nm) and a ZnS shell and having an average particle diameter of 6 nm, without surface modifier | 0.30 parts by mass |
| Toluene | 2000 parts by mass |

[Preparation of Inventive Organic EL Element 15]

An organic EL element 15 was prepared as in the organic EL element 11 except that the luminous layer was formed with the following luminous layer composition 5.

| <Luminous Layer Composition 5> | |
|---|---|
| Exemplified compound a-6 (depicted in Chemical Formula 16) | 13.95 parts by mass |
| Exemplified compound D-135 (depicted in Chemical Formula 82) | 2.45 parts by mass |
| Quantum dot 4 composed of only a CdSe core having an average particle diameter of 2 nm | 0.30 parts by mass |
| Toluene | 2000 parts by mass |

[Preparation of Comparative Organic EL Element 16]

An organic EL element 16 was prepared as in the organic EL element 11 except that the luminous layer was formed with the following luminous layer composition 6.

| <Luminous Layer Composition 6> | |
|---|---|
| Exemplified compound a-1 (depicted in Chemical Formula 16) | 14.25 parts by mass |
| Exemplified compound D-134 (depicted in Chemical Formula 82) | 2.45 parts by mass |
| Toluene | 2000 parts by mass |

Table 4 shows the main configuration of the luminous layer, the observed band gap (absolute value), and the average particle diameter of the quantum dot of each of the resulting organic EL elements 11 to 16.

TABLE 4

| ORGANIC EL DEVICE No. | *1 | HOST COMPOUND | ADDITION TO LUMINOUS LAYER | STRUCTURE OF QUANTUM DOT | | AVERAGE DIAMETER (nm) | BANDGAP(eV) | | REMARKS |
|---|---|---|---|---|---|---|---|---|---|
| | | | | CORE/SHELL STRUCTURE | SURFACE MODIFIER | | *1 HOST COMPOUND | QUANTUM DOT | |
| 11 | D-134 | a-1 | ADDED | PRESENT | PRESENT | 12 | 2.6 | 3.4 | 2.7 | PRESENT INVENTION |
| 12 | DP-1 | a-6 | ADDED | PRESENT | PRESENT | 12 | 2.6 | 3.4 | 2.7 | PRESENT INVENTION |
| 13 | COMPOUND 2 | a-31 | ADDED | PRESENT | PRESENT | 12 | 2.6 | 3.6 | 2.7 | PRESENT INVENTION |
| 14 | D-114 | a-31 | ADDED | PRESENT | NOT PRESENT | 6 | 2.6 | 3.6 | 2.7 | PRESENT INVENTION |
| 15 | D-135 | a-6 | ADDED | NOT PRESENT | NOT PRESENT | 2 | 2.6 | 3.4 | 2.7 | PRESENT INVENTION |
| 16 | D-134 | a-1 | NOT ADDED | NOT PRESENT | NOT PRESENT | — | 2.6 | 3.4 | — | COMPARISON EXAMPLE |

*1: PHOSPHORESCENT DOPANT

The bandgap (eV) of the phosphorescent dopant, the host compound, and the quantum dot shown in Table 4 was determined as described below. The bandgap of the quantum dot, which is an inorganic compound, is a difference in energy between the valence band, and the conductive band and the bandgaps of the phosphorescent dopant and the host compound, which are organic compounds, are a difference in energy between the highest occupied molecular orbital (HOMO) and the lowest occupied molecular orbital (LUMO).

The bandgap (eV) of the Quantum dot was determined by a Tauc plot.

The energy level of the HOMO was determined with a photoelectron spectrometer AC-2 (RIKEN KEIKI Co., Ltd.) and the energy level of the LUMO was calculated from the following expression with an absorption wavelength edge ($\lambda$th (nm)) to determine the bandenergy gap (HOMO-LUMO energy gap), where the value is an absolute value (ev).

(Energy level of LUMO)=(energy level of HOMO)+ 1240/$\lambda$th

The average particle diameter of the quantum dot was determined with a particle size analyzer by dynamic light scattering, ZETASIZER Nano Series Nano-ZS made by Malvern. The diameter indicates the overall particle size from the core to the surface modifier if present or from the core to the shell in a core/shell structure, or the particle size of the core if present alone.

<<Evaluation of Organic EL Element>>

The organic EL elements 11 to 16 were used for the following evaluations:

(1) Determination of Luminous Efficiency

Each organic EL element was driven under a constant current density of 2.5 mA/cm² at room temperature (about 23° C.), and the luminance L immediately after the start of the drive was determined with a spectroradiometer CS-2000 (KONICA MINOLTA OPTICS, INC.).

The relative luminance was calculated relative to the comparative organic EL element 16 (luminance: 1.0) and was used as a luminous efficiency (external extraction quantum efficiency). A larger relative luminance indicates higher luminous efficiency.

(2) Determination of Drive Voltage

Each organic EL element was driven at a constant current of 2.5 mA/cm² at room temperature (about 23° C.) and the drive voltage was determined.

The relative drive voltage was calculated to the comparative organic EL element 16 (drive voltage: 1.0). A smaller relative drive voltage indicates superior low-voltage drive characteristics.

(3) Evaluation of Service Life of Element

Each organic EL element was wound around a metal column having a diameter of 5 cm. The wound organic EL element was continuously driven and the luminescence was observed with the spectroradiometer CS-2000 (described above) to determine the half period $LT_{50}$ when the observed luminance fell to one-half. The initial current was controlled such that the luminance was 4000 cd/m² at the start of the continuous driving operation.

The relative half period to that of the comparative organic EL element 16 ($LT_{50}$: 1.0) and was used as the service life of the element (stability at a continuous driving operation).

A larger value indicates higher stability at a continuous driving operation and a longer service life.

Table 5 shows the results.

TABLE 5

| ORGANIC EL DEVICE NO. | RELATIVE LUMINOUS EFFICIENCY | RELATIVE DRIVE VOLTAGE | RELATIVE SERVICE LIFE OF DEVICE | REMARKS |
|---|---|---|---|---|
| 11 | 1.5 | 0.7 | 1.9 | PRESENT INVENTION |
| 12 | 1.7 | 0.6 | 2.0 | PRESENT INVENTION |
| 13 | 1.6 | 0.5 | 2.5 | PRESENT INVENTION |
| 14 | 1.2 | 0.8 | 1.5 | PRESENT INVENTION |
| 15 | 1.1 | 0.9 | 1.2 | PRESENT INVENTION |
| 16 | 1.0 (STANDARD) | 1.0 (STANDARD) | 1.0 (STANDARD) | COMPARISON EXAMPLE |

The results shown in Table 5 demonstrate that organic EL elements 11 to 15 (blue luminescent elements of the present invention) exhibit sufficiently high luminescence at quantum dots by energy transfer from the blue phosphorescent dopants to the quantum dots, high luminous efficiency, prolonged service life, and a decreased drive voltage, compared to comparative organic EL element 16. These advantages are further enhanced through selection of appropriate phosphorescent dopants.

Example 2

<<Preparation of Organic EL Element>>

White luminescent organic EL elements 21 to 26 were prepared in accordance with the following procedure.

[Preparation of Inventive Organic EL Element 21]

(1.1) Preparation of Flexible Gas-Barrier Film

On an entire face (for formation of a first electrode) of a flexible poly(ethylene naphthalate) film available from Teijin DuPont Films Japan Limited, an inorganic gas-barrier $SiO_x$ film was continuously formed into a thickness of 500 nm with an atmospheric plasma discharge system described in Japanese Unexamined Patent Application Publication No. 2004-68143. The resulting flexible gas-barrier film had an oxygen permeability of 0.001 ml/(m²·day·atm) or less and a moisture permeability of 0.001 g/(m²·day·atm) or less.

(1.2) Formation of First Electrode Layer

Indium tin oxide (ITO) with a thickness of 120 nm was deposited by sputtering on the flexible gas-barrier film and was etched by photolithography to form a pattern of a first electrode (anode) layer having an emission area of 50 mm square.

(1.3) Formation of Hole Injection Layer

The ITO substrate provided with the pattern of the first electrode layer was cleaned with isopropyl alcohol by ultrasonic agitation, was dried in a dry nitrogen gas atmosphere, and was cleaned in a UV ozone environment for 5 minutes. A solution of 70% poly(3,4-ethylene dioxythiophene)-polyethylenesulfonate (hereinafter, simply PEDOT/PSS), Baytron P Al 4083 available from Bayer) in pure water was applied by spin coating on the ITO substrate at 3000 rpm for 30 seconds. The coating film was dried at 200° C. for one hour. A 30 nm thick hole injection layer was thereby formed.

(1.4) Formation of Hole Transport Layer

The substrate provided with the hole injection layer was transferred into an atmosphere of nitrogen (grade G1), and a solution of 0.5% exemplified hole injection compound (60) (Mw=80,000, depicted in Chemical Formula 14) in chlorobenzene was applied by spin coating at 1500 rpm for 30 seconds onto the substrate. The substrate was dried at 160° C. for 30 minutes. A 30 nm thick hole transport layer was thereby formed.

(1.5) Formation of Luminous Layer

A luminous layer composition 21 described below was applied by spin coating at 1500 rpm for 30 seconds and the resulting film was dried at 120° C. for 30 minutes to form a 40 nm thick luminous layer.

| <Luminous Layer Composition 21> | |
| --- | --- |
| Exemplified compound a-2 (depicted in Chemical Formula 16) | 13.95 parts by mass |
| Exemplified compound D-134 (depicted in Chemical Formula 82) | 2.45 parts by mass |
| Exemplified compound D-67 (depicted in Chemical Formula 71) | 0.025 parts by mass |
| Exemplified compound D-80 (depicted in Chemical Formula 72) | 0.025 parts by mass |
| Quantum dot 1; core: CdSe (average particle diameter: 2 nm)/ shell: ZnS (octadecylamine), average particle diameter: 12 nm | 0.30 parts by mass |
| Toluene | 2000 parts by mass |

(1.6) Formation of Electron Transport Layer

Using a solution of electron transport compound A (20 mg) (the structure is depicted in Example 1) in tetrefluoropropanol (TFPO) (4 ml), a film was prepared by spin coating at 1500 rpm for 30 seconds and was dried at 120° C. for 30 minutes to give a 30 nm thick electron transport layer.

(1.7) Formation of Electron Injection Layer and Cathode

The substrate was placed into a vacuum evaporation system without exposition to the atmosphere. Molybdenum resistive heating boats containing sodium fluoride and potassium fluoride, respectively, were attached to the vacuum evaporation system. After the vacuum vessel was evacuated to $4 \times 10^{-5}$ Pa, the boat was electrically heated to deposit sodium fluoride at a rate of 0.02 nm/sec on the electron transport layer into a thickness of 1 nm then to deposit potassium fluoride at a rate of 0.02 nm/sec on sodium fluoride to give a 1.5 nm thick electron injection layer. A 100 nm thick aluminum film was then deposited by evaporation to form a cathode.

(1.8) Sealing and Preparation of Organic EL Element

A sealing member was bonded with a commercially available roller laminator to give an organic EL element 21 of the present invention.

The sealing member used was a laminate of a flexible aluminum foil with a thickness of 30 μm (Toyo Aluminum K.K.) and a poly(ethylene terephthalate) (PET) film with a thickness of 12 μm, which were bonded with a two-component reactive urethane adhesive (thickness of the adhesive layer: 1.5 μm).

A thermosetting sealing adhesive was applied onto the shiny face of the aluminum foil into a uniform thickness of 20 μm and was dried for 12 hours under a vacuum of 100 Pa or less. The product was then transferred to a nitrogen atmosphere with a dew point of −80° C. or less and an oxygen content of 0.8 ppm to be dried for 12 hours or more until the sealing adhesive had a moisture content of less than 100 ppm.

The thermosetting sealing adhesive used was an epoxy adhesive that was a mixture of the following components (A) to (C):

(A) Bisphenol A diglycidyl ether (DGEBA)
(B) Dicyandiamide (DICY)
(C) Epoxy adduct hardening accelerator A sealing substrate was disposed so as to cover the extracting electrode and the connection of the electrode lead in accordance with the configuration shown in FIG. 1, and the laminate was sealed with compression rollers under a roller temperature of 120° C., a pressure of 0.5 MPa, and a roller rate of 0.3 m/min, to prepare an organic EL element 21.

[Preparation of Inventive Organic EL Element 22]

An organic EL element 22 was prepared as in the organic EL element 21 except that the luminous layer was formed with the following luminous layer composition 22.

| <Luminous Layer Composition 22> | |
| --- | --- |
| Exemplified compound a-7 (depicted in Chemical Formula 17) | 13.95 parts by mass |
| Exemplified compound DP-9 (depicted in Chemical Formula 84) | 2.45 parts by mass |
| Exemplified compound D-67 (depicted in Chemical Formula 71) | 0.025 parts by mass |
| Exemplified compound D-80 (depicted in Chemical Formula 72) | 0.025 parts by mass |
| Quantum dot 5; core: CdSe (average particle diameter: 2.8 nm)/ shell: ZnS (octadecylamine), average particle diameter: 12 nm | 0.30 parts by mass |
| Toluene | 2000 parts by mass |

[Preparation of Inventive Organic EL Element 23]

An organic EL element 23 was prepared as in the organic EL element 21 except that the luminous layer was formed with the following luminous layer composition 23.

| <Luminous Layer Composition 23> | |
| --- | --- |
| Exemplified compound a-10 (depicted in Chemical Formula 17) | 13.95 parts by mass |
| Exemplified compound 20 (Compound 20 shown in Table 1) | 2.45 parts by mass |
| Exemplified compound D-67 (depicted in Chemical Formula 71) | 0.025 parts by mass |
| Exemplified compound D-80 (depicted in Chemical Formula 72) | 0.025 parts by mass |
| Quantum dot 6; core: CdSe (average particle diameter: 4.0 nm)/ shell: ZnS (octadecylamine), average particle diameter: 12 nm | 0.30 parts by mass |
| Toluene | 2000 parts by mass |

[Preparation of Inventive Organic EL Element 24]

An organic EL element 24 was prepared as in the organic EL element 21 except that the luminous layer was formed with the following luminous layer composition 24.

| <Luminous Layer Composition 24> | |
| --- | --- |
| Exemplified compound a-10 (depicted in Chemical Formula 17) | 13.95 parts by mass |
| Exemplified compound 40 (Compound 40 shown in Table 1) | 2.45 parts by mass |
| Exemplified compound D-67 (depicted in Chemical Formula 71) | 0.025 parts by mass |
| Exemplified compound D-80 (depicted in Chemical Formula 72) | 0.025 parts by mass |
| Quantum dot 1; core: CdSe (average particle diameter: 2 nm)/ shell: ZnS (octadecylamine), average particle diameter: 12 nm | 0.30 parts by mass |
| Toluene | 2000 parts by mass |

[Preparation of Inventive Organic EL Element 25]

An organic EL element 25 was prepared as in the organic EL element 21 except that the luminous layer was formed with the following luminous layer composition 25.

| <Luminous Layer Composition 25> | |
|---|---|
| Exemplified compound a-7 (depicted in Chemical Formula 17) | 13.95 parts by mass |
| Exemplified compound DP-16 (depicted in Chemical Formula 86) | 2.45 parts by mass |
| Exemplified compound D-67 (depicted in Chemical Formula 71) | 0.025 parts by mass |
| Exemplified compound D-80 (depicted in Chemical Formula 72) | 0.025 parts by mass |
| Quantum dot 1; core: CdSe (average particle diameter: 2 nm)/ shell: ZnS (octadecylamine), average particle diameter: 12 nm | 0.30 parts by mass |
| Toluene | 2000 parts by mass |

[Preparation of Comparative Organic EL Element 26: Comparison Example]

An organic EL element 26 was prepared as in the organic EL element 21 except that the luminous layer was formed with the following luminous layer composition 26.

| <Luminous Layer Composition 26> | |
|---|---|
| Exemplified compound a-2 (depicted in Chemical Formula 16) | 14.25 parts by mass |
| Exemplified compound D-134 (depicted in Chemical Formula 82) | 2.45 parts by mass |
| Exemplified compound D-67 (depicted in Chemical Formula 71) | 0.025 parts by mass |
| Exemplified compound D-80 (depicted in Chemical Formula 72) | 0.025 parts by mass |
| Toluene | 2000 parts by mass |

<<Evaluation of Organic EL Element>>

The resulting organic EL elements 21 to 26 were used for evaluation of the luminous efficiency and the drive voltage as in Example 1. The results of the evaluation were relative values to that in the comparative organic EL element 26.

The color rendering properties and service life including resistance to color shift of each element were evaluated in accordance with the following procedures.

[Evaluation of Color Rendering Properties]

Each organic EL element was driven at room temperature (about 23 to 25° C.) at a luminescence of 1000 cd/m$^2$, and photospectrometric characteristics were determined with a spectroradiometer CS-2000 (KONICA MINOLTA OPTICS, INC.). Color rendering values and their average were calculated from the observed results.

[Evaluation of Service Life of Element]

(1) Evaluation 1: Service Life of Element

The relative service life of the comparative organic EL element 26 was determined as in Example 1.

(2) Evaluation 2: Resistance to Color Shift after Evaluation of Service Life from Initial State of Element Each organic EL element was wound around a metal column having a diameter of 5 cm. The wound organic EL element was continuously driven and the luminescence was observed with the spectroradiometer CS-2000 (described above) to determine the half period $LT_{50}$ until the observed luminance fell to one-half.

The chromaticity (CIE color system x, y) before and after the winding treatment was determined with the spectroradiometer. The difference ($\Delta x$, $\Delta y$) between the chromaticity (x,y) before the winding treatment and that (x, y) after the winding treatment was used as an index indicating the resistance to color shift. A smaller difference indicates higher chromatic stability.

Table 7 shows the results.

TABLE 6

| ORGANIC EL DEVICE No. | *1 | HOST COMPOUND | QUANTUM DOT ADDITION TO LUMINOUS LAYER | STRUCTURE OF QUANTUM DOT CORE/SHELL STRUCTURE | SURFACE MODIFIER | *1 | BANDGAP(eV) HOST COMPOUND | QUANTUM DOT | REMARKS |
|---|---|---|---|---|---|---|---|---|---|
| 21 | D-134 | a-2 | ADDED | PRESENT | PRESENT | 2.6 | 3.5 | 2.7 | PRESENT INVENTION |
| 22 | DP-9 | a-7 | ADDED | PRESENT | PRESENT | 2.6 | 3.5 | 2.3 | PRESENT INVENTION |
| 23 | COMPOUND 20 | a-10 | ADDED | PRESENT | PRESENT | 2.6 | 3.5 | 2.1 | PRESENT INVENTION |
| 24 | COMPOUND 40 | a-10 | ADDED | PRESENT | PRESENT | 2.6 | 3.5 | 2.7 | PRESENT INVENTION |
| 25 | DP-16 | a-7 | ADDED | PRESENT | PRESENT | 2.6 | 3.5 | 2.7 | PRESENT INVENTION |
| 26 | D-134 | a-2 | NOT ADDED | NOT PRESENT | NOT PRESENT | 2.6 | 3.5 | — | COMPARISON EXAMPLE |

*1: PHOSPHORESCENT DOPANT

TABLE 7

| ORGANIC EL DEVICE NO. | RELATIVE LUMINOUS EFFICIENCY | RELATIVE DRIVE VOLTAGE | COLOR RENDERING INDEX | SERVICE LIFE OF DEVICE EVALUATION 1 | EVALUATION 2: RESISTANCE TO COLOR SHIFT $\Delta x$ | EVALUATION 2: RESISTANCE TO COLOR SHIFT $\Delta y$ | REMARKS |
|---|---|---|---|---|---|---|---|
| 21 | 1.4 | 0.6 | 91 | 1.7 | 0.03 | 0.02 | PRESENT INVENTION |
| 22 | 1.7 | 0.6 | 83 | 1.9 | 0.01 | 0.02 | PRESENT INVENTION |
| 23 | 1.8 | 0.6 | 85 | 2.3 | 0.01 | 0 | PRESENT INVENTION |
| 24 | 1.7 | 0.8 | 90 | 2.1 | 0.01 | 0.01 | PRESENT INVENTION |
| 25 | 1.9 | 0.9 | 91 | 2.2 | 0 | 0.01 | PRESENT INVENTION |
| 26 | 1.0 (STANDARD) | 1.0 (STANDARD) | 80 | 1.0 (STANDARD) | 0.08 | 0.06 | COMPARISON EXAMPLE |

The results shown in Table 7 demonstrate that organic EL elements 21 to 25 (white luminescent elements of the present invention) exhibit sufficiently high luminescence at quantum dots by energy transfer from the phosphorescent dopants to the quantum dots, high luminous efficiency, a decreased drive voltage, superior color rendering properties, and a prolonged emission lifetime, compared to comparative organic EL element 26. These advantages are further enhanced through selection of appropriate phosphorescent dopants.

Example 3

<<Preparation of Organic EL Element>>

Blue luminescent organic EL elements 31 to 39 were prepared in accordance with the following procedure.
[Preparation of Comparative Organic EL Element 31: Comparison Example]

(1) Formation of First Electrode Layer

Indium tin oxide (ITO) with a thickness of 100 nm was formed on a glass substrate with dimensions of 100 mm by 100 mm by 1.1 mm (NA 45 made by NH Technoglass Corporation) and was patterned into an anode. The transparent substrate provided with the transparent ITO electrode was ultrasonically cleaned in isopropyl alcohol, was dried in a dry nitrogen stream, and then was cleaned in a UV ozone environment for five minutes.

(2) Formation of Hole Injection Layer

A solution of 70% poly(3,4-ethylene dioxythiophene)-polyethylenesulfonate (PEDOT/PSS), CLEVIO P VP Al 4083 available from H. C. Starck) in pure water was applied by spin coating on the transparent substrate provided with the ITO transparent electrode at 3000 rpm for 30 seconds. The substrate was dried at 200° C. for one hour. A 20 nm thick hole injection layer was thereby formed.

(3) Formation of Hole Transport Layer

The transparent substrate provided with the hole injection layer was fixed to a substrate holder in a commercially available vacuum evaporation system, and 200 mg of N,N-diphenyl-N,N'-bis(1-naphtyl)-1,1'-biphenyl-4,4'-diamine (hereinafter, simply α-NPD as a material for a hole transport material (the structure is depicted in Chemical Formula 129)) was placed onto a molybdenum heating boat, which was then placed into the vacuum evaporation system.

After the vacuum vessel was evacuated to $4\times10^{-4}$ Pa, the boat containing α-NPD was electrically heated to deposit it at a rate of 0.1 nm/sec on the transparent substrate to give a 20 nm thick hole transport layer.

(4) Formation of Luminous Layer

Onto another molybdenum resistive heating boat was placed 200 mg of exemplified host compound a-3 (the structure is depicted in Chemical Formula 16). Furthermore, 100 mg of exemplified dopant compound D-134 (the structure is depicted in Chemical Formula 82), 100 mg of exemplified compound D-67 (the structure is depicted in Chemical Formula 71), and 100 mg of exemplified compound D-80 (depicted in Chemical Formula 72) were placed into the respective molybdenum resistive heating boats and these boats were attached to the vacuum evaporation system.

After the vacuum vessel was evacuated to $4\times10^{-5}$ Pa, the boats containing exemplified host compound a-3 and exemplified dopant compounds D-134, D-67, and D-80, respectively, were electrically heated to codeposit at deposition rates of 0.1 nm/sec, 0.016 nm/sec, and 0.0002 nm/sec, respectively, on the hole transport layer to give a 40 nm thick luminous layer.

(5) Formation of Electron Transport Layer

After 200 mg of compound A (refer to Example 1 for the structure) was placed onto another molybdenum resistive heating boat, the vacuum vessel was evacuated to $4\times10^{-5}$ Pa. The boat was electrically heated to deposit the compound A at a deposition rate of 0.1 nm/sec onto the luminous layer to form a 30 nm thick electron transport layer. The substrate temperature during the deposition was room temperature.

(6) Formation of Electron Injection Layer and Cathode

The substrate was then placed into a vacuum evaporation system without exposition to the atmosphere. Molybdenum resistive heating boats containing sodium fluoride and potassium fluoride, respectively, were attached to the vacuum evaporation system. After the vacuum vessel was evacuated to $4\times10^{-5}$ Pa, the boat was electrically heated to deposit sodium fluoride at a rate of 0.02 nm/sec on the electron transport layer into a thickness of 1 nm then to deposit potassium fluoride at a rate of 0.02 nm/sec on sodium fluoride to give a 1.5 nm thick electron injection layer. A 100 nm thick aluminum film was then deposited by evaporation to form a cathode.

(7) Sealing and Preparation of Lighting Device

The resulting organic EL element 31 was sealed as in Example 2 to form a lighting device provided with the organic EL element 31.

[Preparation of Comparative Organic EL Element 32: Comparison Example]

The steps up to the formation of the hole transport layer were performed as in the comparative organic EL element 31 (comparison example), and a luminous layer was formed on the hole transport layer in accordance with the following procedure.

(Formation of Luminous Layer)

Onto a molybdenum resistive heating boat was placed 200 mg of exemplified host compound a-39 (the structure is depicted in Chemical Formula 23). Furthermore, 100 mg of exemplified dopant compound D-135 (the structure is depicted in Chemical Formula 82), 100 mg of exemplified compound D-67 (the structure is depicted in Chemical Formula 71), and 100 mg of exemplified compound D-80 (depicted in Chemical Formula 72) were placed into the respective polybydenum resistive heating boats and these boats were attached to the vacuum evaporation system.

After the vacuum vessel was evacuated to $4\times10^{-5}$ Pa, the boats containing exemplified host compound a-39 and exemplified dopant compounds D-135, D-67, and D-80, respectively, were electrically heated to codeposit at deposition rates of 0.1 nm/sec, 0.016 nm/sec, and 0.0002 nm/sec, respectively, on the hole transport layer to give a 40 nm thick luminous layer.

A charge generating layer (2) was formed on the resulting luminous layer.

(Formation of Charge Generating Sublayer (2))

Lithium fluoride, aluminum, 1,4,5,8,9,12-hexaazatriphenylenehexacarbonitrile (hereinafter, simply HATCN), and α-NPD (the same as above) were deposited under vacuum in this sequence on the luminous layer.

Lithium fluoride (1 nm)/aluminum (1 nm)/HATCN (1 nm)/α-NPD (40 nm)

Under a vacuum of $4\times10^{-4}$ Pa, lithium fluoride to HATCN were deposited at a deposition rate of 0.02 nm/sec, and α-NPD at 0.1 nm/sec, to give a charge generating layer (2).

(Formation of Luminous Layer (2))

A 40 nm thick luminous layer (2) was formed by coevaporation onto the charge generating layer (2) as in the formation of the luminous layer in the preparation of the organic EL element 31.

(Formation of Electron Transport Layer)

A 30 nm thick electron transport sublayer was formed by coevaporation onto the luminous layer (2) as in the formation of the electron transport layer in the preparation of the organic EL element 31.

(Formation of Electron Injection Layer and Cathode)

Sodium fluoride and then potassium fluoride were deposited on the electron transport layer as in the formation of the electron injection layer and the cathode in the preparation of the organic EL element 31. A 100 nm aluminum thin film was then deposited to give a cathode.

(Sealing and Preparation of Lighting Device)

The resulting organic EL element 32 was sealed as in Example 2 to prepare a lighting device provided with the organic EL element 32.

[Preparation of Inventive Organic EL Element 33]

(1) Formation of First Electrode Layer

Indium tin oxide (ITO) with a thickness of 100 nm was deposited on a glass substrate with dimensions of 100 mm (H) by 100 mm (W) by 1.1 mm (D) (NA 45 made by NH Technoglass Corporation) and was patterned into an anode. The transparent substrate provided with the transparent ITO electrode was ultrasonically cleaned in isopropyl alcohol, was dried in a dry nitrogen stream, and then was cleaned in a UV ozone environment for five minutes.

(2) Formation of Hole Injection Layer

A solution of 70% poly(3,4-ethylene dioxythiophene)-polyethylenesulfonate (PEDOT/PSS), CLEVIO P VP Al 4083 available from H. C. Starck) in pure water was applied by spin coating on the transparent substrate provided with the ITO transparent electrode at 3000 rpm for 30 seconds. The substrate was dried at 200° C. for one hour. A 20 nm thick hole injection layer was thereby formed.

(3) Formation of Hole Transport Layer

The transparent substrate provided with the hole injection layer was fixed to a substrate holder in a commercially available vacuum evaporation system, and 200 mg of α-NPD as a material for a hole transport material was placed onto a molybdenum heating boat, which was then placed into the vacuum evaporation system.

After the vacuum vessel was evacuated to $4\times10^{-4}$ Pa, the boat containing α-NPD was electrically heated to deposit it at a rate of 0.1 nm/sec on the transparent substrate to give a 20 nm thick hole transport layer.

(4) Formation of Quantum Dot Layer

A monomolecular layer of a quantum dot was then formed on the hole transport layer in accordance with the following procedure.

Parts A and B of Sylgard (registered trademark) 184 silicone elastomer (Dow Corning, USA) were mixed in a mass ratio of 10:1 in a plastic beaker. The mixture was then poured into a master mold having a predetermined pattern formed by photolithography, was allowed to stand for about two hours at normal temperature, and then was completely aged in an oven at 60° C. for 2 hours to prepare a stamp.

A solution of 3% quantum dot ink (quantum dot having a CdSe core (2 nm) and a ZnS shell (octadecylamine) in toluene) was applied by spin coating onto the stamp. After the ink was completely dried, the protrudent face of the stamp was urged onto the surface of the hole transport layer of the element. A monomolecular quantum dot layer was thereby formed on the hole transport layer. This process for forming the quantum dot layer is referred to as a stamping process.

(5) Formation of Charge Generating Sublyaer (1)

Lithium fluoride, aluminum, HAT-CN, and α-NPD were deposited under vacuum in this sequence on the quantum dot layer into a configuration and a thickness described below, to generate a charge generating layer.

Lithium fluoride (1 nm)/aluminum (1 nm)/HAT-CN (1 nm)/α-NPD (40 nm)

Under a vacuum of $4\times10^{-4}$ Pa, lithium fluoride to HAT-CN were deposited at a deposition rate of 0.02 nm/sec, and α-NPD at 0.1 nm/sec, to give a charge generating layer (1).

(6) Formation of Luminous Layer

Onto a molybdenum resistive heating boat was placed 200 mg of exemplified host compound a-3 (the structure is depicted in Chemical Formula 16). Furthermore, 100 mg of exemplified dopant compound D-134 (the structure is depicted in Chemical Formula 82), 100 mg of exemplified compound D-67 (the structure is depicted in Chemical Formula 71), and 100 mg of exemplified compound D-80 (depicted in Chemical Formula 72) were placed into the respective molybdenum resistive heating boats and these boats were attached to the vacuum evaporation system. After the vacuum vessel was evacuated to $4\times10^{-5}$ Pa, the boats containing exemplified host compound a-3 and exemplified dopant compounds D-134, D-67, and D-80, respectively, were electrically heated to codeposit at deposition rates of 0.1 nm/sec, 0.016 nm/sec, and 0.0002 nm/sec, respectively, on the charge generating layer to give a 40 nm thick luminous layer.

(7) Formation of Electron Transport Layer

After 200 mg of compound A (refer to Example 1) was placed onto another molybudenum resistive heating boat, the vacuum vessel was evacuated to $4\times10^{-5}$ Pa. The boat was electrically heated to deposit the compound A at a deposition rate of 0.1 nm/sec onto the luminous layer to form a 30 nm thick electron transport layer. The substrate temperature during the deposition was room temperature.

(8) Formation of Electron Injection Layer and Cathode

The substrate was then placed into a vacuum evaporation system without exposition to the atmosphere. Molybudenum resistive heating boats containing sodium fluoride and potassium fluoride, respectively, were attached to the vacuum evaporation system. After the vacuum vessel was evacuated to $4\times10^{-5}$ Pa, the boat was electrically heated to deposit sodium fluoride at a rate of 0.02 nm/sec on the electron transport layer into a thickness of 1 nm then to deposit potassium fluoride at a rate of 0.02 nm/sec on sodium fluoride to give a 1.5 nm thick electron injection layer. A 100 nm thick aluminum film was then deposited by evaporation to form a cathode.

(9) Sealing and Preparation of Organic EL Element

The resulting organic EL element 33 was sealed as in Example 2 to form a lighting device provided with the organic EL element 33.

[Preparation of Inventive Organic EL Element 34]

An organic EL element 34 was prepared as in the organic EL element 33 except that the luminous layer was formed in accordance with the following procedure.

(Formation of Luminous Layer)

Onto a molybudenum resistive heating boat was placed 200 mg of exemplified host compound a-8 (the structure is depicted in Chemical Formula 17). Furthermore, 100 mg of exemplified dopant compound DP-3 (the structure is depicted in Chemical Formula 83), 100 mg of exemplified compound D-67 (the structure is depicted in Chemical Formula 71), and 100 mg of exemplified compound D-80 (depicted in Chemical Formula 72) were placed into the respective molybudenum resistive heating boats and these boats were attached to the vacuum evaporation system. After the vacuum vessel was evacuated to $4\times10^{-5}$ Pa, the boats containing exemplified host compound a-8 and exemplified dopant compounds DP-3, D-67, and D-80, respectively, were electrically heated to codeposit at deposition rates of 0.1 nm/sec, 0.016 nm/sec, and 0.0002 nm/sec, respectively, on the charge generating layer to give a 40 nm thick luminous layer.

[Preparation of Inventive Organic EL Element 35]

An organic EL element 35 was prepared as in the comparative organic EL element 32 except that a quantum dot layer (2) was deposited on the charge generating layer (2) in accordance with the procedure described below and the luminous layer (2) was not formed.

In the formation of the luminous layer, the exemplified compound a-39 was replaced with the exemplified compound a-17 (the structure is depicted in Chemical Formula 18), and the exemplified compound D-135 was replaced with the exemplified compound 30 (compound 30 in Table 1).

(Formation of Quantum Dot Layer (2))

A monomolecular layer of a quantum dot, i.e., quantum dot layer (2) was then formed on the charge generating layer (2) in accordance with the following procedure.

Parts A and B of Sylgard (registered trademark) 184 silicone elastomer (Dow Corning, USA) were mixed in a mass ratio of 10:1 in a plastic beaker. The mixture was then poured into a master mold having a predetermined pattern formed by photolithography, was allowed to stand for about two hours at normal temperature, and then was completely aged in an oven at 60° C. for 2 hours to prepare a stamp.

A solution of 3% quantum dot ink (quantum dot having a CdSe core (2 nm) and a ZnS shell (octadecylamine) in toluene) was applied by spin coating onto the stamp. After the ink was completely dried, the protrudent face of the stamp was urged onto the surface of the hole transport layer of the element. A monomolecular quantum dot layer (2) was thereby formed on the hole transport layer. This process for forming the quantum dot layer is referred to as a stamping process.

[Preparation of Inventive Organic EL Element 36]

After the steps up to the formation of a hole transport layer in the preparation of the organic EL element 21 in Example 2, a quantum dot layer (1) was formed in accordance with the following coating process.

(Formation of Quantum Dot Layer (1))

A solution of 3% quantum dot ink (quantum dot having a CdSe core (2 nm) and a ZnS shell (octadecylamine) in toluene) was applied by spin coating onto the hole transport layer. The quantum dot ink was completely dried to give a monomolecular quantum dot layer (1).

A charge generating layer (1) was then formed as in the preparation of the organic EL element 33.

A luminous layer, a charge generating layer (2), and a quantum dot layer (2) (the quantum dot had a CdCe core having an average particle diameter of 4 nm and a ZnS shell (octadecylamine) and had an overall particle size of 12 nm) were formed as in the preparation of the organic EL element 35, and then an electron transport layer, an electron injection layer, and a cathode were prepared as in the preparation of the organic EL element 21 in Example 2.

In the formation of the luminous layer, the exemplified compound a-17 used for formation of the luminous layer in the organic EL element 35 was replaced with the exemplified compound a-22 (the structure is depicted in Chemical Formula 19), and the exemplified compound 30 was replaced with the exemplified compound 51 (compound 51 in Table 2).

The resulting organic EL element 36 was sealed as in Example 2 to give a lighting device provided with the organic EL element 36.

[Preparation of Inventive Organic EL Element 37]

After the steps up to the formation of a quantum dot layer (1) in the preparation of the organic EL element 36, a charge generating layer (1) was formed by the following coating process.

(Formation of Charge Generating Layer (1))

After a 1:1 solution of DBp-6 (the structure is depicted in Chemical Formula 143) and AQp-2 (the structure is depicted in Chemical Formula 153) in chlorobenzene was applied by slit coating, the coating was irradiated with UV rays from a low-pressure mercury lamp (15 mW/cm$^2$) for 30 seconds at 130° C. to optically polymerize the polymerizable groups contained in the compounds. An insolubilized n-type layer (CGL) with a thickness of 20 nm was thereby formed.

On the n-type layer (CGL), a 1:1 solution of DFp-1 (the structure is depicted in Chemical Formula 146) and AG-6 (the structure is depicted in Chemical Formula 133) in chlorobenzene was applied by slit coating, and then the coating was irradiated with UV rays from a low-pressure mercury lamp (15 mW/cm$^2$) for 30 seconds at 130° C. to optically polymerize the polymerizable groups contained in the compounds. An insolubilized p-type layer (CGL), i.e., a charge generating layer (1) with a thickness of 20 nm was thereby formed.

(Formation of Hole Transport Layer (2))

A solution of Poly(N,N'-bis(4-butylphenyl)-N,N'-bis(phenyl))benzidine (ADS-254 available from American Dye Source) in chlorobenzene was applied by slit coating on the p-type layer (CGL), and the coating was dried at 150° C. for 1 hour to give a 40 nm thick hole transport layer (2).

(Formation of Luminous Layer)

A luminous layer was then formed as in the preparation of the luminous layer used in the preparation of the organic EL element 21 in Example 2.

In the formation of the luminous layer, the exemplified compound a-2 was replaced with the exemplified compound a-29 (the structure is depicted in Chemical Formula 20), and the exemplified compound D-134 was replaced with the exemplified compound DP-4 (the structure is depicted in Chemical Formula 83).

(Formation of Charge Generating Layer (2))

A charge generating layer (2) was formed by a coating process on the luminous layer, as in the formation of the charge generating layer (1).

(Formation of Quantum Dot Layer (2))

A quantum dot layer (2) was formed on the charge generating layer (2) as in the formation of the quantum dot layer (2) in the organic EL element 35 (stamping process).

The quantum dot used had a CdCe core with an average particle diameter of 4 nm and ZnS shell (octadecylamine) and had an overall particle size of 12 nm.

(Formation of Electron Transport Layer, Electron Injection Layer, and Cathode)

An electron transport layer, an electron injection layer, and a cathode were formed as in the organic EL element 21 in Example 2.

(Sealing)

The resulting organic EL element 37 was sealed as in Example 2 to prepare a lighting device provided with the organic EL element 37.

[Preparation of Inventive Organic EL Element 38]

The steps up to the formation of the hole transport layer, the quantum dot layer (1), and the charge generating layer (1) were performed as in the organic EL element 36, and a luminous layer, a charge generating layer (2), a luminous layer (2), an electron transport layer, an electron injection layer, and a cathode were formed as in the preparation of the organic EL element 32 to give an organic EL element 38.

For the formation of each luminous layer, the same compounds as those used in the formation of a luminous layer of the organic EL element 32 were used, except that the exemplified compound D-135 used for the formation of the luminous layer was replaced with exemplified compound 101 (Compound 101 depicted in Table 3).

[Preparation of Inventive Organic EL Element 39]

An organic EL element 39 was prepared as in the preparation of the organic EL element 31, except that a hole transport layer was formed in accordance with the following procedure and a charge generating layer (1) was formed on the hole transport layer as described below.

In the formation of the luminous layer, the exemplified compound a-3 was replaced with the exemplified compound a-41 (the structure is depicted in Chemical Formula 23), and exemplified compound D-134 was replaced with exemplified compound DP-14 (the structure is depicted in Chemical Formula 85).

(Formation of Hole Transport Layer)

An exemplified compound (60) (Mw=80,000, the structure is depicted in Chemical Formula 14) for a hole transport material was dissolved in chlorobenzene into a concentration of 0.5 mass %, and then a 3% solution of a quantum dot substance having a CdSe core (average particle diameter: 2 nm) and a ZnS shell (octadecylamine) in toluene was mixed therewith such that the quantum dot was 20 mass % relative to the exemplified compound (60). The mixed solution was applied by spin coating at 1500 rpm for 30 seconds and was kept at 160° C. for 30 minutes to form a 30 nm thick hole transport layer. AFM observation confirmed the formation of a monomolecular layer of the quantum dot on the hole transport layer.

(Formation of Charge Generating Layer (1))

A charge generating layer (1) was formed as in the charge generating layer (1) in the organic EL element 36.

The host compound and the phosphorescent dopant used for preparation of each organic EL element, and the layer configuration of the element are shown in Table 8.

TABLE 8

| ORGANIC EL DEVICE No. | *1 | HOST COMPOUND | LAYER CONFIGURATION ||||
|---|---|---|---|---|---|---|
| | | | HOLE TRANSPORT LAYER | QUANTUM DOT LAYER (1) | CHARGE GENERATING LAYER (1) | LUMINOUS LAYER (1) |
| 31 | D-134 | a-3 | EVAPORATION | — | — | EVAPORATION |
| 32 | D-135 | a-39 | EVAPORATION | — | — | EVAPORATION |
| 33 | D-134 | a-3 | EVAPORATION | STAMPING | EVAPORATION | EVAPORATION |
| 34 | DP-3 | a-8 | EVAPORATION | STAMPING | EVAPORATION | EVAPORATION |
| 35 | COMPOUND 30 | a-17 | EVAPORATION | — | — | EVAPORATION |
| 36 | COMPOUND 51 | a-22 | APPLICATION | APPLICATION | EVAPORATION | EVAPORATION |
| 37 | DP-4 | a-29 | APPLICATION | APPLICATION | APPLICATION | APPLICATION |
| 38 | COMPOUND 101 | a-39 | APPLICATION | APPLICATION | EVAPORATION | EVAPORATION |
| 39 | DP-14 | a-41 | APPLICATION(*2) | — | EVAPORATION | EVAPORATION |

| ORGANIC EL DEVICE No. | LAYER CONFIGURATION ||||  REMARKS |
|---|---|---|---|---|---|
| | CHARGE GENERATING LAYER (2) | QUANTUM DOT LAYER (2) | LUMINOUS LAYER (2) | ELECTRON TRANSPORT LAYER | |
| 31 | — | — | — | EVAPORATION | COMPARISON EXAMPLE |
| 32 | EVAPORATION | — | EVAPORATION | EVAPORATION | COMPARISON EXAMPLE |
| 33 | — | — | — | EVAPORATION | PRESENT INVENTION |
| 34 | — | — | — | EVAPORATION | PRESENT INVENTION |
| 35 | EVAPORATION | STAMPING | — | EVAPORATION | PRESENT INVENTION |
| 36 | EVAPORATION | STAMPING | — | APPLICATION | PRESENT INVENTION |
| 37 | APPLICATION | STAMPING | — | APPLICATION | PRESENT INVENTION |

TABLE 8-continued

| 38 | EVAPORATION | — | EVAPORATION | EVAPORATION | PRESENT INVENTION |
| 39 | — | — | — | EVAPORATION | PRESENT INVENTION |

*1: PHOSPHORESCENT DOPANT
(*2)THE QUANTUM DOT (1) WAS FORMED ON THE PLANAR FACE OF THE HOLE TRANSPORT LAYER.

<<Evaluation of Organic EL Element>>

The luminous efficiency, drive voltage, color rendering properties, and service life of each of the organic EL elements 31 to 39 were evaluated as in Example 2. Table 9 shows the results.

The luminous efficiency, drive voltage, and service life (Evaluation 1) of the element were relative values to the values of the organic EL element 31.

In the inventive organic EL elements 33 to 39, the charge generating layers disposed between the quantum dot layer and the luminous layer also ensures sufficient luminescence from the quantum dot, improved color rendering properties and emission lifetime, and stable chromaticity. These effects can be enhanced by selection of appropriate phosphorescent dopant.

TABLE 9

| ORGANIC EL DEVICE NO. | RELATIVE LUMINOUS EFFICIENCY | RELATIVE DRIVE VOLTAGE | COLOR RENDERING INDEX | SERVICE LIFE OF DEVICE EVALUATION 1 | EVALUATION 2: RESISTANCE TO COLOR SHIFT $\Delta x$ | $\Delta y$ | REMARKS |
|---|---|---|---|---|---|---|---|
| 31 | 1.0 (STANDARD) | 1.0 (STANDARD) | 82 | 1.0 (STANDARD) | 0.07 | 0.06 | COMPARISON EXAMPLE |
| 32 | 1.0 | 0.8 | 84 | 1.6 | 0.05 | 0.03 | COMPARISON EXAMPLE |
| 33 | 1.5 | 0.2 | 92 | 1.7 | 0.01 | 0.02 | PRESENT INVENTION |
| 34 | 1.7 | 0.2 | 93 | 1.9 | 0.01 | 0.01 | PRESENT INVENTION |
| 35 | 1.9 | 0.2 | 88 | 2.1 | 0.01 | 0.01 | PRESENT INVENTION |
| 36 | 1.9 | 0.4 | 91 | 2.3 | 0 | 0.01 | PRESENT INVENTION |
| 37 | 1.9 | 0.4 | 92 | 1.8 | 0.02 | 0.01 | PRESENT INVENTION |
| 38 | 1.9 | 0.5 | 90 | 2.5 | 0.01 | 0 | PRESENT INVENTION |
| 39 | 1.9 | 0.1 | 91 | 1.5 | 0.02 | 0.02 | PRESENT INVENTION |

The results shown in Table 9 demonstrate that the organic EL elements 33 to 39, which are white light emitting elements of the present invention, achieve sufficient luminescence from the quantum dot as a result of energy transfer from the phosphorescent dopant to the quantum dot, and thus exhibit improved luminous efficiency, low driving voltage, superior color rendering properties, prolonged emission lifetime, and stable chromaticity, compared to comparative organic EL element 31 and 32. These advantages are enhanced by the selection of the phosphorescent dopant.

In addition to the confirmation of the advantageous effects of the present invention, a luminous layers 1 and 2 each having a thickness of 40 nm were formed by codepositing the exemplary compound 101 (Compound 101 depicted in Table 3) as a phosphorescent dopant and exemplary compound a-39 (the structure is depicted in Chemical Formula 23) as a host compound for the luminous layer 1 (blue luminescent monolayer), exemplary compound D-80 (the structure is depicted in Chemical Formula 72) as a phosphorescent dopant and exemplary compound a-39 (described above) as a host compound for the luminous layer 2 (red luminescent monolayer), at a deposition rate of 0.1 nm/sec for each host compound and a deposition rate of 0.016 nm/sec for each phosphorescent dopant, in the configuration of the organic EL element 37. This organic EL element was driven. White light emission was observed which had a luminous efficiency 1.8 times higher and a service life 2.1 times higher than those of the comparative organic EL element 31, a drive voltage ($\Delta V$) of 0.3, a color rendering index Ra of 90, and a color shift before and after the service life of $\Delta x=0.01$ and $\Delta y=0.01$.

Although a multilayer configuration including a charge generating layer results in a significant increase in drive voltage, a combination with a quantum dot can significantly reduce such an increase in drive voltage.

INDUSTRIAL APPLICABILITY

The inventive organic electroluminescent element exhibits superior color rendering properties and stable white light emission characteristics at low drive voltage, and thus is suitable for display devices and various light sources.

REFERENCE SIGNS LIST 1 flexible substrate
2 anode
3 hole injection layer
4 hole transport layer
5 luminous layer
6 electron transport layer
7 electron injection layer
8 cathode
9 sealing adhesive
10 flexible sealing member
11 quantum dot
20 organic functional layers
100 organic electroluminescent device

The invention claimed is:
1. An organic electroluminescent device comprising:
a substrate;
a pair of electrodes; and
at least two organic functional layers including a luminous layer, wherein
the pair of electrodes and the organic functional layers are provided on the substrate,
the luminous layer contains a host compound and a phosphorescent dopant,
the luminous layer or an adjacent layer contains a quantum dot having a core/shell structure,
a surface of the quantum dot is modified with a surface modifier,
the phosphorescent dopant contained in the luminous layer comprises at least one type of blue phosphorescent compound, and
the blue phosphorescent dopant is a compound represented by Formula (3):

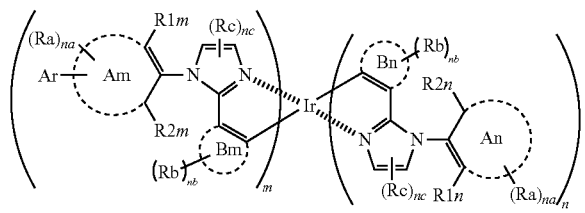

Formula (3)

wherein rings Am, An, Bm, and Bn each, represents five- or six-member aromatic hydrocarbon ring or six-member heterocyclic aromatic ring; Ar represents an aromatic hydrocarbon ring, heterocyclic aromatic ring, nonaromatic hydrocarbon ring, or a nonaromatic heterocyclic ring; R1m, R2m, R1n, and R2n each independently represent an alkyl group having two or more carbon atoms, aromatic hydrocarbon ring group, heterocyclic aromatic ring group, nonaromatic hydrocarbon ring group, nonaromatic heterocyclic ring group which optionally have a substituent group; Ra, Rb, and Rc each independently a hydrogen or halogen atom or a cyano, alkyl, alkenyl, alkynyl, alkoxy, amino, silyl, arylalkyl, aryl, heteroaryl, or nonaromatic hydrocarbon ring group, or a nonaromatic heterocyclic ring group which optionally have a substituent; Ra may form a ring together with Ar; na and nc each represents 1 or 2; nb represents an integer of 1 to 4; m represents 1 or 2, n represents 1 or 2, wherein m+n is 3; three ligands coordinated to Ir are not all the same.

2. The organic electroluminescent device according to claim 1, wherein the luminous layer contains the quantum dot.

3. The organic electroluminescent device according to claim 1, wherein the adjacent layer adjacent to the luminous layer contains the quantum dot.

4. The organic electroluminescent device according to claim 1, further comprising a charge generating layer between the luminous layer and the adjacent layer adjacent to the luminous layer.

5. The organic electroluminescent device according to claim 1, wherein the phosphorescent dopant contained in the luminous layer comprises the blue phosphorescent compound and another phosphorescent compound having a band gap which is at least 0.1 eV lower than the band gap of the blue phosphorescent dopant, and
the luminous layer emits white light.

6. The organic electroluminescent device according to claim 1, wherein the quantum dot comprises at least Si, Ge, GaN, GaP, CdS, CdSe, CdTe, InP, InN, ZnS, $In_2S_3$, ZnO, CdO or a mixture thereof.

7. The organic electroluminescent device according to claim 1, wherein the quantum dot has an average particle size in a range of 1.0 to 20 nm.

8. The organic electroluminescent device according to claim 1, wherein the core/shell structure is composed of at least two types of compounds.

9. The organic electroluminescent device according to claim 1, wherein the quantum dot has a band gap which is at least 0.1 eV lower than the band gap of the material contained in the adjacent layer.

10. The organic electroluminescent device according to claim 1, wherein the quantum dot has a band gap which is at least 0.1 eV lower than the band gap of the host compound contained in the luminous layer.

11. The organic electroluminescent device according to claim 1, wherein a band gap of at least one type of the quantum dot is at least 0.1 eV higher than a hand bap of the blue phosphorescent compound contained in the luminous layer.

12. The organic electroluminescent device according to claim 1, wherein the host compound has a molecular weight of 2000 or less.

13. The organic electroluminescent device according to claim 12, wherein the host compound having the molecular weight of 2000 or less is represented by Formula (8):

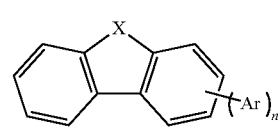

Formula (8)

wherein X represents NR', an oxygen atom, a sulfur atom, CR'R", or SiR'R"; R' and R" each represent a hydrogen atom or substituent group; Ar represents an aromatic ring; and n represents an integer of 0 to 8.

14. The organic electroluminescent device according to claim 1, wherein at least one layer of the at least two organic layers including the luminous layer is formed by a wet coating process.

15. The organic electroluminescent device according to claim 1, wherein the surface modifier is selected from the group consisting of organic phosphorus compounds, organic nitrogen compounds, organic sulfur compounds, higher fatty acids, and alcohols.

* * * * *